US012274159B2

(12) United States Patent
Jeon et al.

(10) Patent No.: US 12,274,159 B2
(45) Date of Patent: Apr. 8, 2025

(54) ORGANIC LIGHT-EMITTING DEVICE

(71) Applicant: Samsung Electronics Co., Ltd., Suwon-si (KR)

(72) Inventors: Soonok Jeon, Suwon-si (KR); Inkoo Kim, Suwon-si (KR); Sangmo Kim, Hwaseong-si (KR); Yusuke Maruyama, Hwaseong-si (KR); Won-joon Son, Yongin-si (KR); Hyeonho Choi, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 402 days.

(21) Appl. No.: 17/193,540

(22) Filed: Mar. 5, 2021

(65) Prior Publication Data

US 2021/0288259 A1 Sep. 16, 2021

(30) Foreign Application Priority Data

Mar. 5, 2020 (KR) ........................ 10-2020-0027988
Feb. 17, 2021 (KR) ........................ 10-2021-0021419

(51) Int. Cl.
*H01L 51/00* (2006.01)
*C07F 5/02* (2006.01)
(Continued)

(52) U.S. Cl.
CPC ........... *H10K 85/615* (2023.02); *C07F 5/027* (2013.01); *C09K 11/06* (2013.01);
(Continued)

(58) Field of Classification Search
CPC .. H10K 85/615; H10K 85/322; H10K 85/657; C07F 5/027
See application file for complete search history.

(56) References Cited

U.S. PATENT DOCUMENTS 10,689,402 B2 6/2020 Hatakeyama et al.
2008/0100212 A1* 5/2008 Tsuboyama .......... H10K 85/341 977/932

(Continued)

FOREIGN PATENT DOCUMENTS

KR 1020090065201 A 6/2009
KR 1020110106192 A 9/2011

(Continued)

OTHER PUBLICATIONS

English language translation of KR20090065201A, pp. 1-109, Feb. 20, 2024.*

(Continued)

*Primary Examiner* — Alexander C Kollias
(74) *Attorney, Agent, or Firm* — CANTOR COLBURN LLP

(57) ABSTRACT

An organic light-emitting device including: a first electrode; a second electrode; and an organic layer disposed between the first electrode and the second electrode, wherein the organic layer includes an emission layer, wherein the emission layer includes a polycyclic compound represented by Formula 1 and a host, and wherein an amount of the polycyclic compound is less than an amount of the host in the emission layer, wherein Formula 1 is as provided herein.

19 Claims, 2 Drawing Sheets

(51) Int. Cl.

| | |
|---|---|
| ***C09K 11/06*** | (2006.01) |
| ***H10K 85/60*** | (2023.01) |
| *H10K 50/12* | (2023.01) |
| *H10K 101/30* | (2023.01) |

(52) U.S. Cl.

CPC ................. *C09K 2211/1007* (2013.01); *C09K 2211/1011* (2013.01); *H10K 50/121* (2023.02); *H10K 2101/30* (2023.02)

(56) References Cited

U.S. PATENT DOCUMENTS

| | | | | |
|---|---|---|---|---|
| 2018/0301629 | A1* | 10/2018 | Hatakeyama ........ | H10K 85/322 |
| 2020/0058885 | A1* | 2/2020 | Hong .................. | H10K 85/322 |
| 2020/0140471 | A1* | 5/2020 | Chen .................. | C07F 15/0086 |
| 2020/0144515 | A1 | 5/2020 | Hatakeyama et al. | |
| 2021/0053998 | A1* | 2/2021 | Kim .................. | H10K 85/6576 |
| 2021/0167288 | A1 | 6/2021 | Hatakeyama et al. | |

FOREIGN PATENT DOCUMENTS

| | | | |
|---|---|---|---|
| KR | 101506919 | B1 | 3/2015 |
| KR | 20160119683 | A | 10/2016 |
| KR | 20200019272 | A | 2/2020 |
| WO | 2010050778 | A1 | 5/2010 |
| WO | 2016017514 | A1 | 2/2016 |
| WO | 2016152418 | A1 | 9/2016 |
| WO | 2019009052 | A1 | 1/2019 |

OTHER PUBLICATIONS

Dae Hyun Ahn et al., "Highly efficient blue thermally activated delayed fluorescence emitters based on symmetrical and rigid oxygen-bridged boron acceptors," Nature Photonics, Aug. 2019, pp. 540-546, vol. 13.
Extended European Search Report (EESR) mailed Aug. 2, 2021 for EP Patent Appl. No. 21160639.7.
Hiroki Hirai et al., "One-Step Borylation of 1,3-Diaryloxybenzenes Towards Efficient Materials for Organic Light-Emitting Diodes," Angew. Chem. Int. Ed., 2015, pp. 13581-13585, vol. 54.
Soichiro Nakatsuka et al., "Divergent Synthesis of Heteroatom-Centered 4,8, 12-Triazatriangulenes," Communications, Angew. Chem. Int. Ed., 2017, pp. 5087-5090, vol. 56.
Takuji Hatakeyama et al., "Ultrapure Blue Thermally Activated Delayed Fluorescence Molecules: Effi cient HOMO-LUMO Separation by the Multiple Resonance Effect," Adv. Mater., 2016, pp. 2777-2781, vol. 28.
Xiao Liang et al., "Peripheral Amplification of Multi-Resonance Induced Thermally Activated Delayed Fluorescence for Highly Efficient OLEDs," Angew. Chem. Int. Ed. 2018, pp. 11316-11320, vol. 57.
Yi Yuan et al., "The Design of Fused Amine/Carbonyl System for Efficient Thermally Activated Delayed Fluorescence: Novel Multiple Resonance Core and Electron Acceptor," Adv. Optical Mater., 2019, pp. 1-6, vol. 1801536.
Anton Pershin et al., "Highly Emissive Excitons With Reduced Exchange Energy in Thermally Activated Delayed Fluorescent Molecules," Nature Communications, 2019, pp. 1-5.
European Search Report for European Patent Application No. 21160639.7 dated Oct. 30, 2024.
Office Action issued Jan. 23, 2025 of KR Patent Application No. 10-2021-0021419.

* cited by examiner

ORGANIC LIGHT-EMITTING DEVICE

CROSS-REFERENCE TO RELATED APPLICATION

This application claims priority to and the benefit of Korean Patent Application No. 10-2020-0027988, filed on Mar. 5, 2020, and Korean Patent Application No. 10-2021-0021419, filed on Feb. 17, 2021, in the Korean Intellectual Property Office, and all the benefits accruing therefrom under 35 U.S.C. § 119, the contents of which are incorporated by reference herein in their entireties.

BACKGROUND

1. Field

The present disclosure relates to an organic light-emitting device.

2. Description of the Related Art

Organic light-emitting devices (OLEDs) are self-emission devices that, as compared with conventional devices, have wide viewing angles, high contrast ratios, short response times, and excellent brightness, driving voltage, and response speed characteristics, and produce full-color images.

OLEDs include an anode, a cathode, and an organic layer disposed between the anode and the cathode and including an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. The excitons may transit from an excited state to a ground state and generate visible light.

SUMMARY

One or more embodiments include an organic light-emitting device (OLED) having high efficiency and high colorimetric purity.

Additional aspects will be set forth in part in the description which follows and, in part, will be apparent from the description, or may be learned by practice of the presented exemplary embodiments of the disclosure.

According to an aspect, provided is an organic light-emitting device including a first electrode, a second electrode, and an organic layer disposed between the first electrode and the second electrode, wherein the organic layer includes an emission layer, wherein the emission layer includes a polycyclic compound represented by Formula 1 and a host, and wherein an amount of the polycyclic compound is less than an amount of the host in the emission layer:

Formula 1

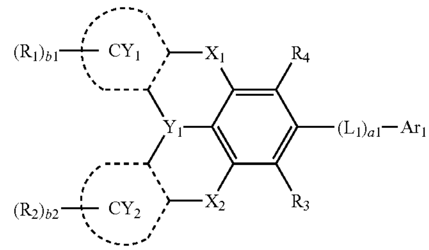

Formula 1A

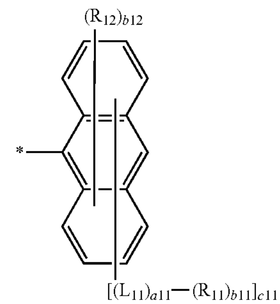

In Formulae 1 and 1A, $Ar_1$ is a group represented by Formula 1A, rings $CY_1$ and $CY_2$ are each independently a $C_5$-$C_{30}$ carbocyclic group or a $C_1$-$C_{30}$ heterocyclic group, $Y_1$ is B, N, P, P(=O), P(=S), Al, Ga, As, Si($R_5$), or Ge($R_5$), $X_1$ and $X_2$ are each independently O, S, Se, N($R_6$), C($R_6$)($R_7$), Si($R_6$)($R_7$), Ge($R_6$)($R_7$), and P(=O)($R_6$), $L_1$ and $L_{11}$ are each independently a single bond, a substituted or unsubstituted $C_5$-$C_{30}$ carbocyclic group, or a substituted or unsubstituted $C_1$-$C_{30}$ heterocyclic group, a1 and a11 are each independently an integer from 1 to 3, when a1 is 2 or greater, at least two $L_1$(s) may be identical to or different from each other, and when a11 is 2 or greater, at least two $L_{11}$(s) may be identical to or different from each other, $R_1$, $R_2$, $R_3$, $R_4$, $R_5$, $R_6$, $R_7$, $R_{11}$, and $R_{12}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(═O)($Q_8$)($Q_9$), $R_1$ and $R_2$ are optionally bound to form a substituted or unsubstituted $C_5$-$C_{30}$ carbocyclic group or a substituted or unsubstituted $C_1$-$C_{30}$ heterocyclic group, b1 and b2 are each independently an integer from 0 to 10, when b1 is 2 or greater, at least two $R_1$(s) are identical to or different from each other, and when b2 is 2 or greater, at least two $R_2$(s) are identical to or different from each other, b11 is an integer from 1 to 5, when b11 is 2 or greater, at least two $R_{11}$(s) are identical to or different from each other, b12 is an integer from 1 to 8, when b12 is 2 or greater, at least two $R_{12}$(s) are identical to or different from each other, c11 is an integer from 1 to 8, when c11 is 2 or greater, at least two -$(L_{11})_{a11}$-$(R_{11})_{b11}$(s) are identical to or different from each other, a sum of b12 and c11 is 9, and at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $O_2$—Coo heteroarylalkyl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), —B($Q_{16}$)($Q_{17}$), or —P(═O)($Q_{18}$)($Q_{19}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a s$C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), —B($Q_{26}$)($Q_{27}$), or —P(═O)($Q_{28}$)($Q_{29}$), or —Si($Q_{31}$)($Q_{32}$)($Q_{33}$), —N($Q_{34}$)($Q_{35}$), —B($Q_{36}$)($Q_{37}$), or —P(═O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, or a substituted or unsubstituted monovalent non-aromatic condensed heteropolycyclic group.

BRIEF DESCRIPTION OF THE DRAWINGS

The above and other aspects, features, and advantages of certain exemplary embodiments of the disclosure will be more apparent from the following description taken in conjunction with the accompanying drawings, in which.

DETAILED DESCRIPTION

Figure 1:
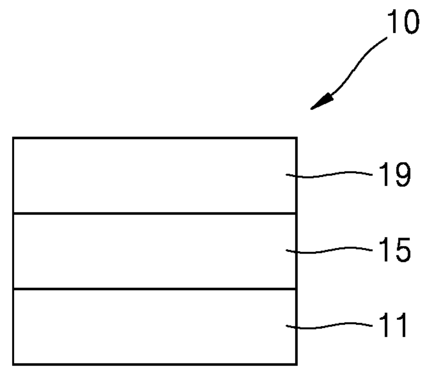
FIG. 1 is a schematic cross-sectional view of an organic light-emitting device according to an aspect of one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organic light-emitting device includes: a first electrode; a second electrode; and an organic layer disposed between the first electrode and the second electrode, wherein the organic layer includes an emission layer, wherein the organic layer includes a polycyclic compound represented by Formula 1 and a host, and wherein an amount of the polycyclic compound is less than an amount of the host in the emission layer.

The polycyclic compound is a compound represented by Formula 1:

Formula 1

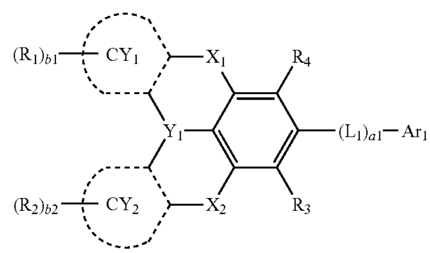

wherein $Ar_1$ is a group represented by Formula 1A:

Formula 1A

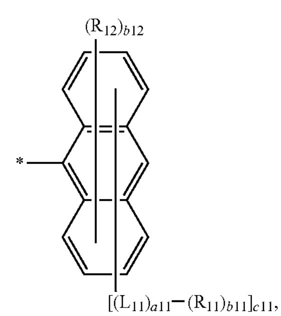

wherein, in Formulae 1, rings $CY_1$ to $CY_2$ are each independently a $C_5$-$C_{30}$ carbocyclic group or a $C_1$-$C_{30}$ heterocyclic group.

In one or more embodiments, $CY_1$ and $CY_2$ may each independently be an A group, a B group, a condensed ring in which at least two A groups are condensed, a condensed ring in which at least two B groups are condensed, or a condensed ring in which at least one A group and at least one B group are condensed.

In the condensed ring in which at least two A groups are condensed, each A group may be same or different.

In the condensed ring in which at least two B groups are condensed, each B group may be same or different.

The A group may be a cyclopenta-1,3-diene group, an indene group, an azulene group, a benzene group, a naphthalene group, an anthracene group, a phenanthrene group, a tetracene group, a tetraphene group, a pyrene group, a chrysene group, a triphenylene group, or a fluorene group.

The B group may be a furan group, a thiophene group, a pyrrole group, a borole group, a silole group, a pyrrolidine group, an imidazole group, a triazole group, an oxazole group, an isoxazole group, a thiazole group, an isothiazole group, a pyridine group, a pyrimidine group, a pyridazine group, a triazine group, an indole group, an isoindole group, an indolizine group, a quinoline group, an isoquinoline group, a quinoxaline group, an isoquinoxaline group, a carbazole group, a dibenzofuran group, a dibenzothiophene group, a dibenzosilole group, or a dibenzoborole group.

In one or more embodiments, the A group may be a benzene group, a naphthalene group, or an anthracene group, and the B group may be carbazole group, a dibenzofuran group, a dibenzothiophene group, a dibenzosilole group, or a dibenzoborole group.

For example, $CY_1$ and $CY_2$ may each independently be a benzene group, a naphthalene group, an anthracene group, or a fluorene group, but embodiments are not limited thereto.

In Formula 1, $Y_1$ is B, N, P, P(═O), P(═S), Al, Ga, As, $Si(R_5)$, or $Ge(R_5)$. For example, $Y_1$ may be B, N, P, P(═O), P(═S), Al, or Ga.

In Formula 1, $X_1$ and $X_2$ are each independently O, S, Se, $N(R_5)$, $C(R_6)(R_7)$, $Si(R_6)(R_7)$, $Ge(R_6)(R_7)$, or P(═O)(Re).

In one or more embodiments, $X_1$ and $X_2$ may be identical to each other. For example, $X_1$ and $X_2$ may each be O, S, $N(R_5)$, $C(R_6)(R_7)$, or $Si(R_6)(R_7)$, but embodiments are not limited thereto.

In one or more embodiments, $X_1$ and $X_2$ may be different from each other. For example, $X_1$ may be O, and $X_2$ may be S; $X_1$ may be O, and $X_2$ may be N(Re); $X_1$ may be O, and $X_2$ may be $C(R_6)(R_7)$; $X_1$ may be O, and $X_2$ may be $Si(R_6)(R_7)$; $X_1$ may be S, and $X_2$ may be $N(R_6)$; $X_1$ may be S, and $X_2$ may be $C(R_6)(R_7)$; $X_1$ may be S, and $X_2$ may be $Si(R_6)(R_7)$; $X_1$ may be N(Re), and $X_2$ may be $C(R_6)(R_7)$; $X_1$ may be N(Re), and $X_2$ may be $Si(R_6)(R_7)$; or $X_1$ may be $C(R_6)(R_7)$, and $X_2$ may be $Si(R_6)(R_7)$. For example, $X_2$ may be O, and $X_1$ may be S; $X_2$ may be O, and $X_1$ may be N(Re); $X_2$ may be O, and $X_1$ may be $C(R_6)(R_7)$; $X_2$ may be O, and $X_1$ may be $Si(R_6)(R_7)$; $X_2$ may be S, and $X_1$ may be N(Re); $X_2$ may be S, and $X_1$ may be $C(R_6)(R_7)$; $X_2$ may be S, and $X_1$ may be $Si(R_6)(R_7)$; $X_2$ may be N(Re), and $X_1$ may be $C(R_6)(R_7)$; $X_2$ may be N(Re), and $X_1$ may be $Si(R_6)(R_7)$; or $X_2$ may be $C(R_6)(R_7)$, and $X_1$ may be $Si(R_6)(R_7)$.

In one or more embodiments, $Y_1$ may be B, and $X_1$ and $X_2$ may each independently be O, S, Se, $N(R_6)$, $C(R_6)(R_7)$, or $Si(R_6)(R_7)$, but embodiments are not limited thereto.

In Formulae 1 and 1A, $L_1$ and $L_{11}$ are each independently a single bond, a substituted or unsubstituted $C_5$-$C_{30}$ carbocyclic group, or a substituted or unsubstituted $C_1$-$C_{30}$ heterocyclic group.

In one or more embodiments, $L_1$ and $L_{11}$ may each independently be:

a single bond;

a phenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, or a chrysenylenylene group;

a phenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, or a chrysenylenylene group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group; or a phenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, and a chrysenylenylene group, each substituted with at least one selected from a phenyl group, an indenyl group, a naphthyl group, an azulenyl group, a heptalenyl group, an acenaphthyl group, a fluorenyl group, a phenalenyl group, a phenanthrenyl group, an anthracenyl group, a fluoranthenyl group, a triphenylenyl group, a pyrenyl group, or a chrysenylenyl group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ cycloalkyl group, a $C_3$-$C_{60}$ cycloalkenyl group, a $C_1$-$C_{60}$ heterocycloalkyl group, a $C_1$-$C_{60}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, but embodiments are not limited thereto.
For example, $L_1$ and $L_{11}$ may each independently be a single bond or a group represented by one of Formulae 3-1 to 3-32, but embodiments are not limited thereto:
3-1
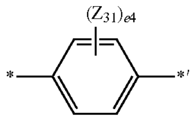
3-2
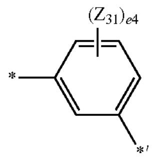
3-3
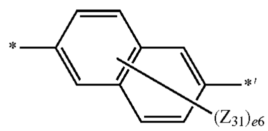
3-4
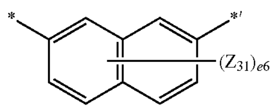
3-5
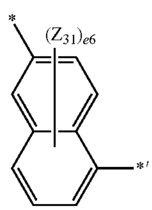
3-6
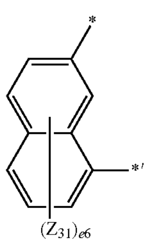
3-7
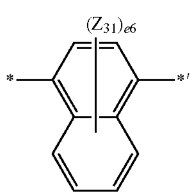
3-8
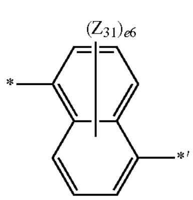
-continued
3-9
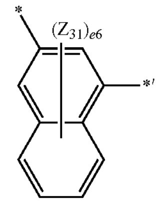
3-10
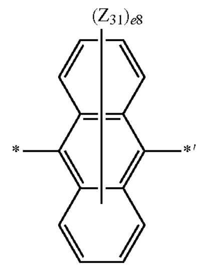
3-11
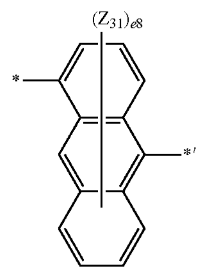
3-12
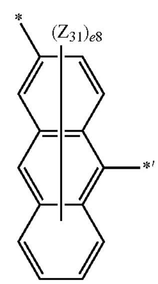
3-13
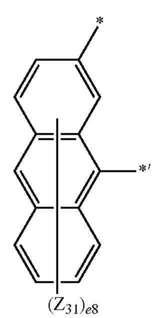
3-14
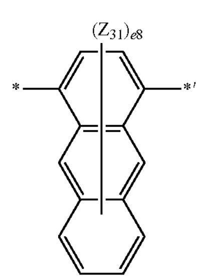

-continued
3-15
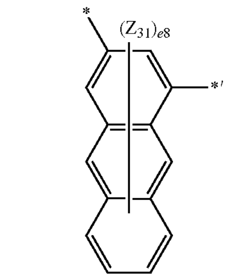
3-16
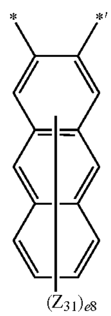
3-17
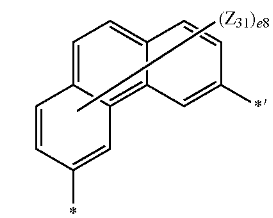
3-18
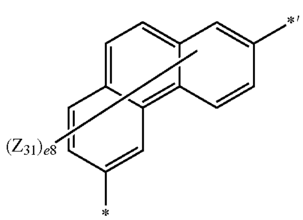
3-19
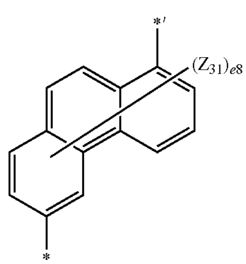
3-20
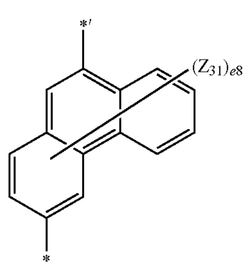
-continued
3-21
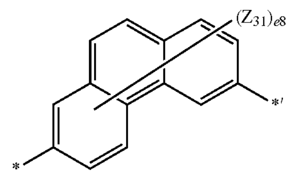
3-22
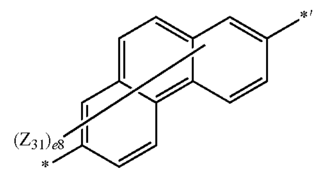
3-23
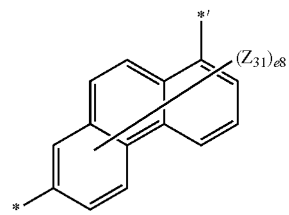
3-24
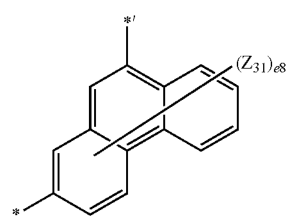
3-25
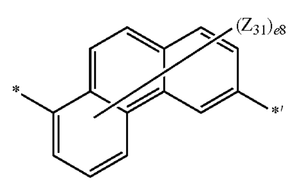
3-26
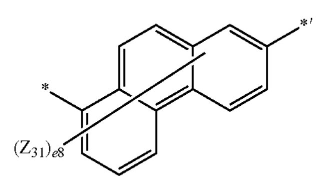
3-27
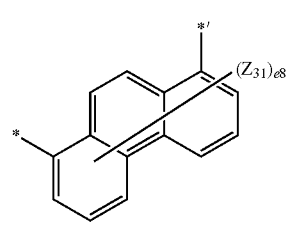
3-28
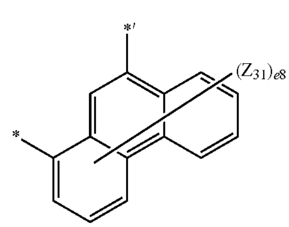

-continued 3-29

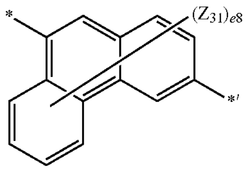

3-30

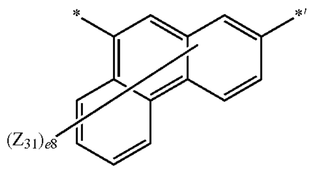

3-31

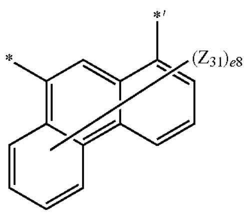

3-32

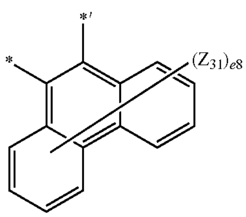

wherein, in Formulae 3-1 to 3-32, $Z_{31}$ may be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group a $C_1$-$C_{60}$ heteroaryloxy group, a $C_1$-$C_{60}$ heteroarylthio group, or a s$C_2$-$C_{60}$ heteroarylalkyl group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, or a $C_2$-$C_{60}$ heteroarylalkyl group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a s$C_2$-$C_{60}$ heteroarylalkyl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), —B($Q_{26}$)($Q_{27}$), or —P(=O)($Q_{28}$)($Q_{29}$), e4 may be an integer from 1 to 4, e6 may be an integer from 1 to 6, e8 may be an integer from 1 to 8, and

* and *' each indicate a binding site to an adjacent atom.

In Formulae 1 and 1A, a1 and a11 are each independently an integer from 1 to 3, and when a1 is 2 or greater, at least two $L_1$(s) are identical to or different from each other, and when a11 is 2 or greater, at least two $L_{11}$(s) are identical to or different from each other.

In Formulae 1 and 1A, $R_1$, $R_2$, $R_3$, $R_4$, $R_5$, $R_6$, $R_7$, $R_{11}$, and $R_{12}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_1$-$C_{60}$ heterocycloalkyl group, a substituted or unsubstituted $C_3$-$C_{60}$ cycloalkenyl group, a substituted or unsubstituted $C_1$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)($Q_9$), and in Formula 1, $R_1$ and $R_2$ are optionally bound to form a substituted or unsubstituted $C_5$-$C_{30}$ carbocyclic group or a substituted or unsubstituted $C_1$-$C_{30}$ heterocyclic group.

In one or more embodiments, in Formula 1, $R_1$ and $R_2$ may each independently be:

hydrogen, deuterium, —F, —Cl, —Br, —I, a hydroxyl group, a cyano group, a nitro group, an amino group, a $C_1$-$C_{60}$ alkyl group, or a $C_1$-$C_{60}$ alkoxy group;

a $C_1$-$C_{60}$ alkyl group or a $C_1$-$C_{60}$ alkoxy group, each substituted with at least one of deuterium, —F, —Cl, —Br, —I, a hydroxyl group, a cyano group, a nitro group, an amino group, a phenyl group, a biphenyl group, a naphthyl group, a fluorenyl group, a phenanthrenyl group, an anthracenyl group, a fluoranthenyl group, a triphenylenyl group, a pyrenyl group, or a chrysenyl group;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, or a carbazolyl group;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, or a carbazolyl group, each substituted with at least one of deuterium, —F, —Cl, —Br, —I, a hydroxyl group, a cyano group, a nitro group, an amino group, a $C_1$-$C_{60}$ alkyl group, a $C_1$-$C_{60}$ alkoxy group, a $C_7$-$C_{60}$ arylalkyl group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a carbazolyl group, —Si($Q_{31}$)($Q_{32}$)($Q_{33}$), —N($Q_{34}$)($Q_{35}$), —B($Q_{36}$)($Q_{37}$), or —P(=O)($Q_{38}$)($Q_{39}$), or —N($Q_1$)($Q_2$), —Si($Q_3$)($Q_4$)($Q_5$), —B($Q_6$)($Q_7$), or —P(=O)($Q_8$)($Q_9$), but embodiments are not limited thereto.

In one or more embodiments, $R_1$ and $R_2$ may each independently be:

hydrogen, deuterium, —F, —Cl, —Br, —I, a hydroxyl group, a cyano group, a nitro group, a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group; or a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group, each substituted with at least one of deuterium, —F, —Cl, —Br, —I, a hydroxyl group, a cyano group, a nitro group, or a phenyl group.

In one or more embodiments, at least one of $R_1$ and $R_2$ may be a group represented by Formulae 5-1 or 5-2, but embodiments are not limited thereto:

5-1

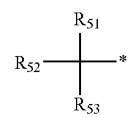

5-2

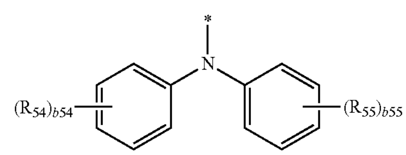

wherein, in Formulae 5-1 and 5-2, $R_{51}$ to $R_{55}$ may each independently be:

deuterium, —F, —Cl, —Br, —I, a hydroxyl group, a cyano group, a nitro group, a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, a tert-hexyl group, a phenyl group, a biphenyl group, or a terphenyl group; and;

a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group, each substituted with at least one of deuterium, —F, —Cl, —Br, —I, a hydroxyl group, a cyano group, a nitro group, or a phenyl group, $R_{54}$ and $R_{55}$ may optionally be bound to each other to form a heterocyclic ring, and b54 and b55 may each independently be an integer from 0 to 4.

For example, in Formula 5-1, one of $R_{51}$ to $R_{53}$ may be a phenyl group, and the other two of $R_{51}$ to $R_{53}$ may be a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group.

For example, in Formula 5-1, $R_{51}$ to $R_{53}$ may each independently be selected from a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, and a tert-hexyl group. For example, in Formula 5-1, $R_{51}$ to $R_{53}$ may each be a methyl group.

For example, in Formula 5-2, $R_{54}$ and $R_{55}$ may be bound to each other to form a five-membered ring with a ring-forming nitrogen atom.

In one or more embodiments, in Formula 1, $R_3$ and $R_4$ may each independently be:

- hydrogen, deuterium, —F, —Cl, —Br, —I, a hydroxyl group, a cyano group, a nitro group, a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group;
- a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, and a tert-hexyl group, each substituted with at least one of deuterium, —F, —Cl, —Br, —I, a hydroxyl group, a cyano group, a nitro group, or a phenyl group, but embodiments are not limited thereto.

For example, $R_3$ and $R_4$ may each be hydrogen.

In one or more embodiments, in Formula 1, $R_5$, $R_5$, and $R_7$ may each independently be:

- hydrogen, deuterium, —F, —Cl, —Br, —I, a hydroxyl group, a cyano group, a nitro group, a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group;
- a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group, each substituted with at least one of deuterium, —F, —Cl, —Br, —I, a hydroxyl group, a cyano group, a nitro group, or a phenyl group;
- a phenyl group, a biphenyl group, a naphthyl group, a fluorenyl group, a carbazolyl group, a dibenzofuranyl group, or a dibenzothiophenyl group;
- a phenyl group, a biphenyl group, a naphthyl group, a fluorenyl group, a carbazolyl group, a dibenzofuranyl group, and a dibenzothiophenyl group, each substituted with at least one of a phenyl group, a biphenyl group, a naphthyl group, a fluorenyl group, a carbazolyl group, a dibenzofuranyl group, or a dibenzothiophenyl group, but embodiments are not limited thereto.

In one or more embodiments, in Formula 1A, $R_{11}$ may be represented by one of Formulae 4-1 to 4-42, and $R_{12}$ may be:

- hydrogen, deuterium, —F, —Cl, —Br, —I, a hydroxyl group, a cyano group, a nitro group, a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group;
- a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group, each substituted with at least one of deuterium, —F, —Cl, —Br, —I, a hydroxyl group, a cyano group, a nitro group, or a phenyl group, but embodiments are not limited thereto:

4-1

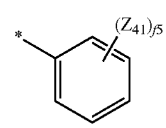

4-2

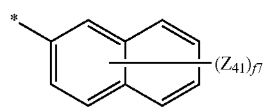

4-3

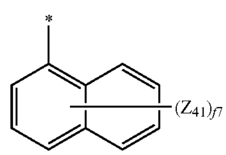

4-4

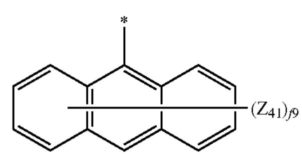

4-5

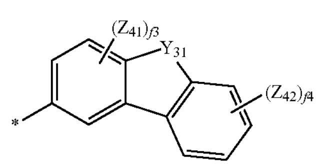

4-6

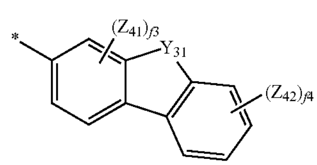

-continued
4-7
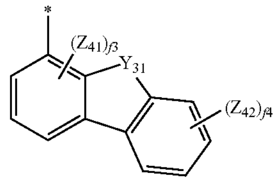
4-8
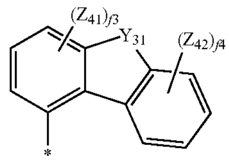
4-9
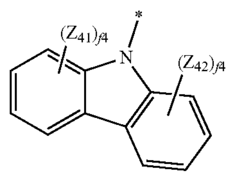
4-10
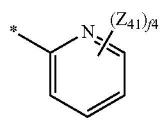
4-11
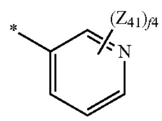
4-12
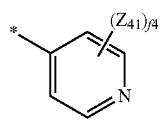
4-13
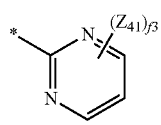
4-14
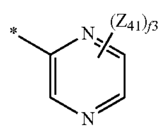
4-15
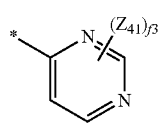
4-16
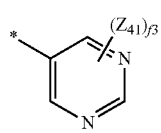
4-17
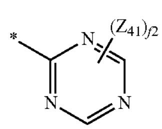
-continued
4-18
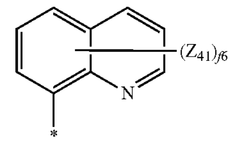
4-19
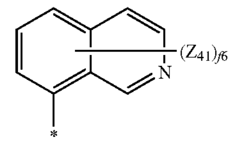
4-20
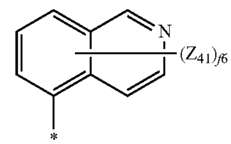
4-21
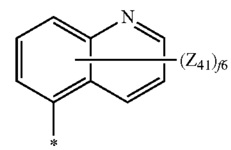
4-22
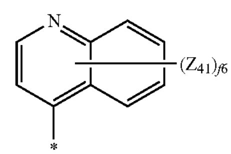
4-23
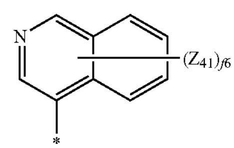
4-24
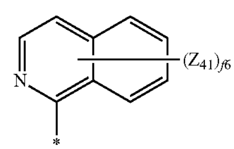
4-25
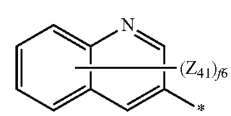
4-26
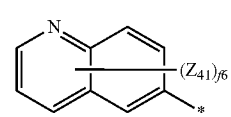
4-27
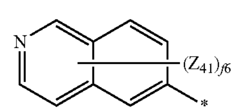
4-28
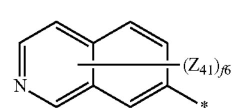

-continued 4-29

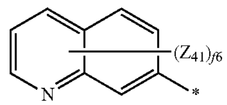

4-30

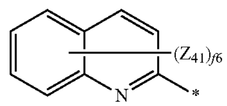

4-31

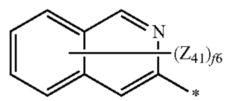

4-32

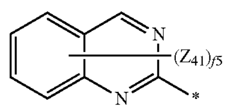

4-33

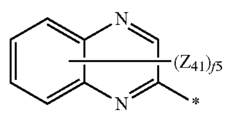

4-34

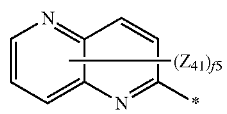

4-35

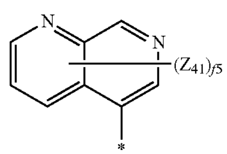

4-36

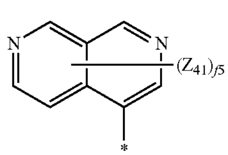

4-37

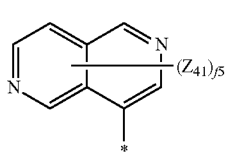

4-38

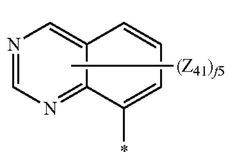

4-39

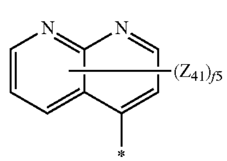

4-40

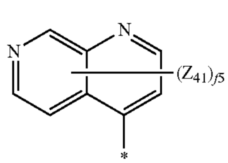

-continued 4-41

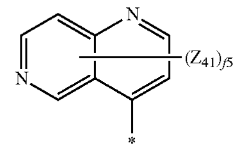

4-42

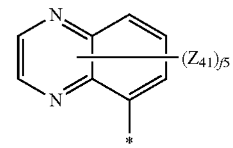

wherein, in Formulae 4-1 to 4-42, $Y_{31}$ may be O, S, $C(Z_{45})(Z_{46})$, $N(Z_{47})$, or $Si(Z_{48})(Z_{49})$, $Z_{41}$ to $Z_{49}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_7$-$C_{60}$ arylalkyl group, a cyclopentyl group, a cyclohexyl group, a cycloheptyl group, a cyclopentenyl group, a cyclohexenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, or a carbazolyl group;

a cyclopentyl group, a cyclohexyl group, a cycloheptyl group, a cyclopentenyl group, a cyclohexenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, or a carbazolyl group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, or a $C_7$-$C_{60}$ arylalkyl group, for example a cumyl group, but embodiments are not limited thereto, f3 may be an integer from 1 to 3, f4 may be an integer from 1 to 4, f5 may be an integer from 1 to 5, f6 may be an integer from 1 to 6, f7 may be an integer from 1 to 7, f9 may be an integer from 1 to 9, and

* indicates a binding site to an adjacent atom.

In Formula 1, b1 and b2 are each independently an integer from 0 to 10, and when b1 is 2 or greater, at least two $R_1$(s) are identical to or different from each other, and when b2 is 2 or greater, at least two $R_2$(s) are identical to or different from each other.

In Formula 1A, b11 is an integer from 1 to 5, and when b11 is 2 or greater, at least two $R_{11}$(s) are identical to or different from each other.

In Formula 1A, b12 is an integer from 1 to 8, and when b12 is 2 or greater, at least two $R_{12}$(s) are identical to or different from each other.

In Formula 1A, c11 is an integer from 1 to 8, and when c11 is 2 or greater, at least two $\text{-}(L_{11})_{a11}\text{-}(R_{11})_{b11}$(s) are identical to or different from each other.

In Formula 1A, the sum of b12 and c11 is 9. For example, b12 may be 8, and c11 may be 1, wherein the sum of b12 and c11 is 9 (i.e., 8+1=9).

In one or more embodiments, Formula 1A may be a group represented by one of Formulae 1A-1 to 1A-5:

1A-1

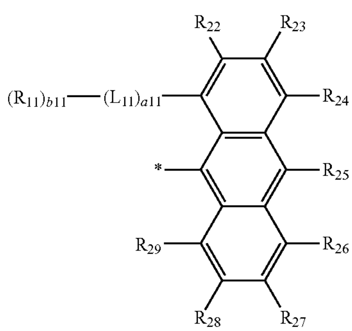

1A-2

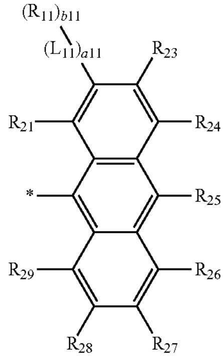

-continued 1A-3

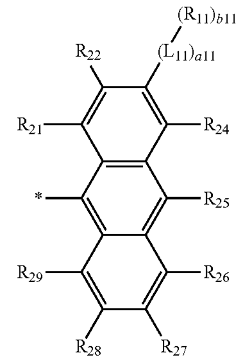

1A-4

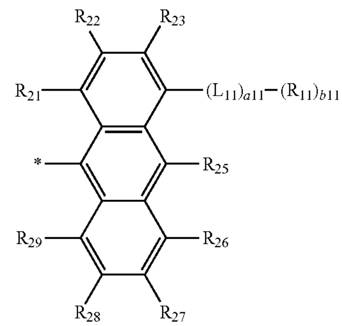

1A-5

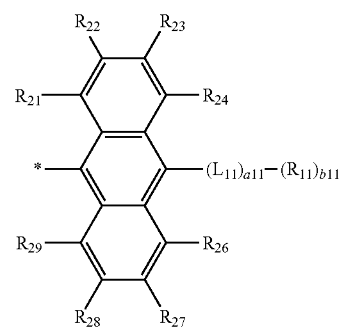

wherein in Formulae 1A-1 to 1A-5, $L_{11}$, $a_{11}$, $R_{11}$, and $b_{11}$ may respectively be understood by referring to the descriptions of $L_{11}$, $a_{11}$, $R_{11}$, and $b_{11}$ provided herein, $R_{21}$ to $R_{29}$ may each be understood by referring to the description of $R_{12}$ provided herein, and

* indicates a binding site to an adjacent atom.

In one or more embodiments, the polycyclic compound may include a compound represented by one of Formulae 2-1 to 2-8:

2-1

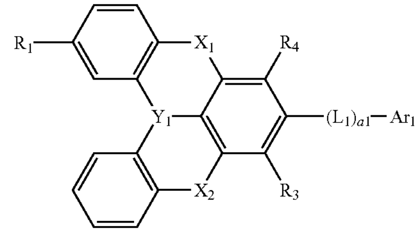

-continued
2-2
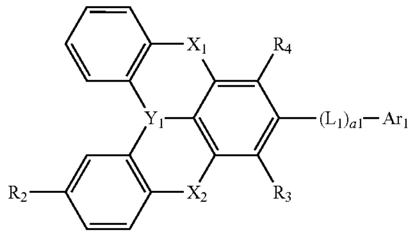
2-3
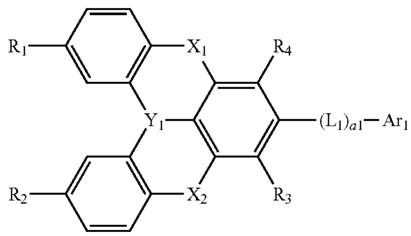
2-4
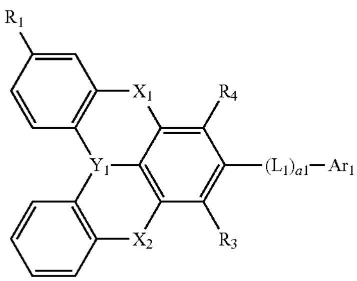
2-5
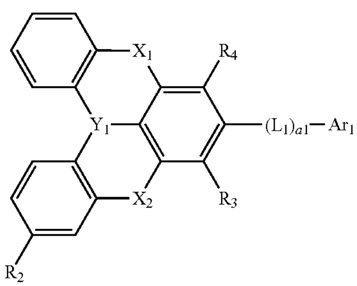
2-6
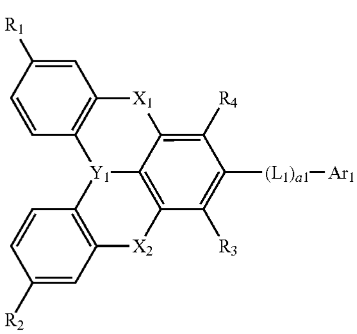
-continued
2-7
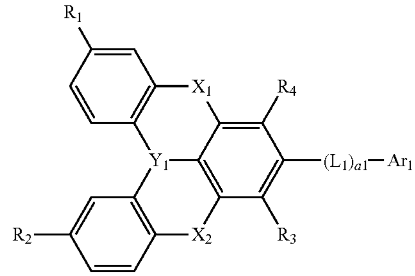
2-8
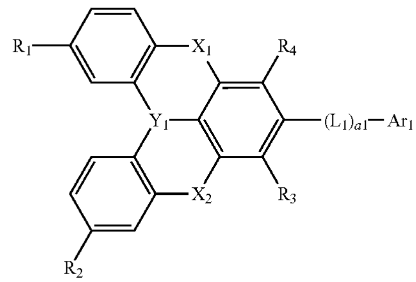
wherein, in Formulae 2-1 to 2-8,
$Y_1$, $X_1$, $X_2$, $R_1$, $R_2$, $R_3$, $R_4$, $R_5$, $L_1$, $a_1$, and $Ar_1$ may respectively be understood by referring to the descriptions of $Y_1$, $X_1$, $X_2$, $R_1$, $R_2$, $R_3$, $R_4$, $R_5$, $L_1$, $a_1$, and $Ar_1$ provided herein.
In one or more embodiments, the polycyclic compound may be a compound represented by one or more of Compounds 1 to 468:
1
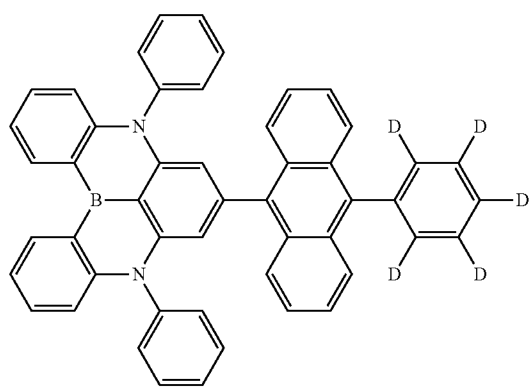
2
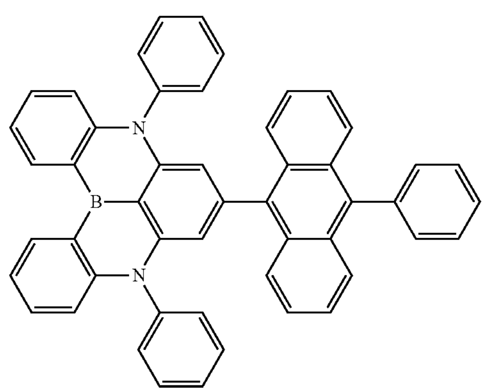

-continued
3
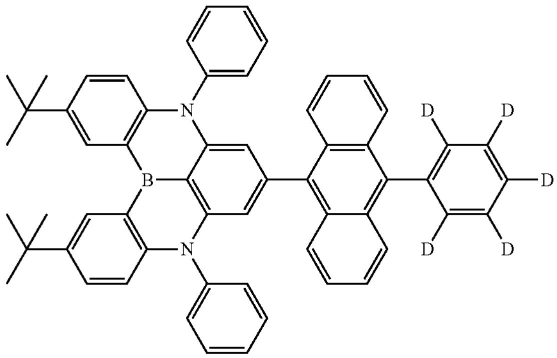
4
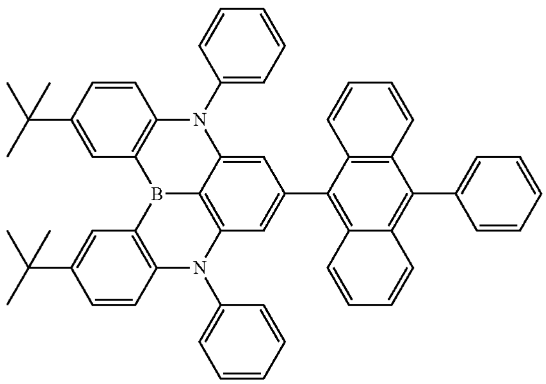
5
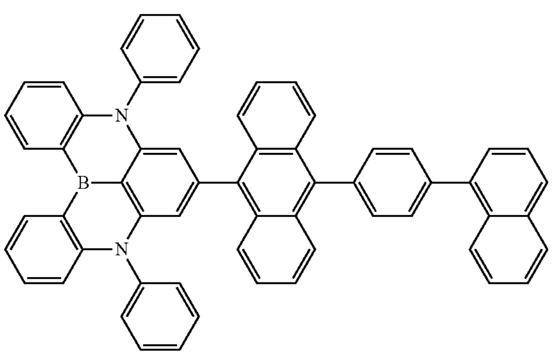
6
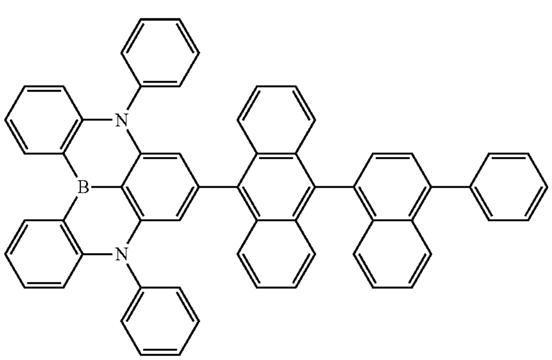
-continued
7
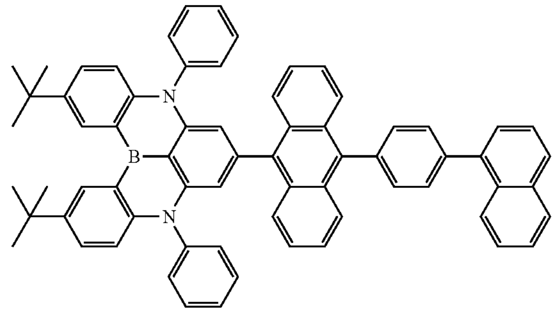
8
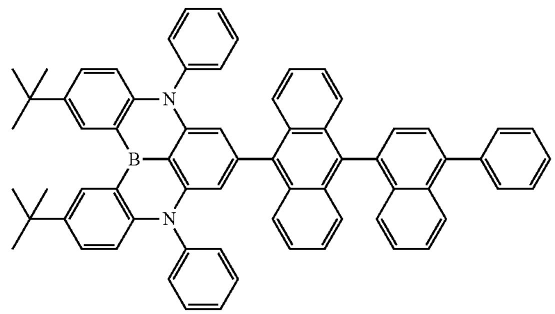
9
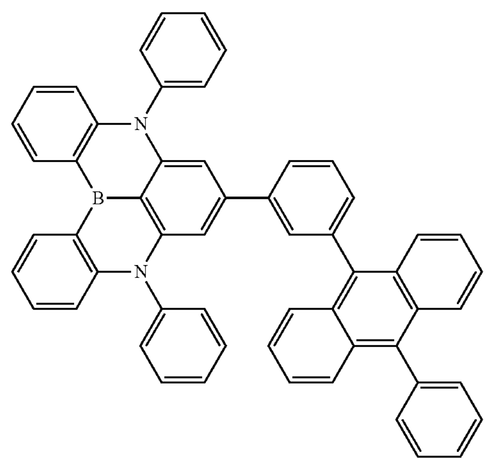
10
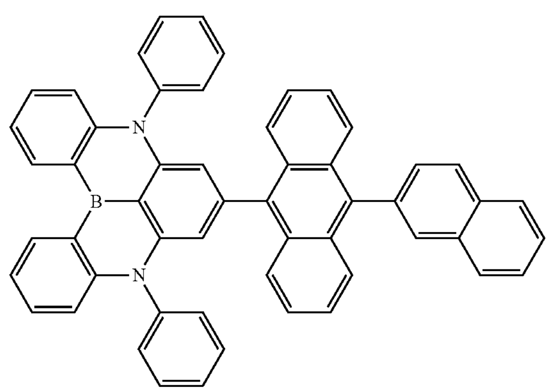

-continued
11
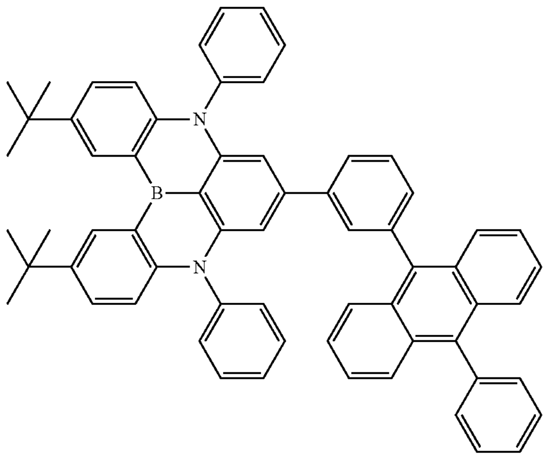
12
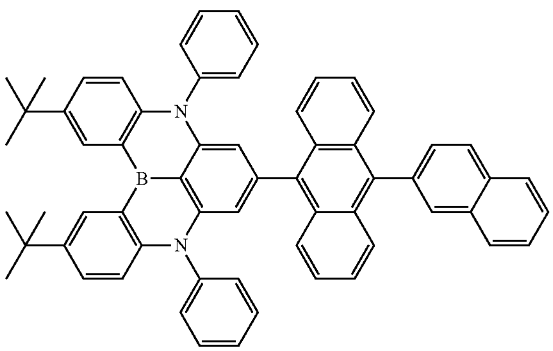
13
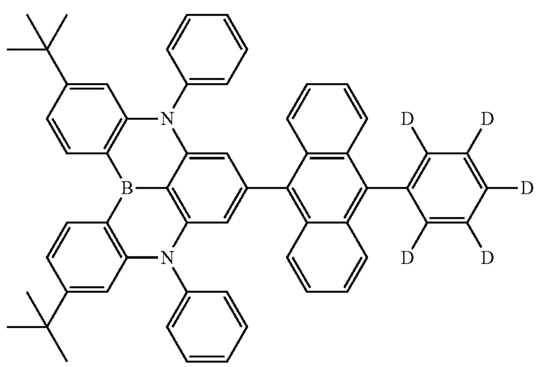
14
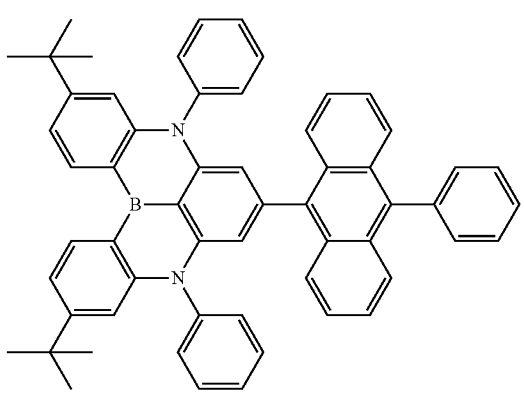
-continued
15
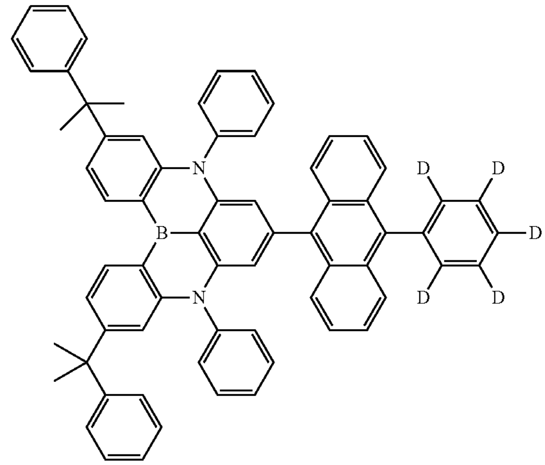
16
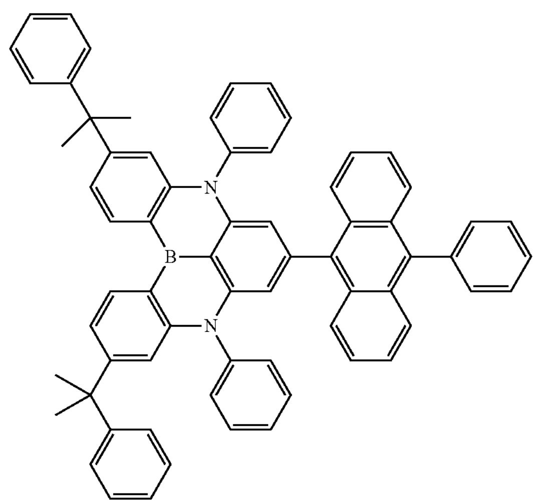
17
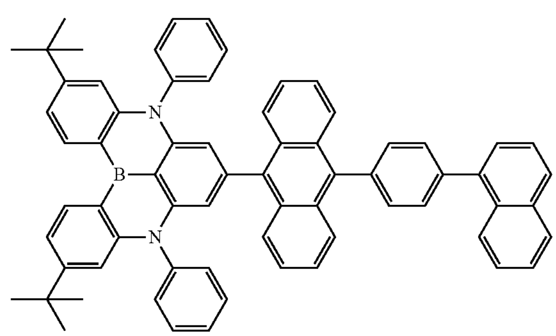

-continued
18
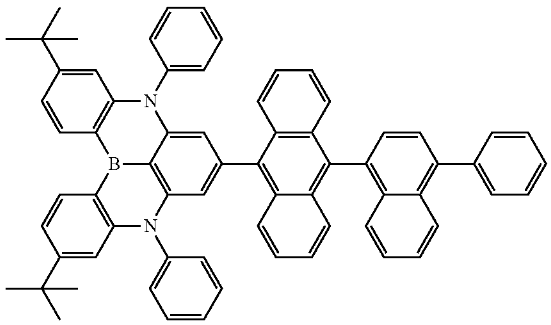
19
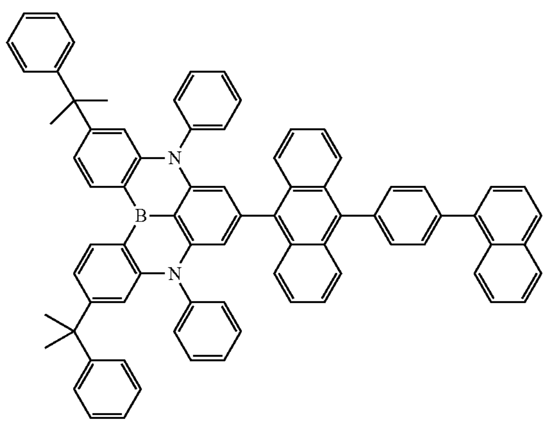
20
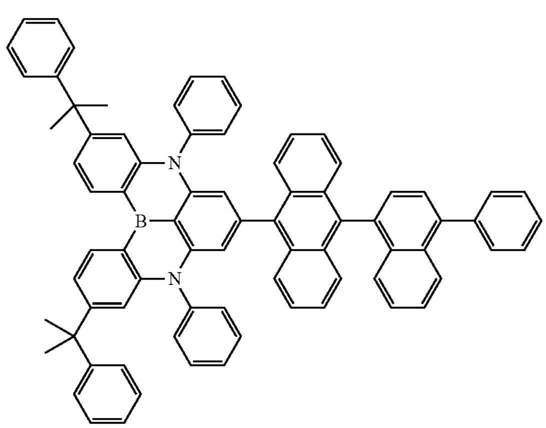
-continued
21
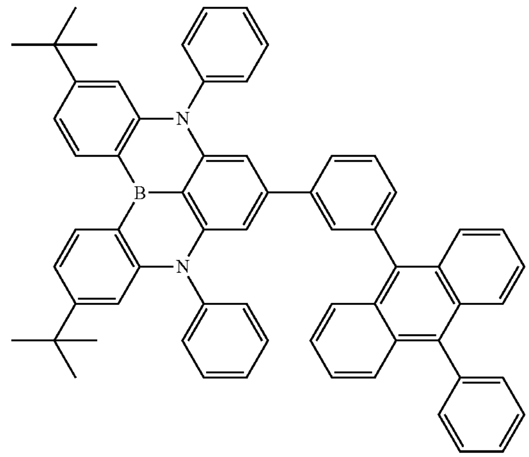
22
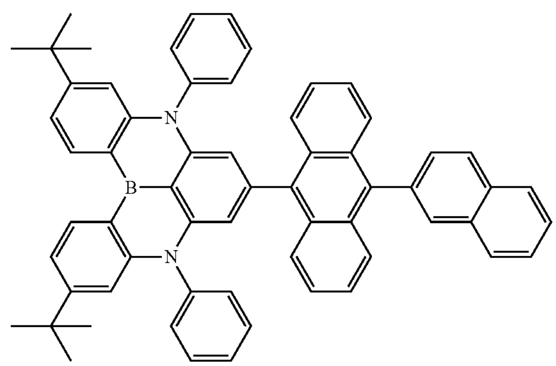
23
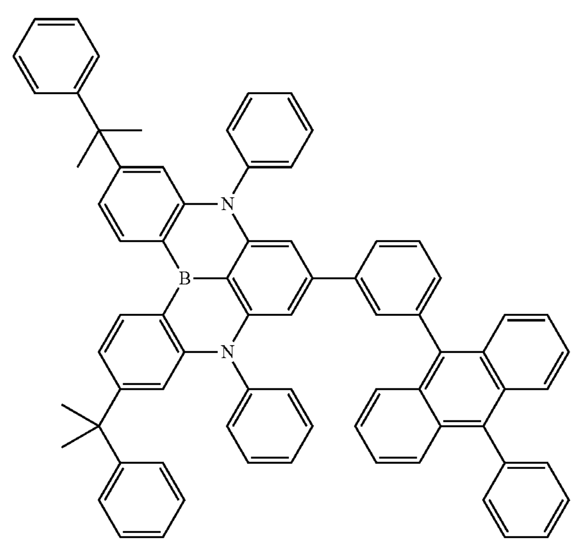

-continued
24
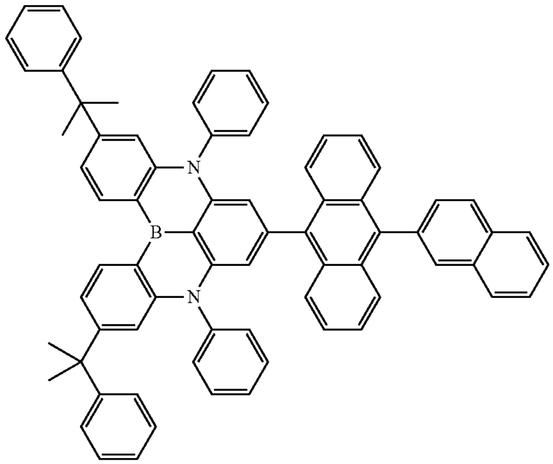
25
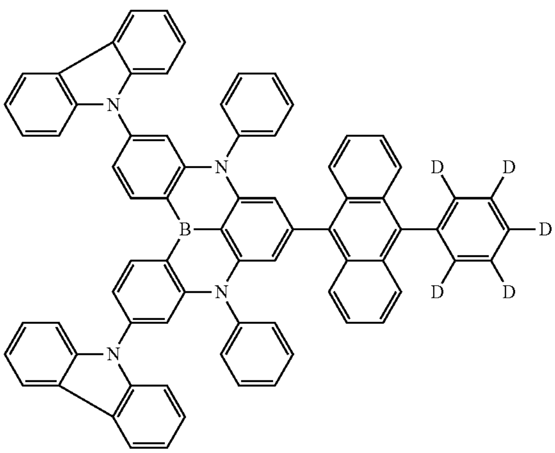
26
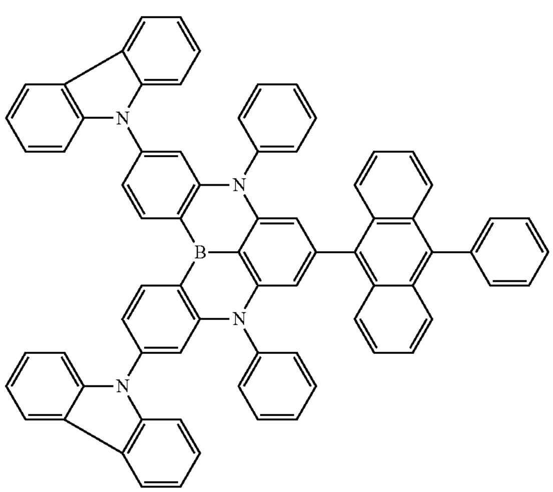
-continued
27
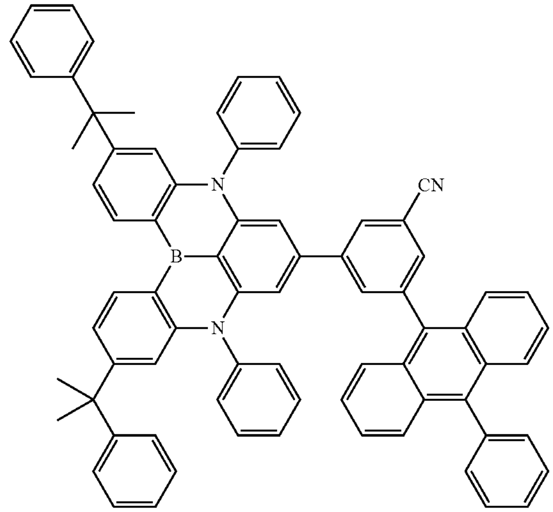
28
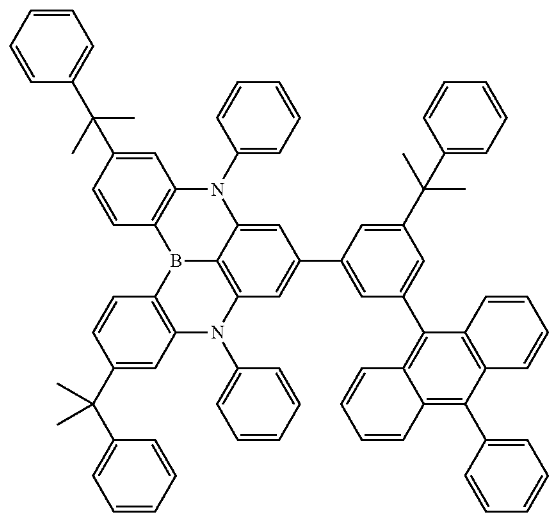
29
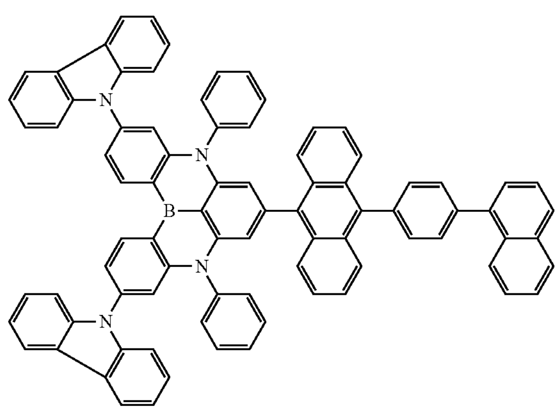

-continued
30
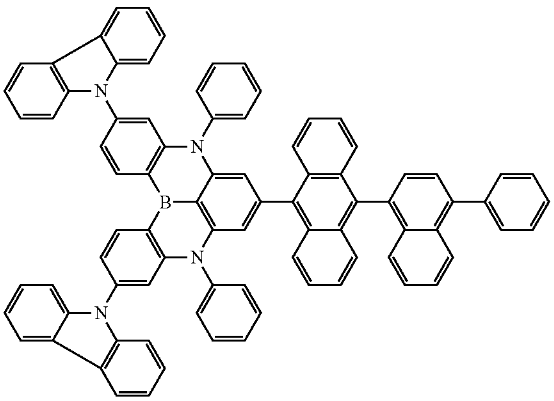
31
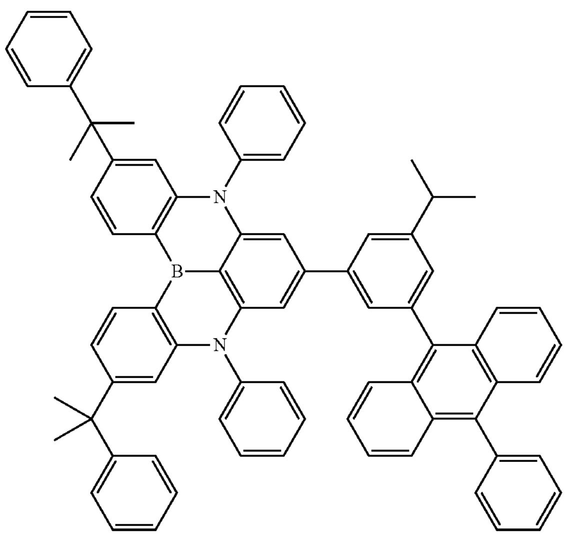
32
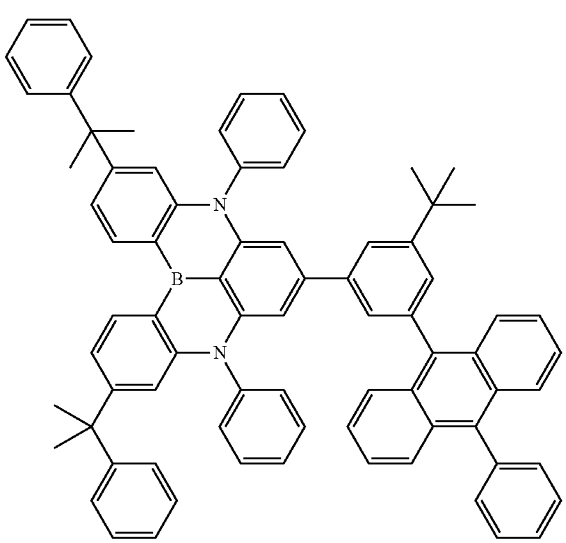
-continued
33
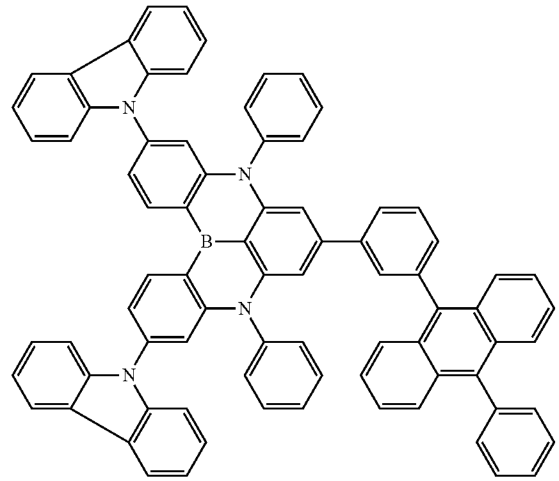
34
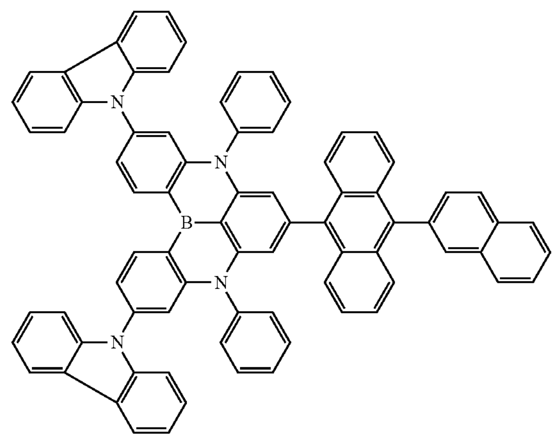
35
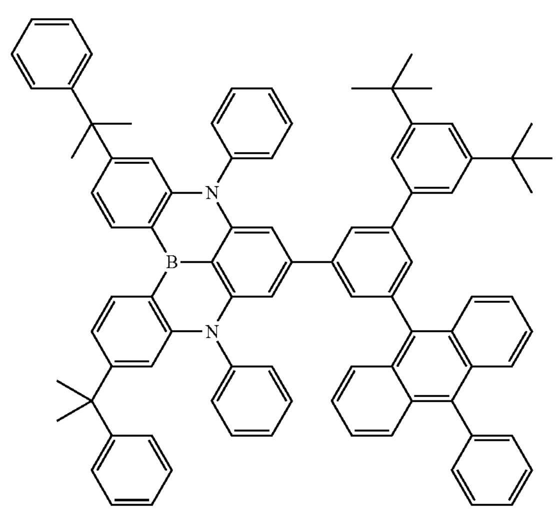

36
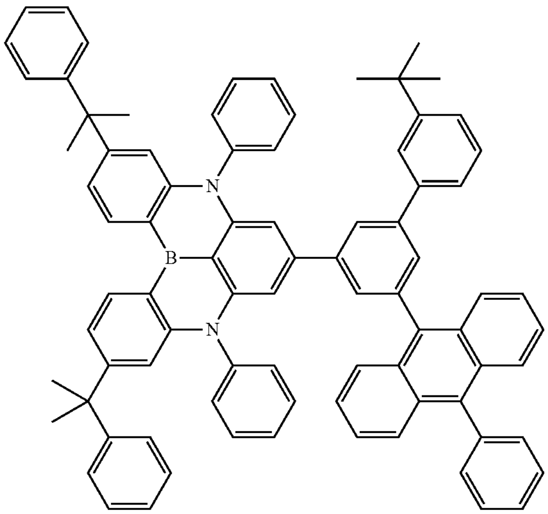
37
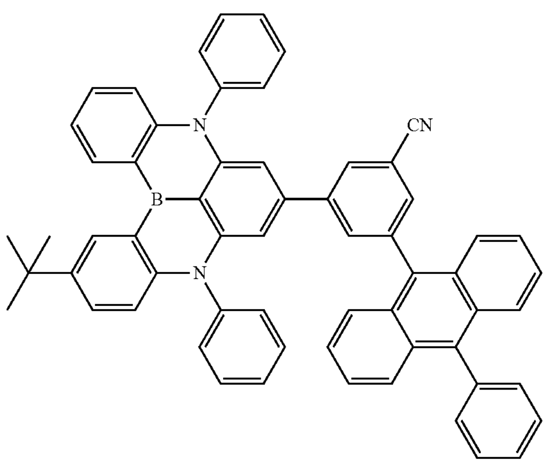
38
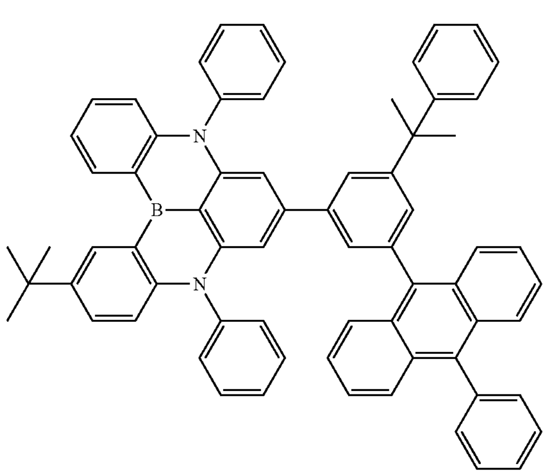
39
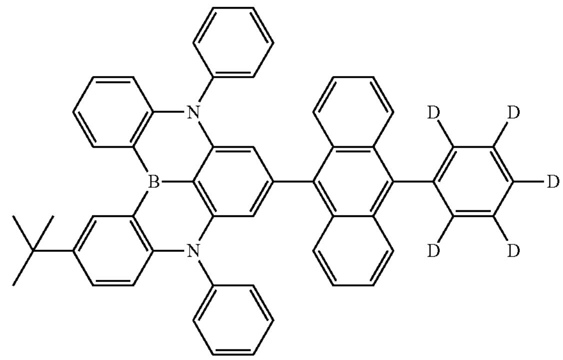
40
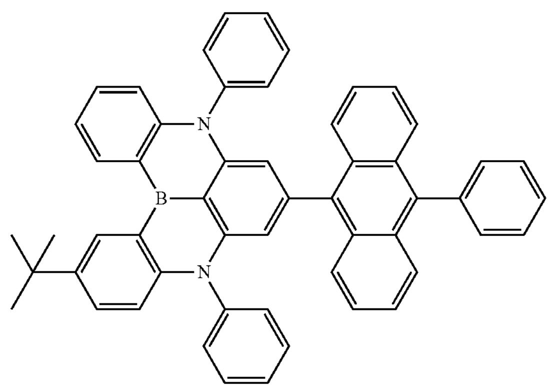
41
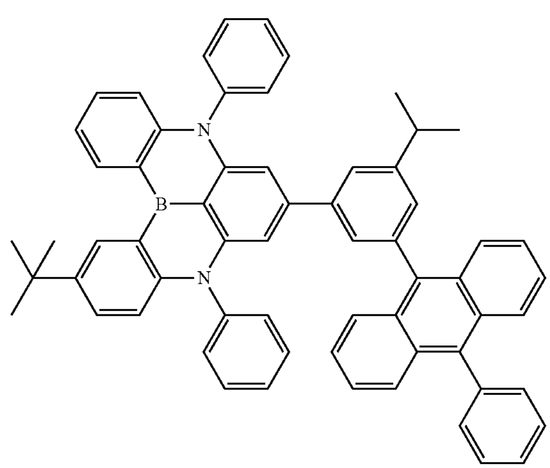

42
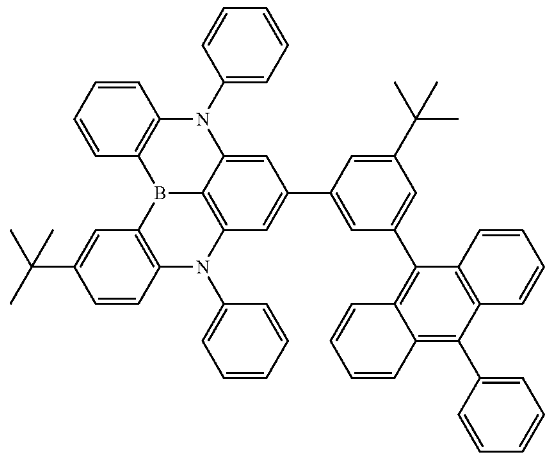
43
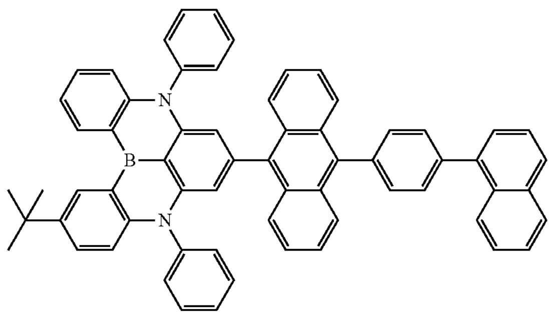
44
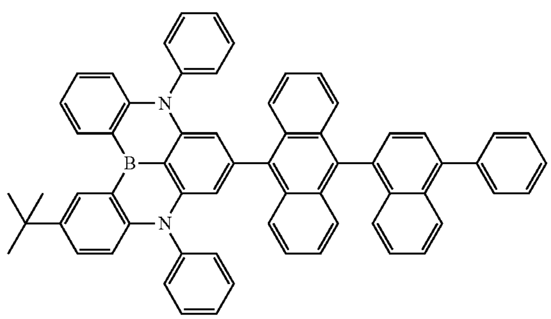
45
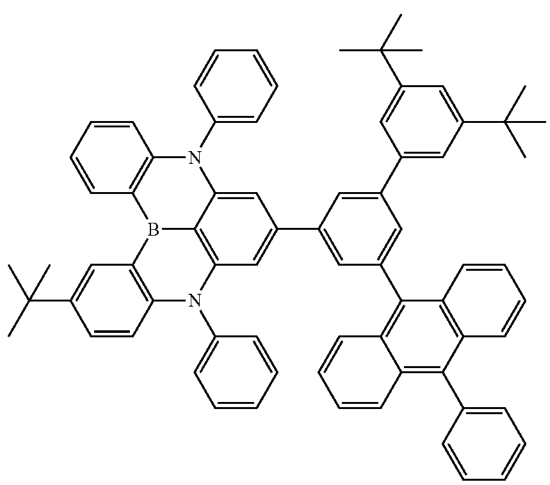
46
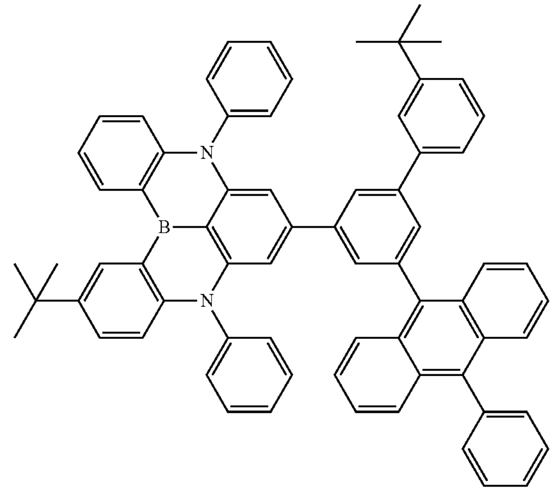
47
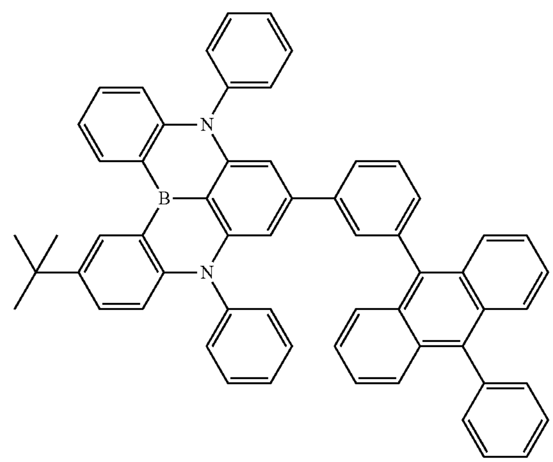
48
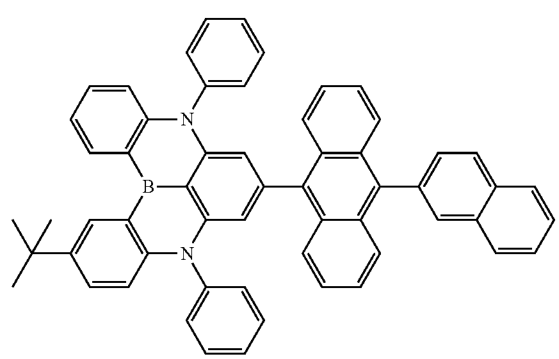

-continued
49
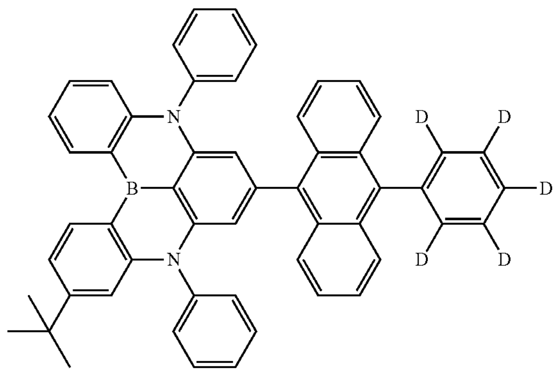
50
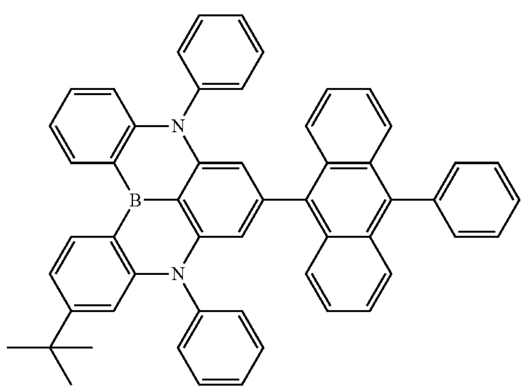
51
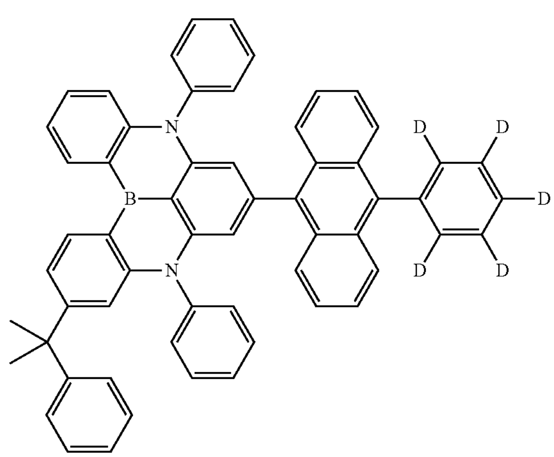
-continued
52
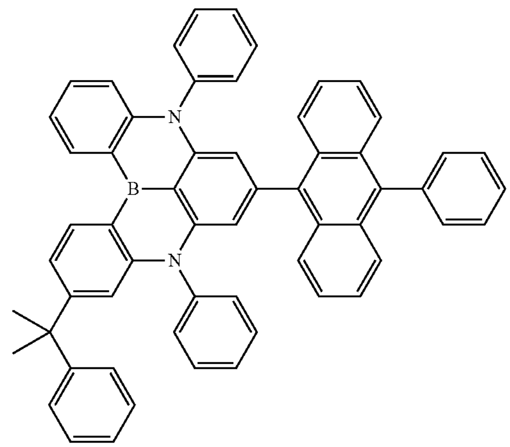
53
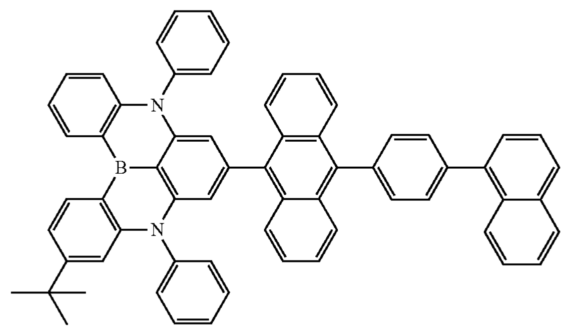
54
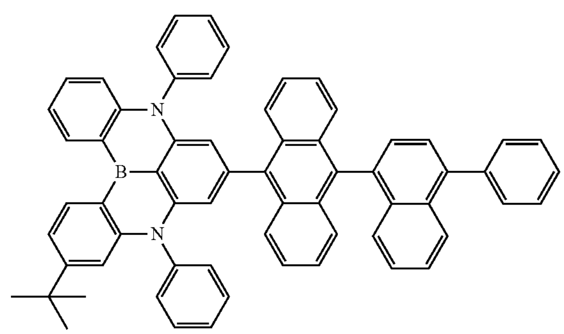
55
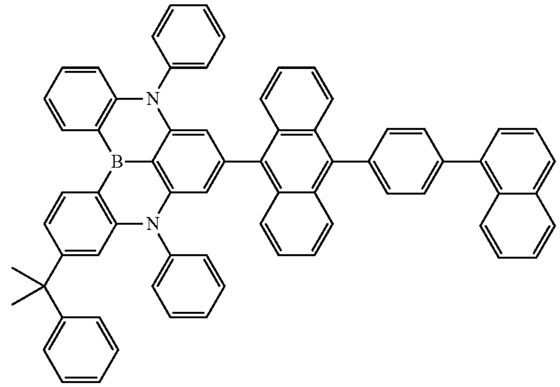

-continued
56
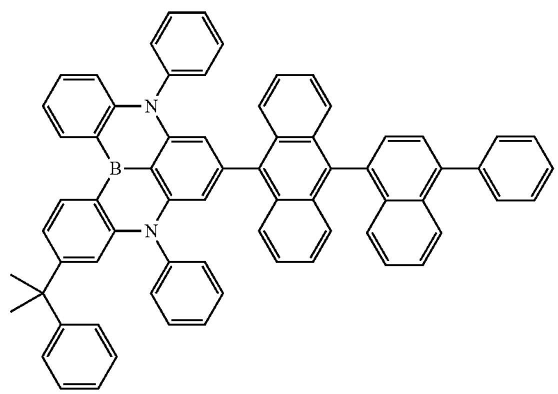
57
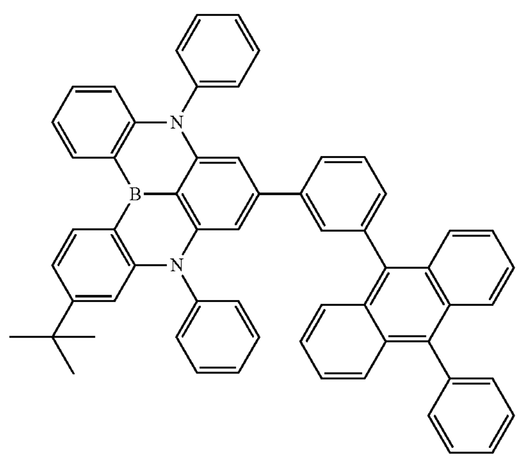
58
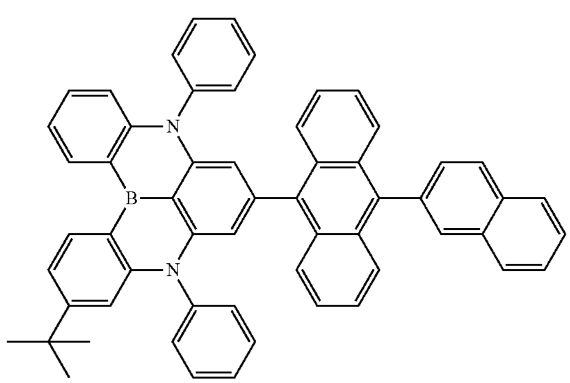
-continued
59
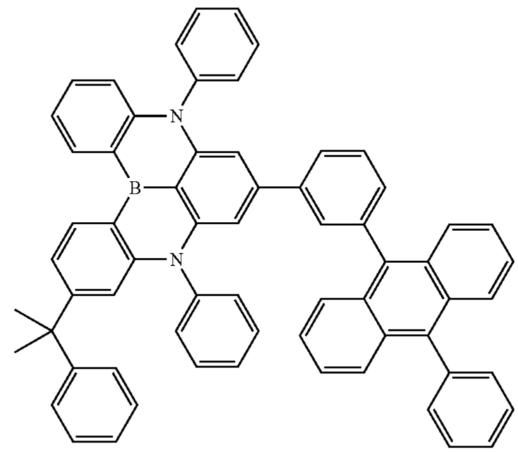
60
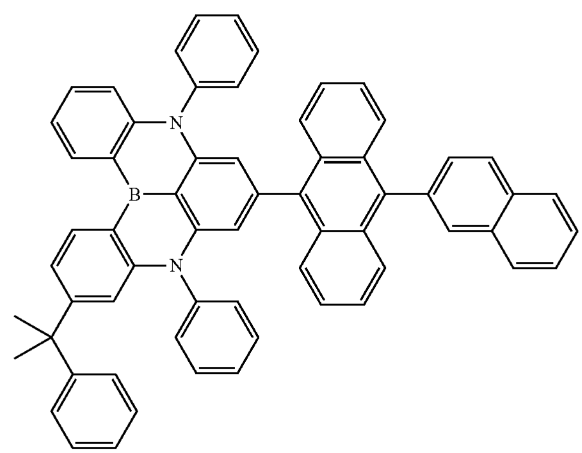
61
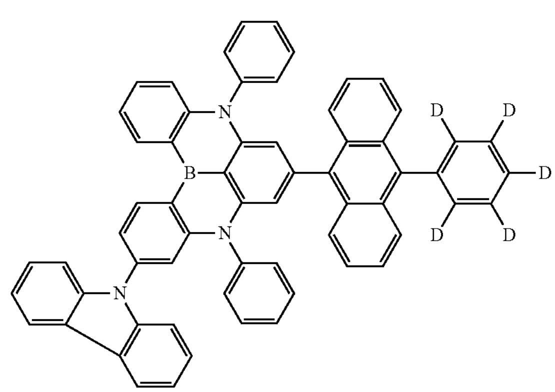

-continued
62
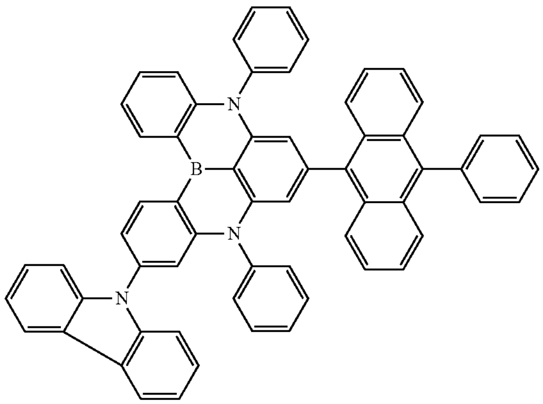
63
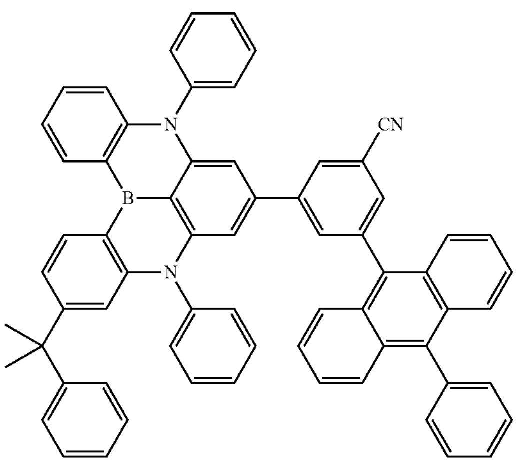
64
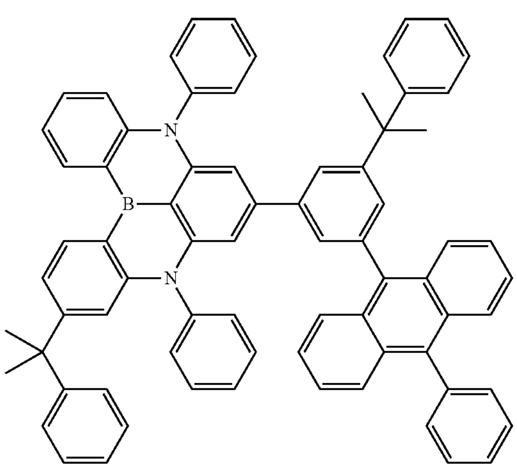
-continued
65
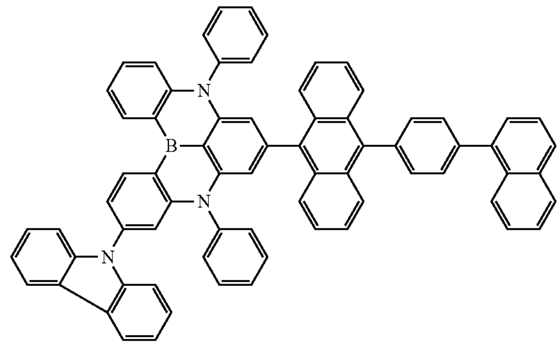
66
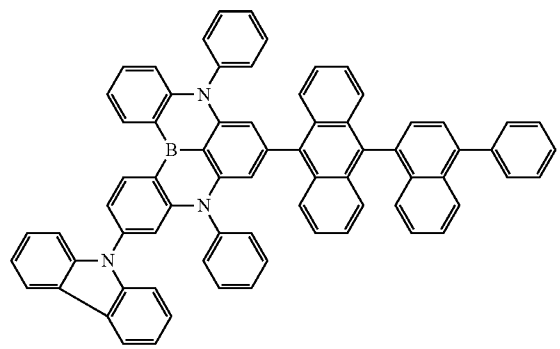
67
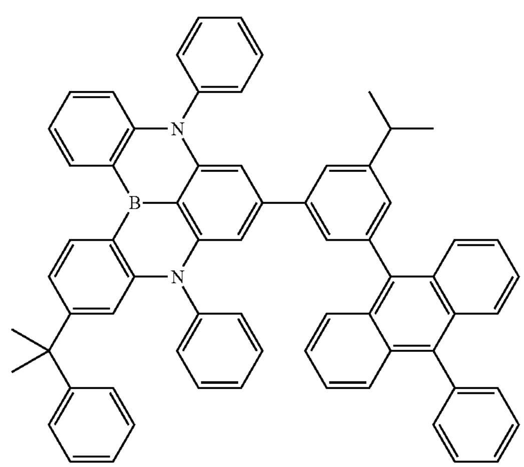

-continued
68
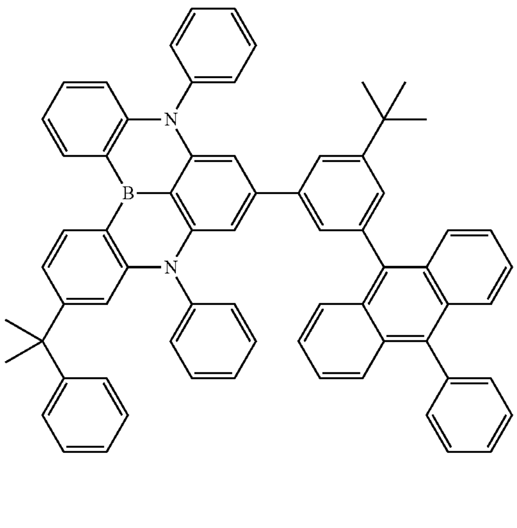
69
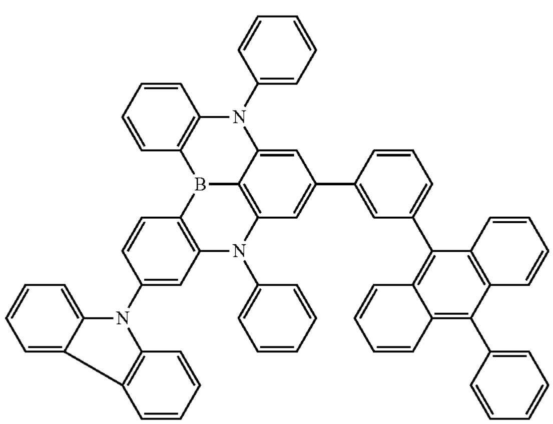
70
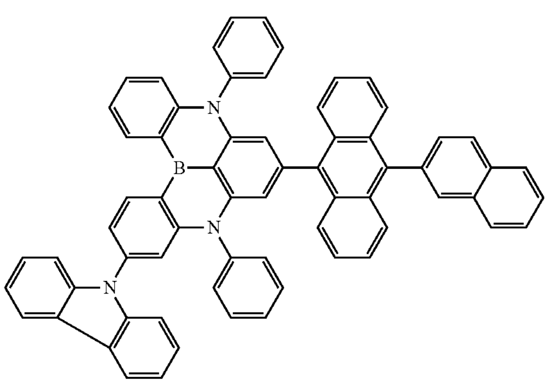
-continued
71
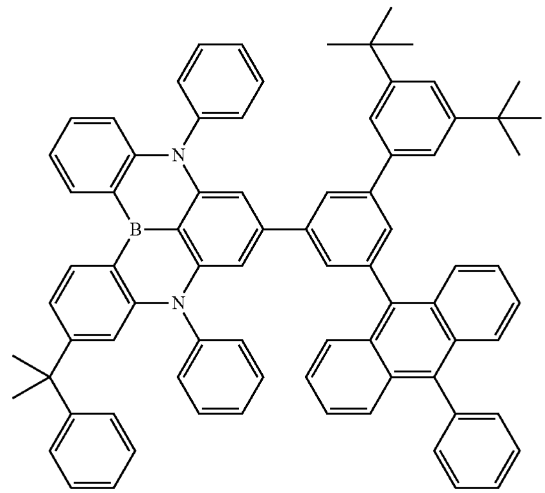
72
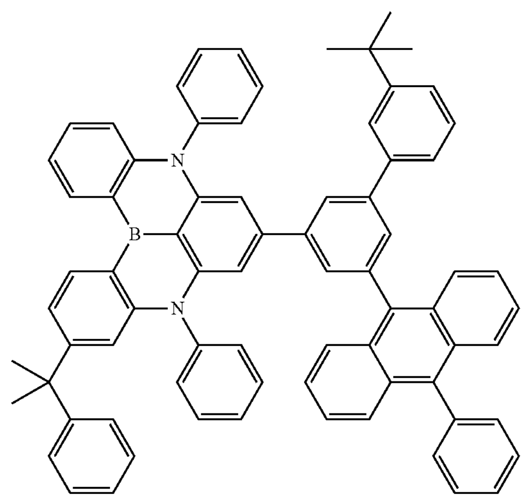
73
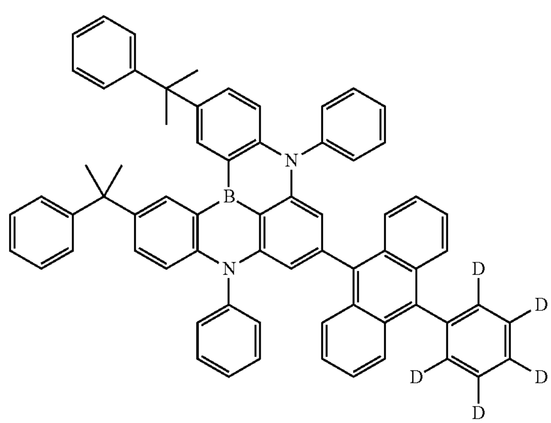

-continued
74
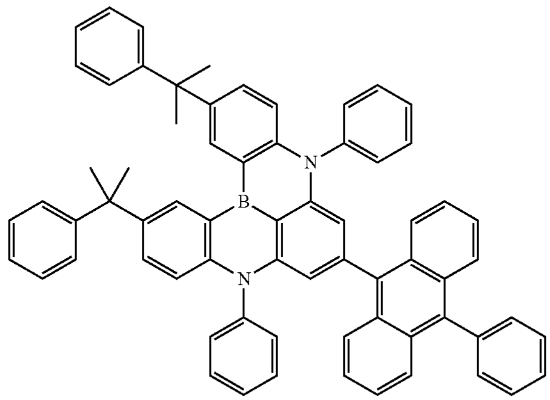
75
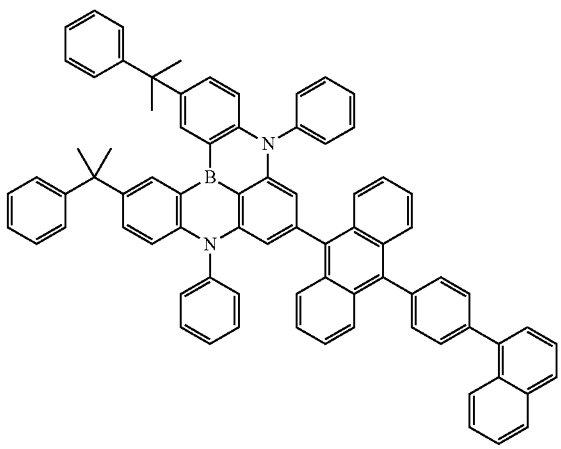
76
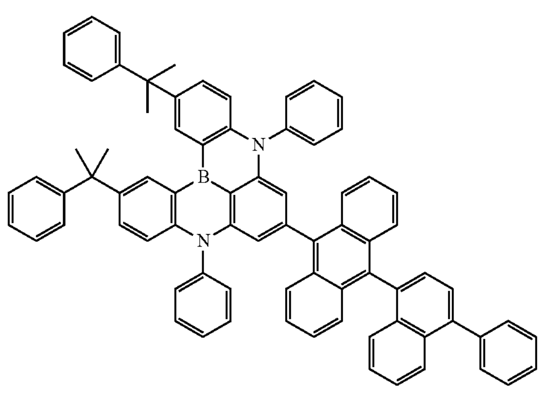
-continued
77
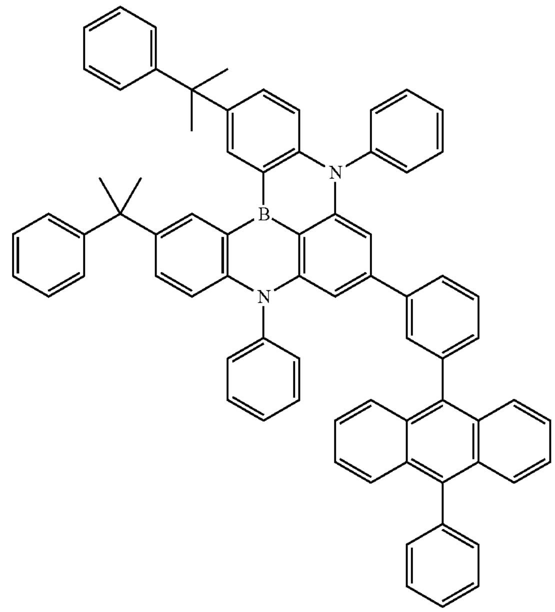
78
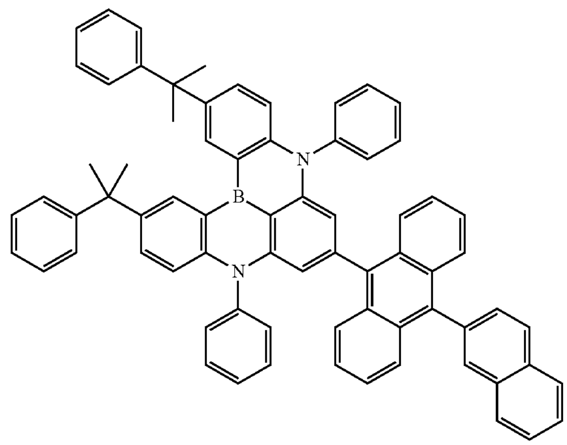
79
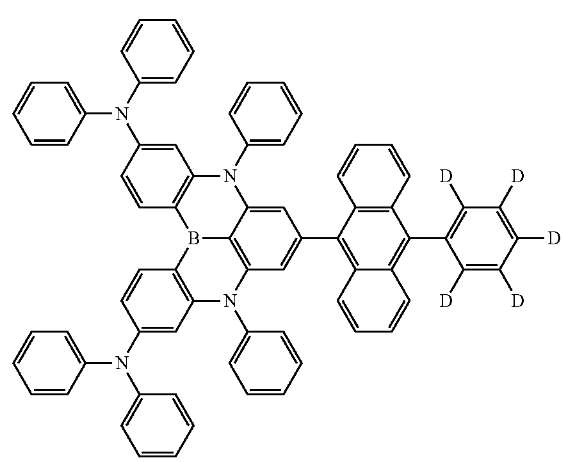

-continued
80
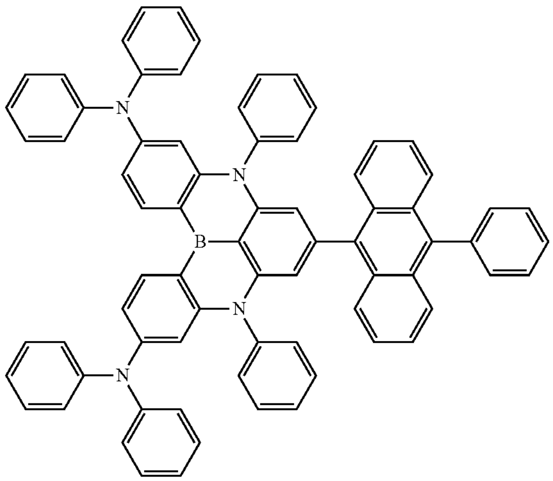
81
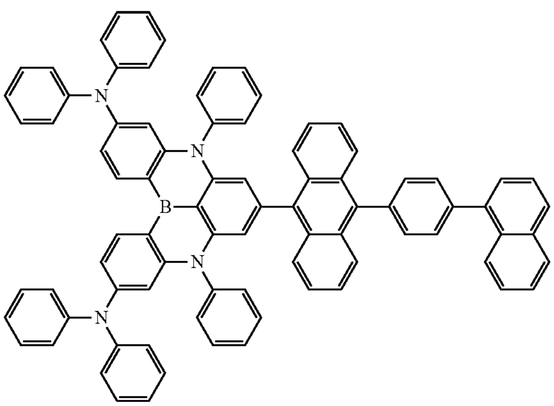
82
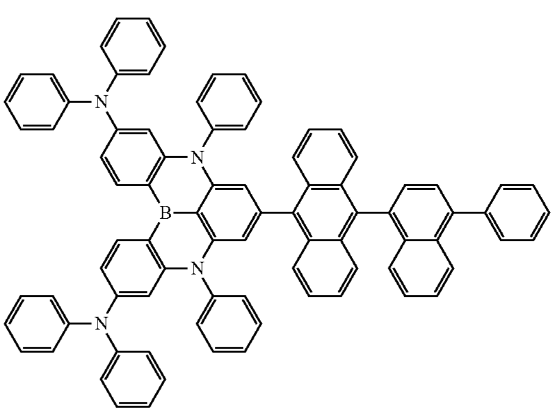
-continued
83
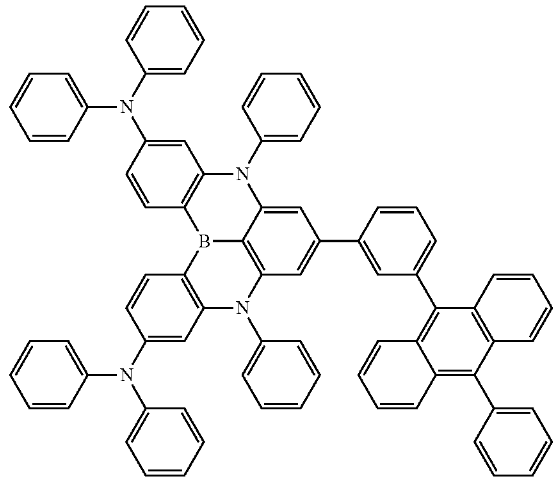
84
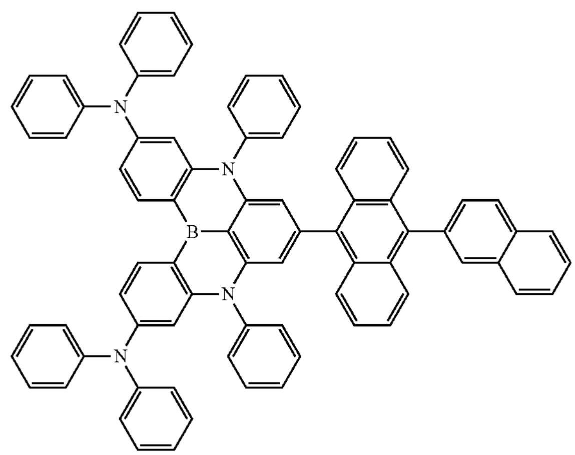
85
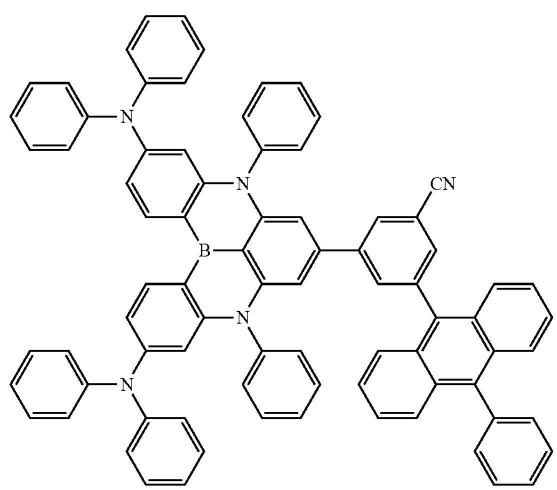

-continued
86
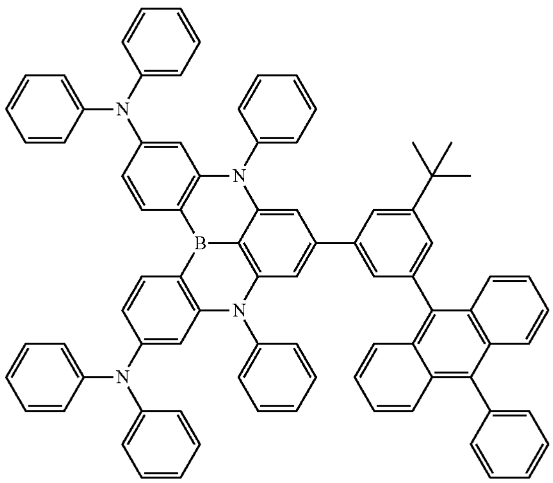
87
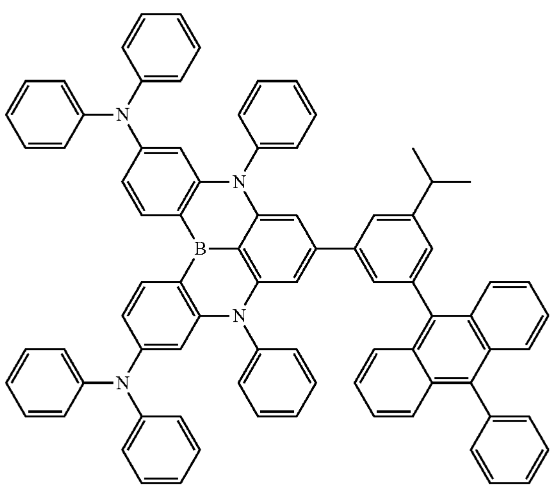
88
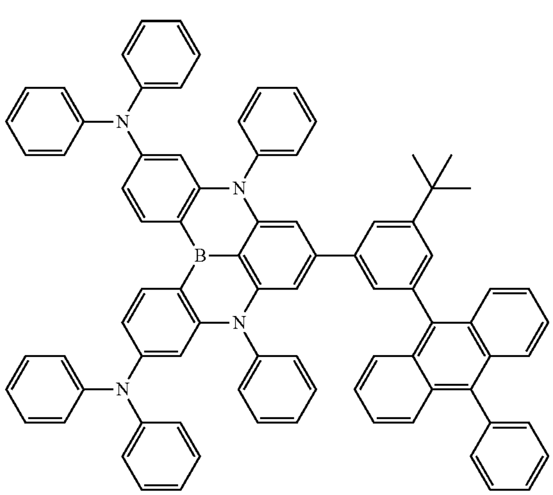
-continued
89
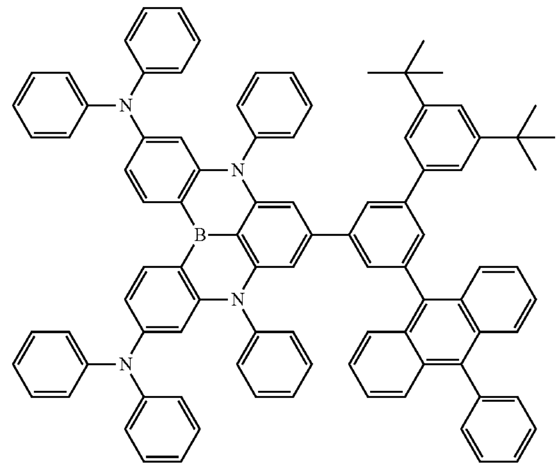
90
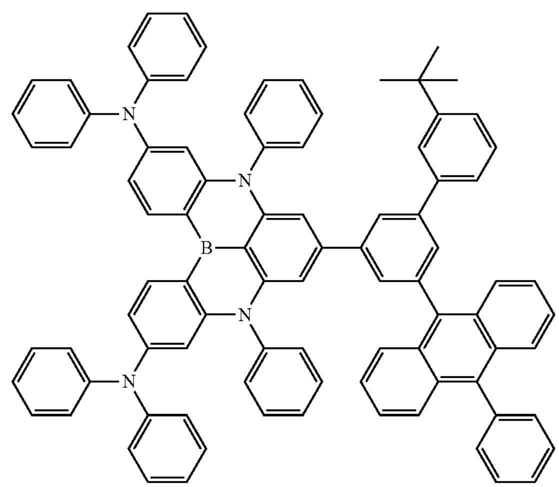
91
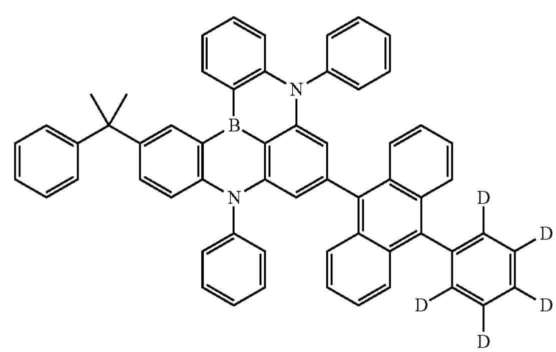

-continued
92
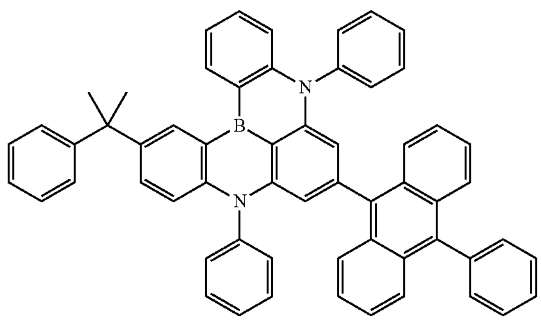
93
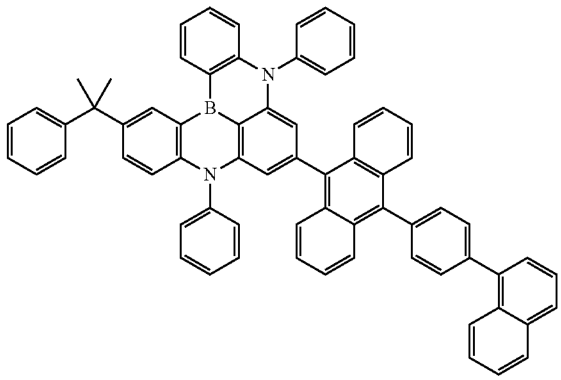
94
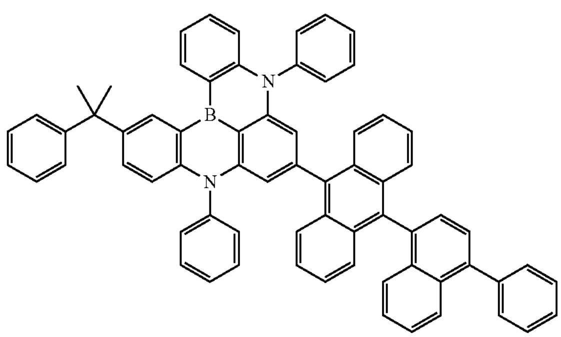
95
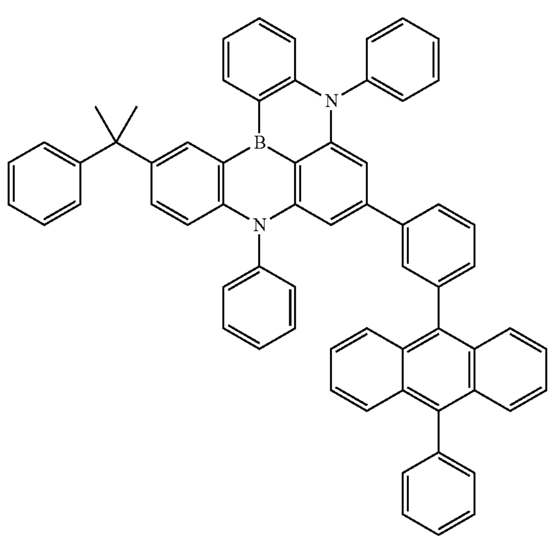
-continued
96
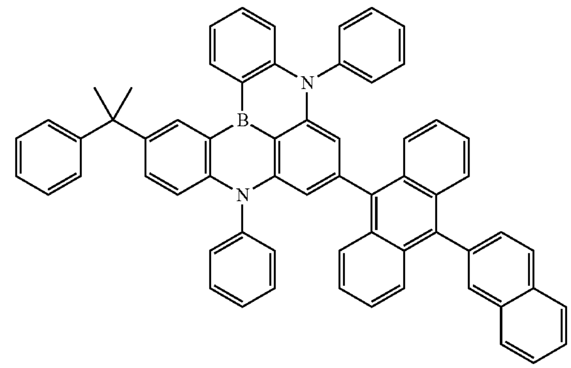
97
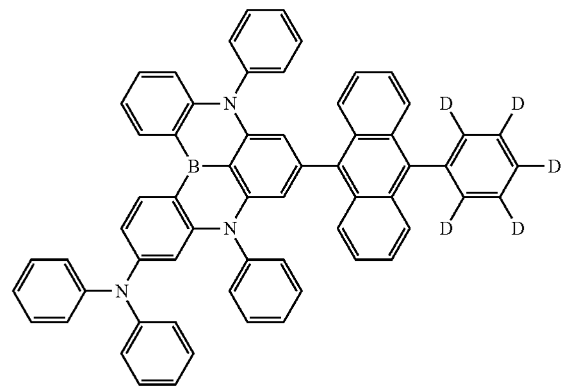
98
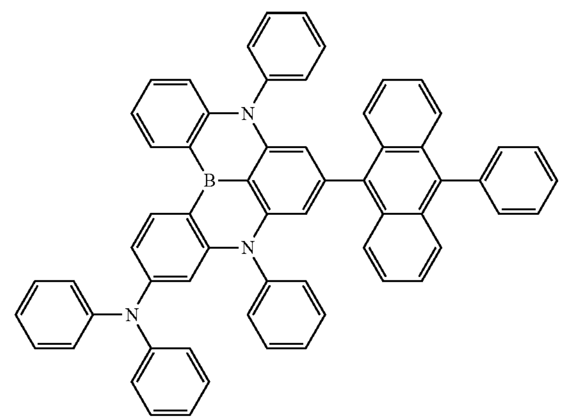
99
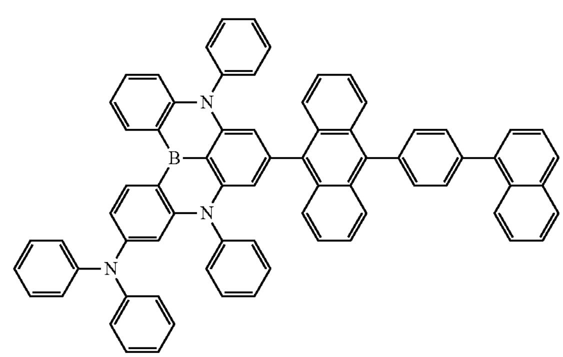

-continued
100
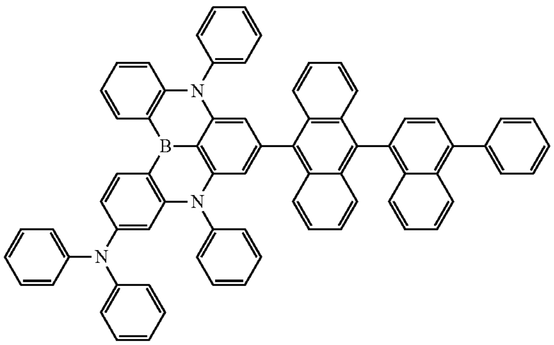
101
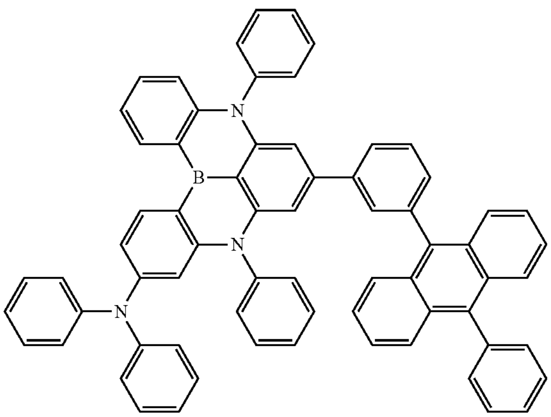
102
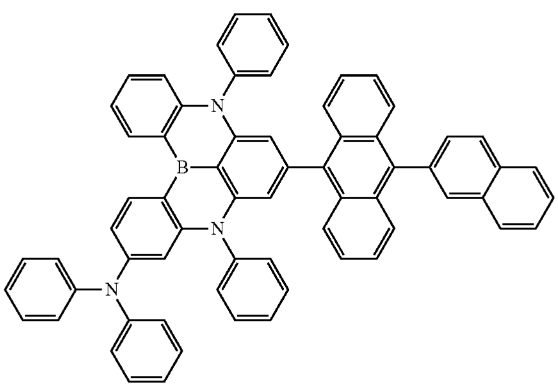
103
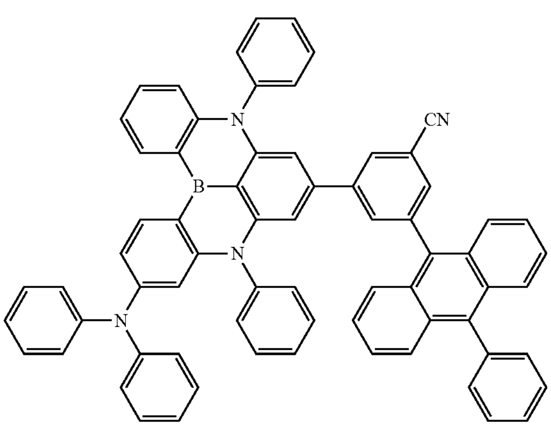
-continued
104
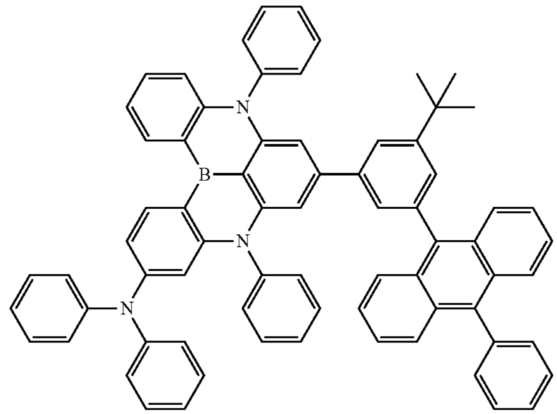
105
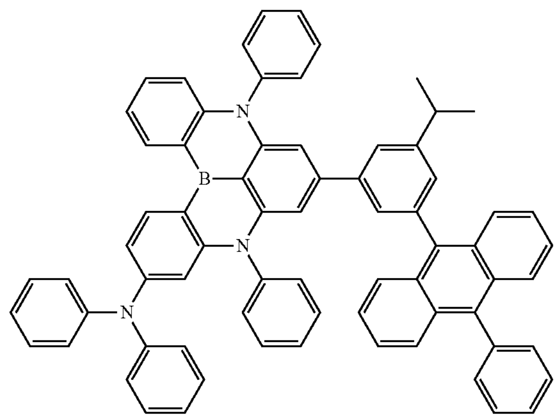
106
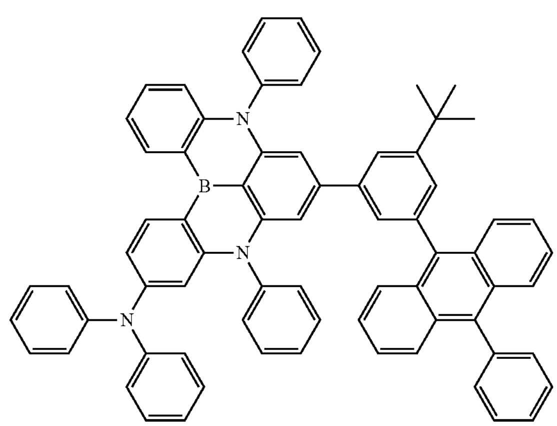

-continued
107
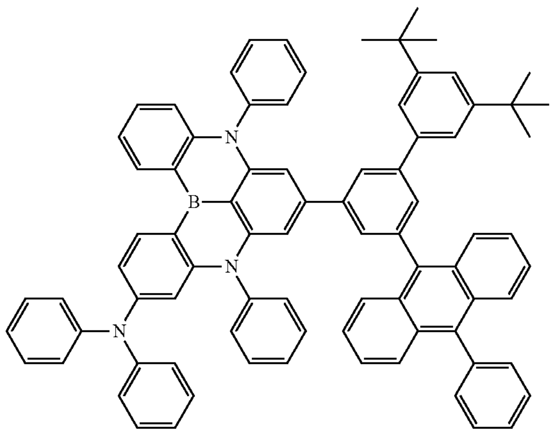
108
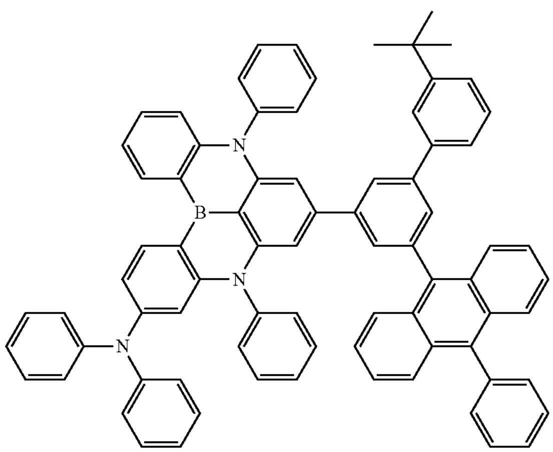
109
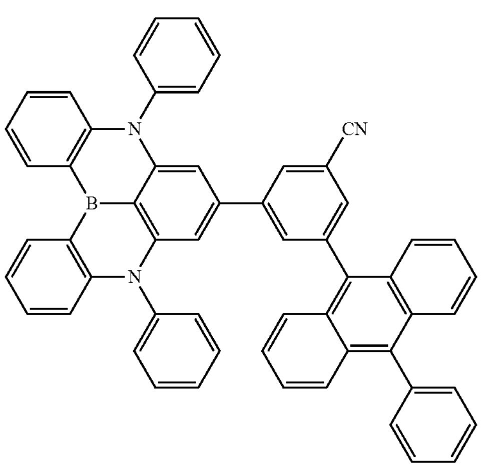
-continued
110
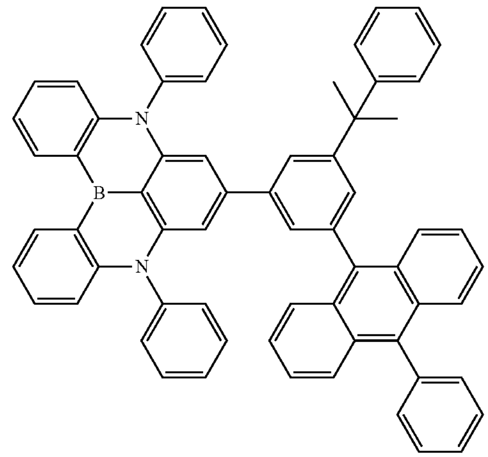
111
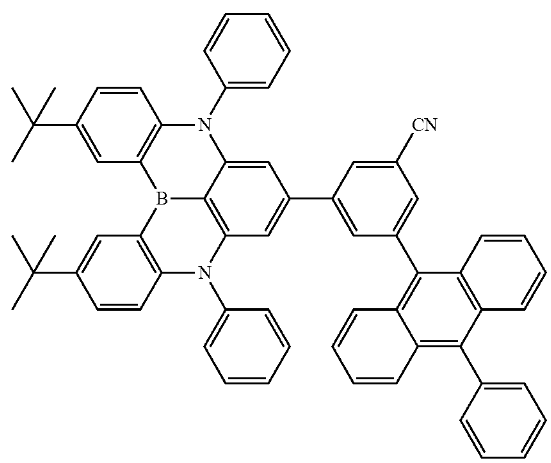
112
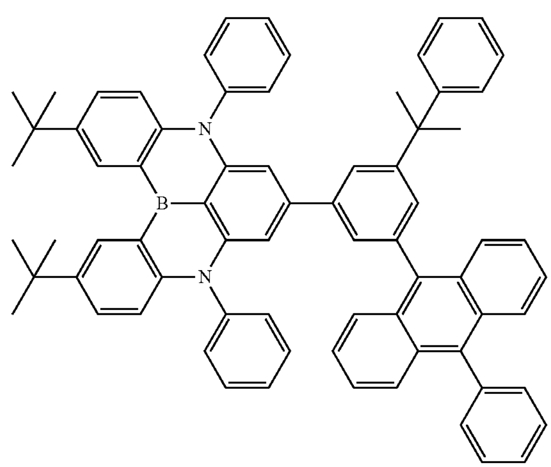

-continued
113
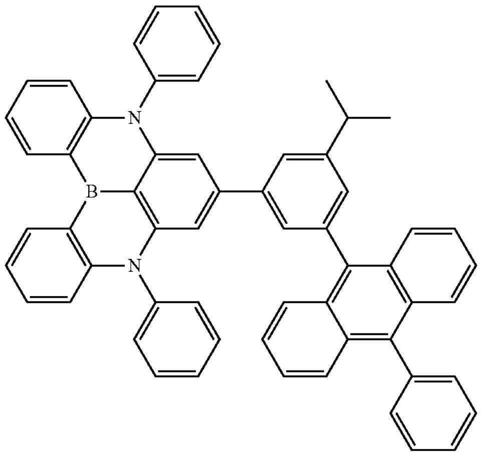
114
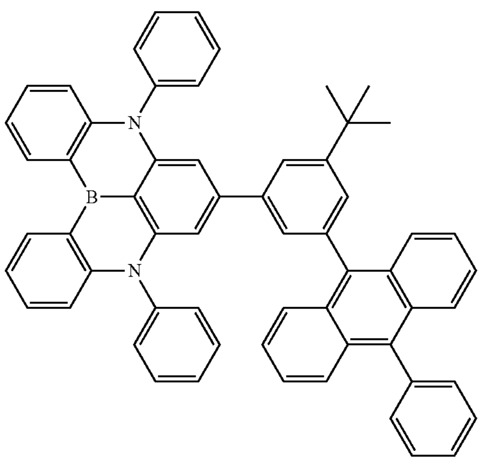
115
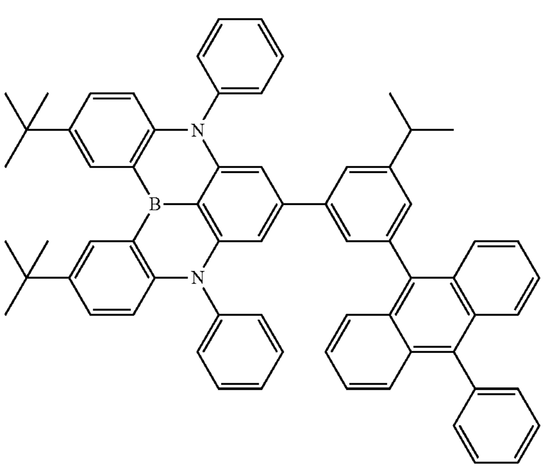
-continued
116
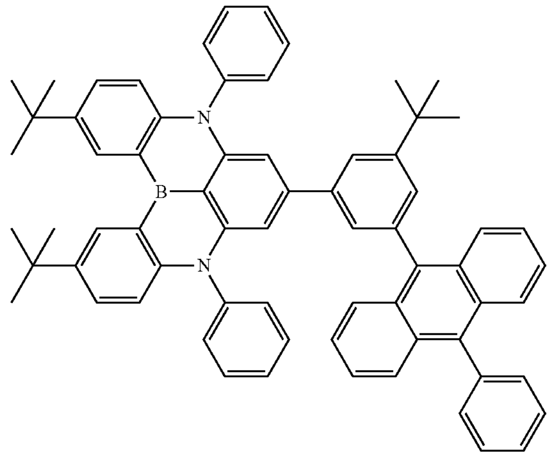
117
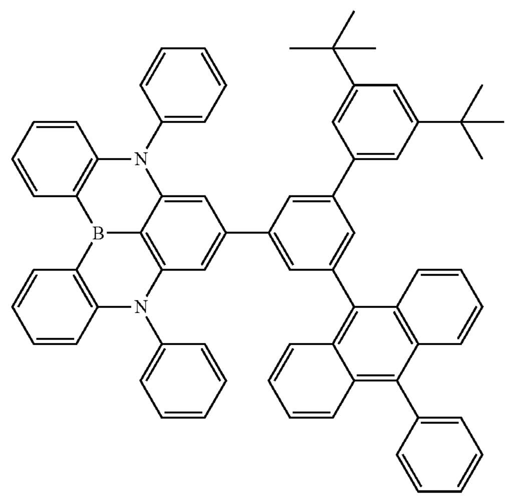
118
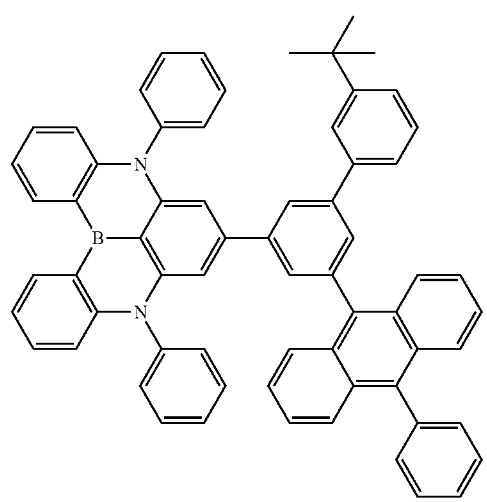

-continued
119
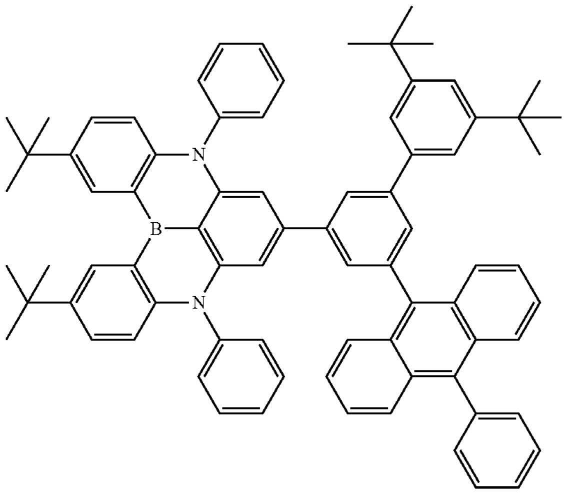
120
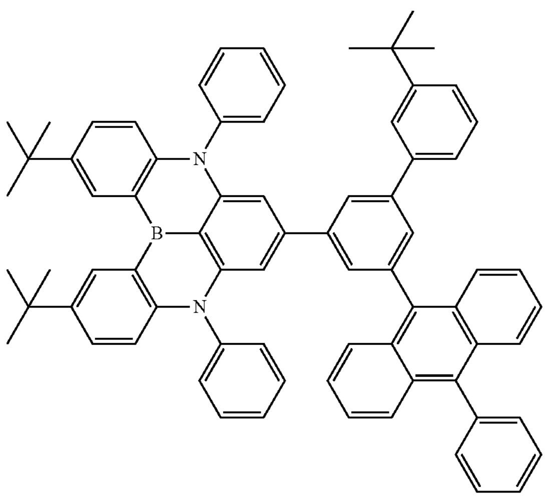
121
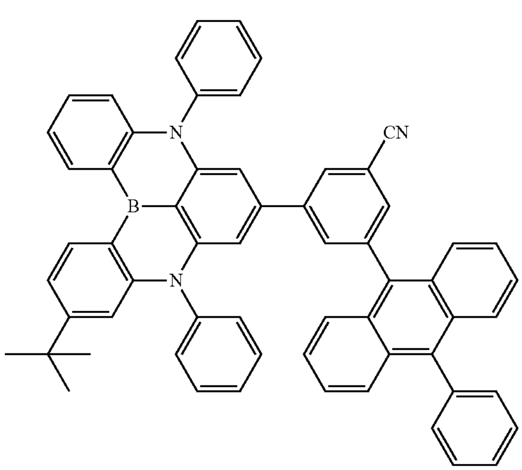
-continued
122
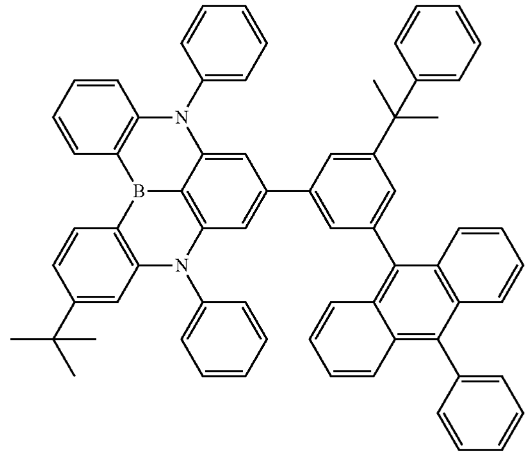
123
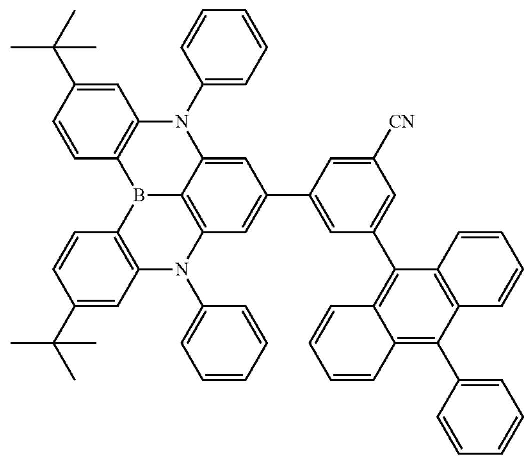
124
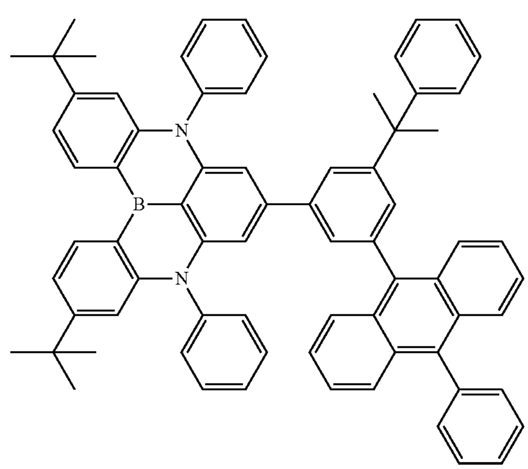

125
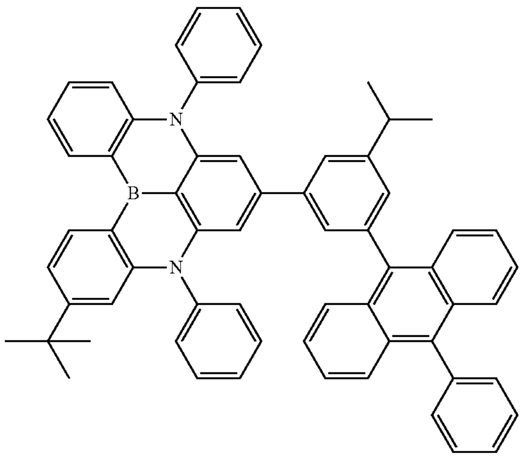
126
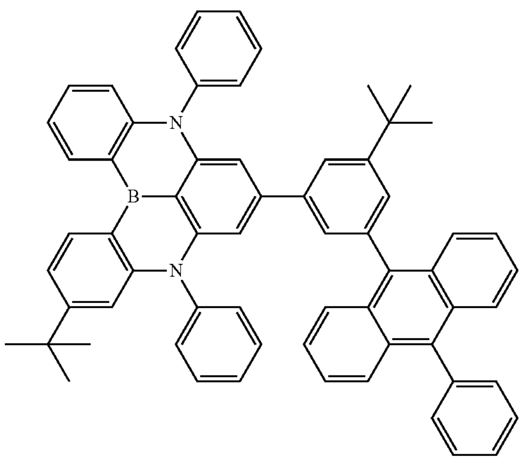
127
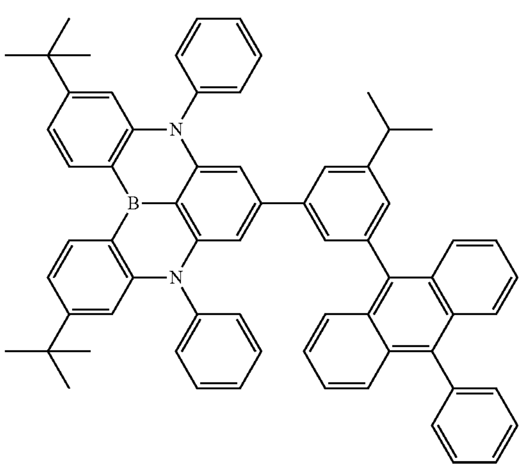
128
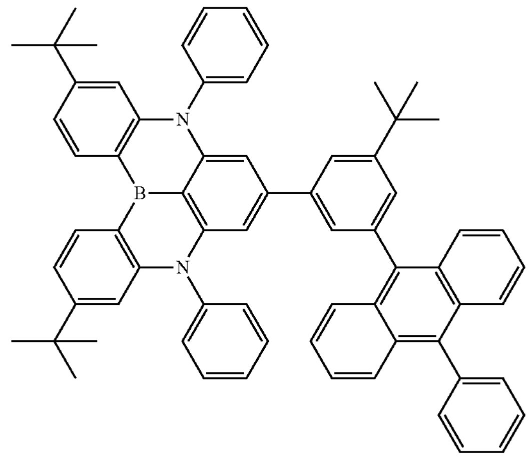
129
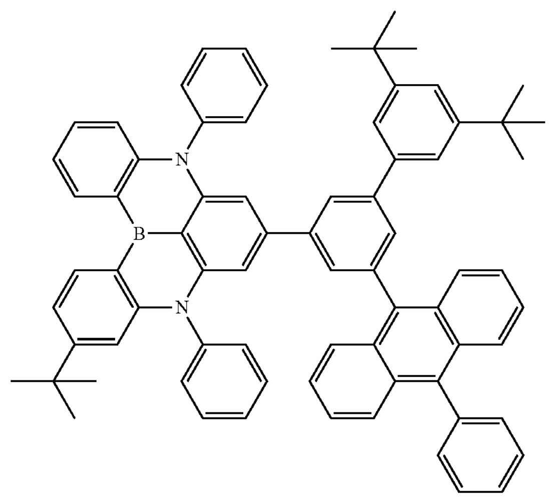
130
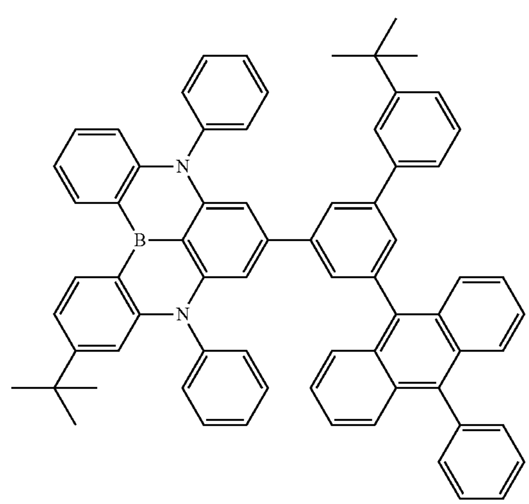

-continued
131
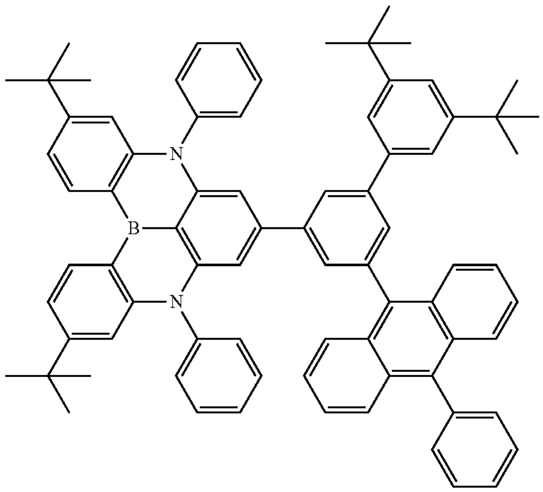
132
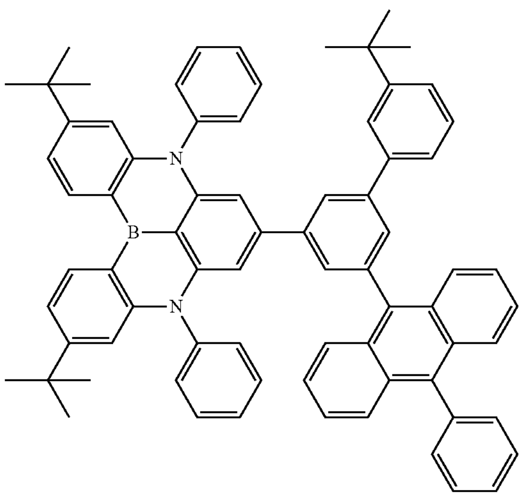
133
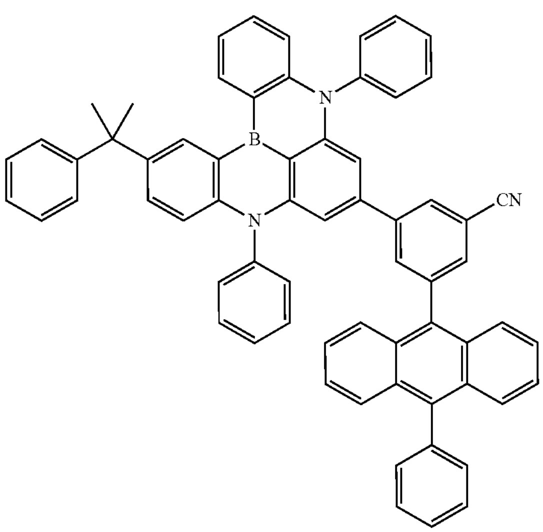
-continued
134
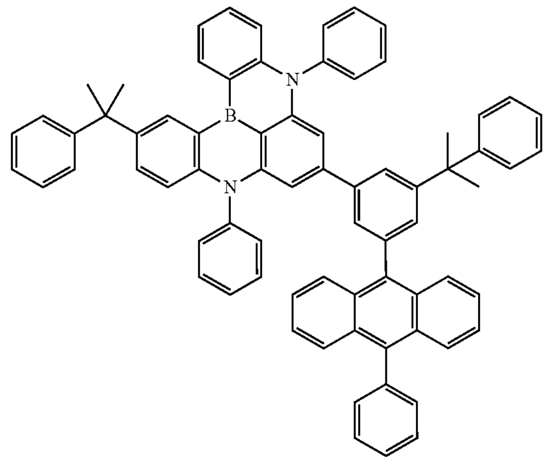
135
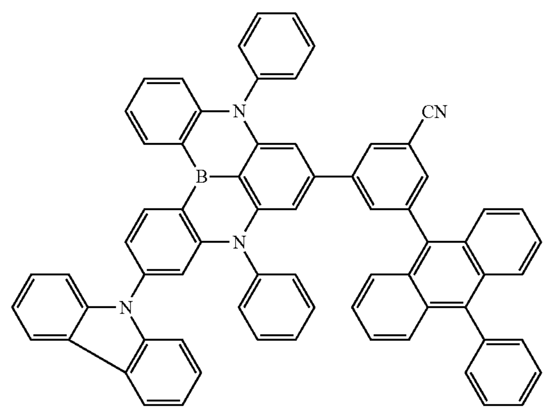
136
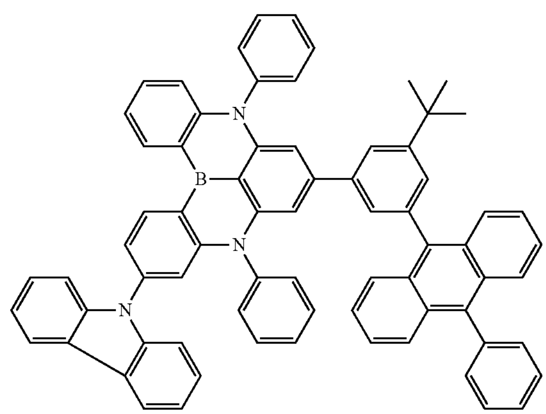

-continued
137
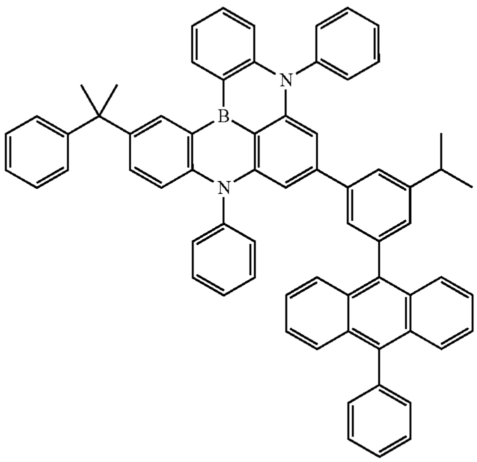
138
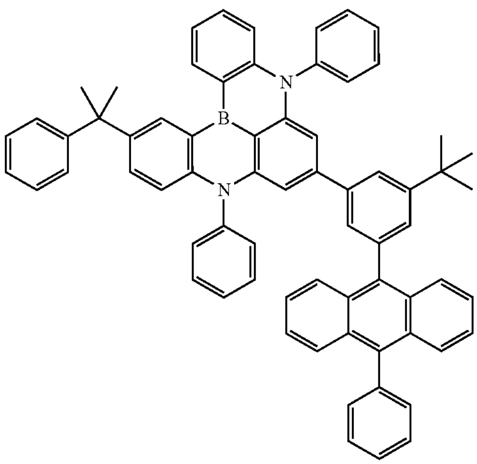
139
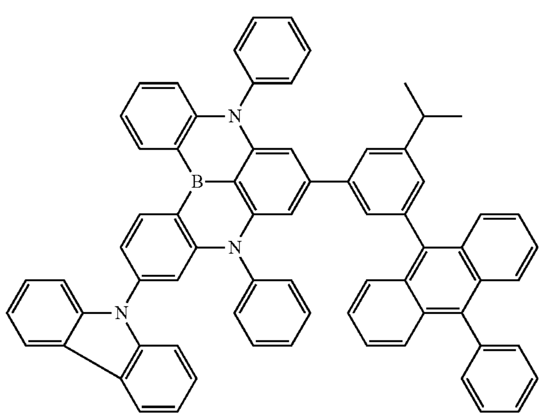
-continued
140
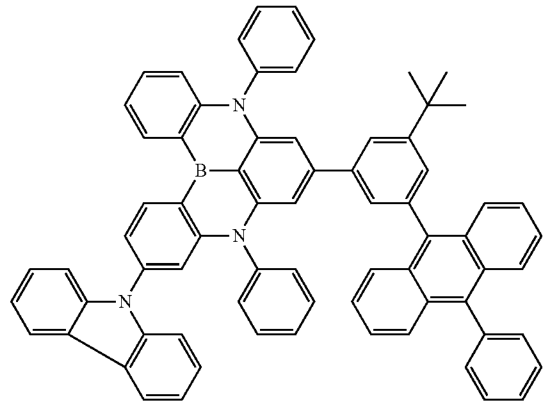
141
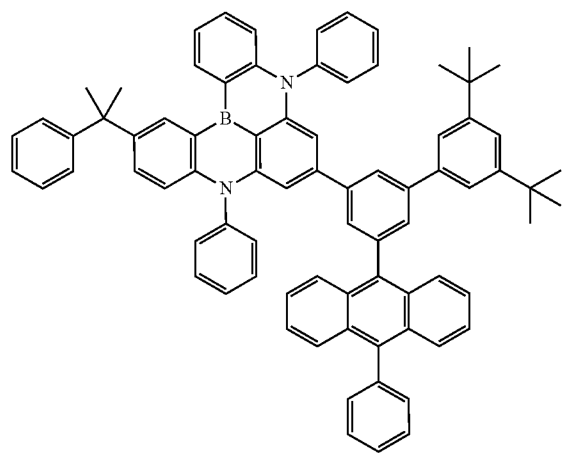
142
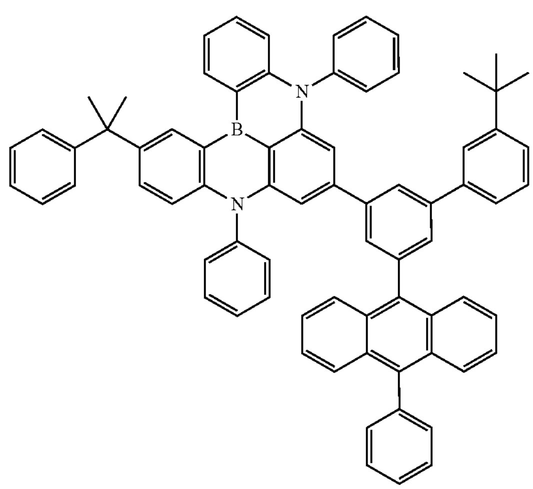

-continued
143
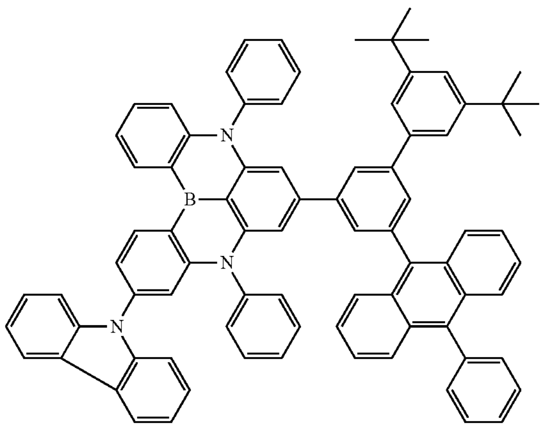
144
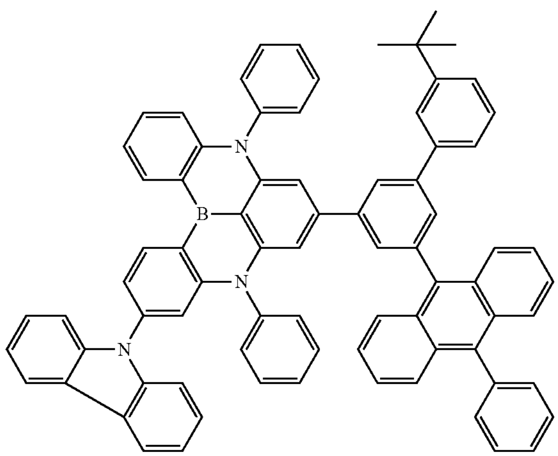
145
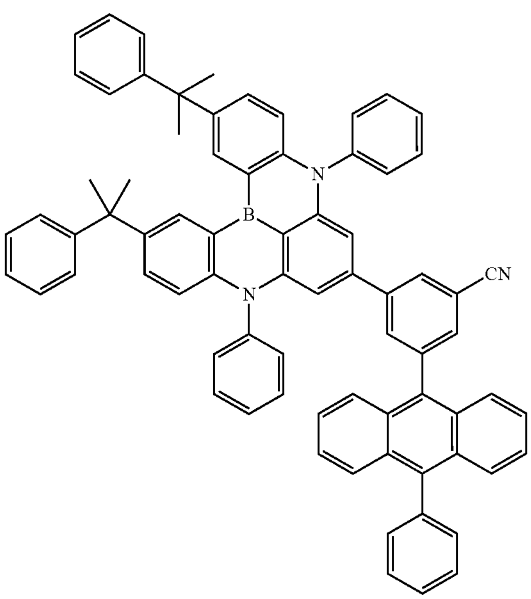
-continued
146
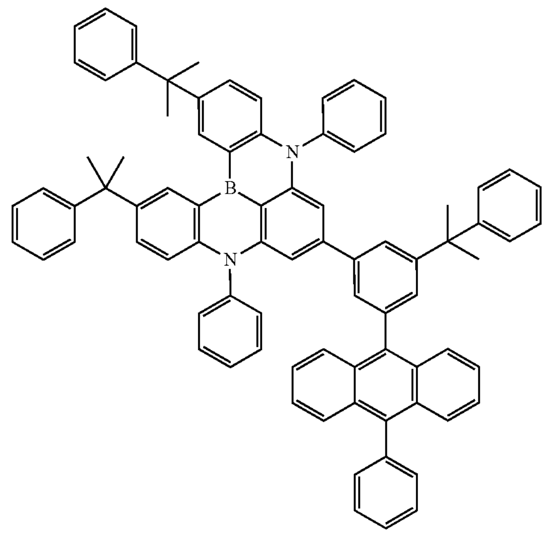
147
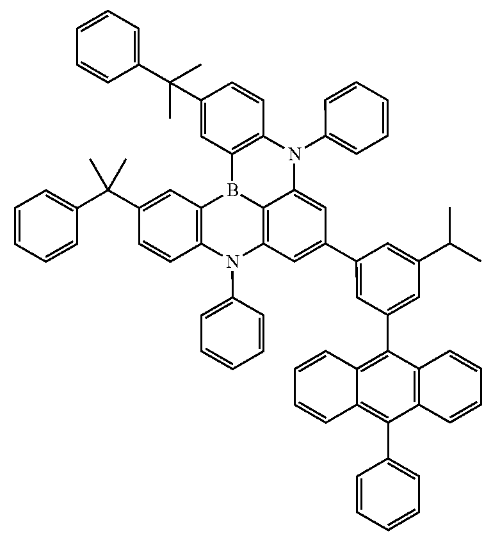
148
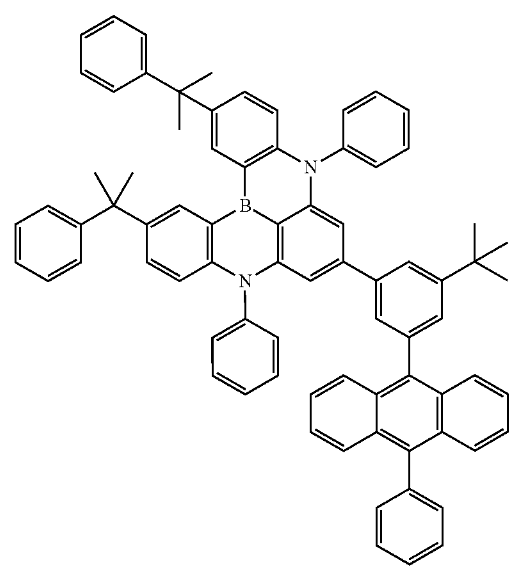

-continued
149
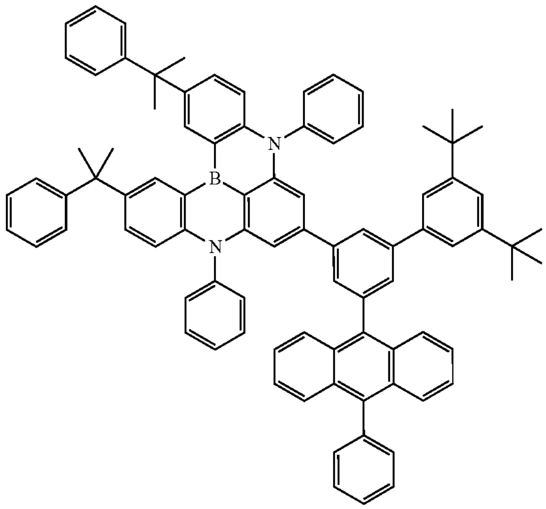
150
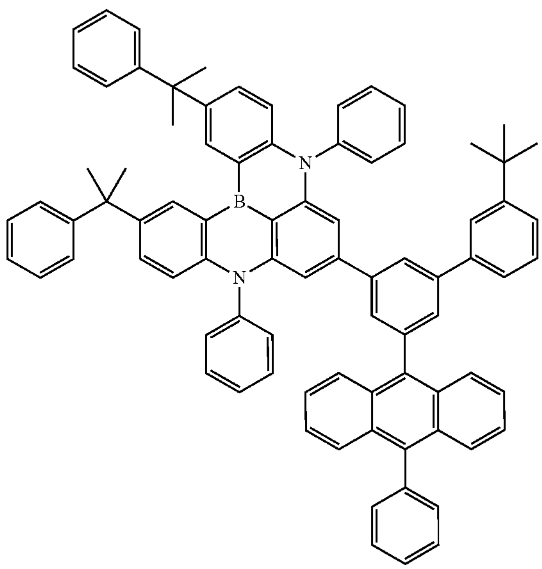
151
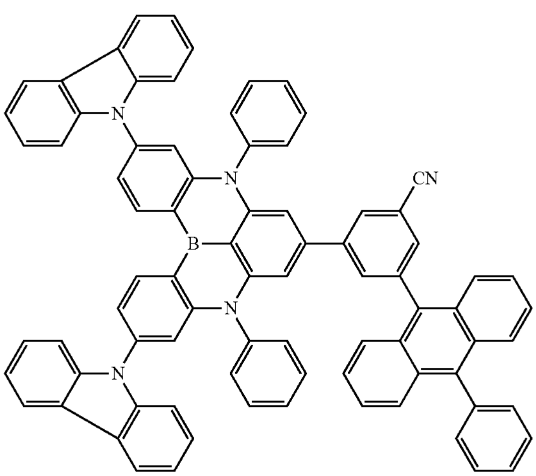
-continued
152
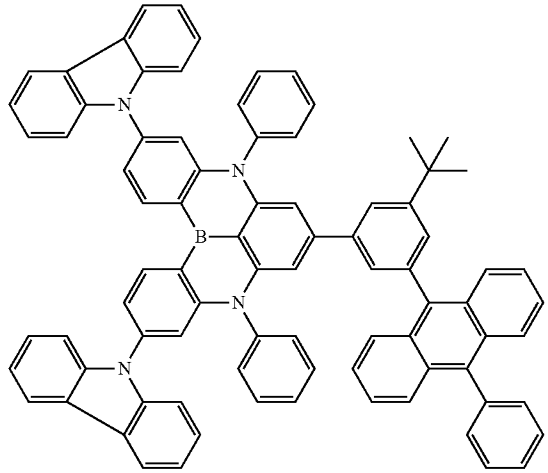
153
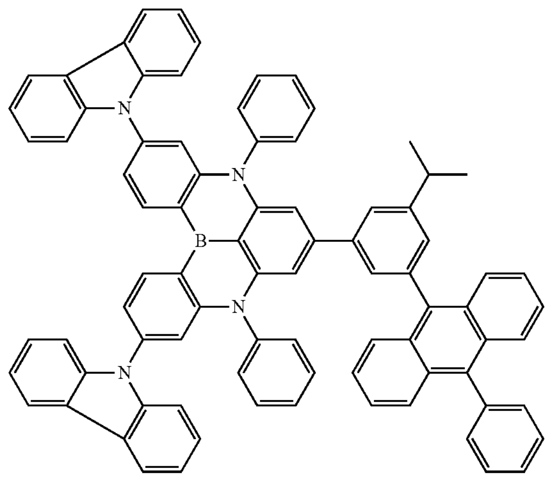
154
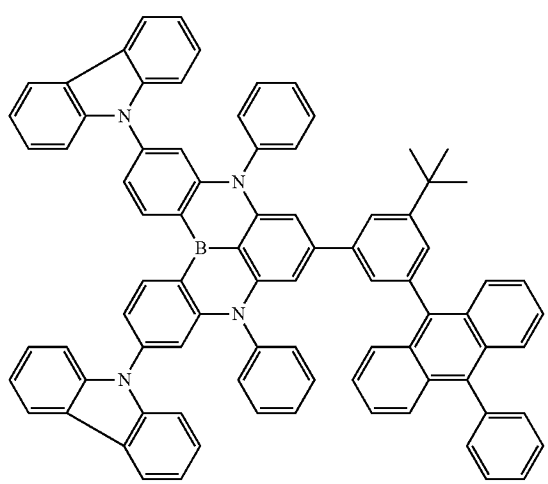

-continued
155
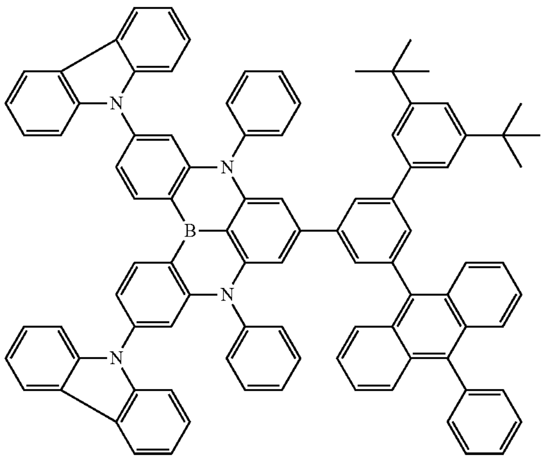
156
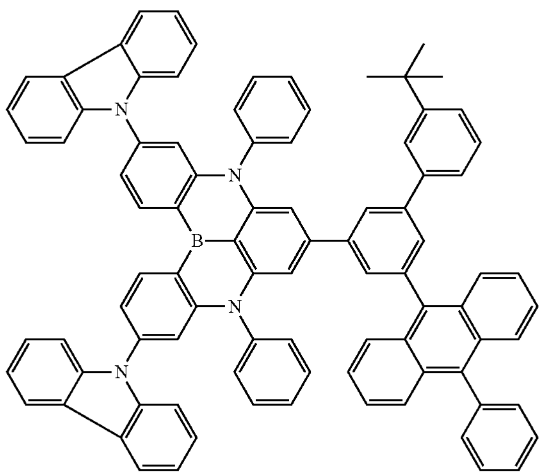
157
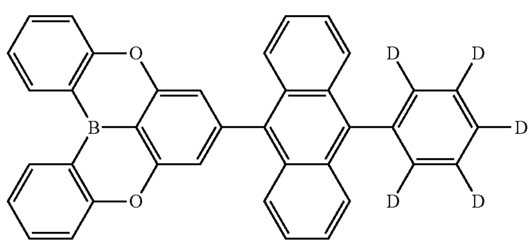
158
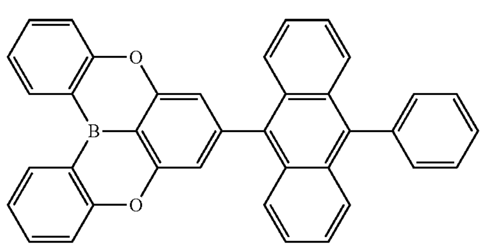
-continued
159
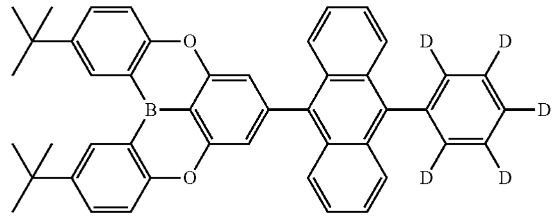
160
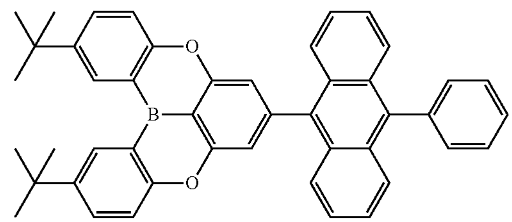
161
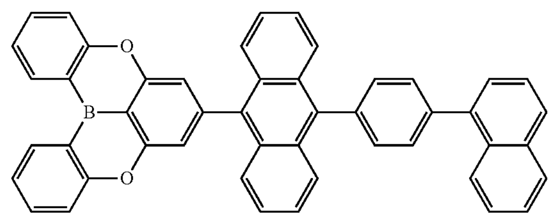
162
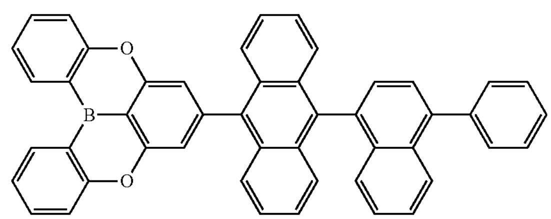
163
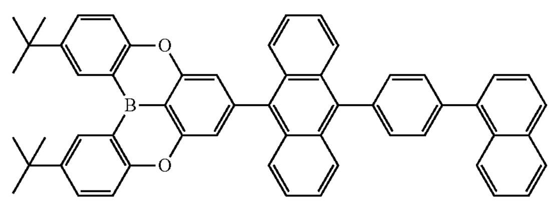
164
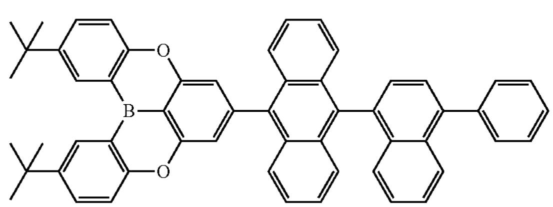

-continued
165
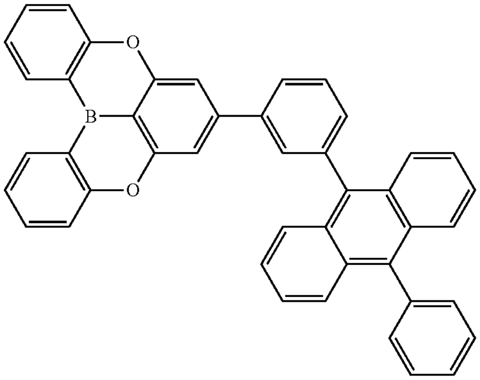
166
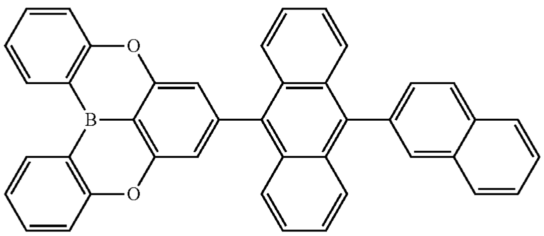
167
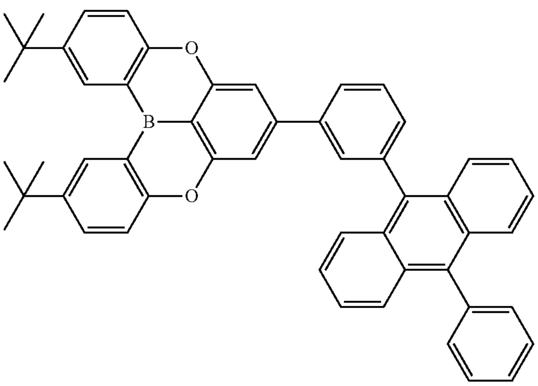
168
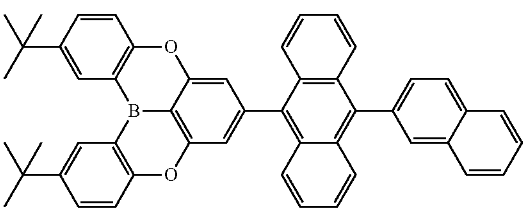
169
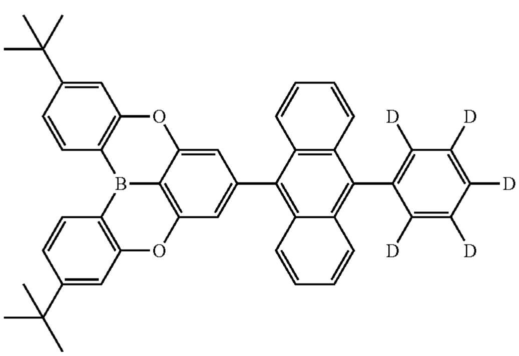
-continued
170
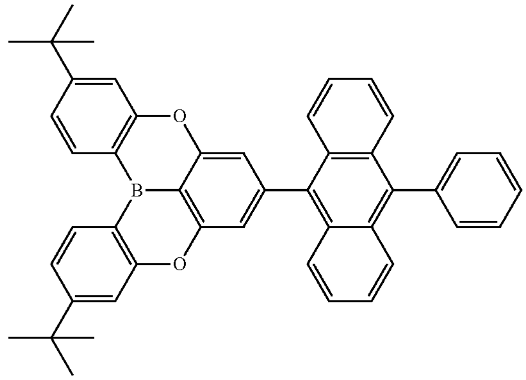
171
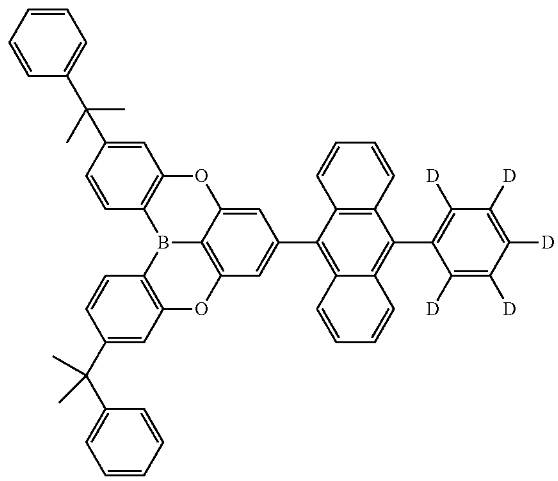
172
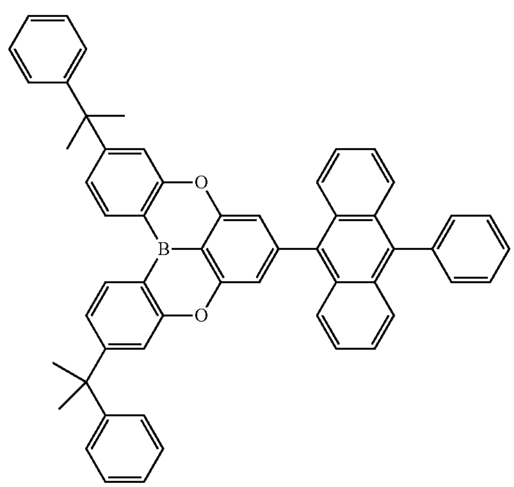

-continued
173
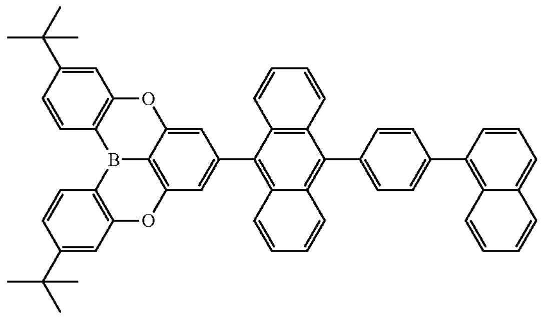
174
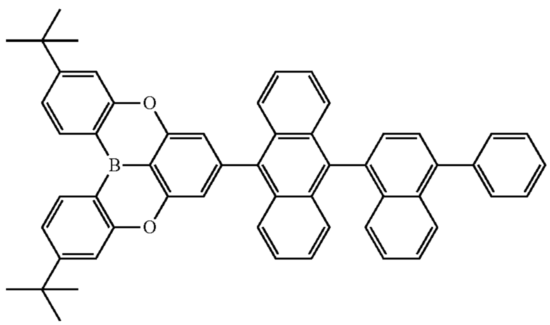
175
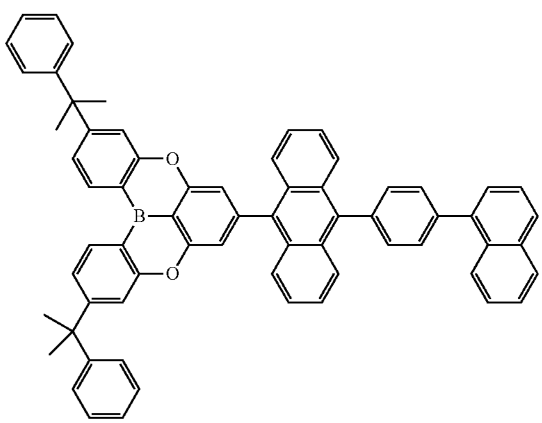
176
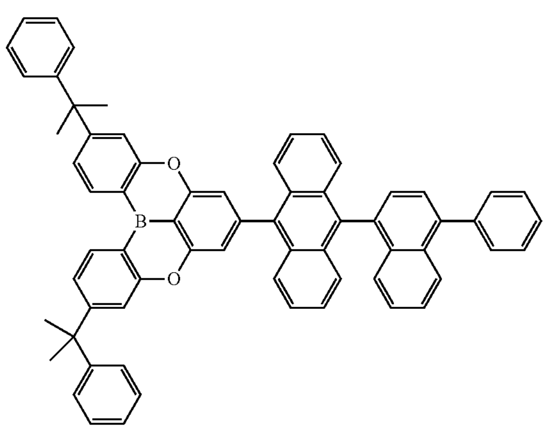
-continued
177
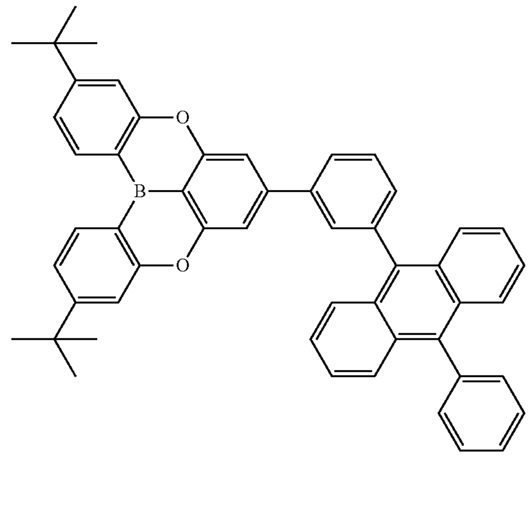
178
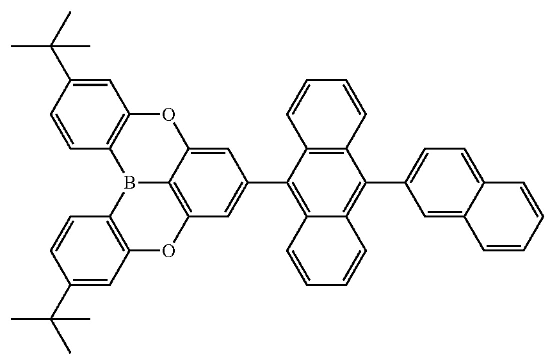
179
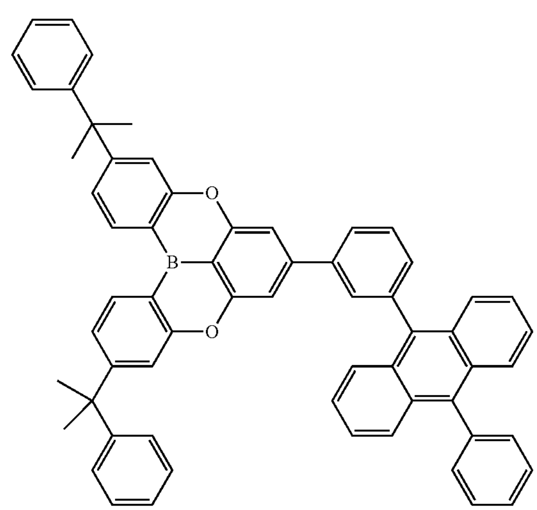

-continued
180
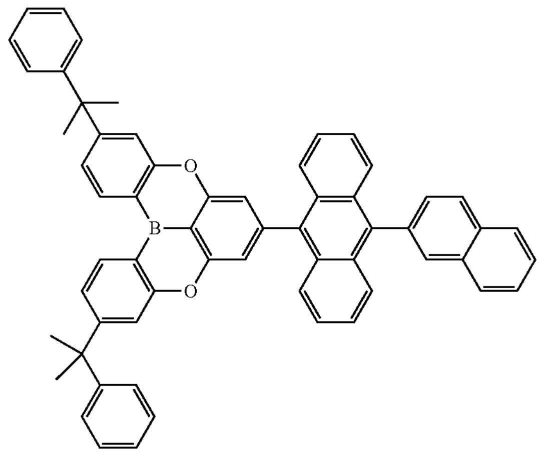
181
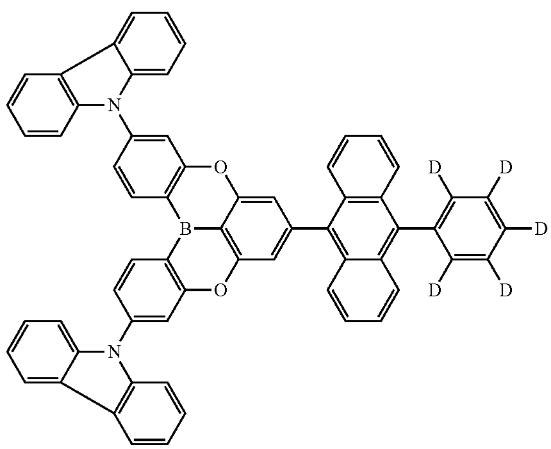
182
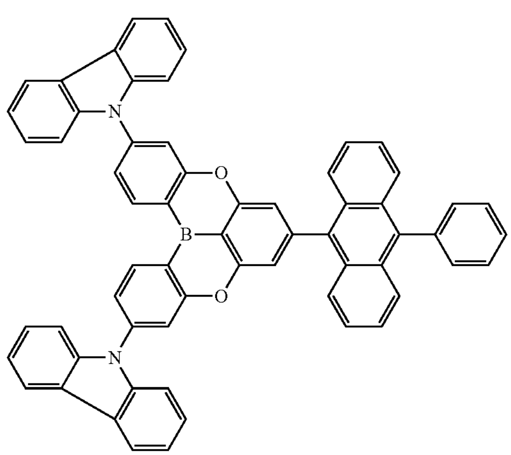
-continued
183
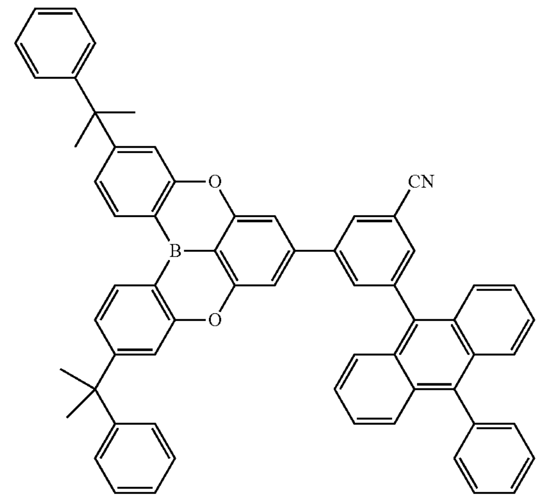
184
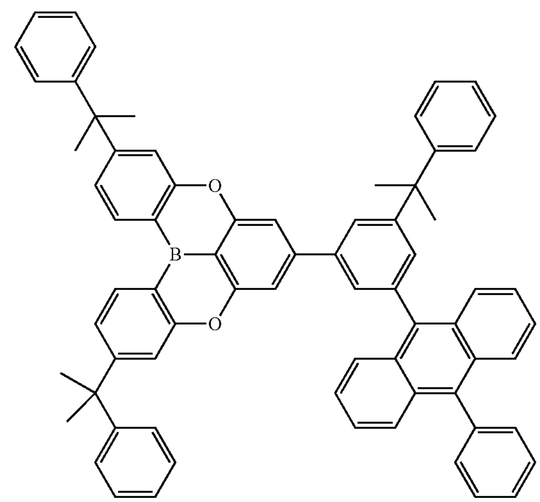
185
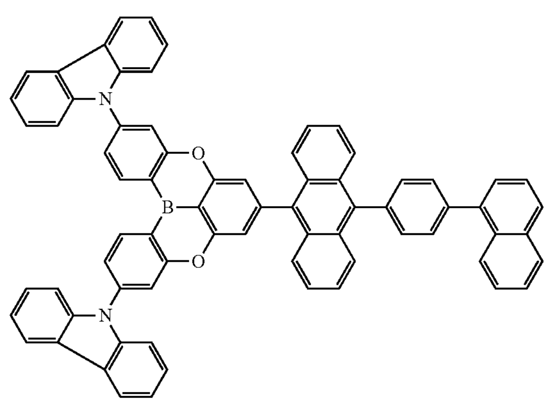

-continued
186
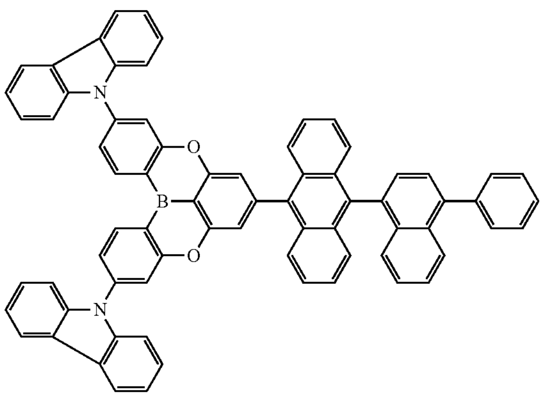
187
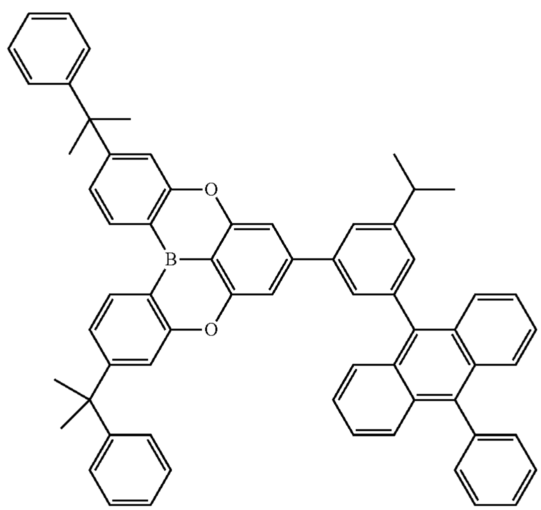
188
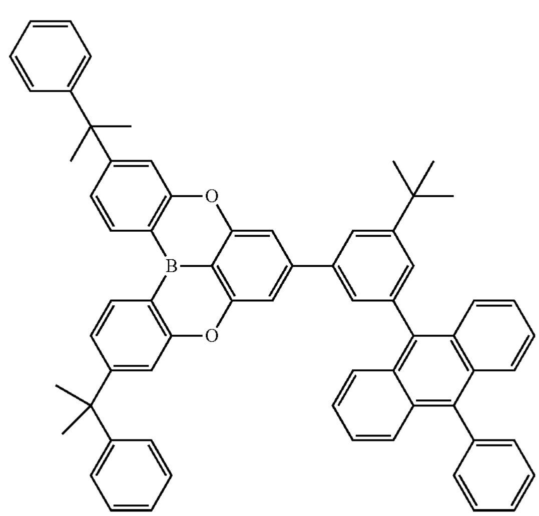
-continued
189
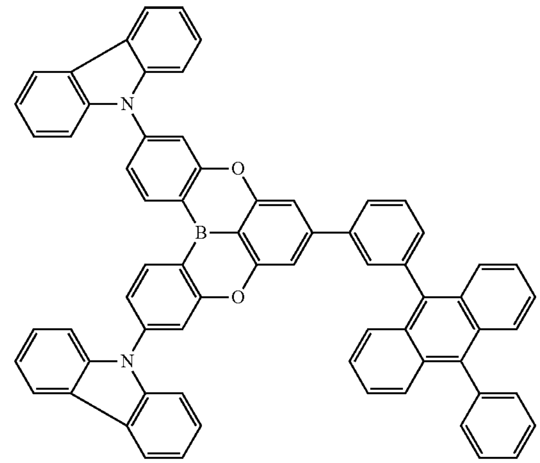
190
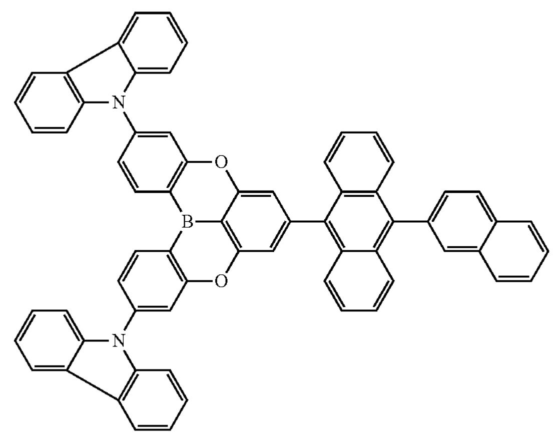
191
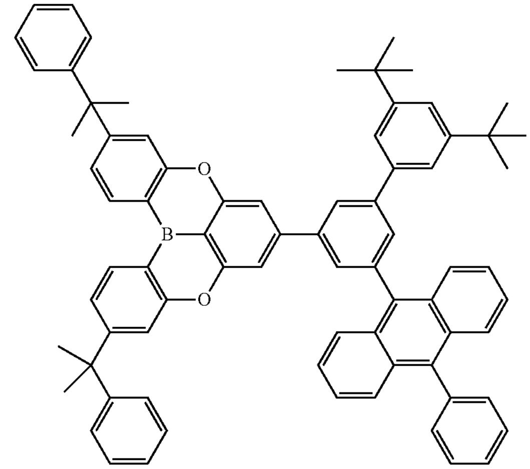

-continued
192
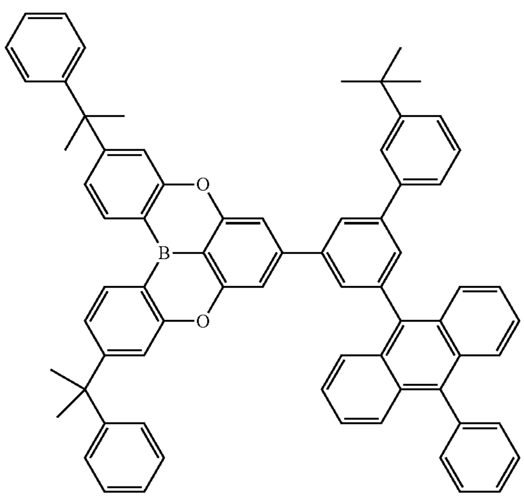
193
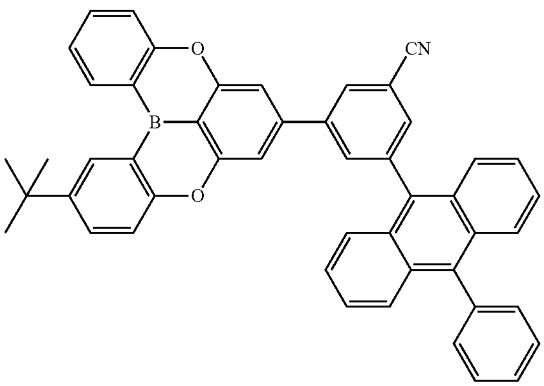
194
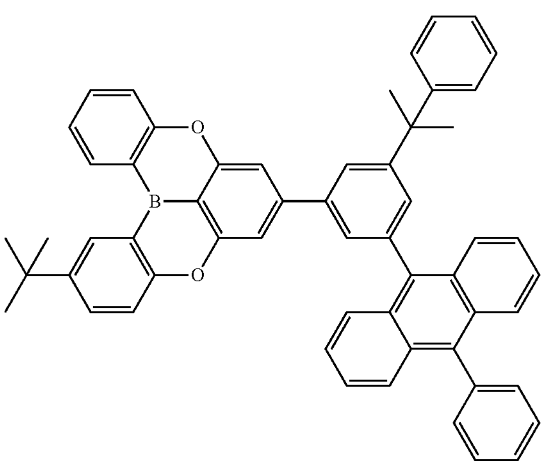
195
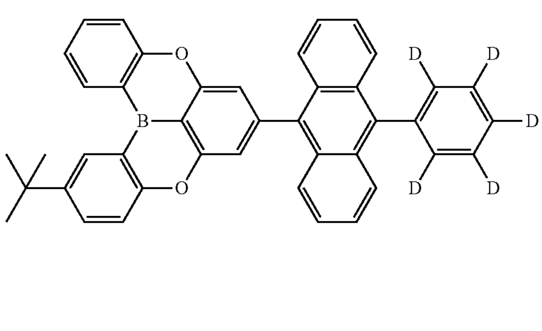
-continued
196
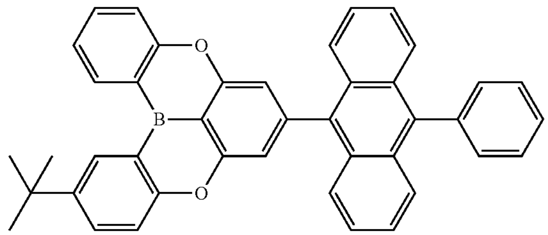
197
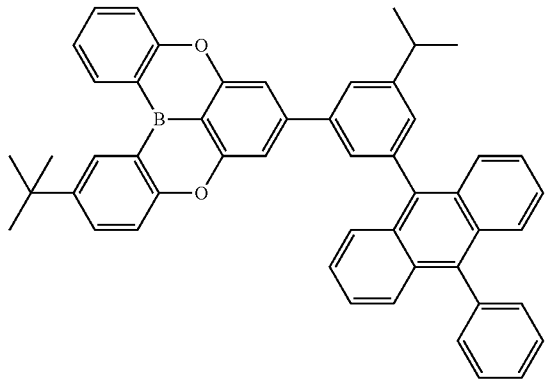
198
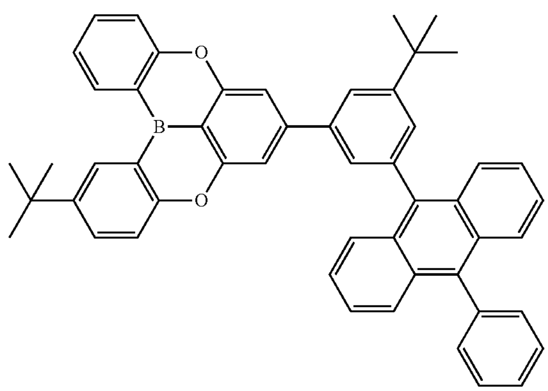
199
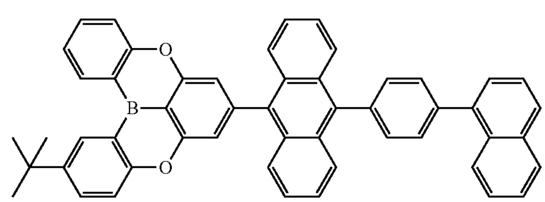
200
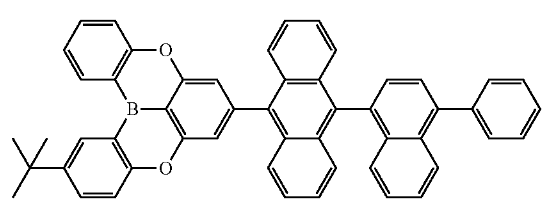

-continued
201
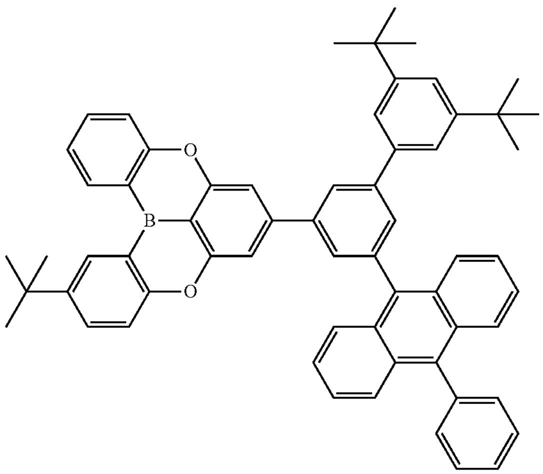
202
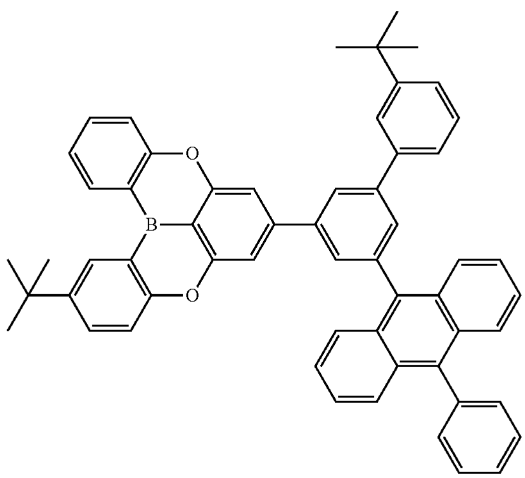
203
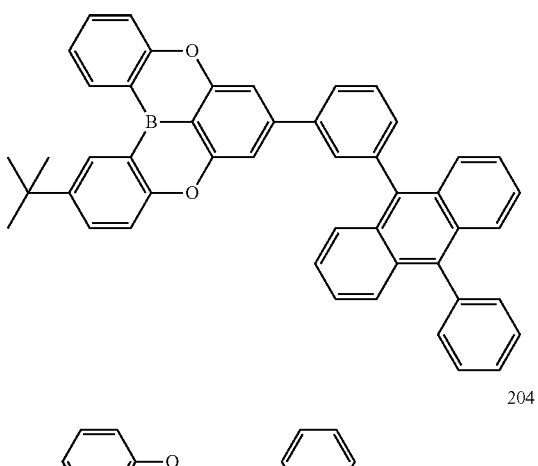
204
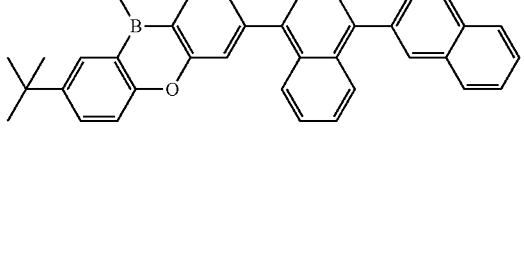
-continued
205
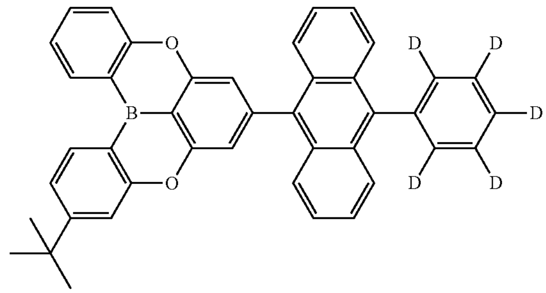
206
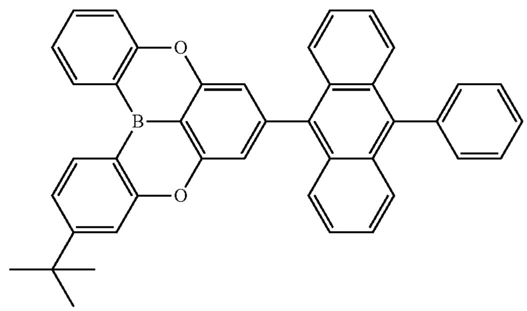
207
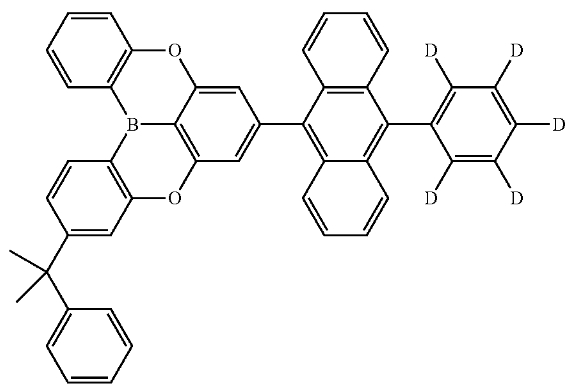
208
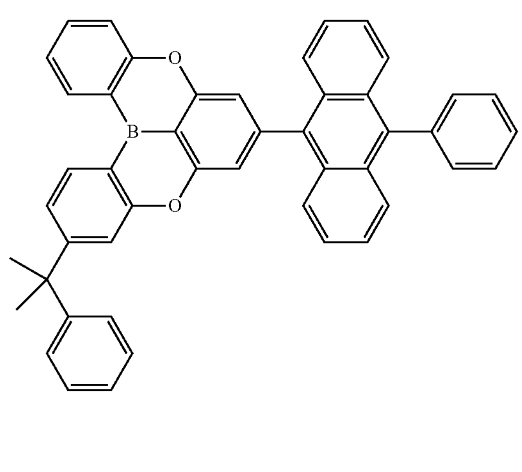

-continued
209
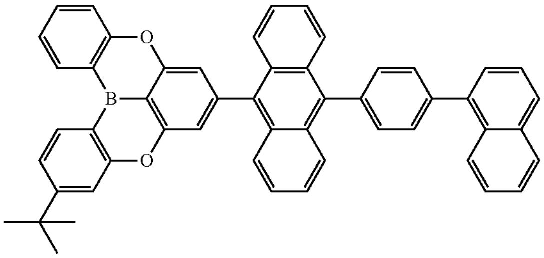
210
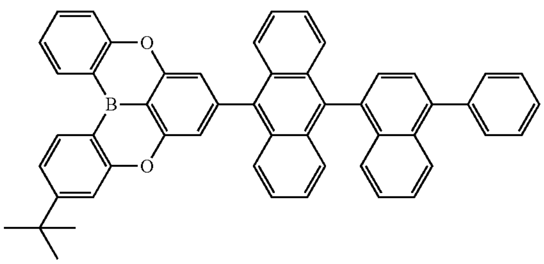
211
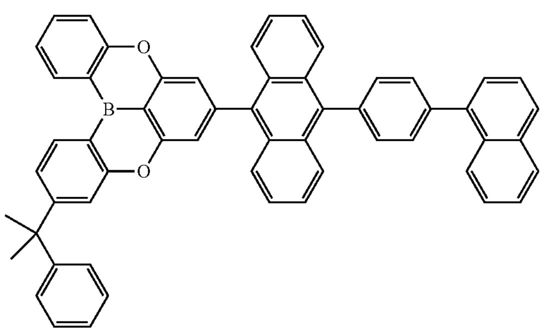
212
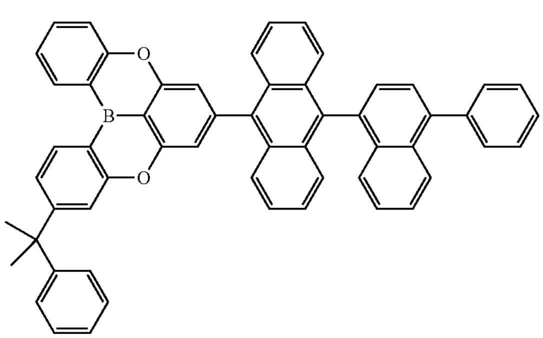
-continued
213
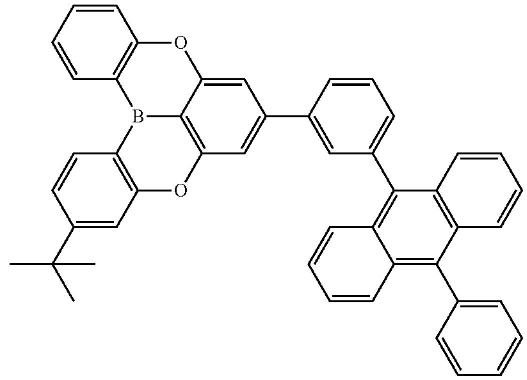
214
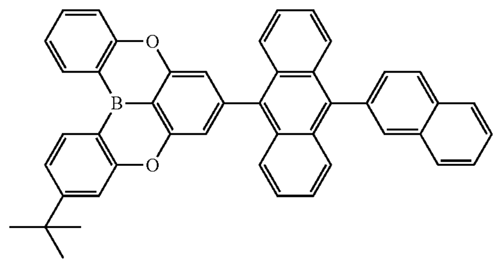
215
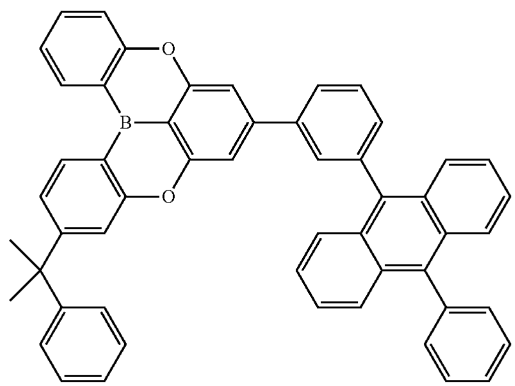
216
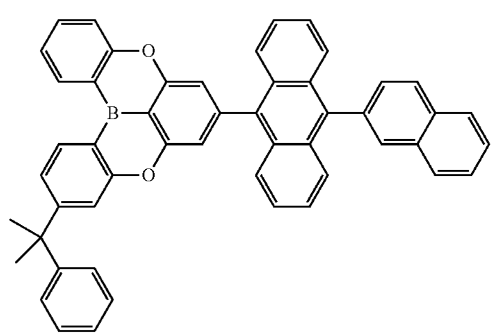

-continued
217
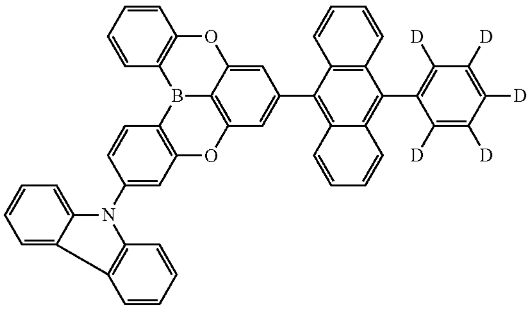
218
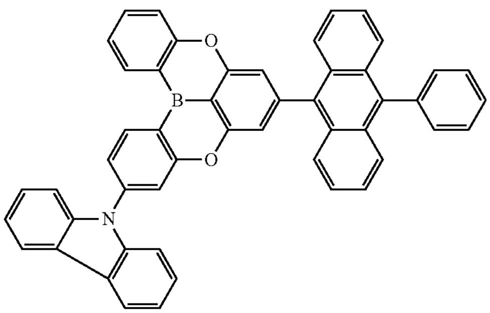
219
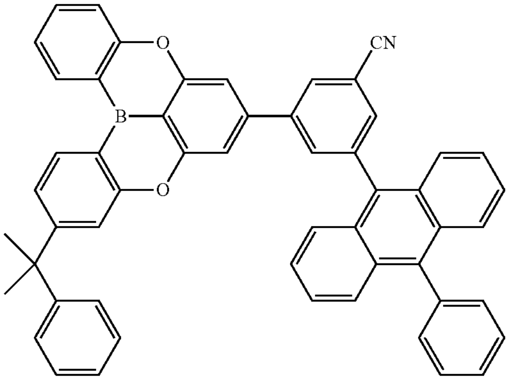
220
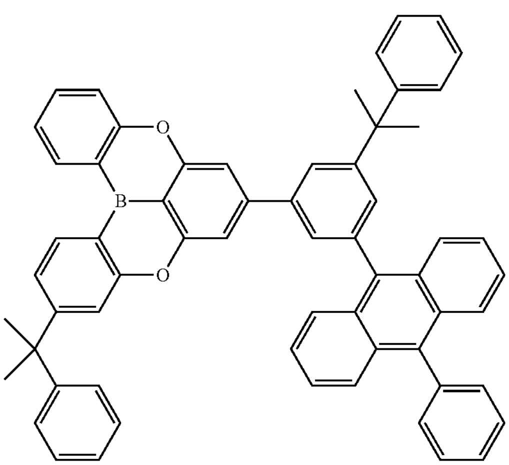
-continued
221
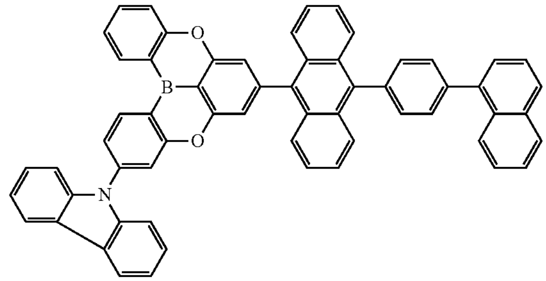
222
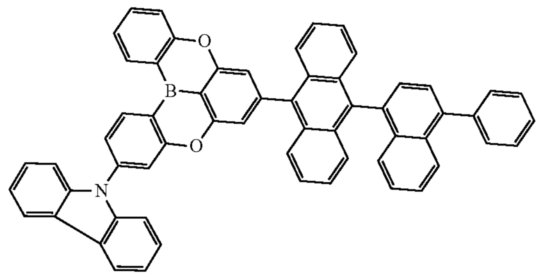
223
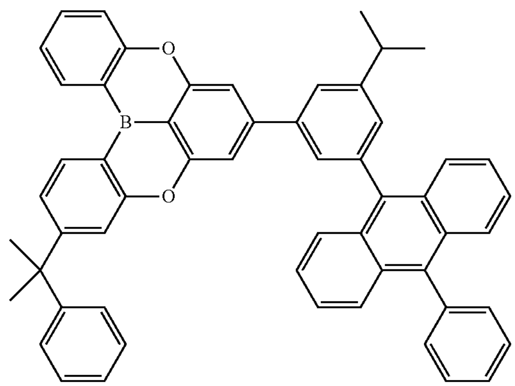
224
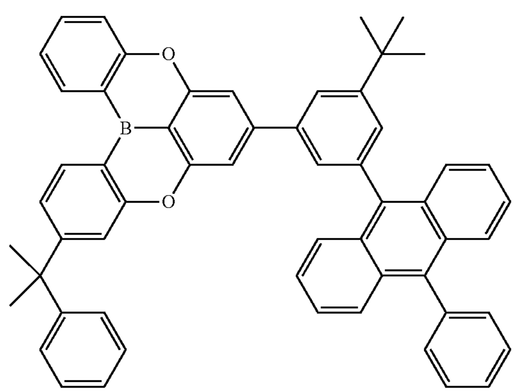

-continued
225
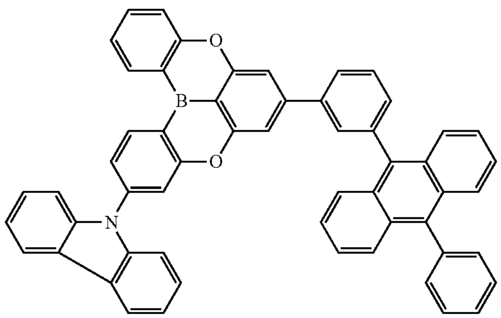
226
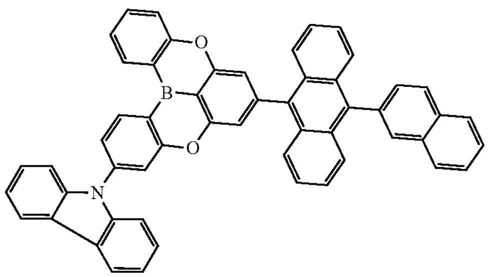
227
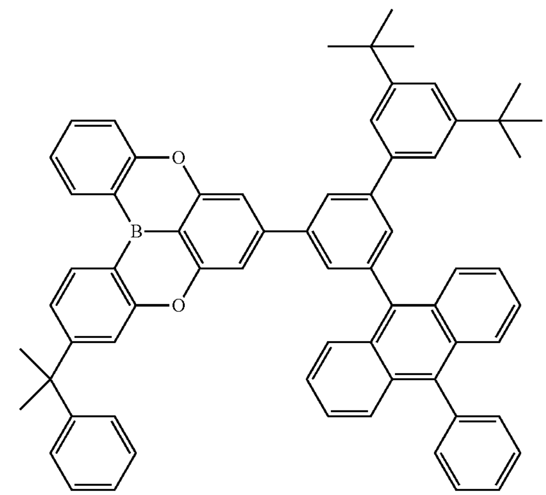
228
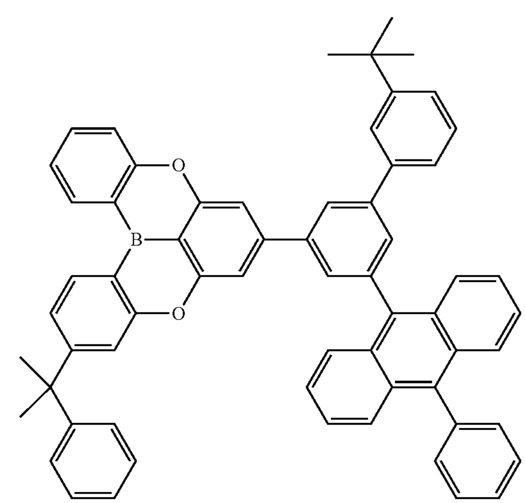
-continued
229
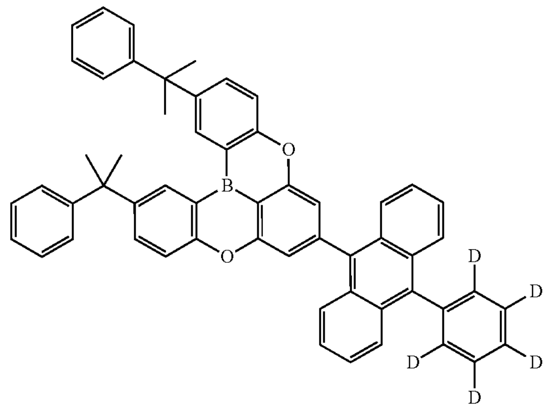
230
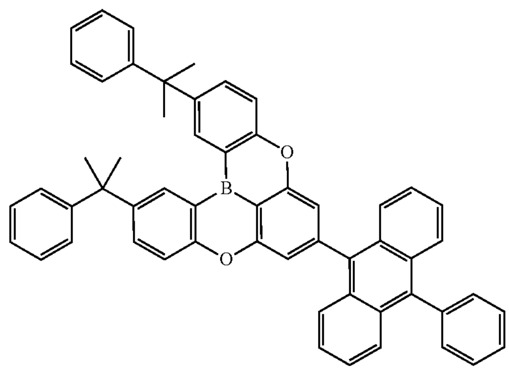
231
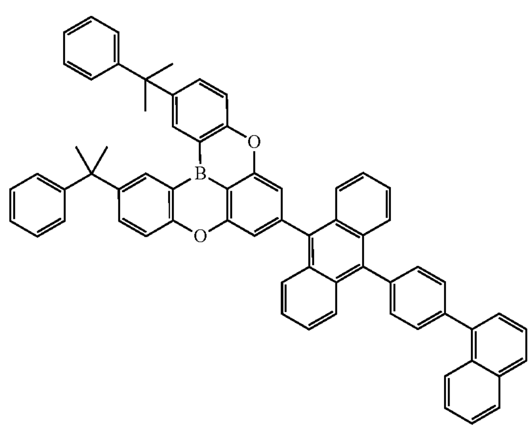

-continued
232
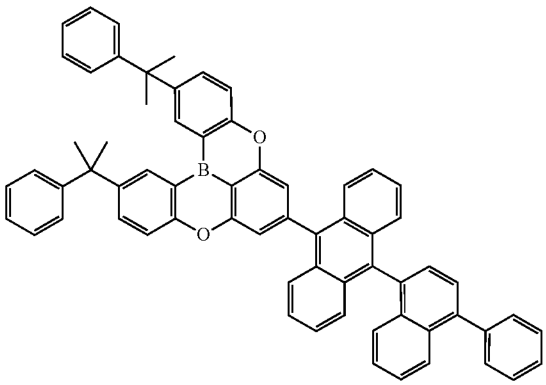
233
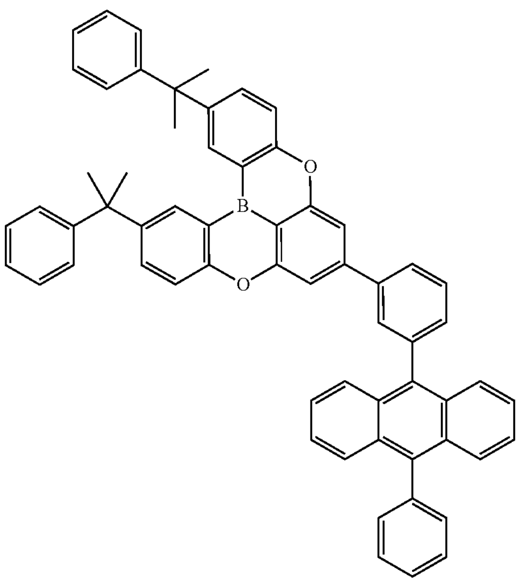
234
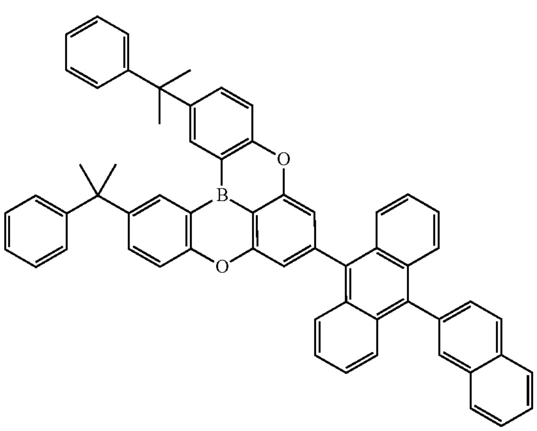
-continued
235
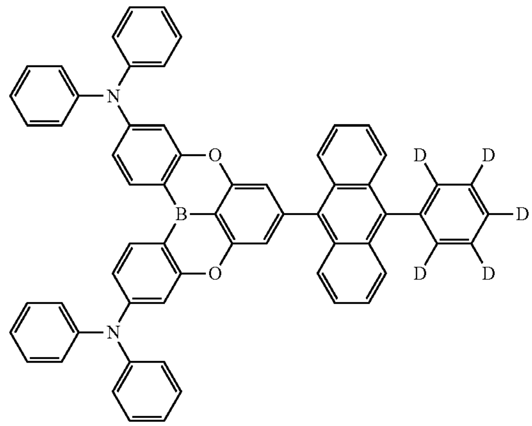
236
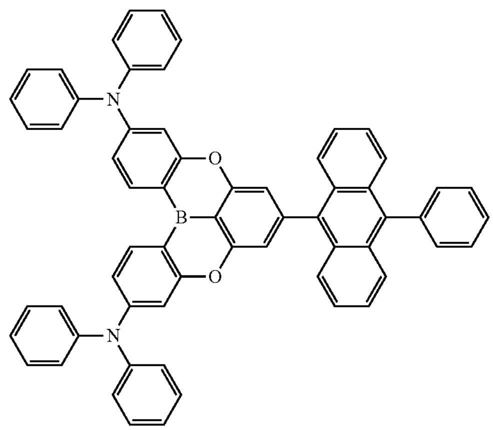
237
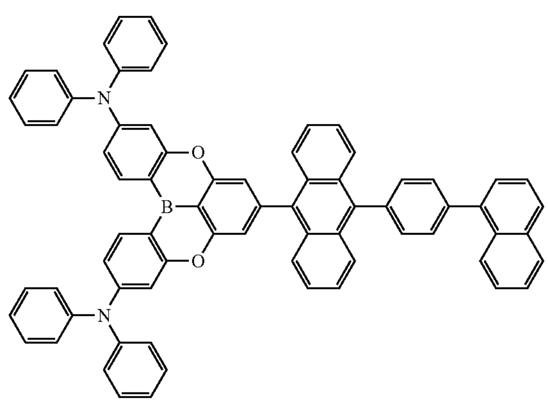

-continued
238
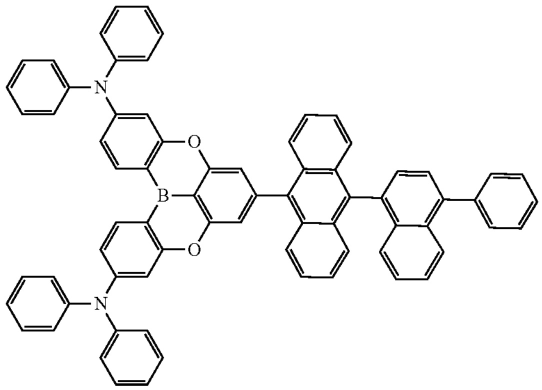
239
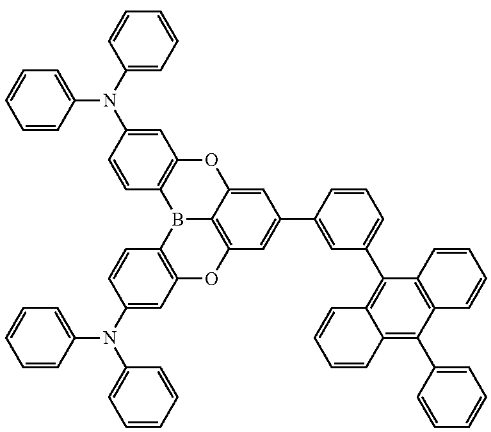
240
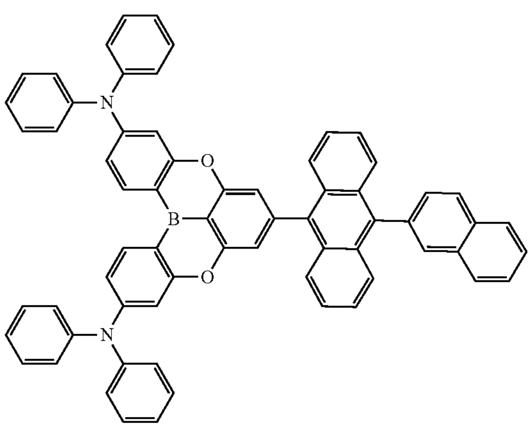
-continued
241
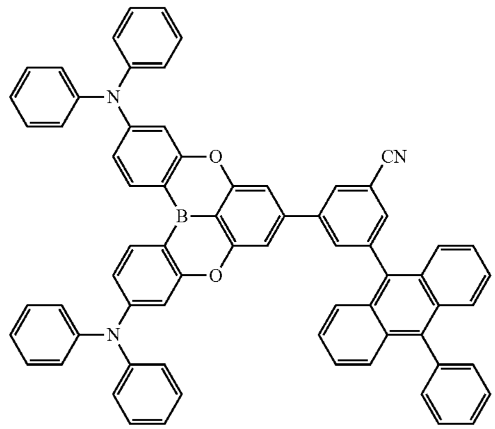
242
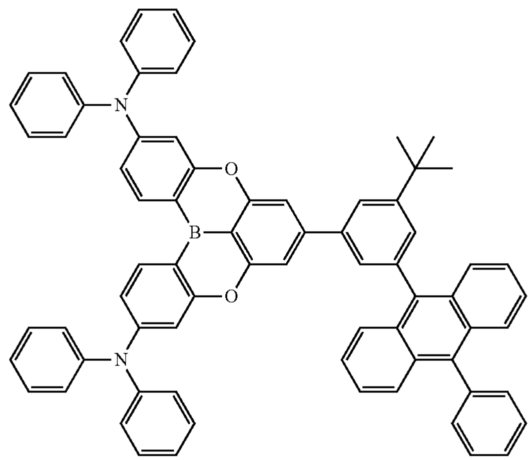
243
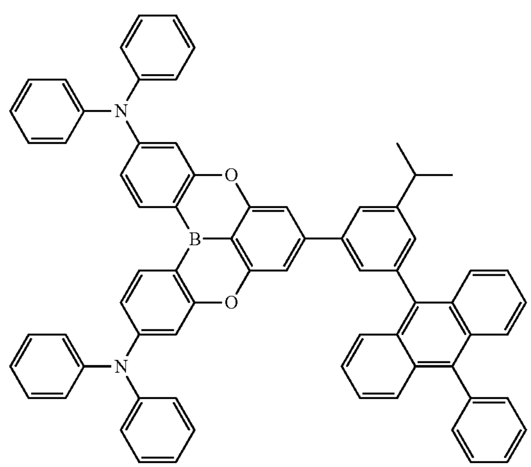

-continued
244
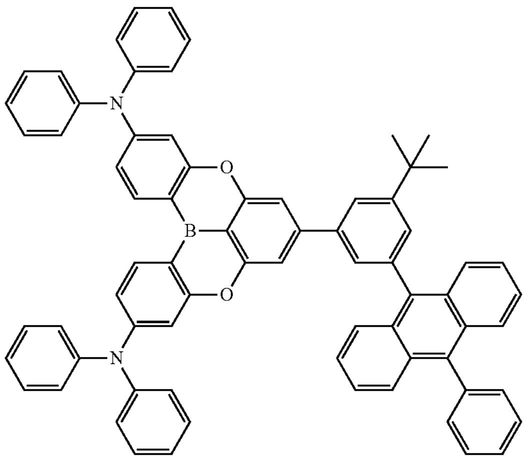
245
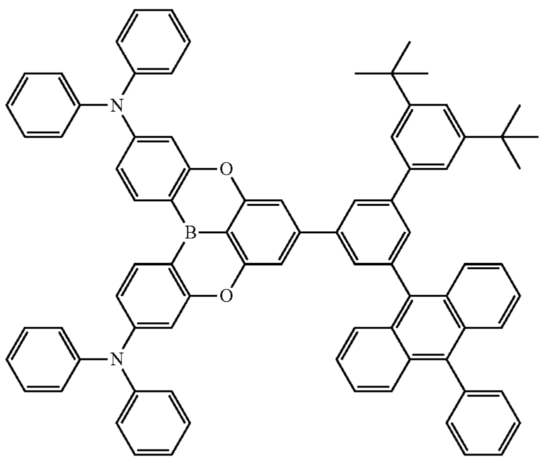
246
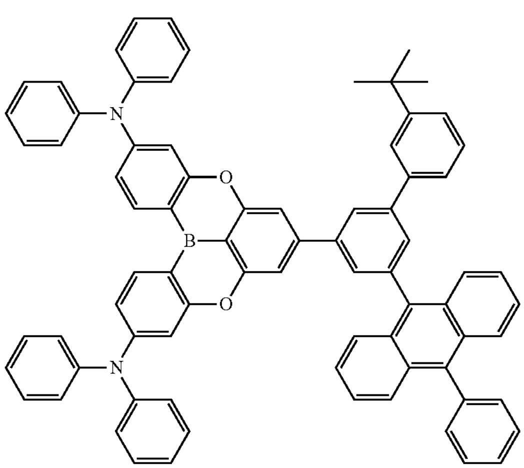
-continued
247
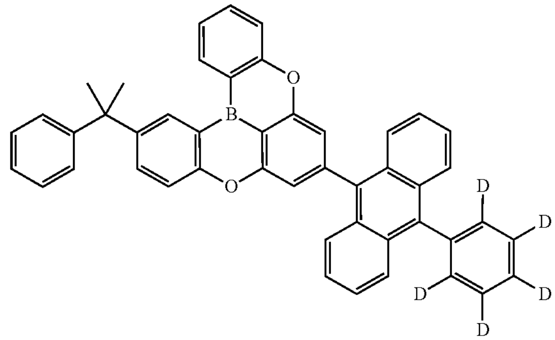
248
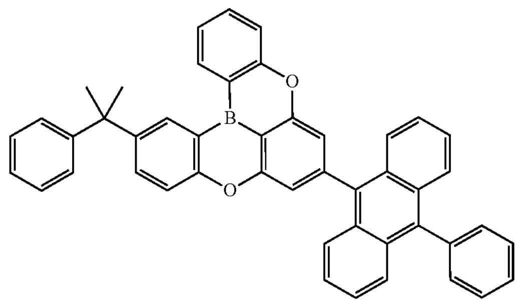
249
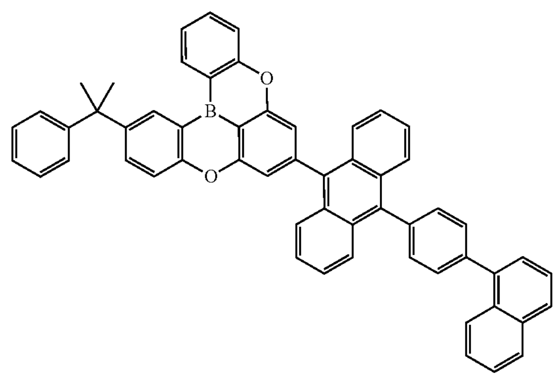
250
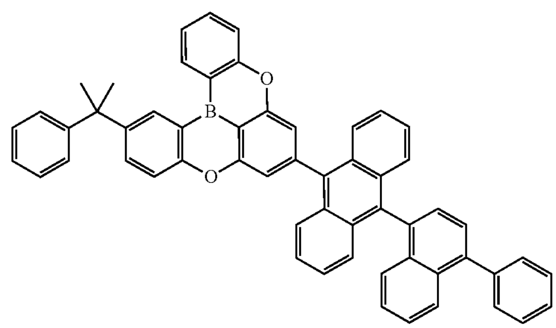

-continued
251
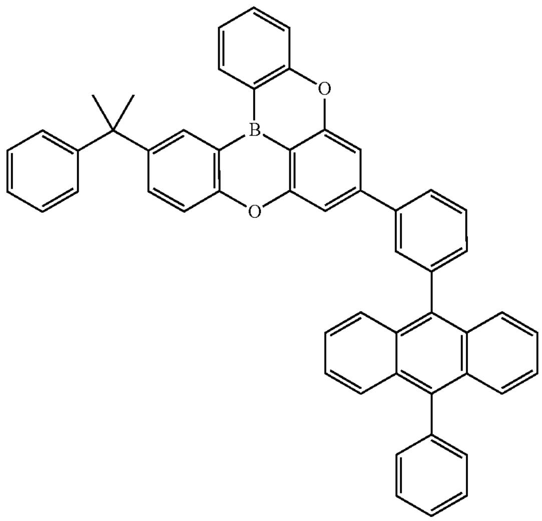
252
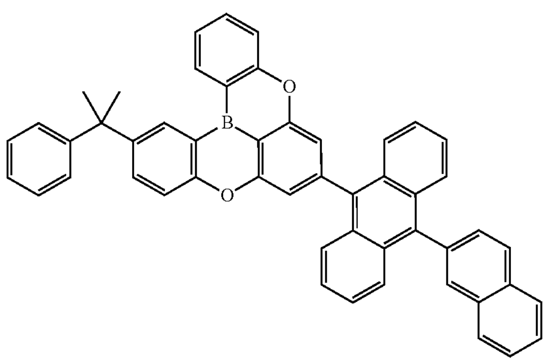
253
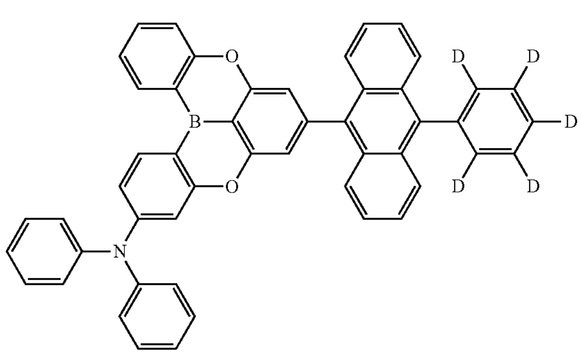
-continued
254
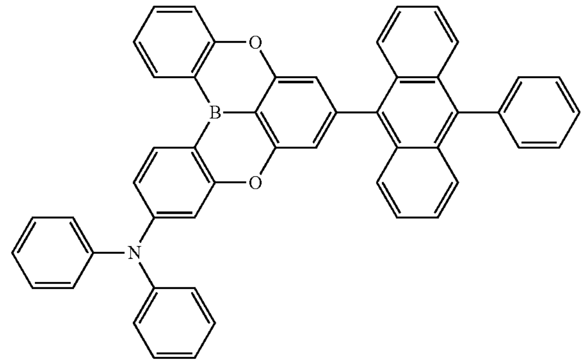
255
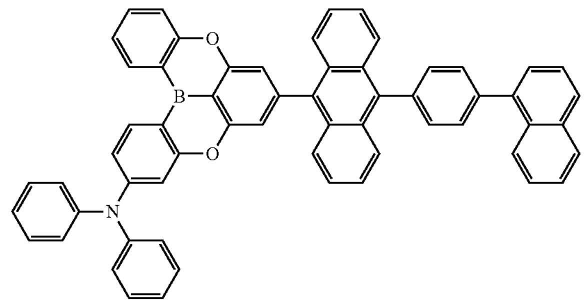
256
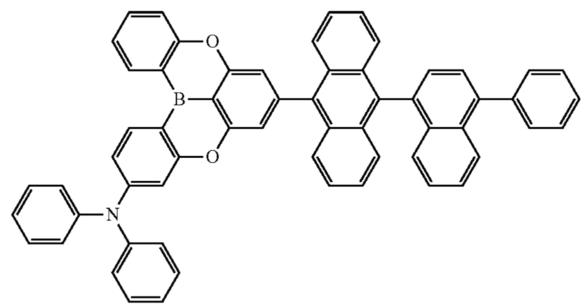
257
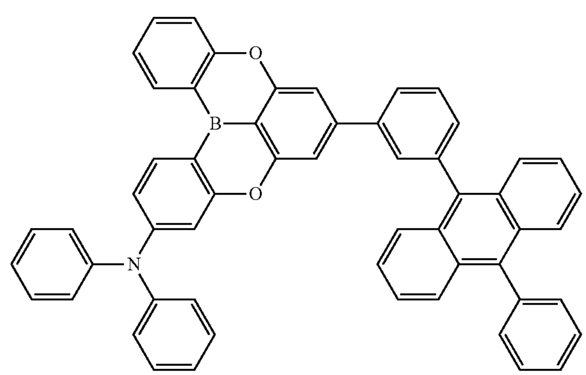

-continued
258
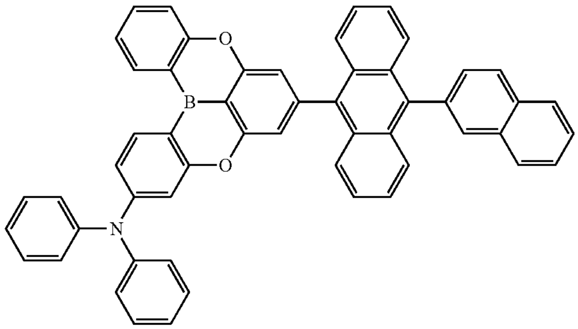
259
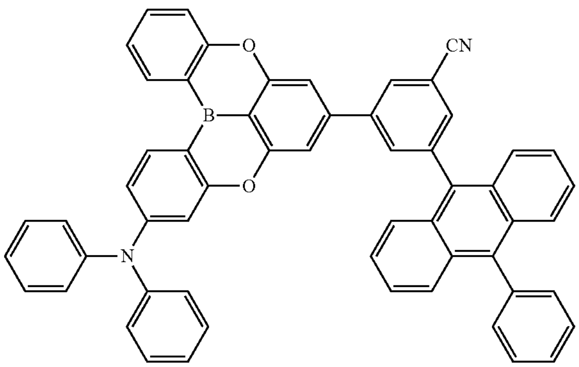
260
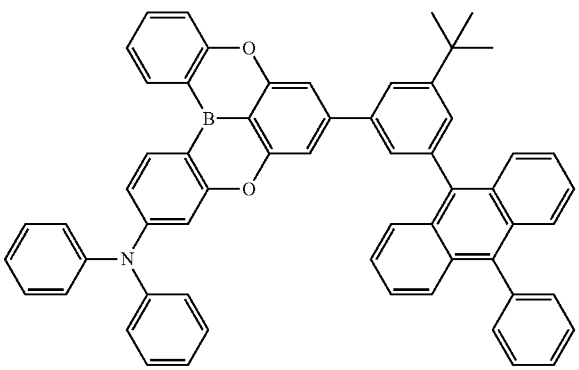
261
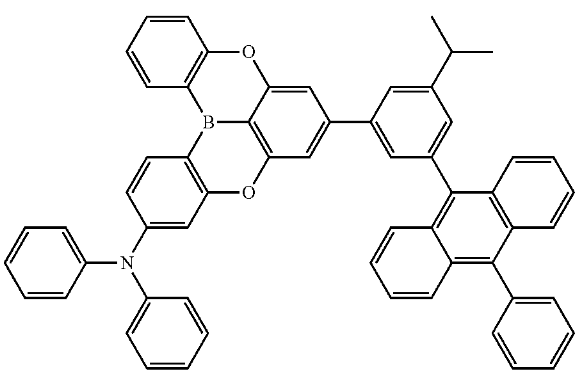
-continued
262
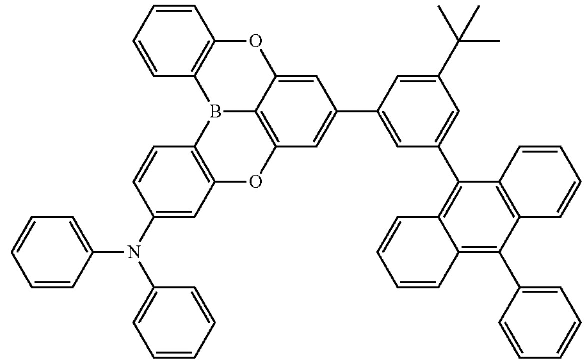
263
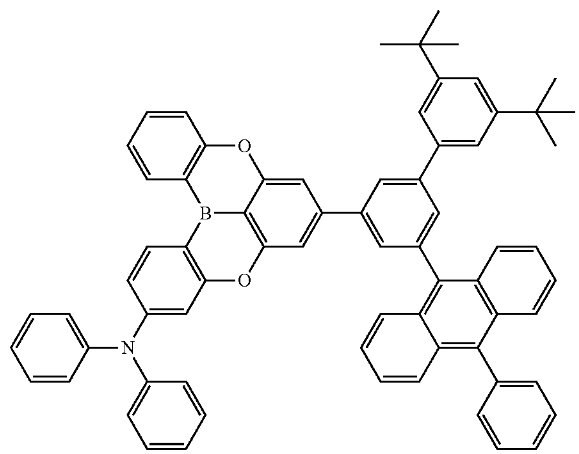
264
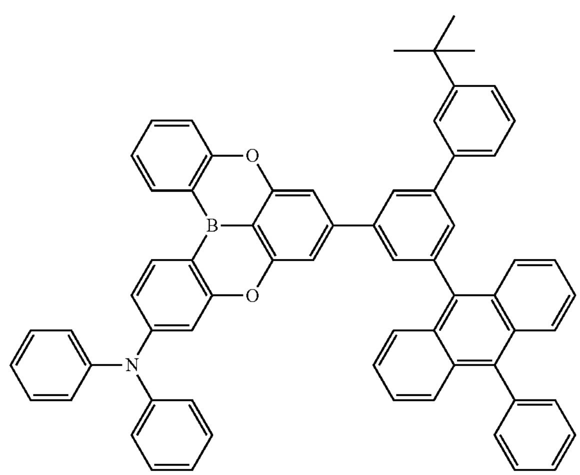

-continued
265
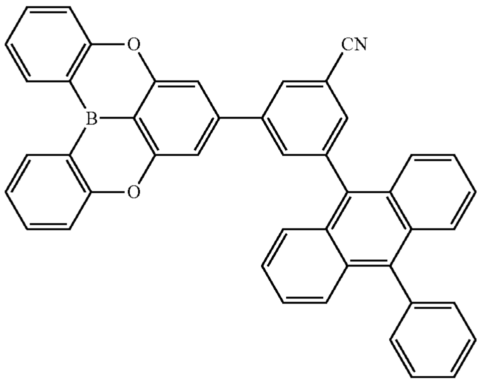
266
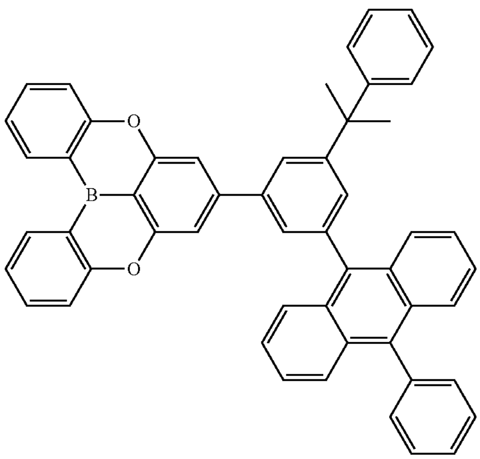
267
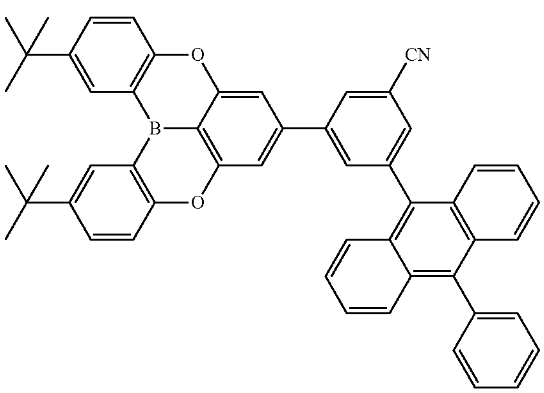
-continued
268
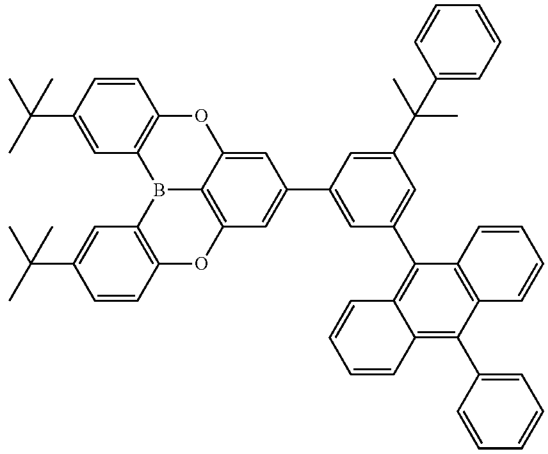
269
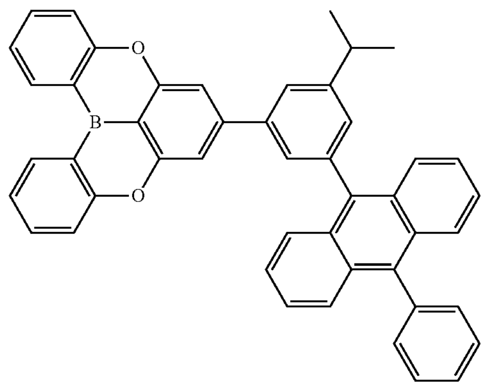
270
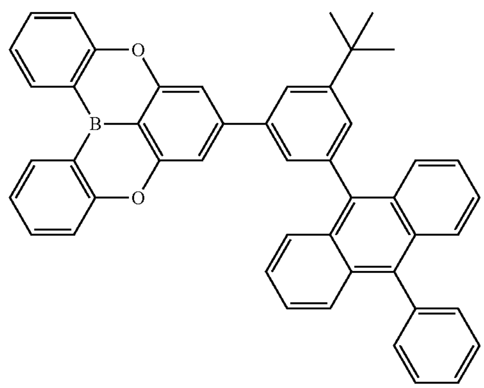
271
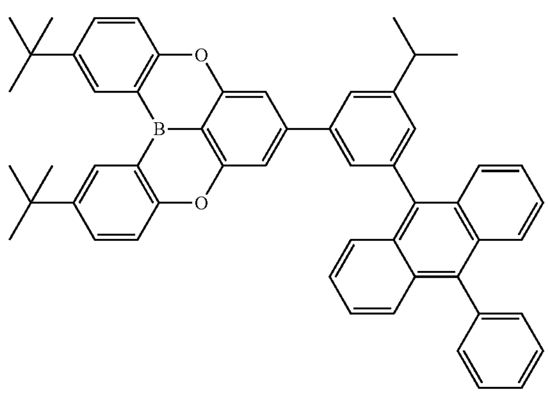

-continued
272
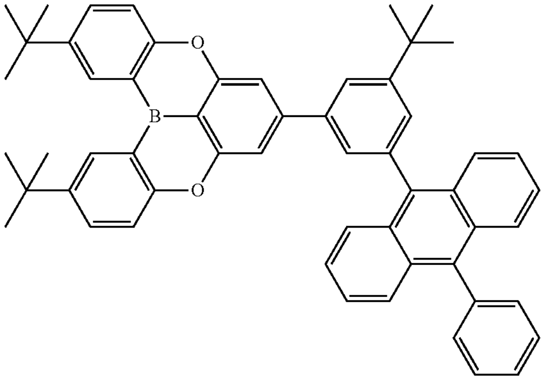
273
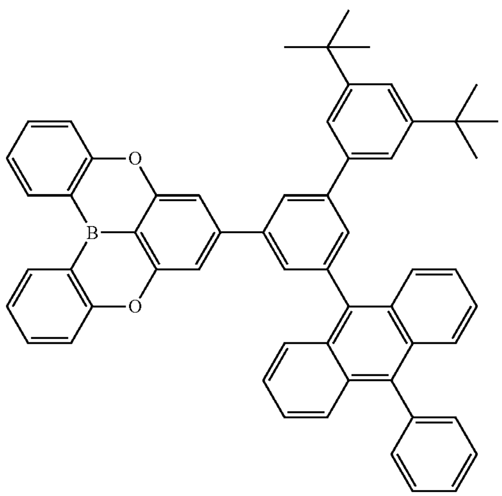
274
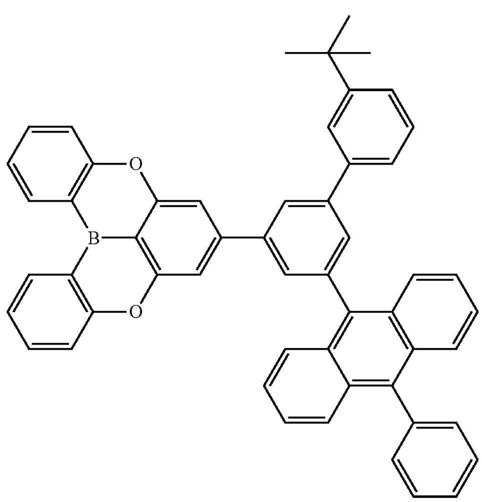
-continued
275
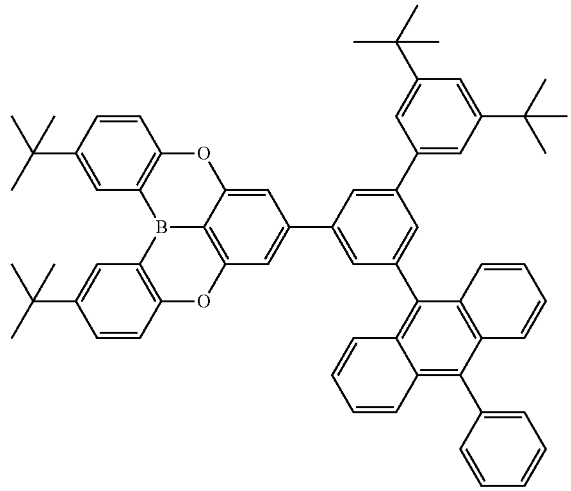
276
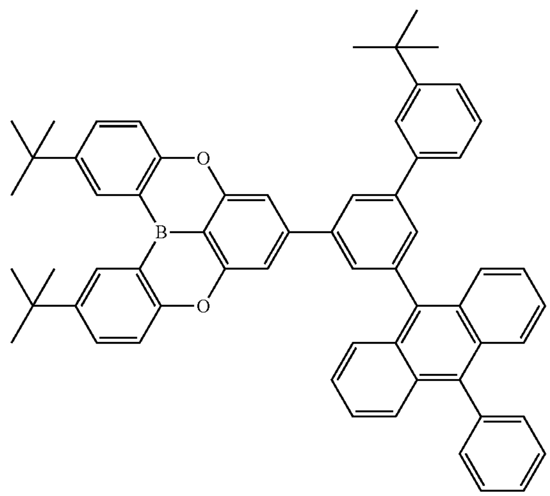
277
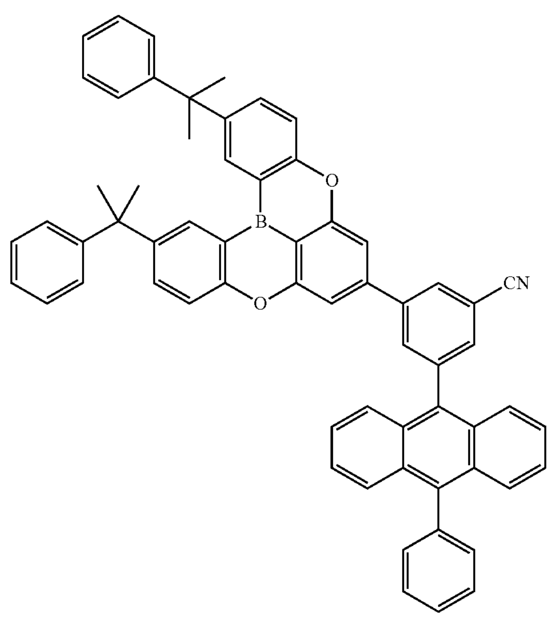

-continued
278
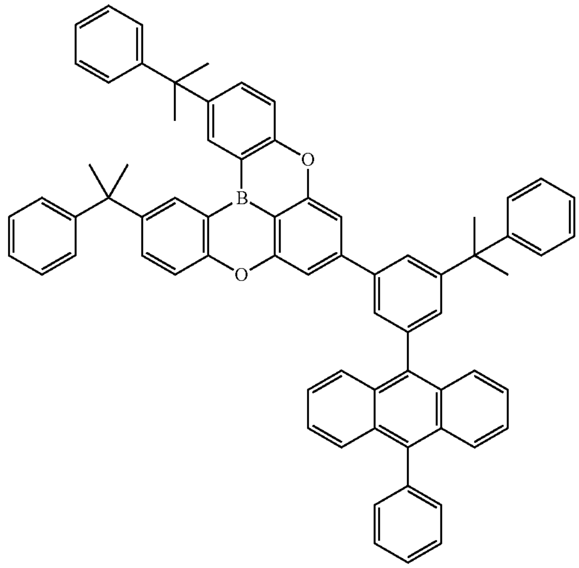
279
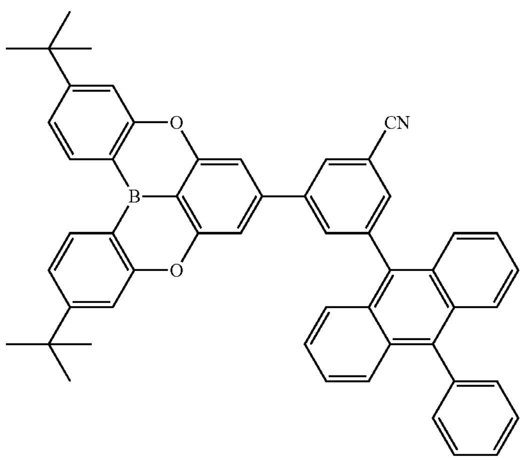
280
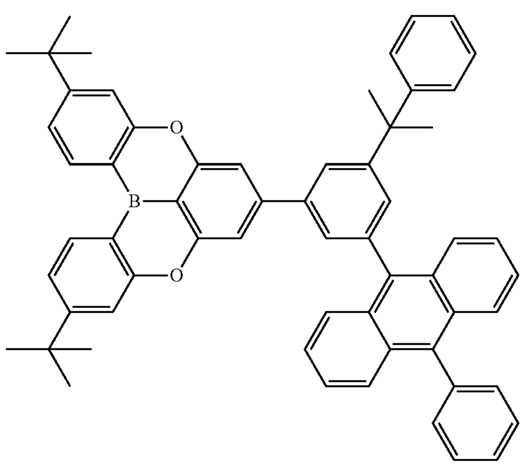
-continued
281
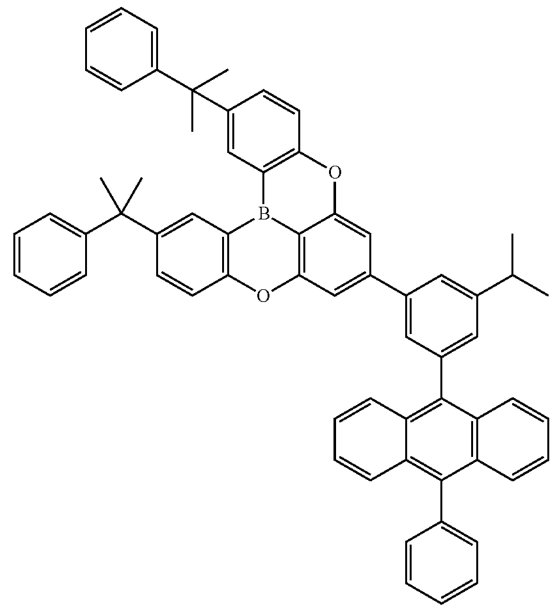
282
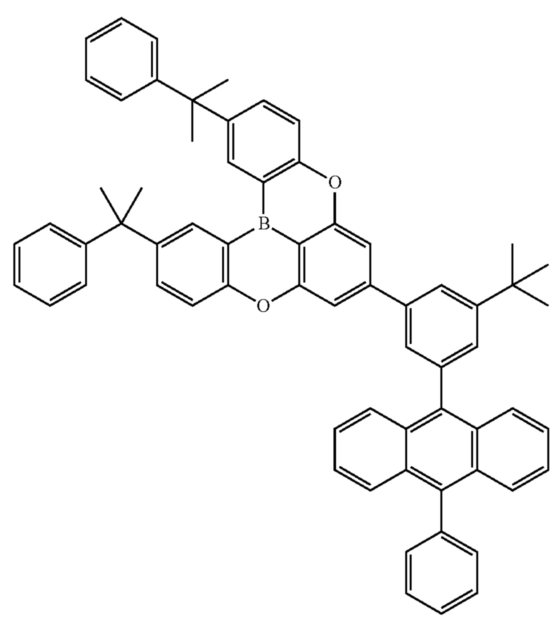

-continued
283
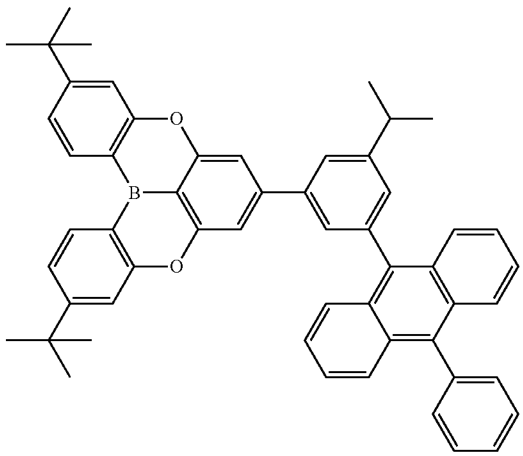
284
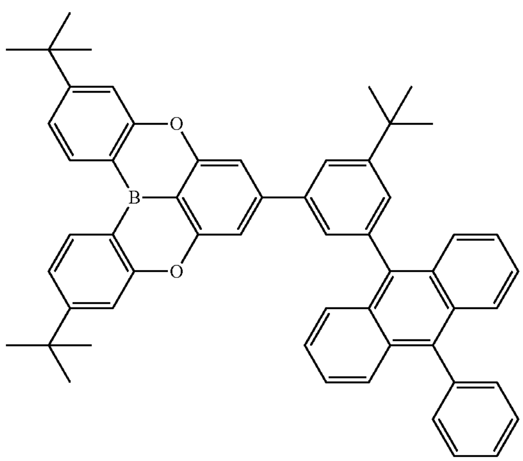
285
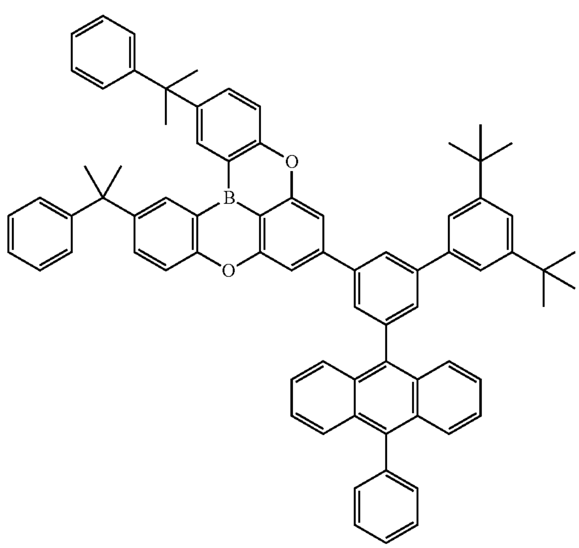
-continued
286
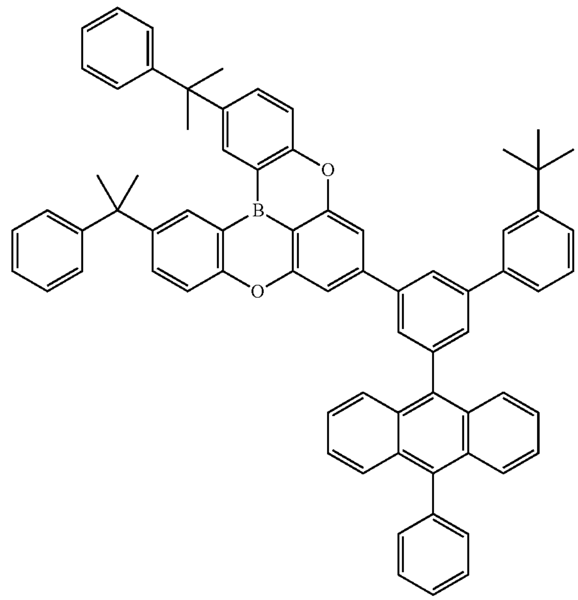
287
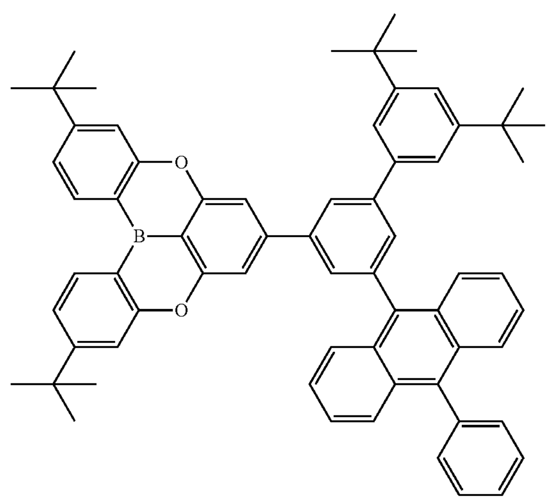
288
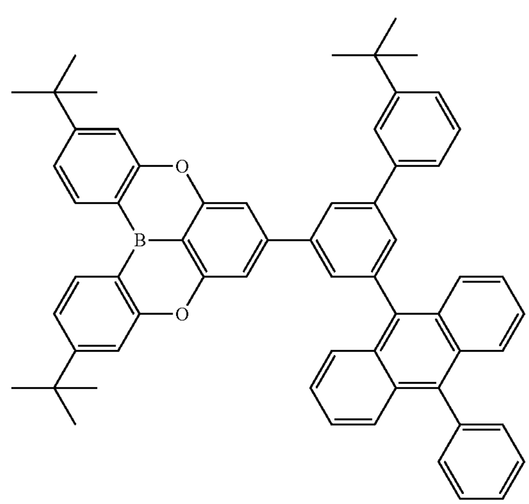

289
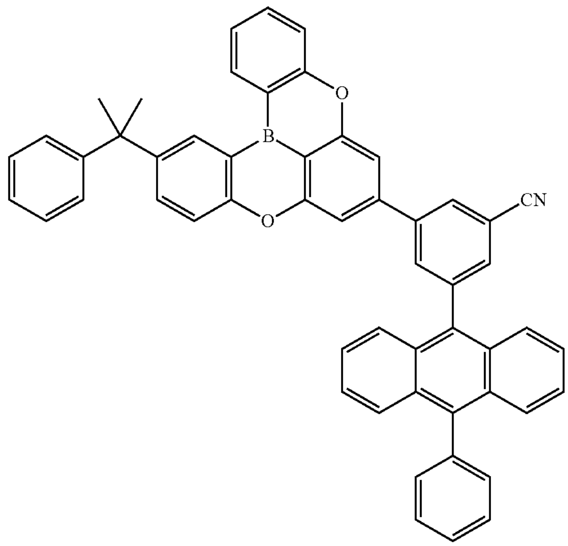
290
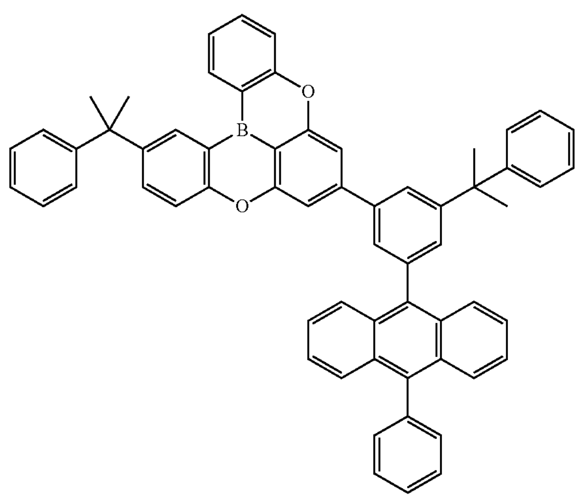
291
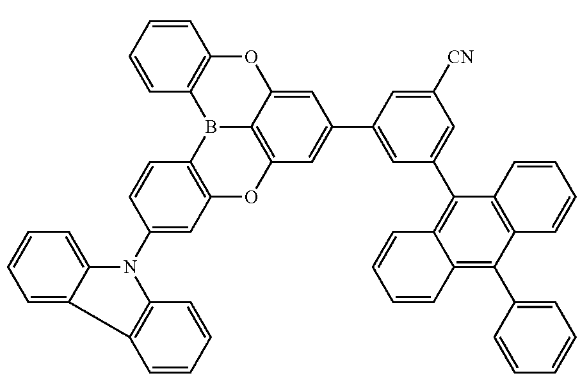
292
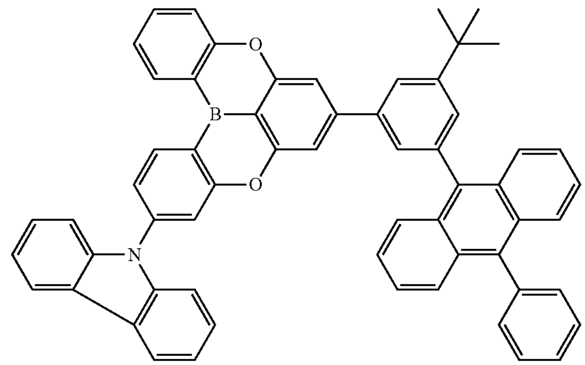
293
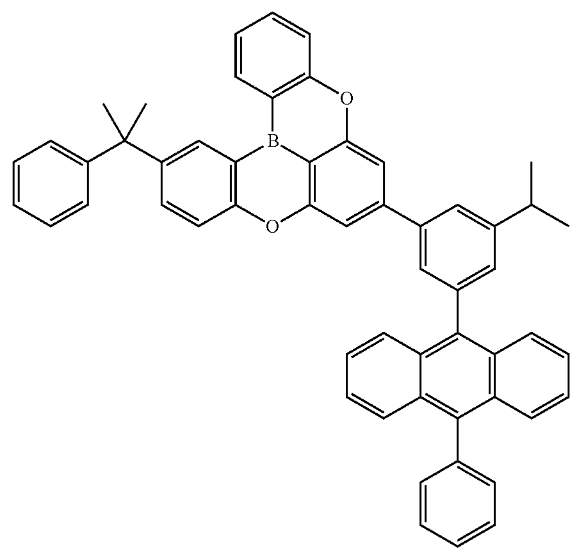
294
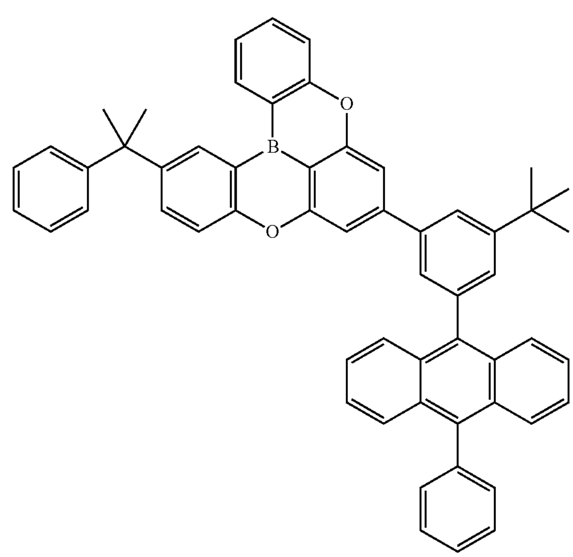

-continued
295
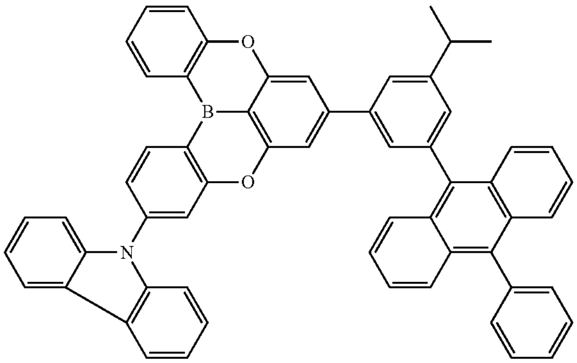
296
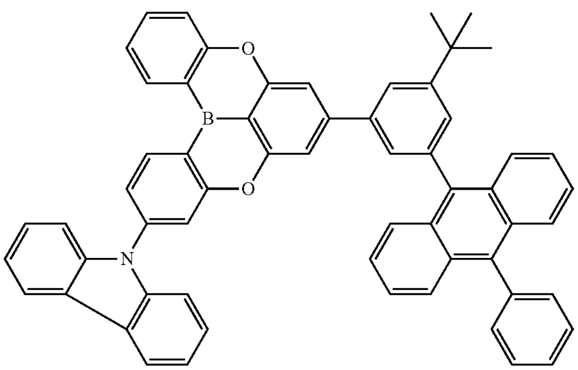
297
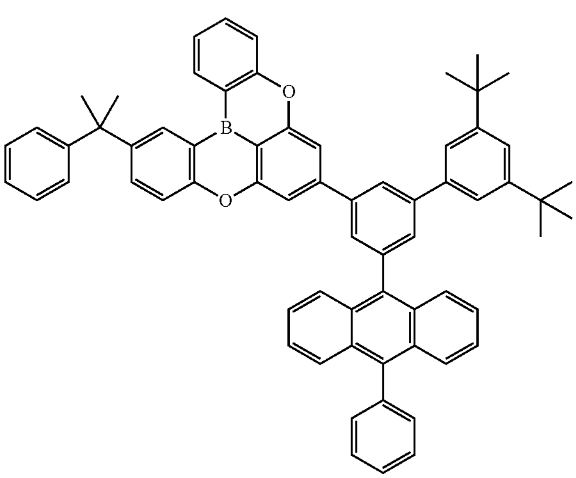
-continued
298
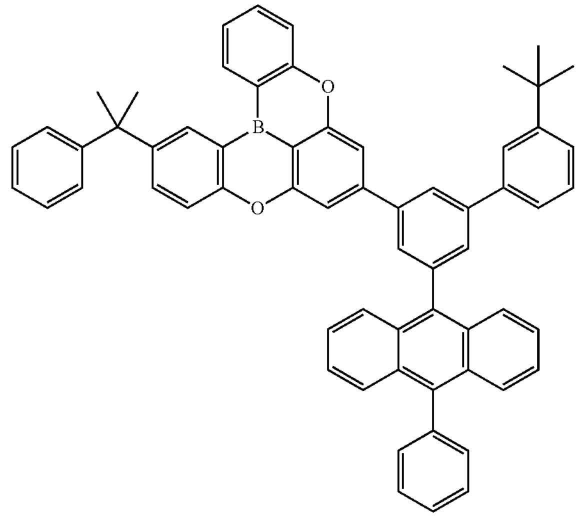
299
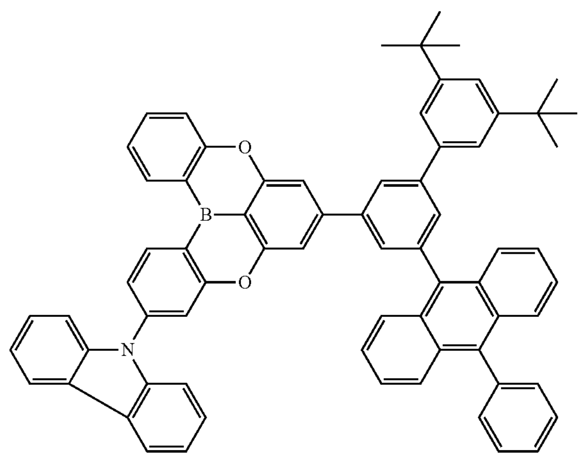
300
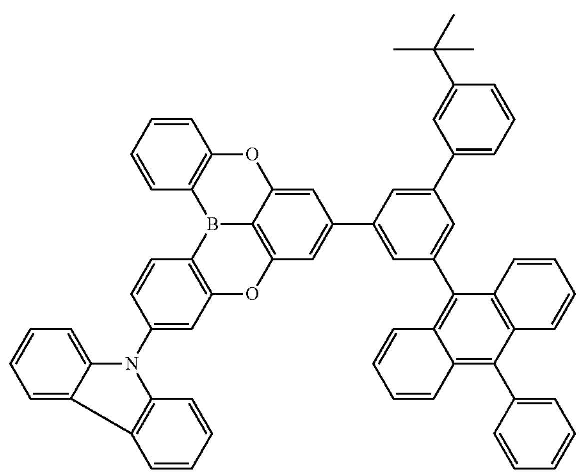

-continued
301
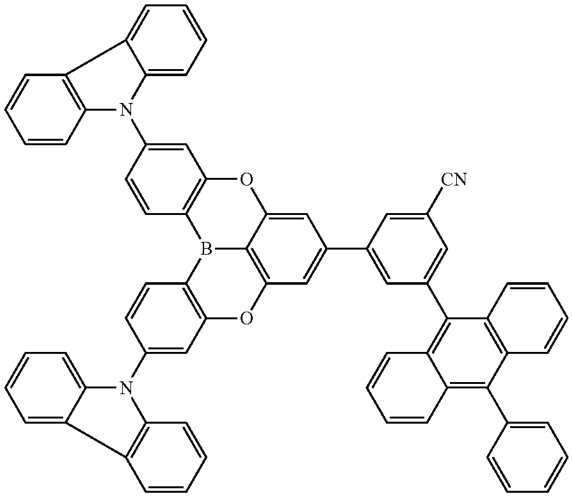
302
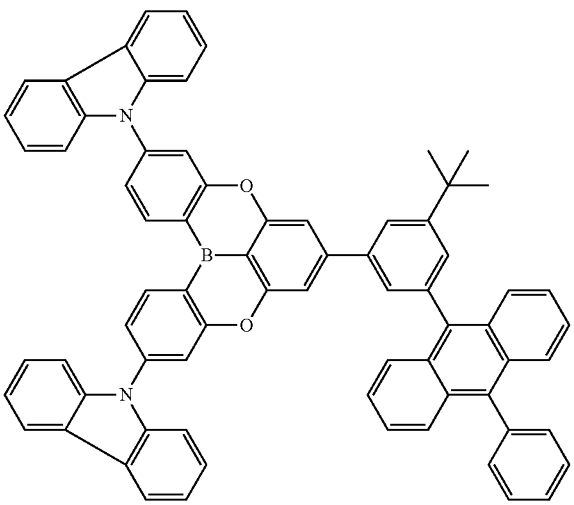
303
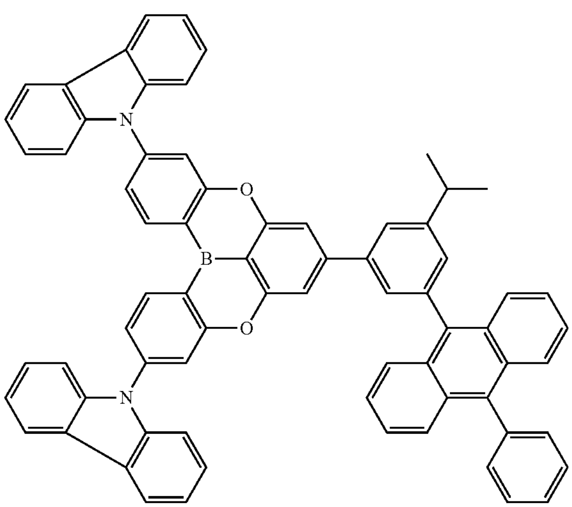
-continued
304
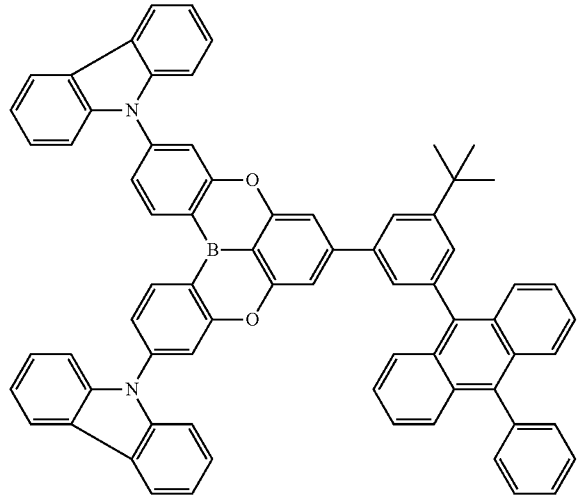
305
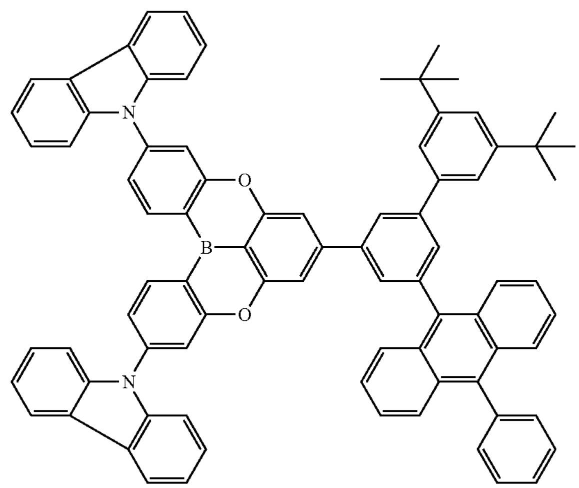
306
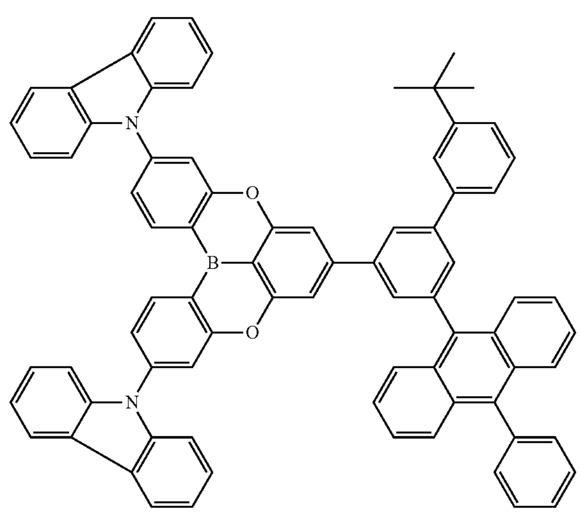

-continued
307
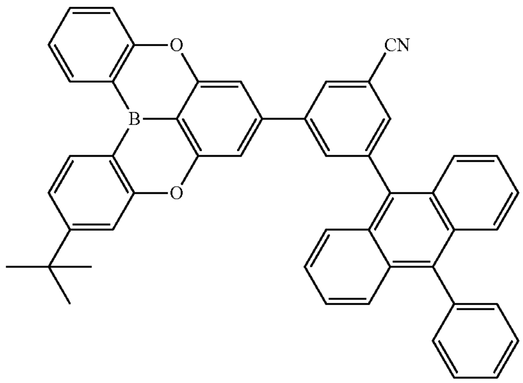
308
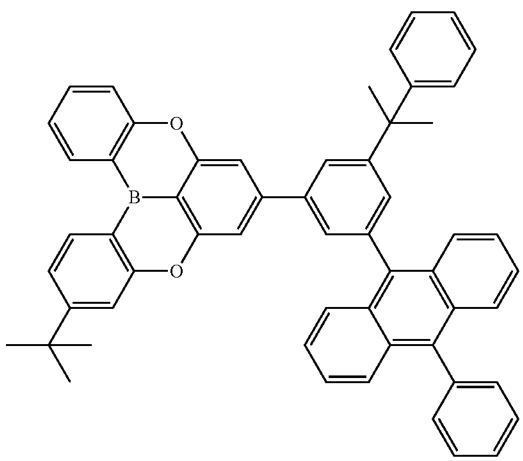
309
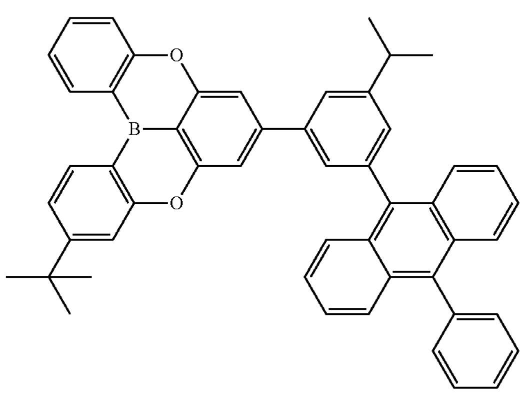
-continued
310
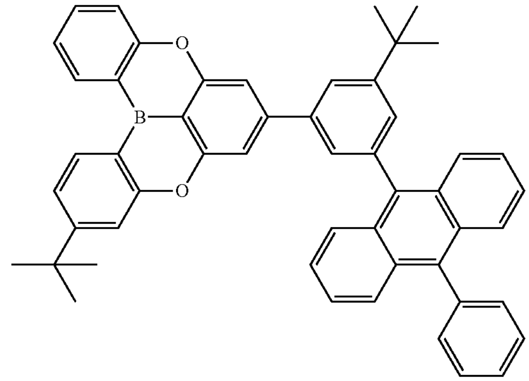
311
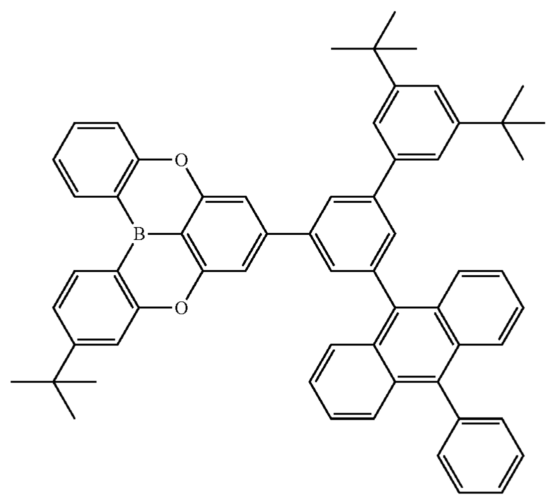
312
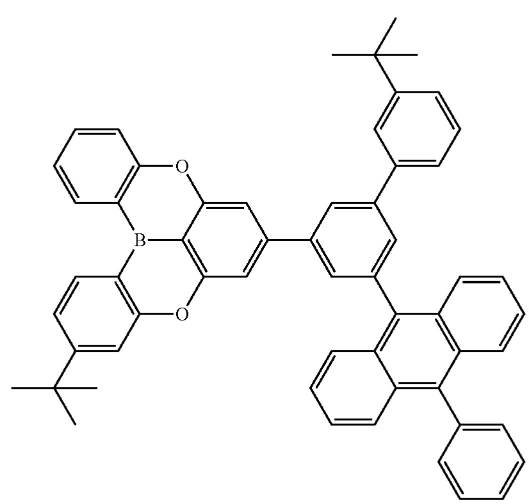

313
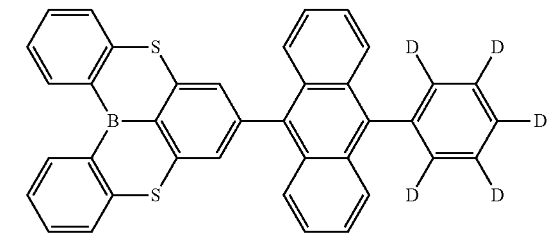
314
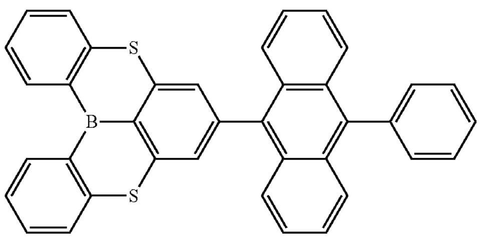
315
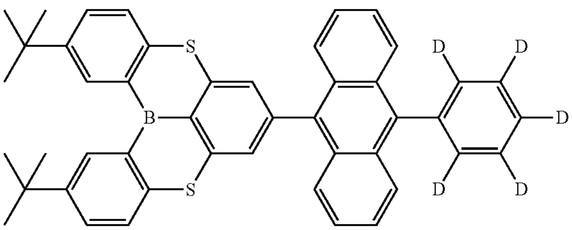
316
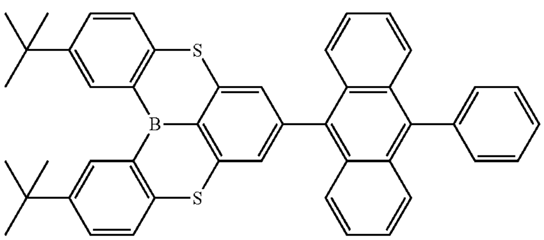
317
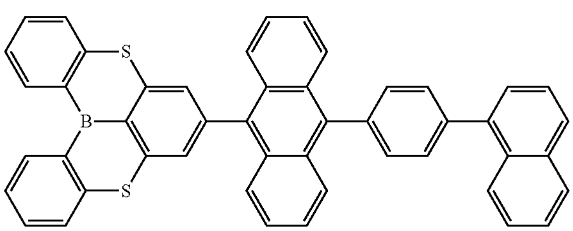
318
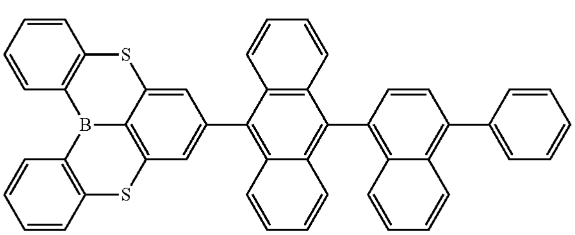
319
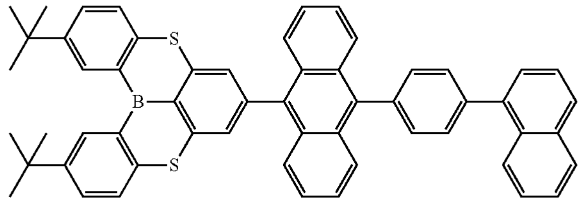
320
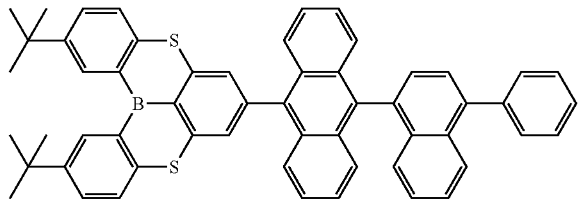
321
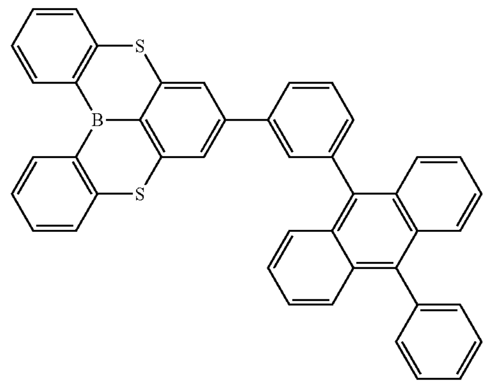
322
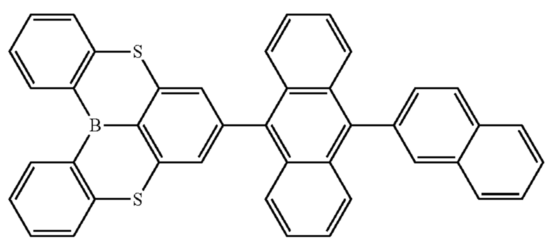
323
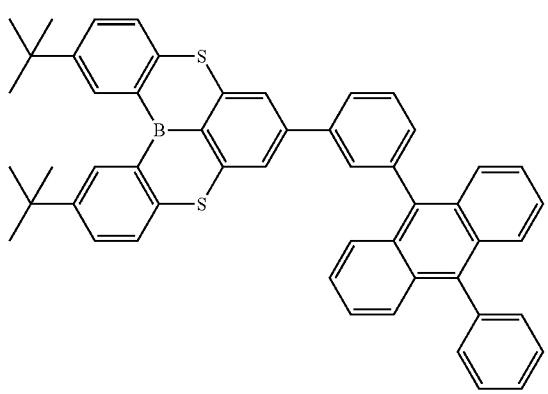

324
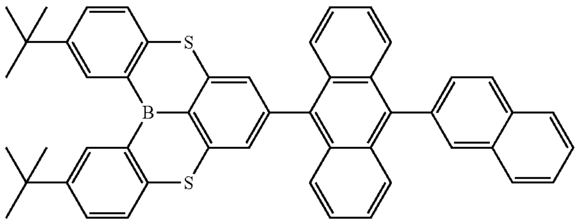
325
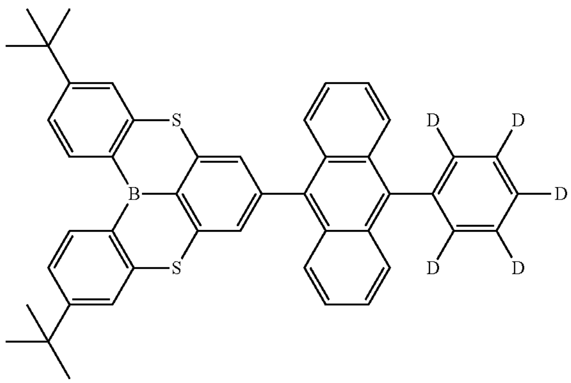
326
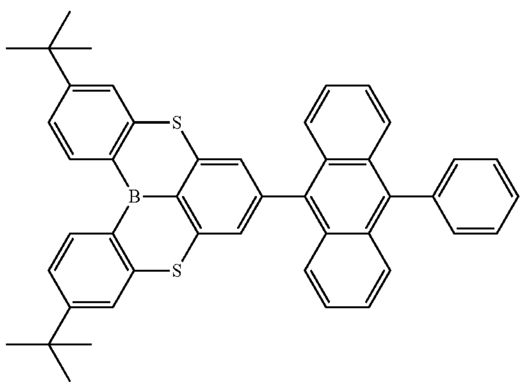
327
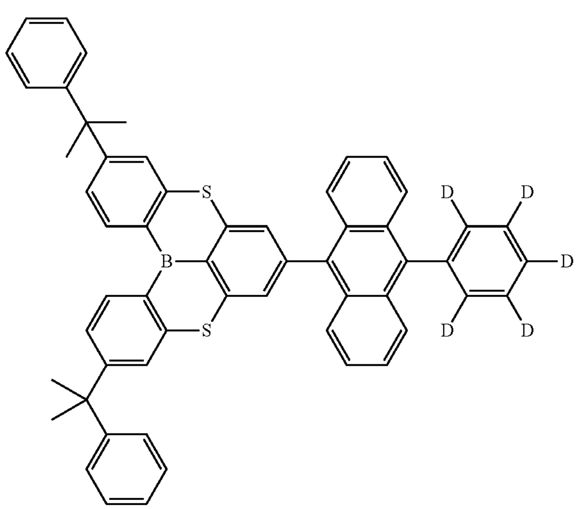
328
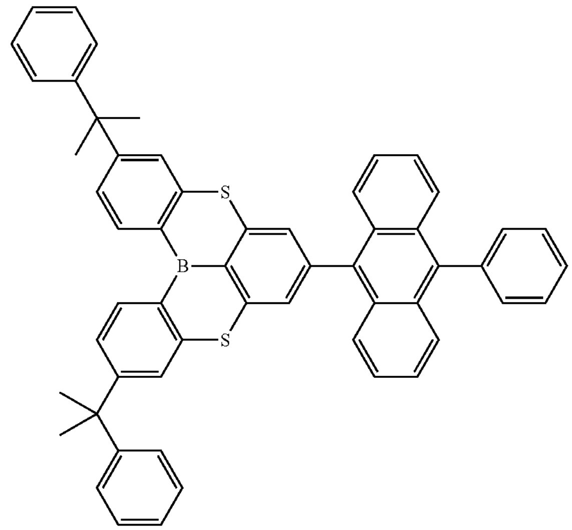
329
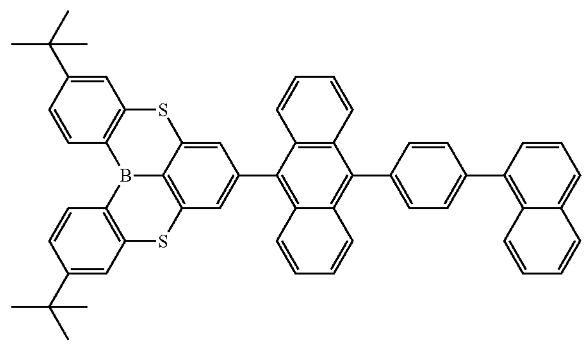
330
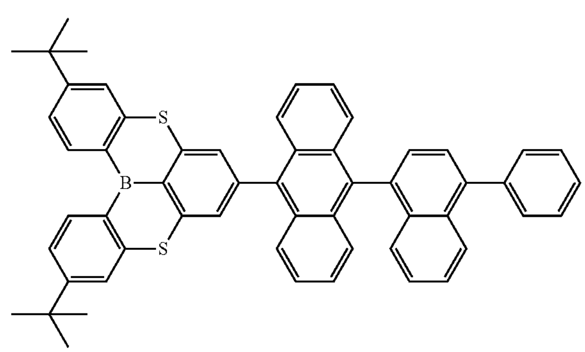

-continued
331
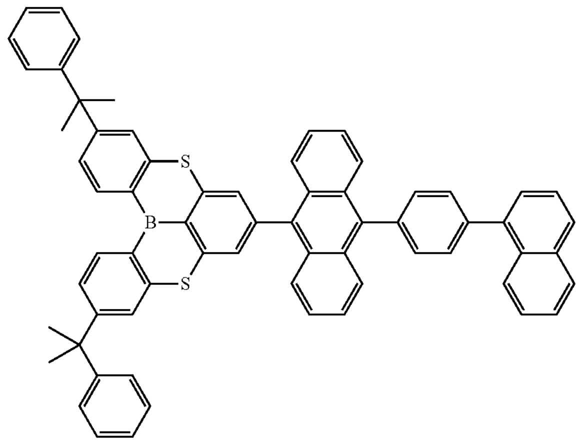
332
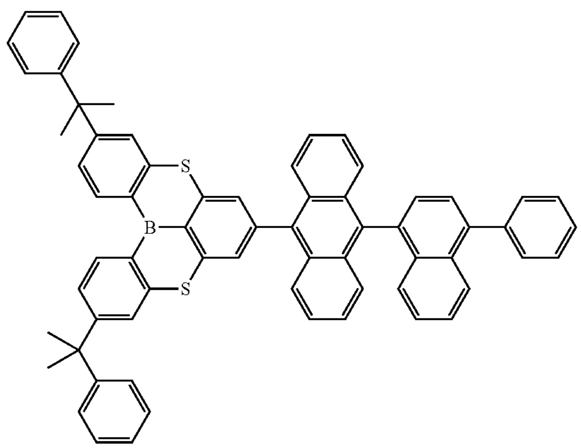
333
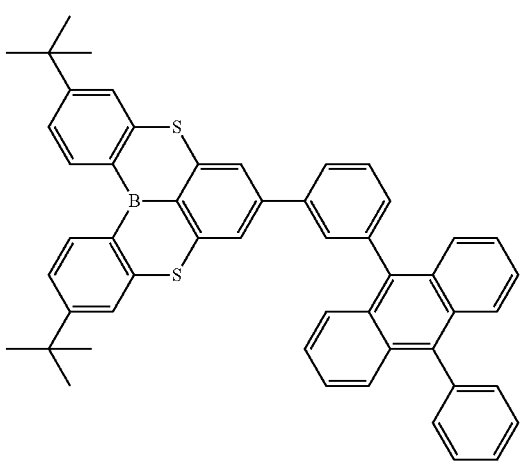
-continued
334
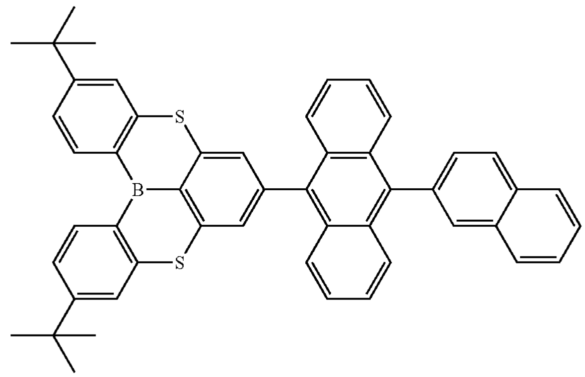
335
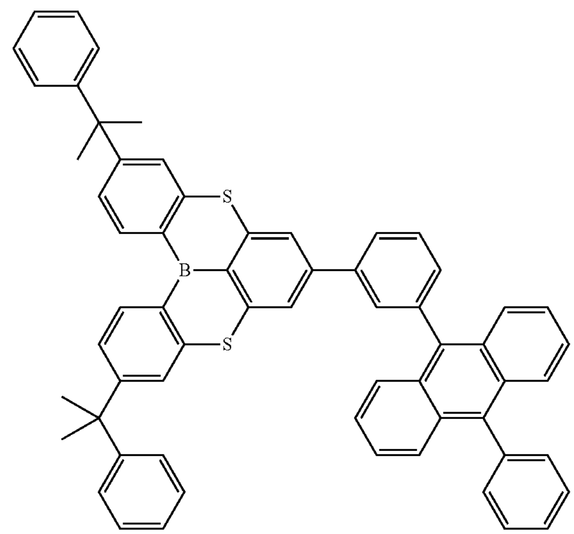
336
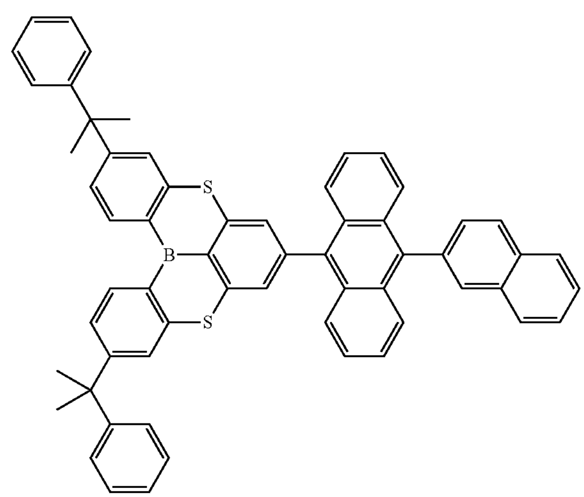

-continued
337
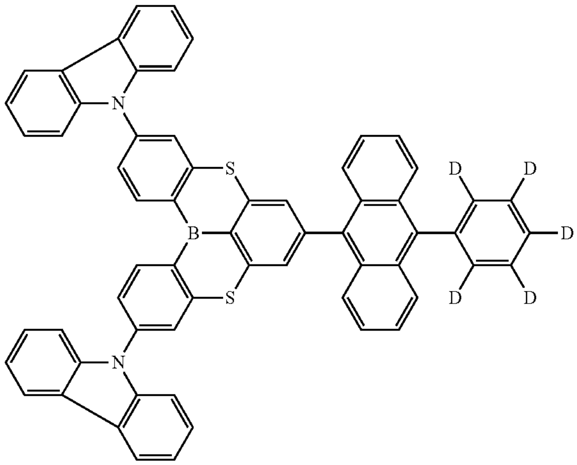
338
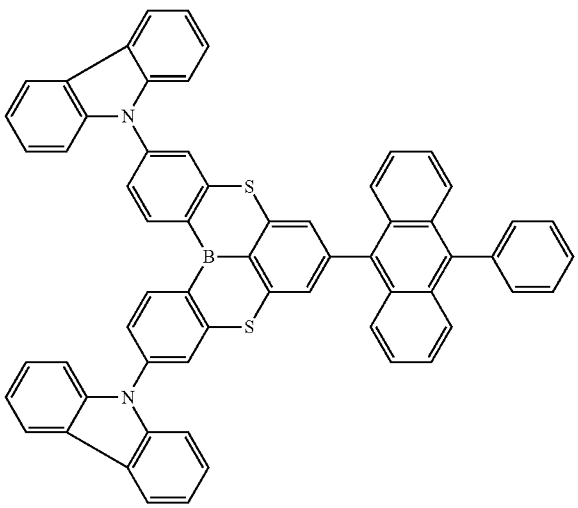
339
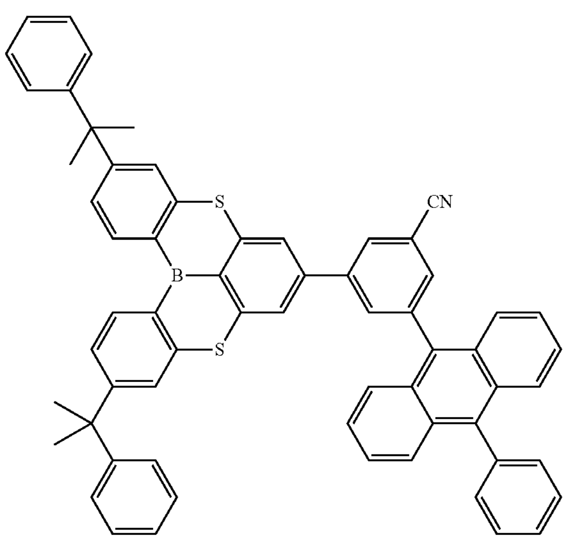
-continued
340
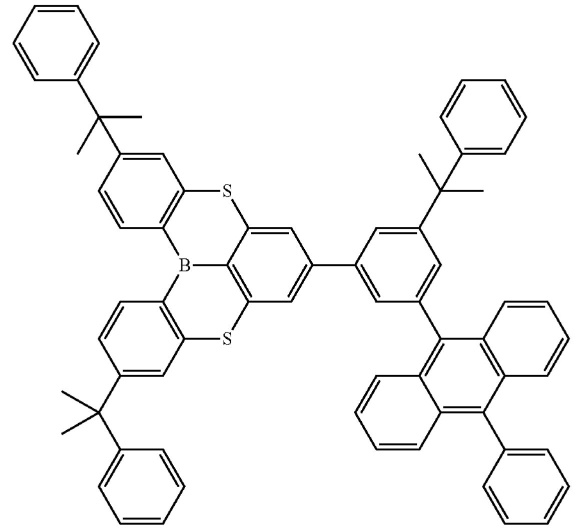
341
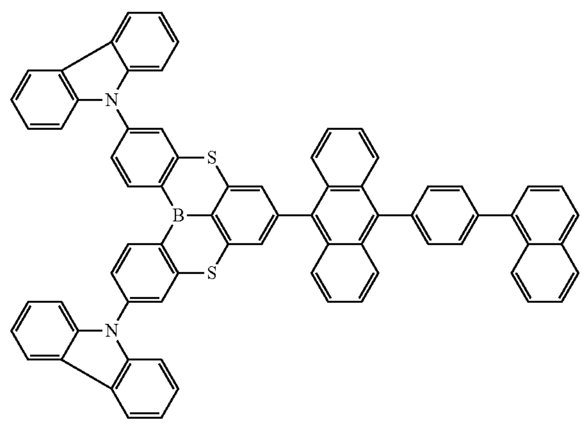
342
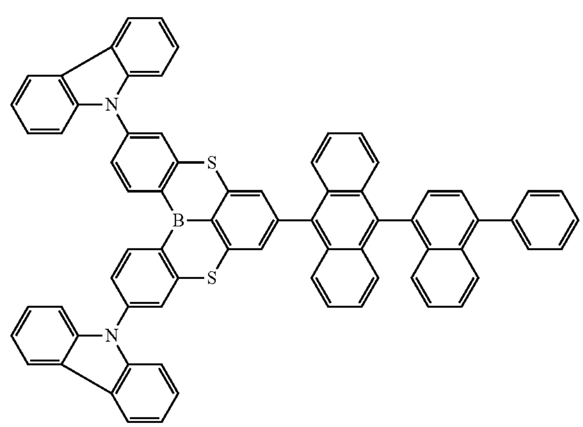

343
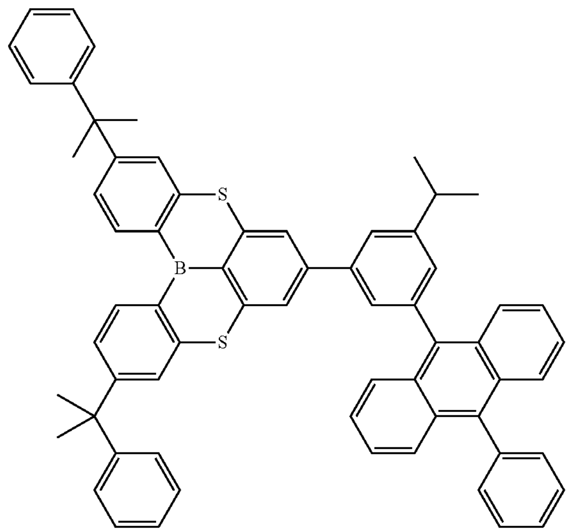
344
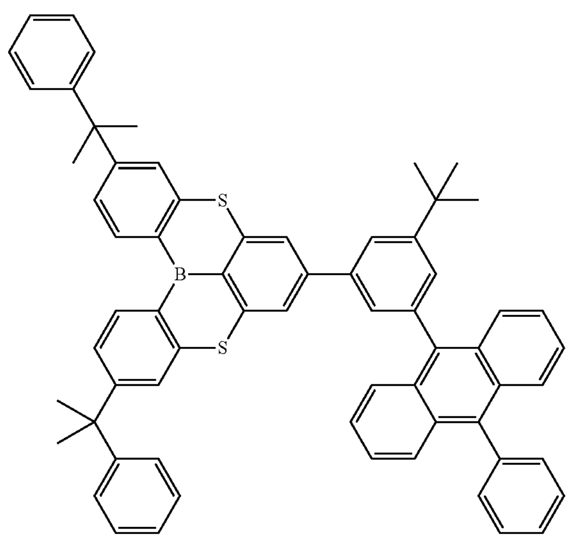
345
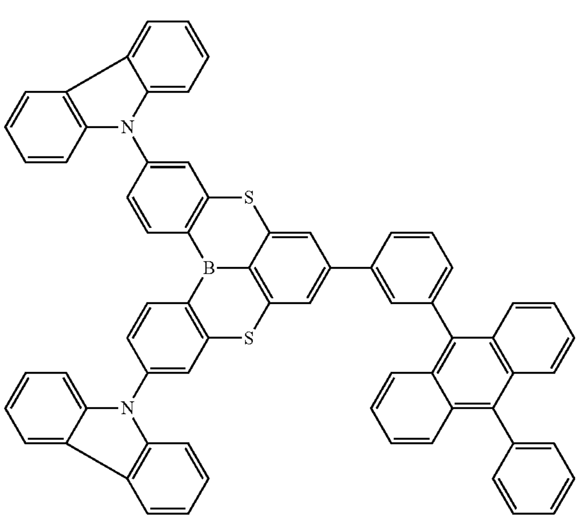
346
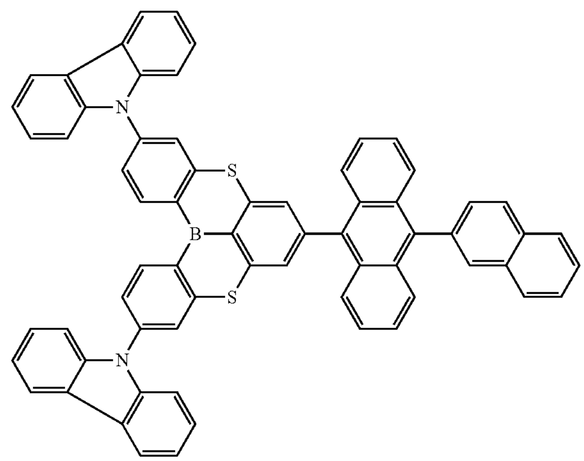
347
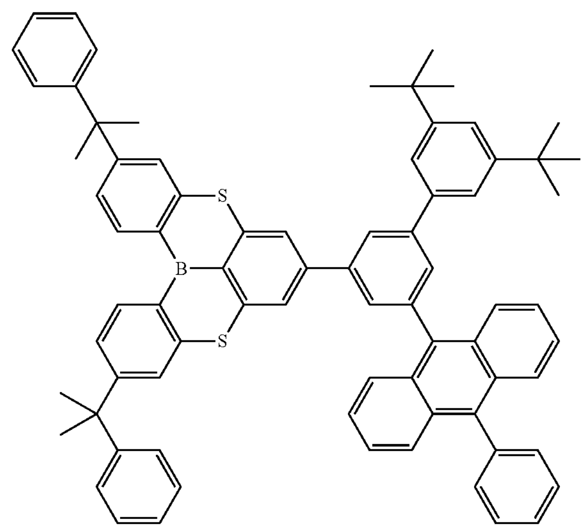
348
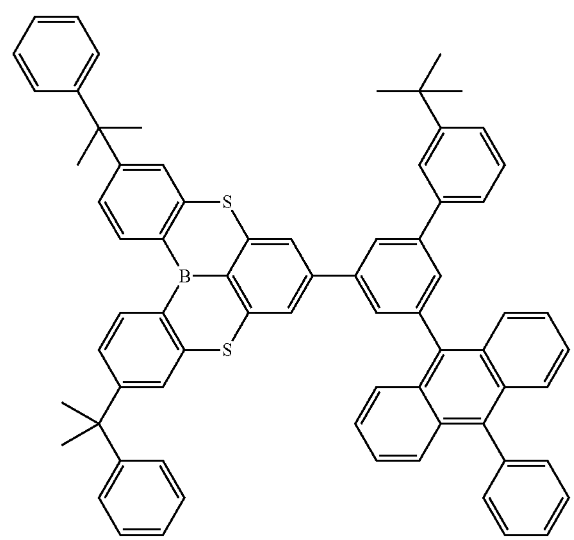

-continued
349
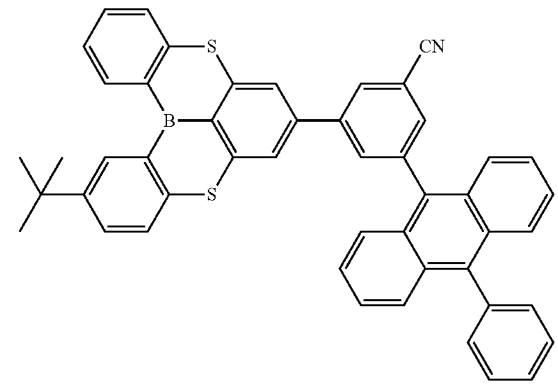
350
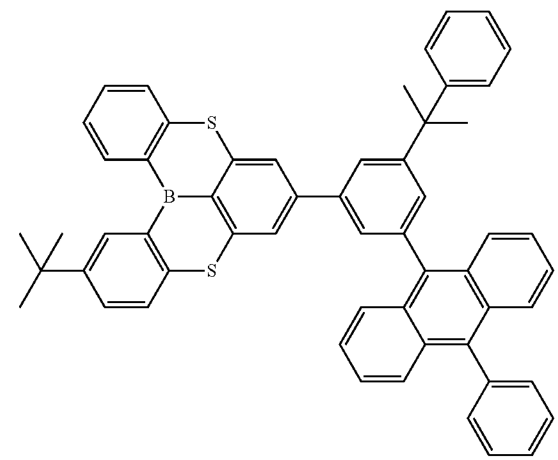
351
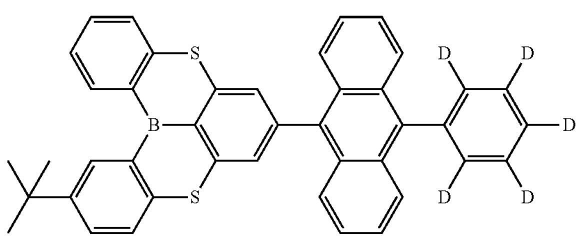
352
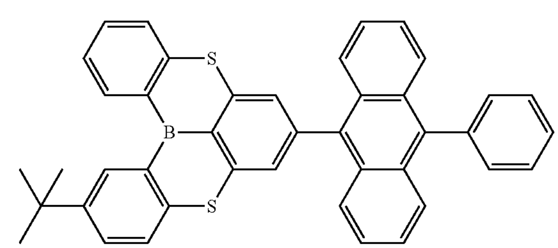
-continued
353
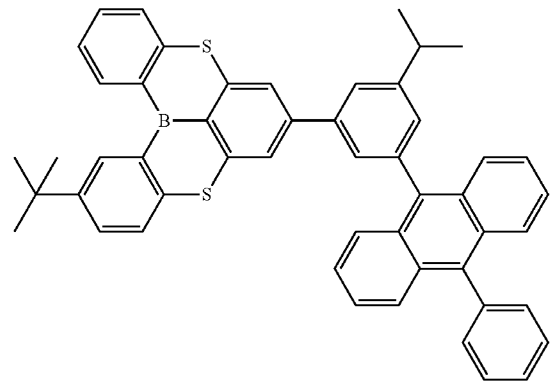
354
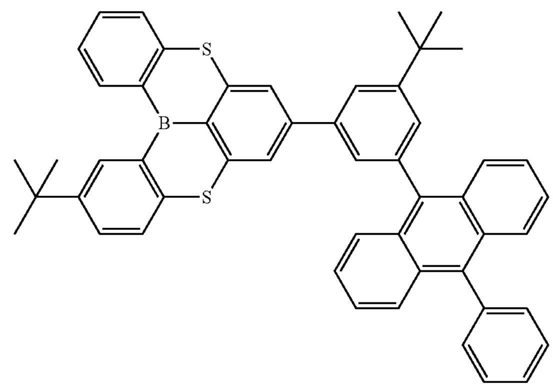
355
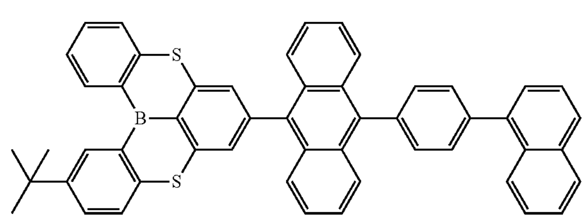
356
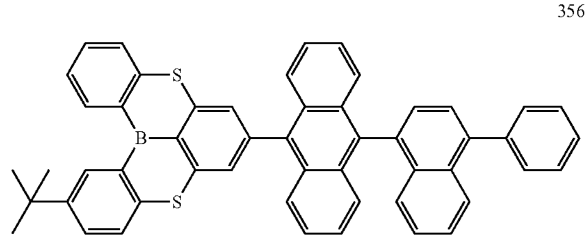

357
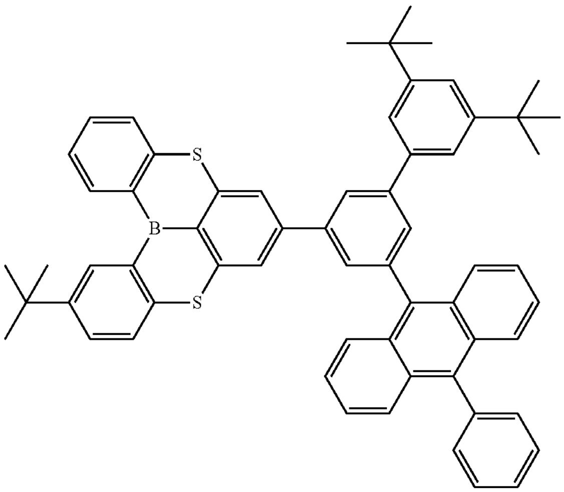
358
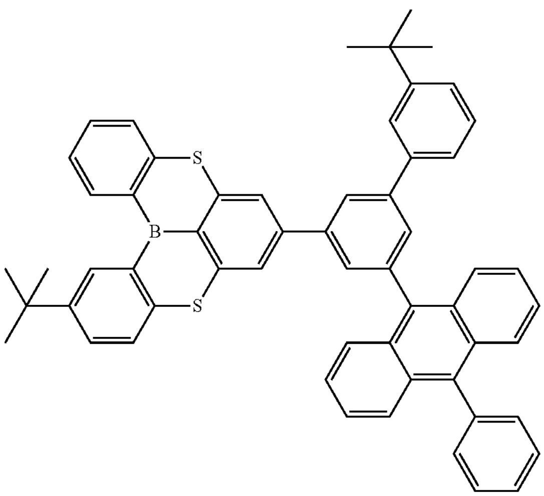
359
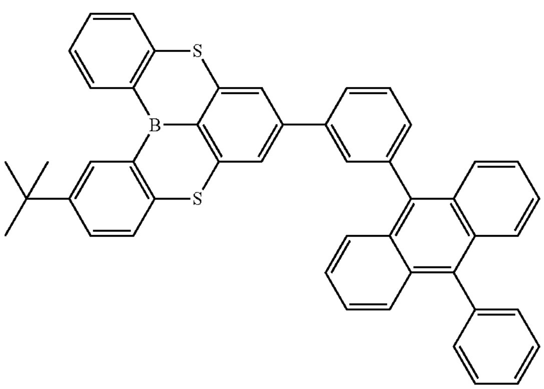
360
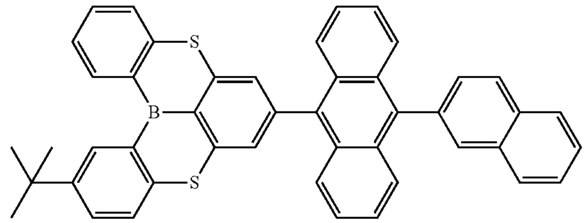
361
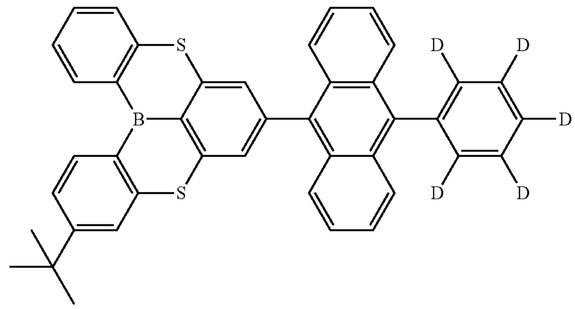
362
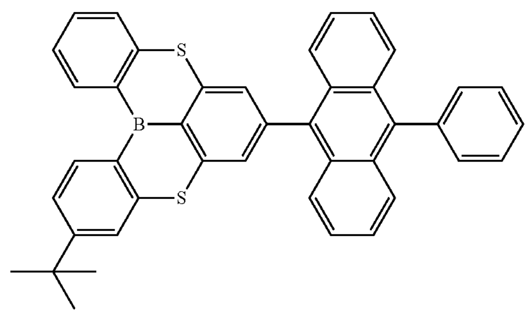
363
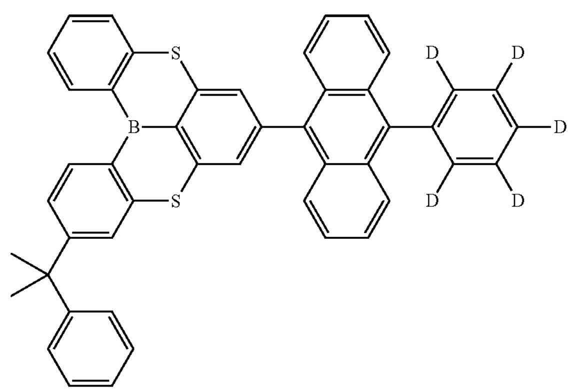

-continued
364
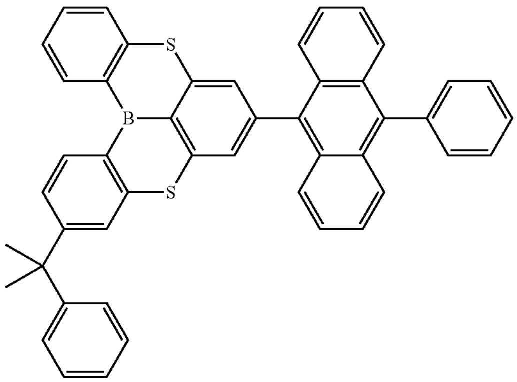
365
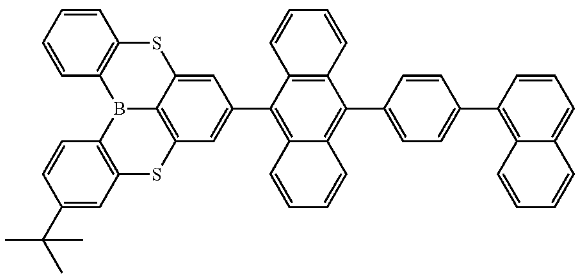
366
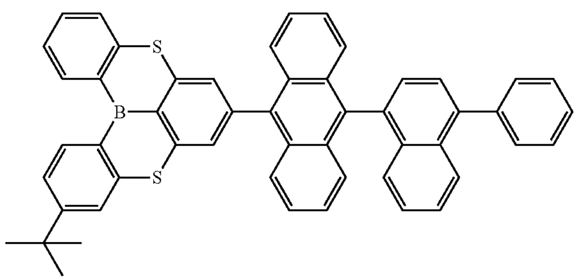
367
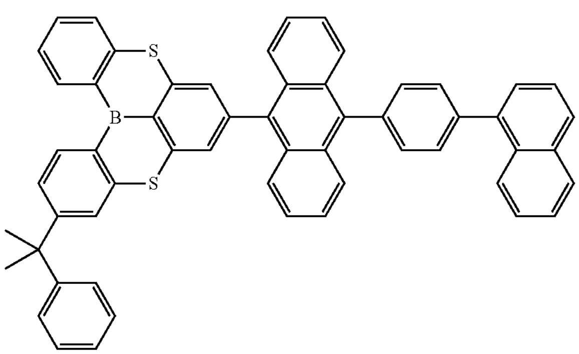
-continued
368
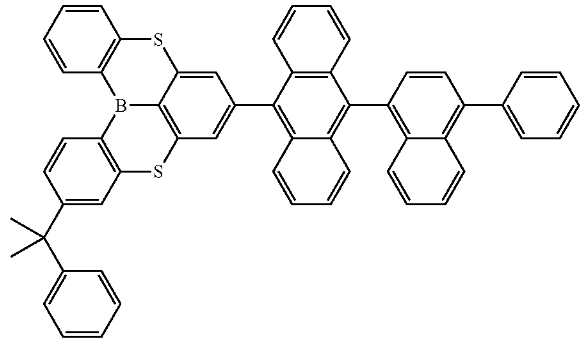
369
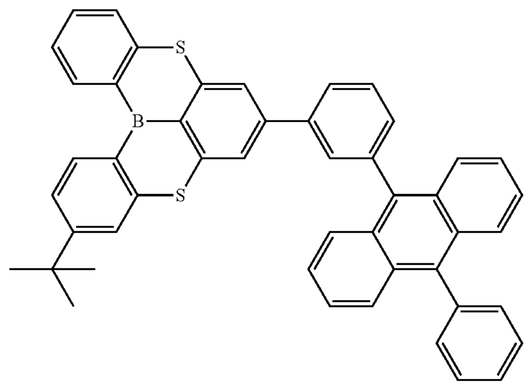
370
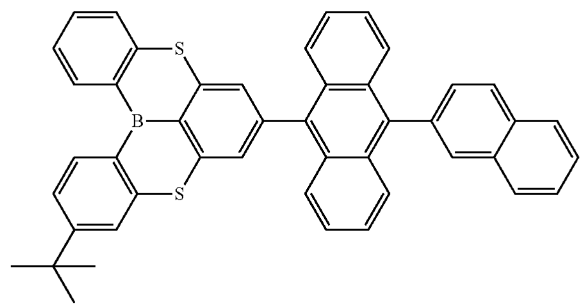
371
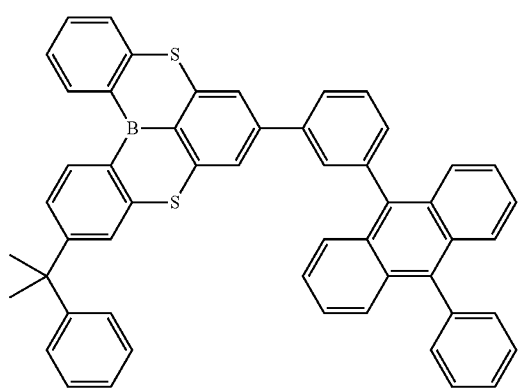

-continued
372
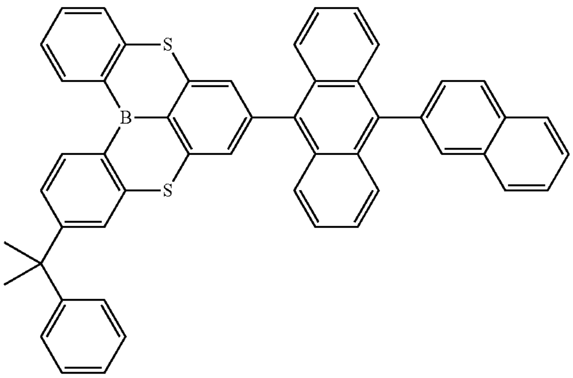
373
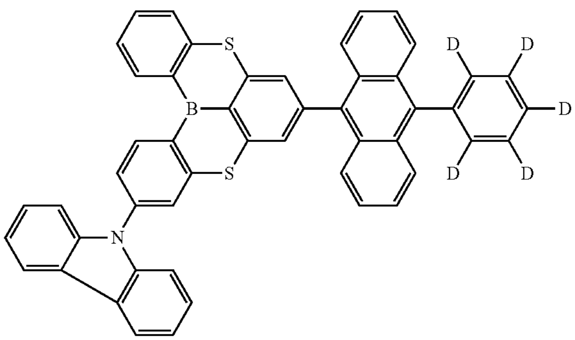
374
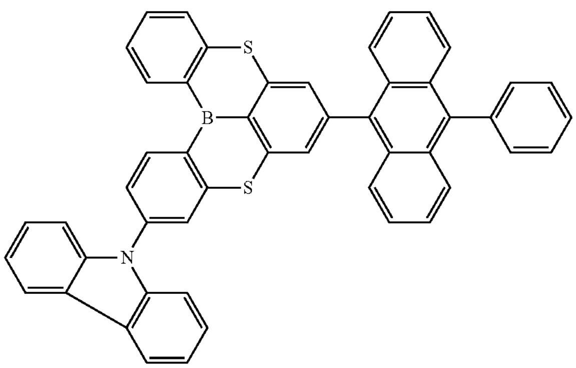
375
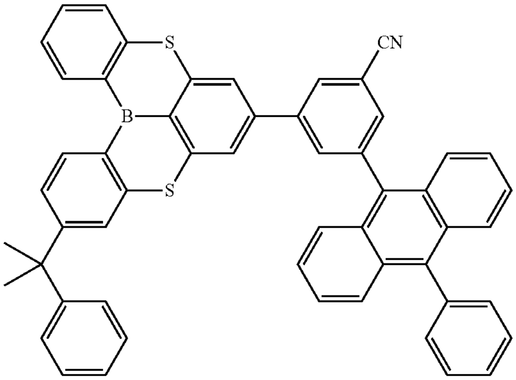
-continued
376
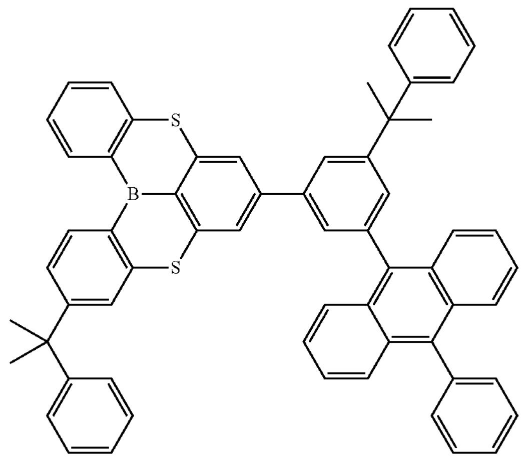
377
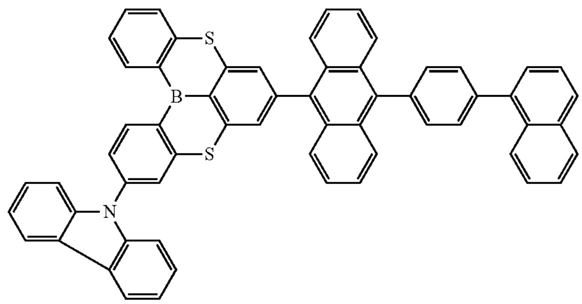
378
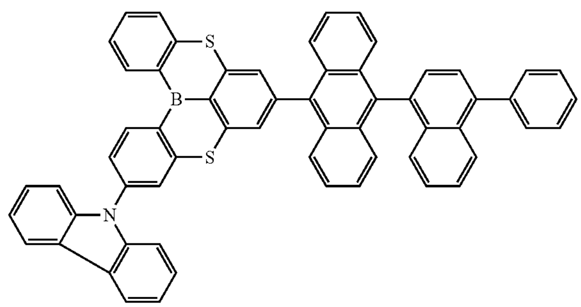
379
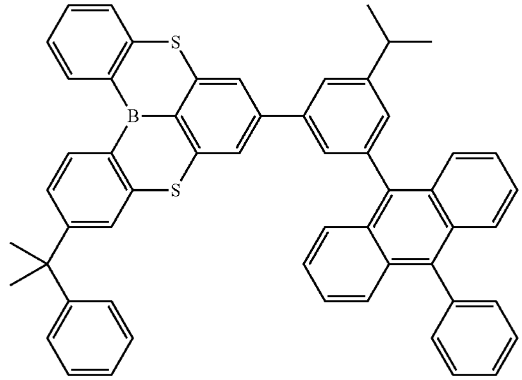

-continued
380
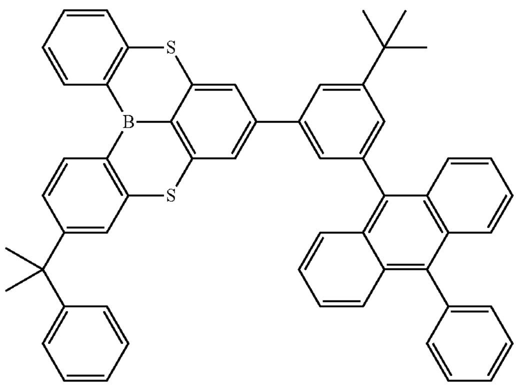
381
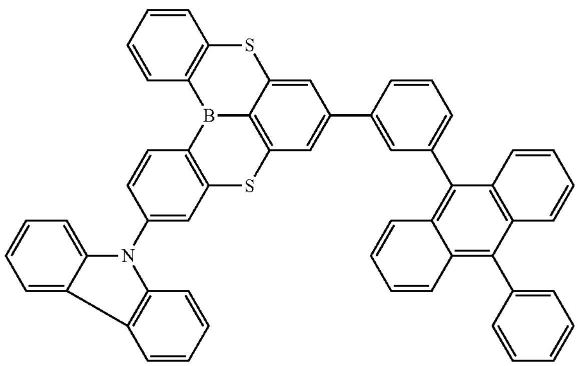
382
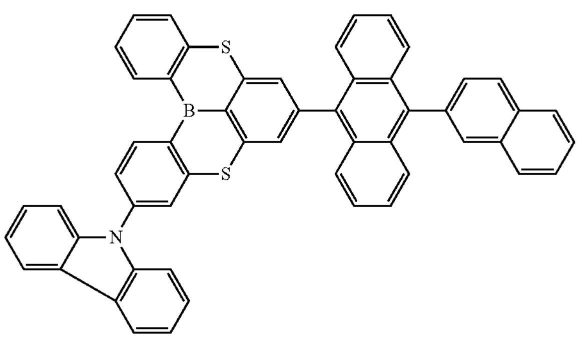
383
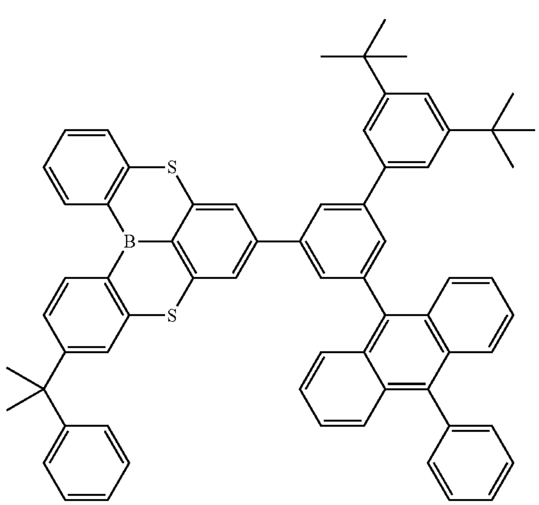
-continued
384
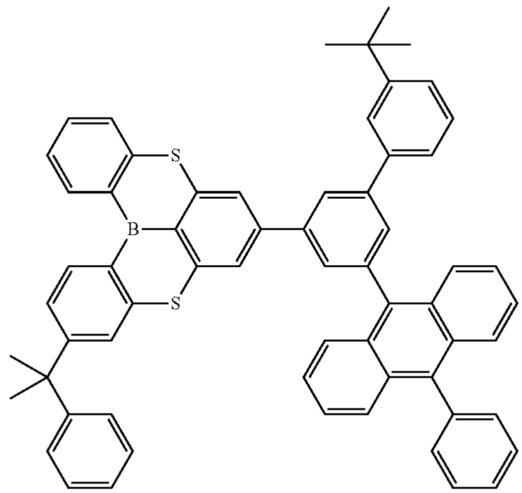
385
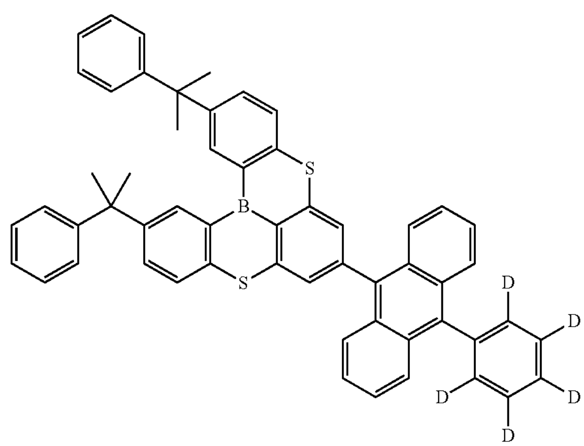
386
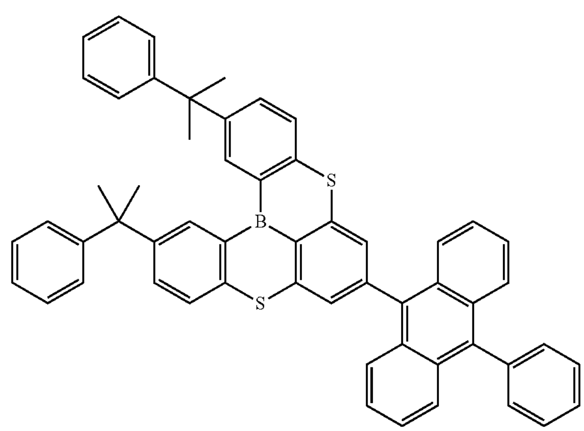

-continued
387
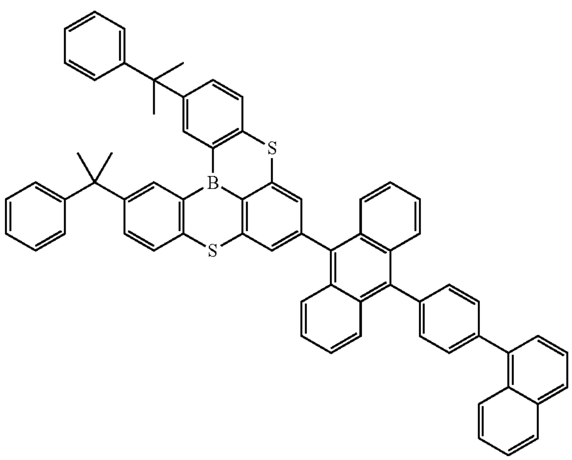
388
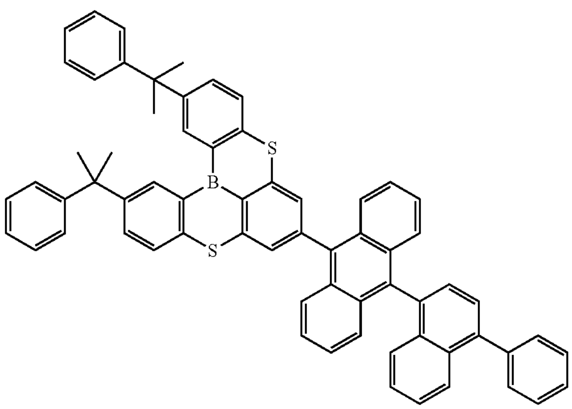
389
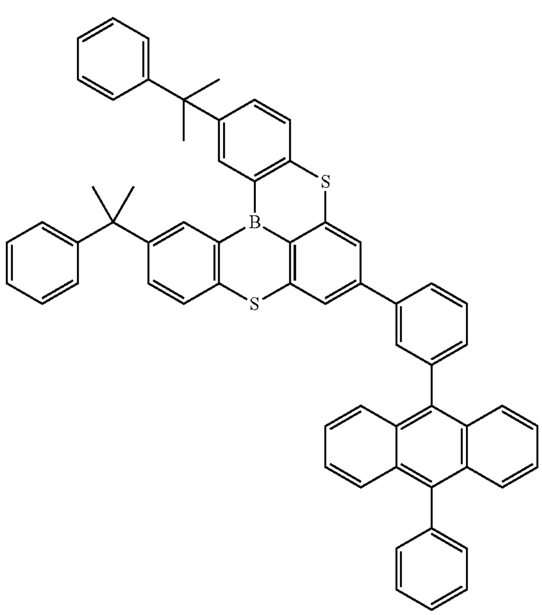
-continued
390
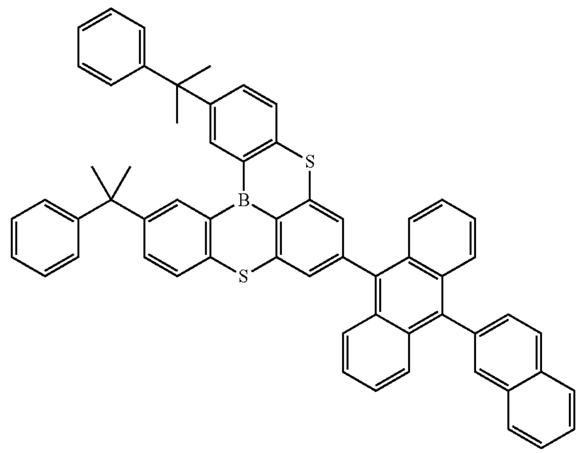
391
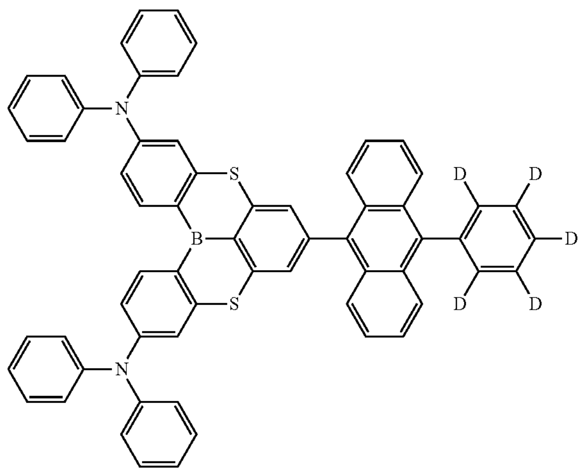
392
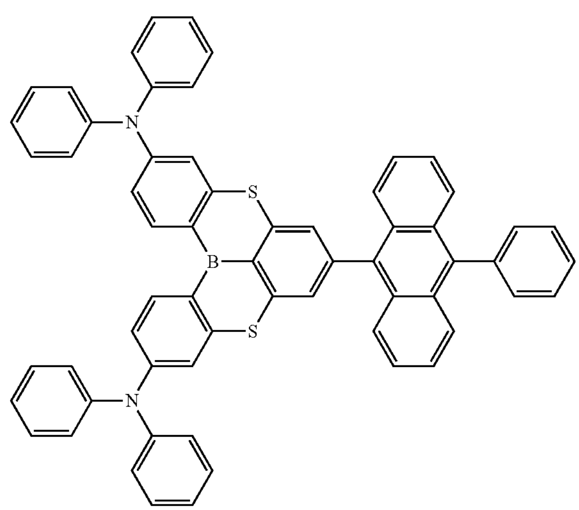

-continued
393
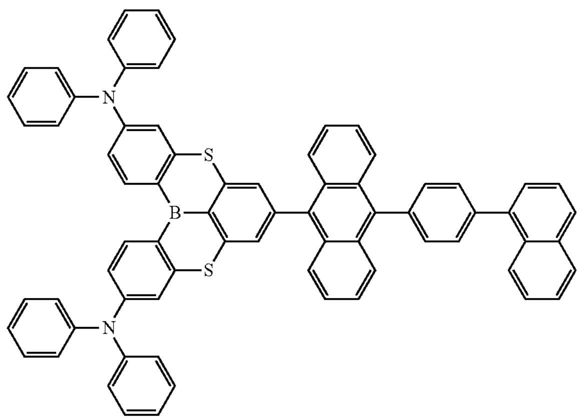
394
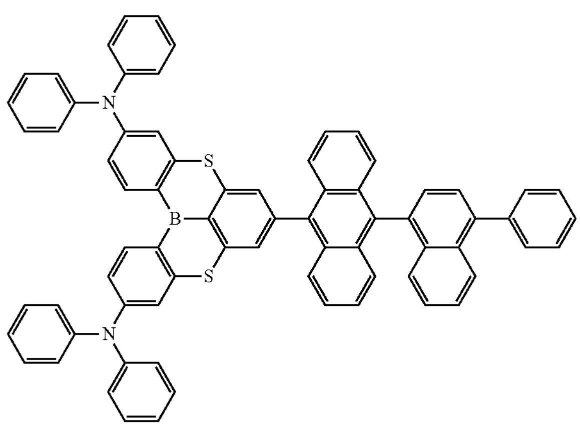
395
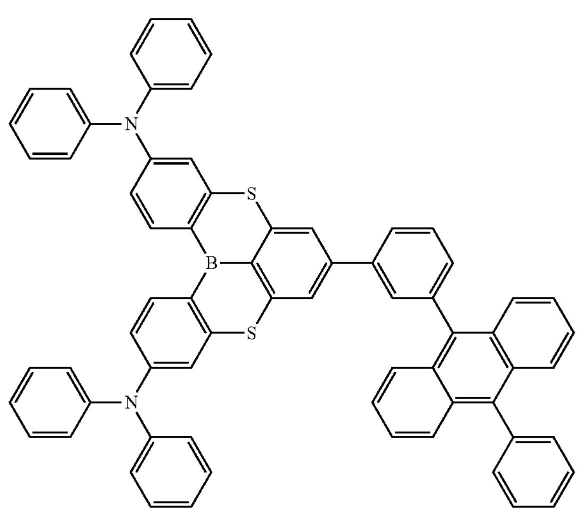
-continued
396
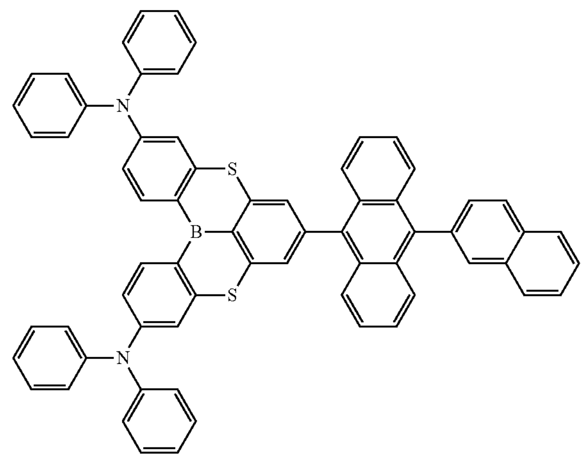
397
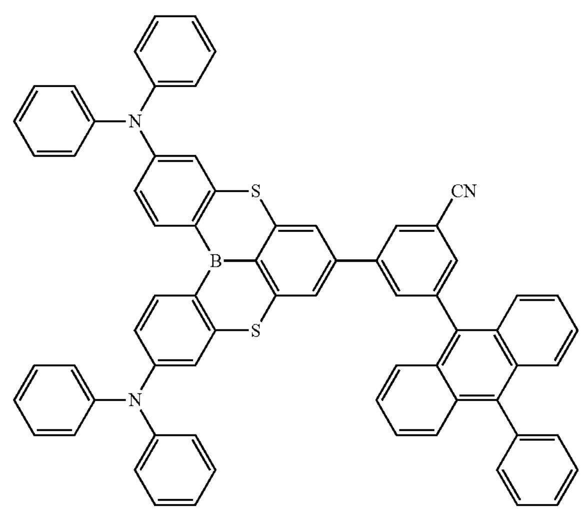
398
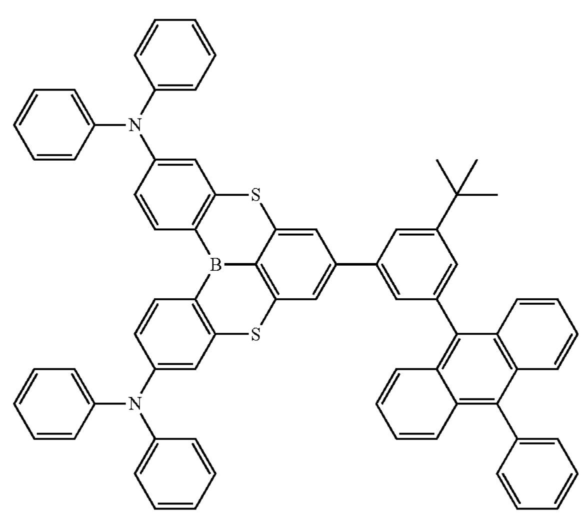

399
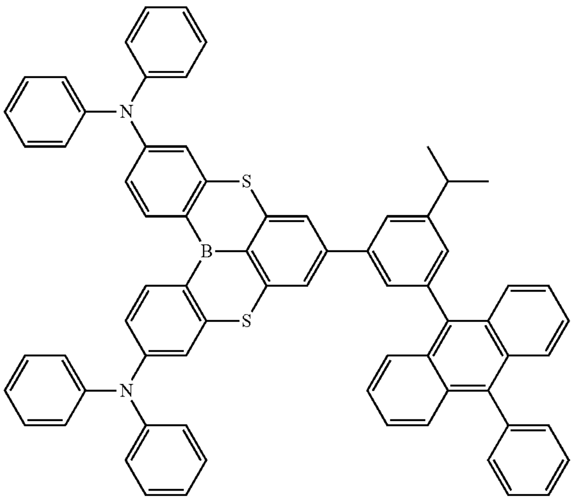
400
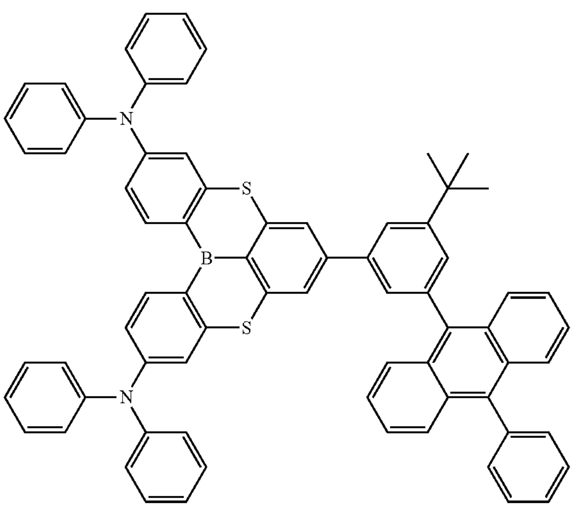
401
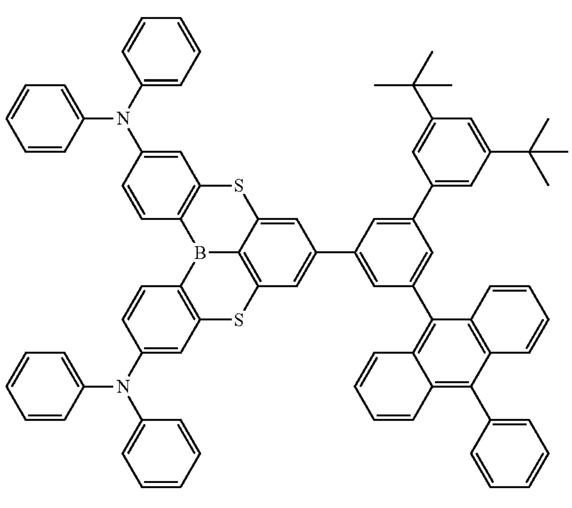
402
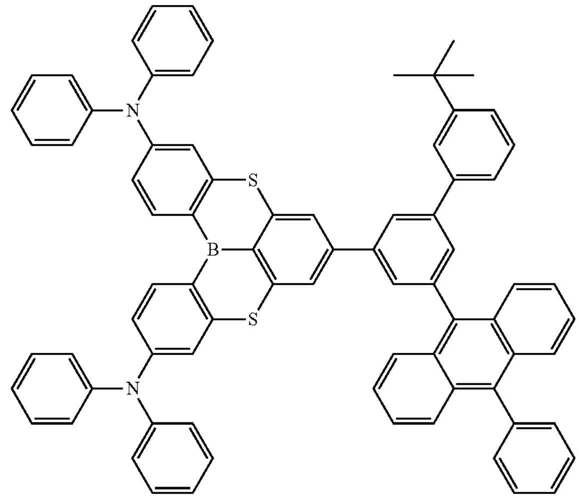
403
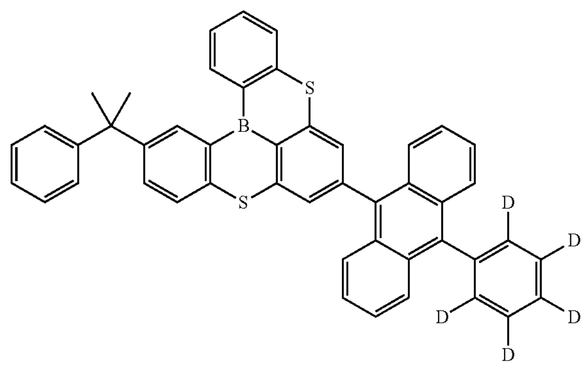
404
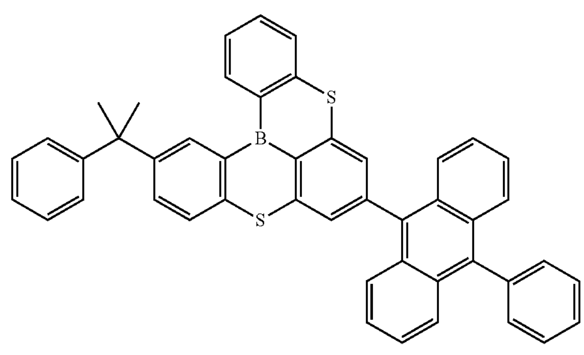

-continued
405
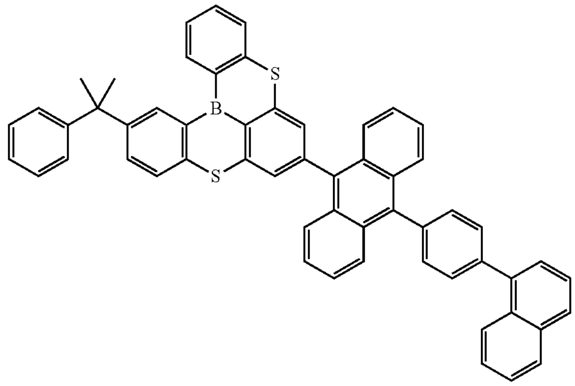
406
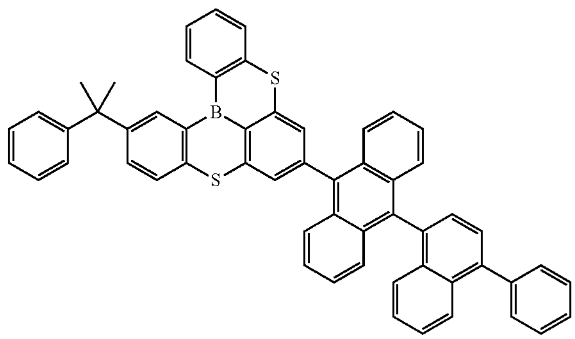
407
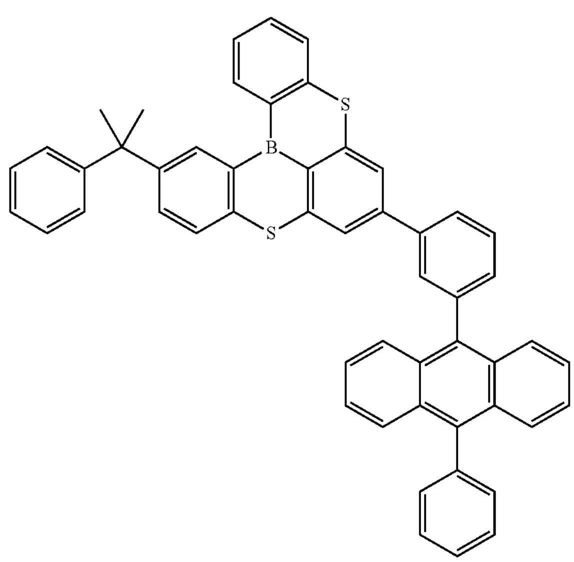
-continued
408
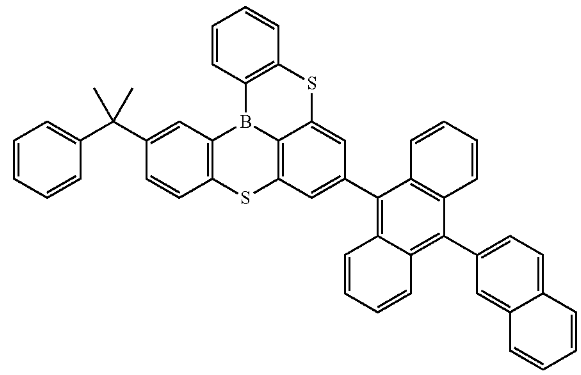
409
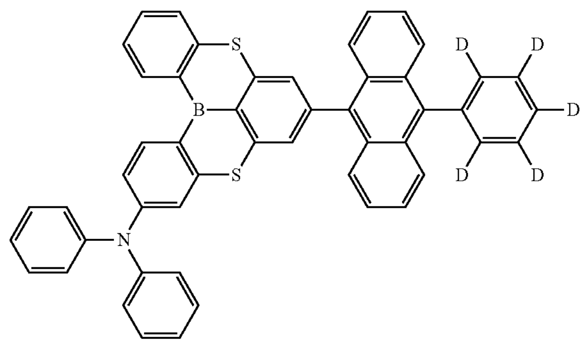
410
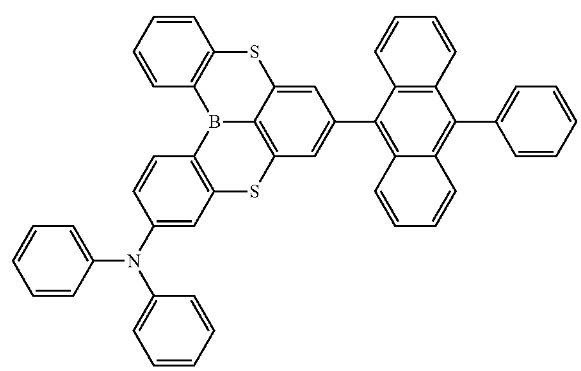
411
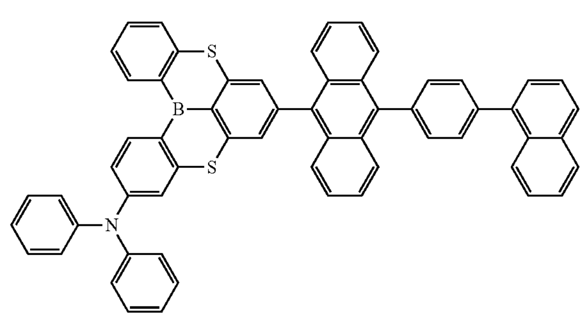

-continued
412
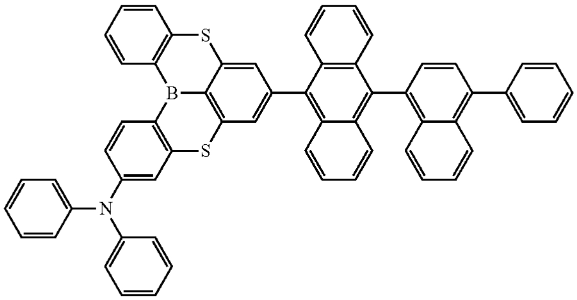
413
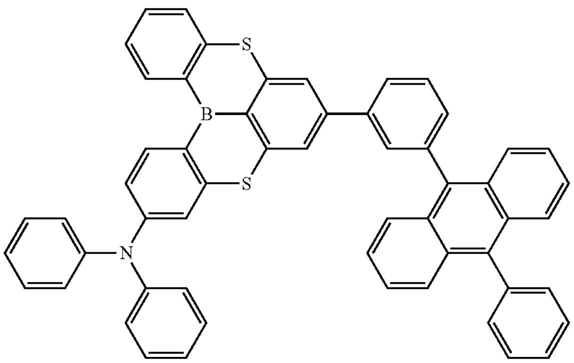
414
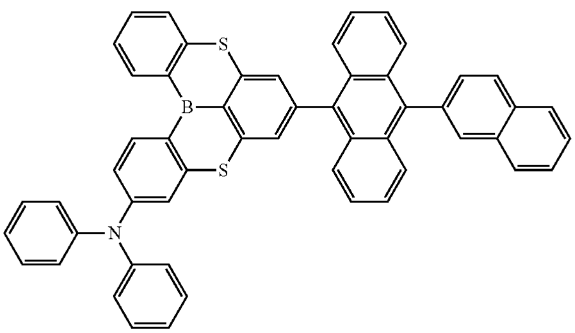
415
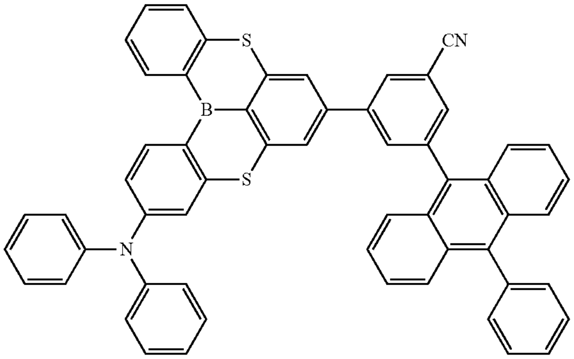
-continued
416
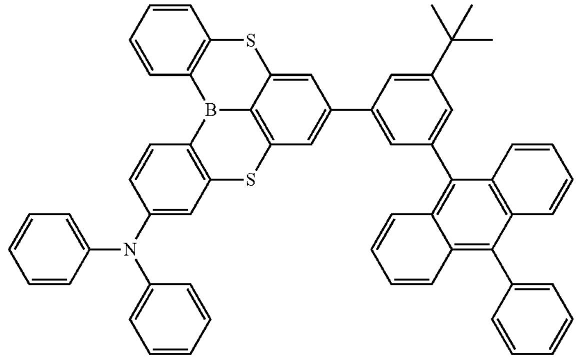
417
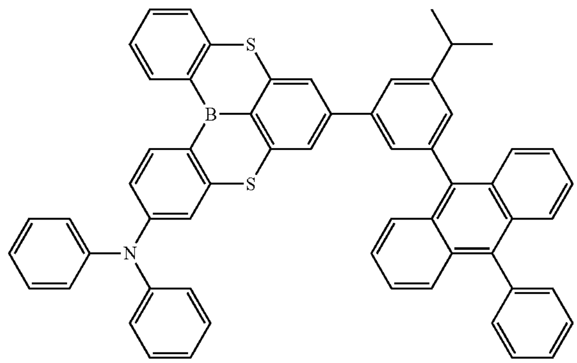
418
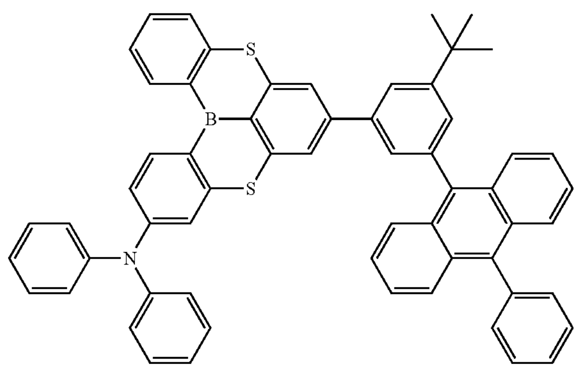
419
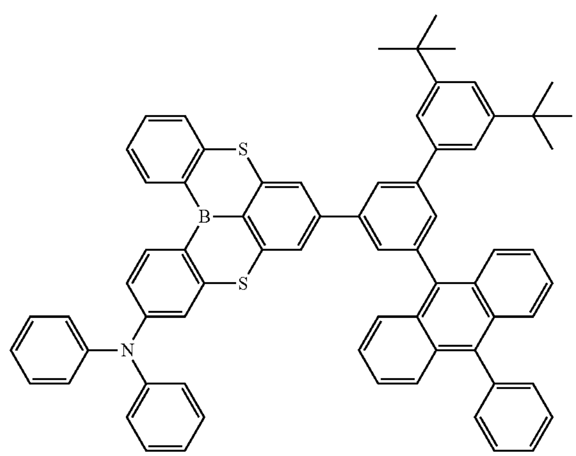

-continued
420
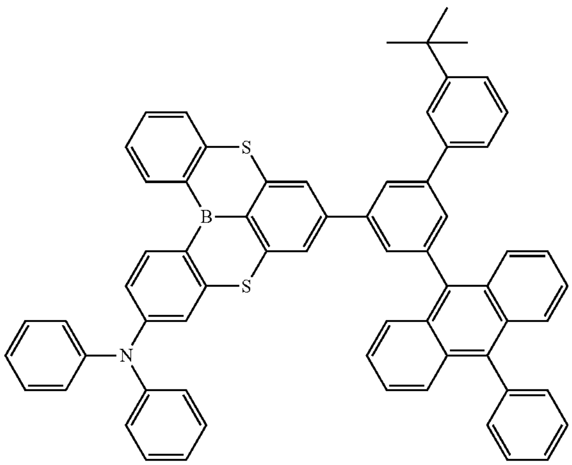
421
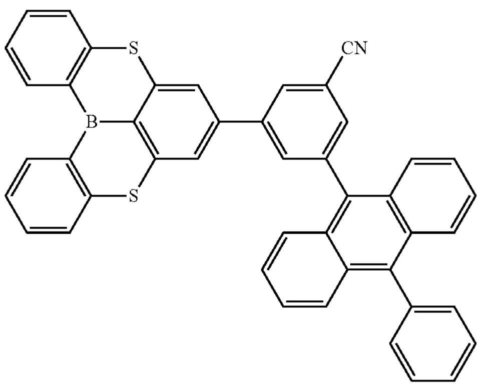
422
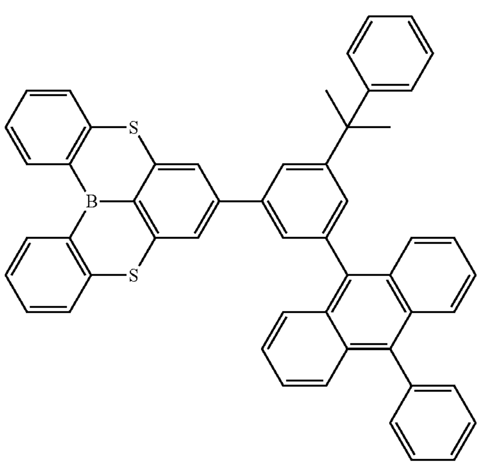
-continued
423
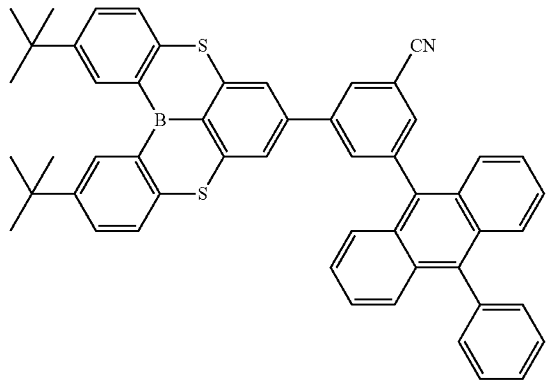
424
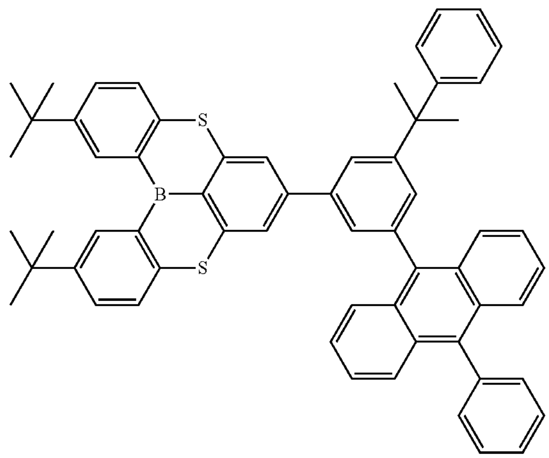
425
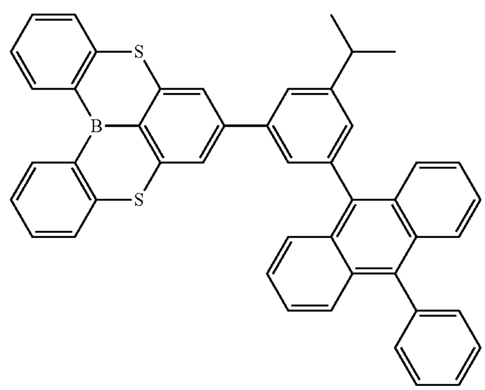
426
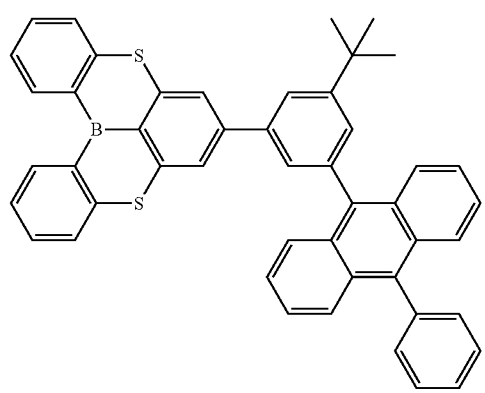

-continued
427
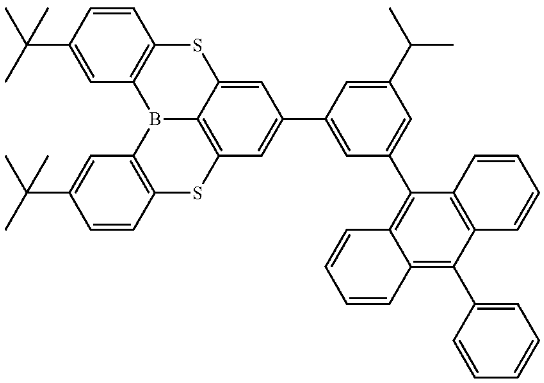
428
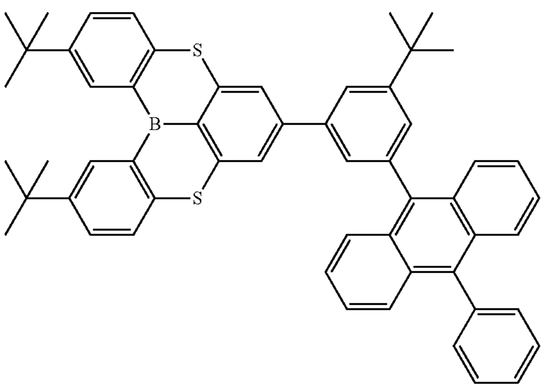
429
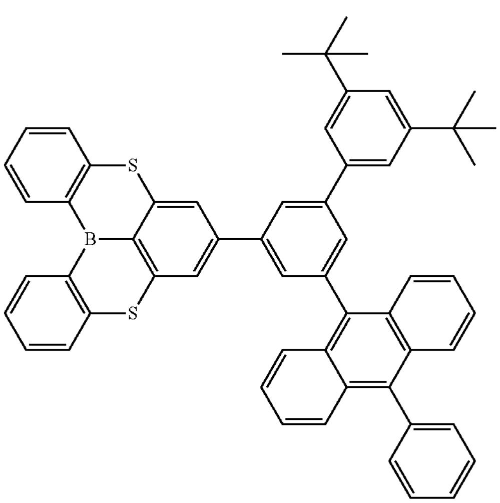
-continued
430
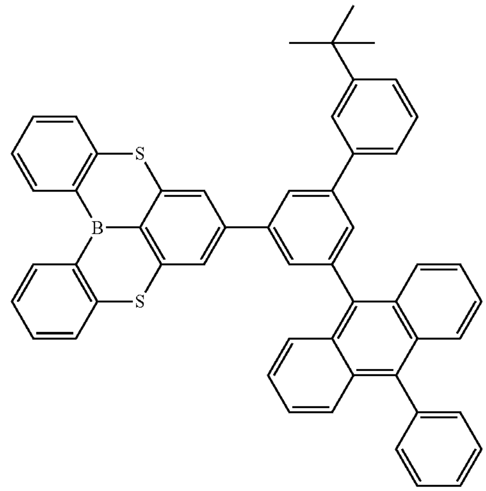
431
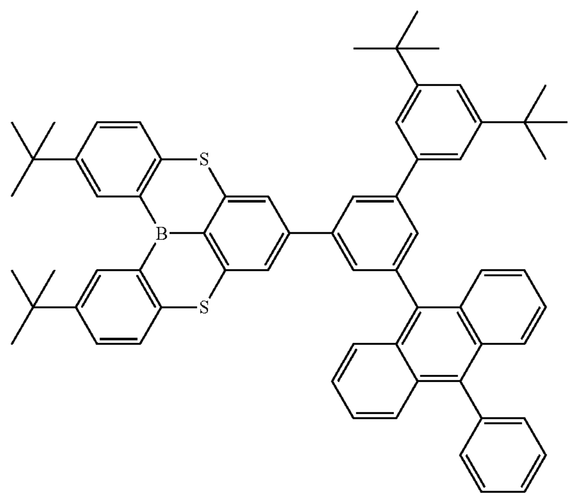
432
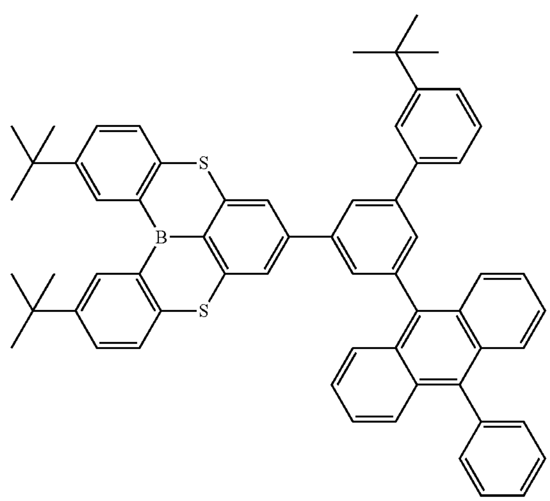

-continued
433
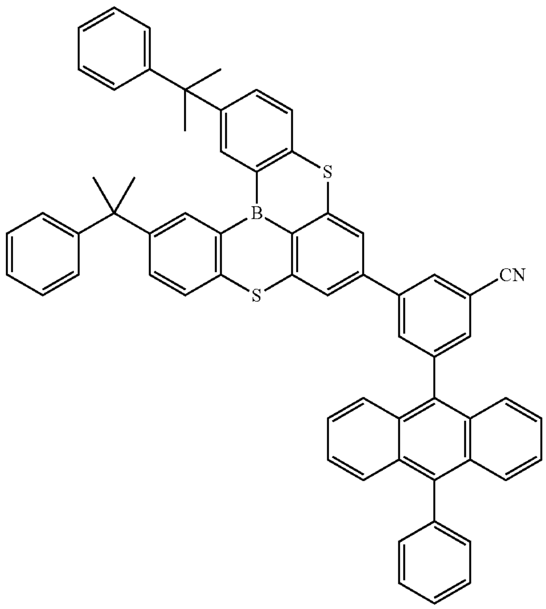
434
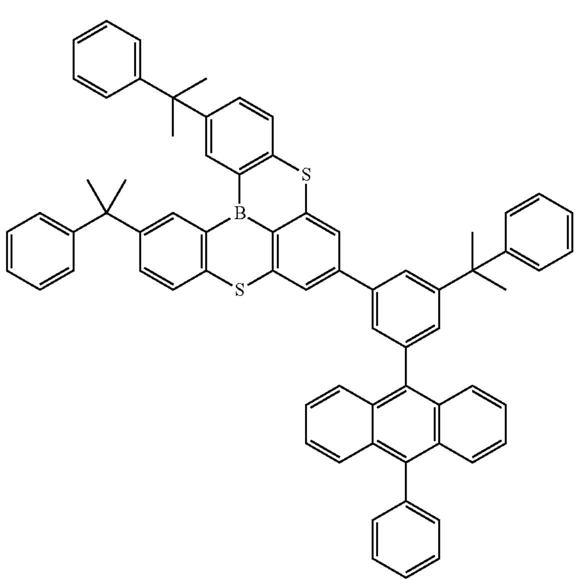
-continued
435
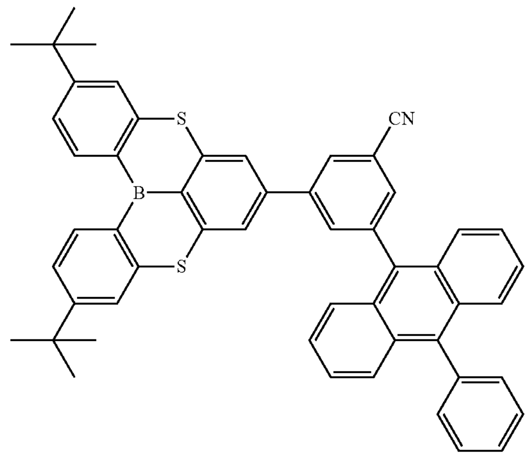
436
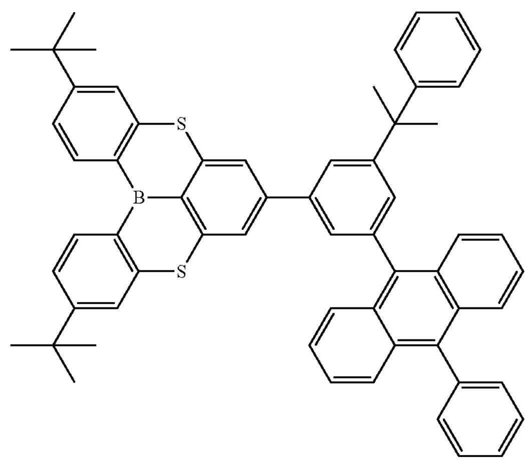
437
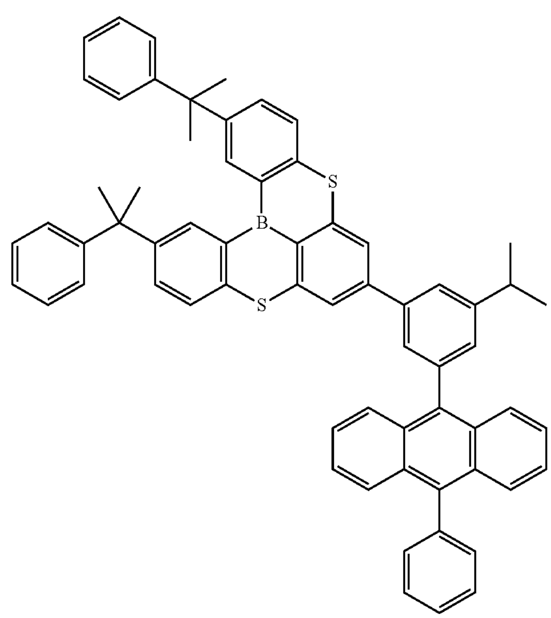

-continued
438
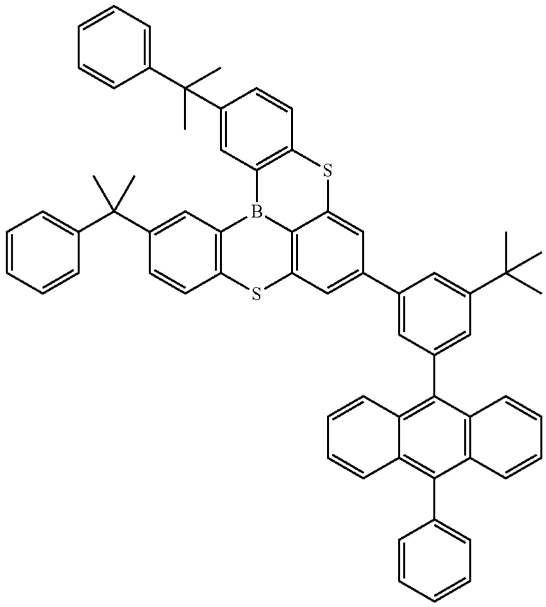
439
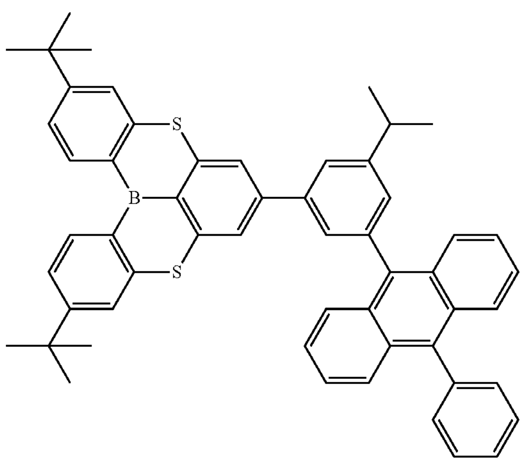
440
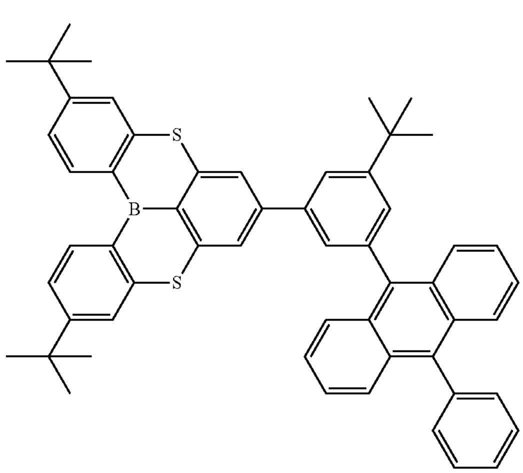
-continued
441
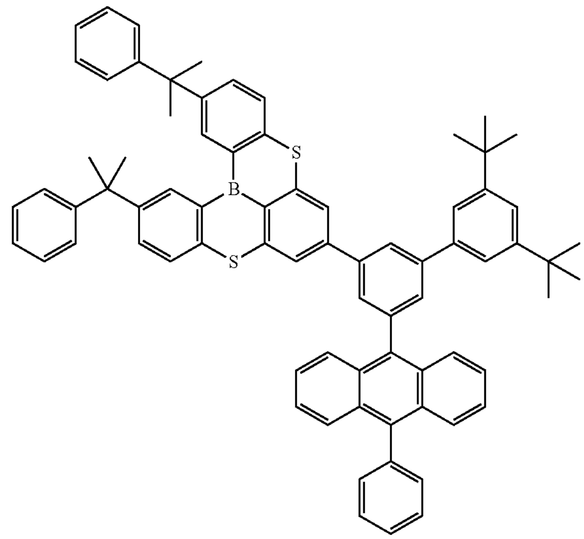
442
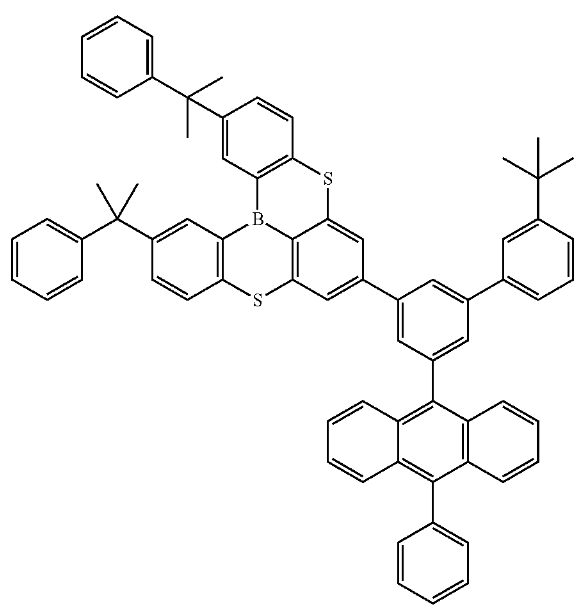

-continued
443
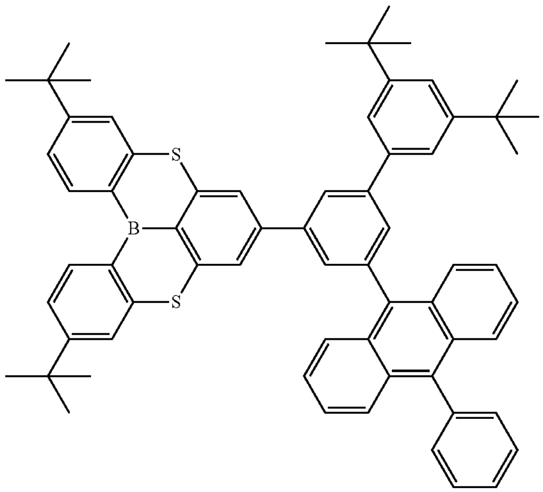
444
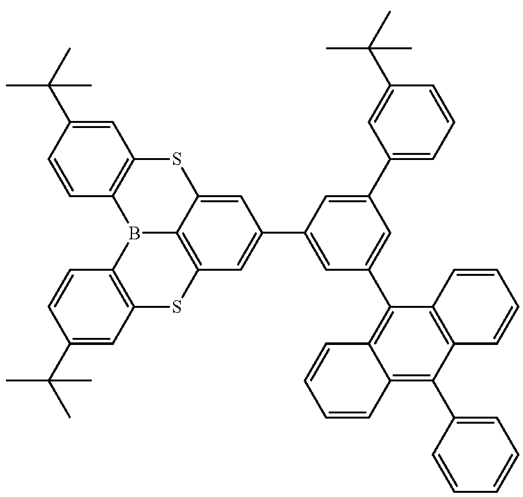
445
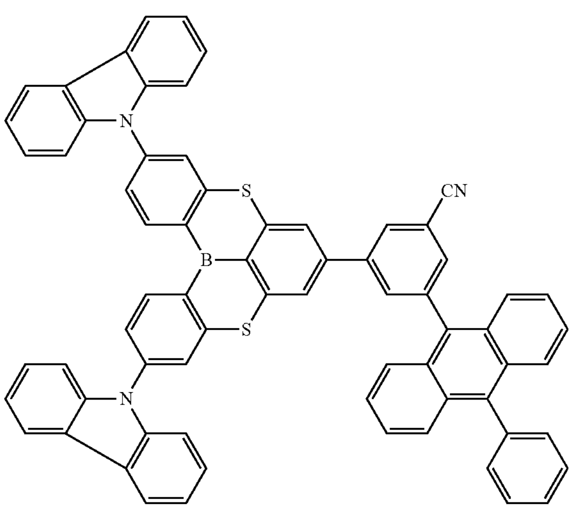
-continued
446
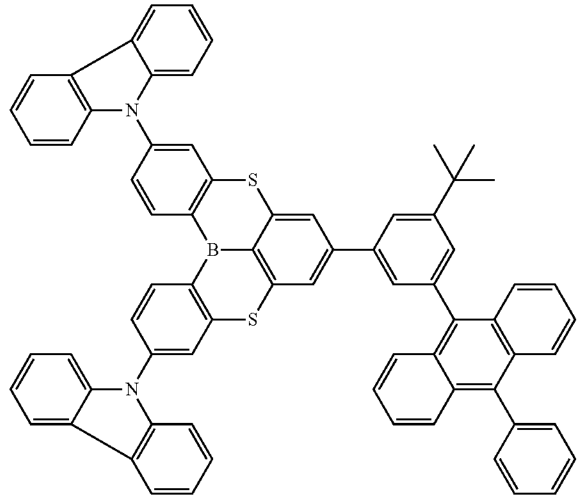
447
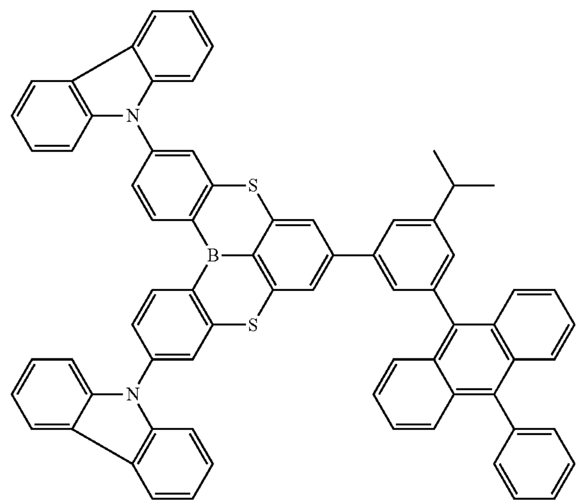
448
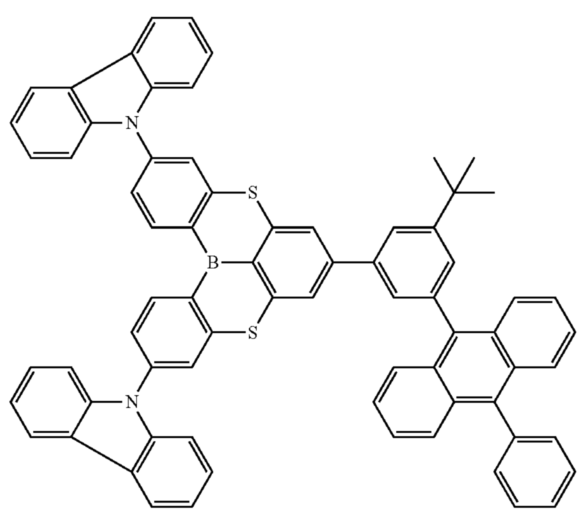

-continued
449
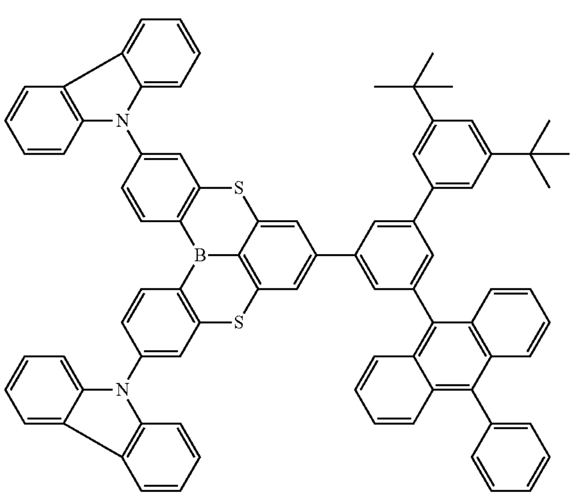
450
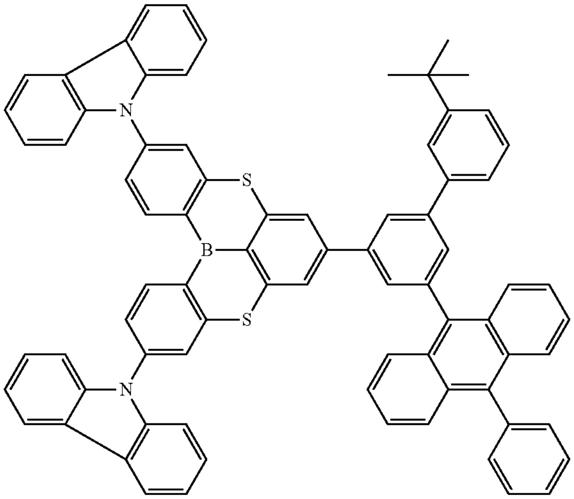
451
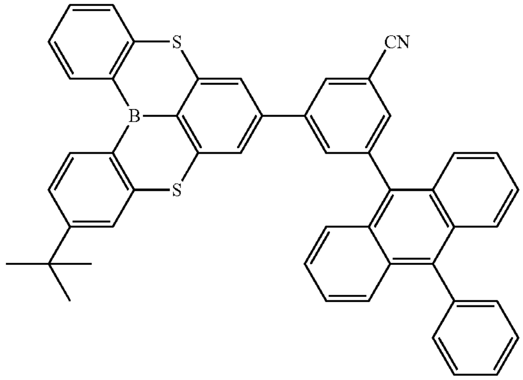
-continued
452
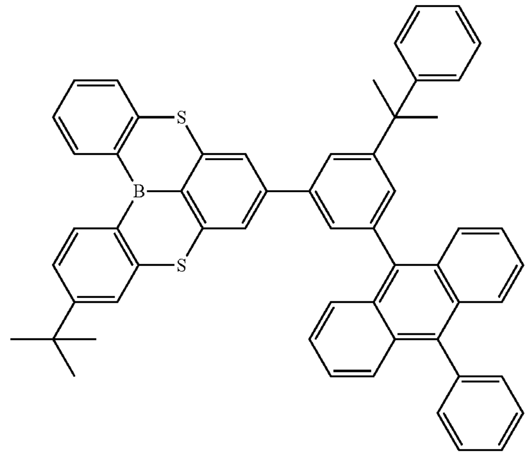
453
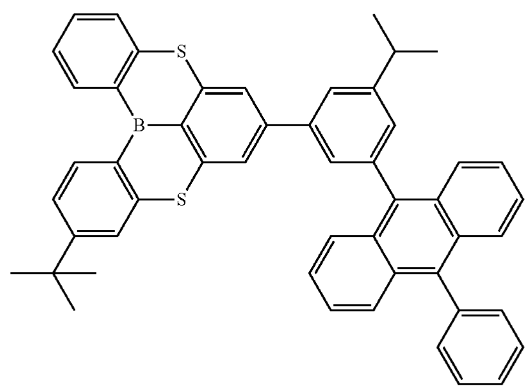
454
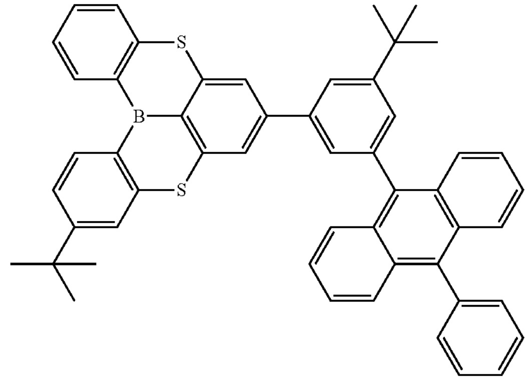

455
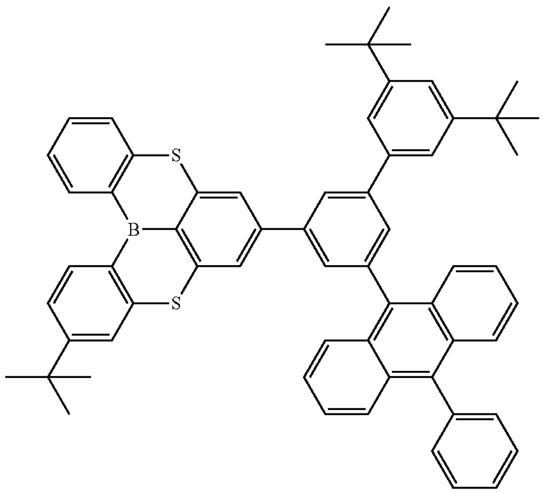
456
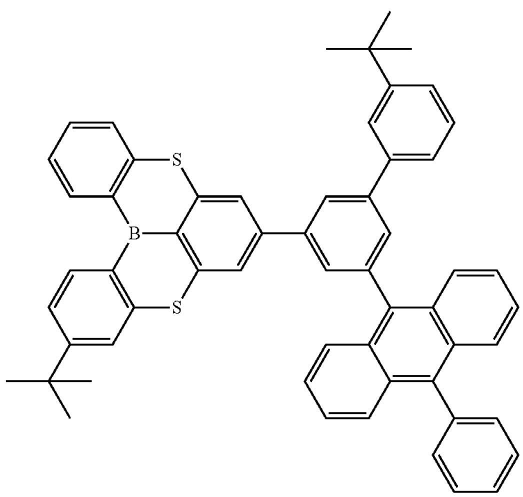
457
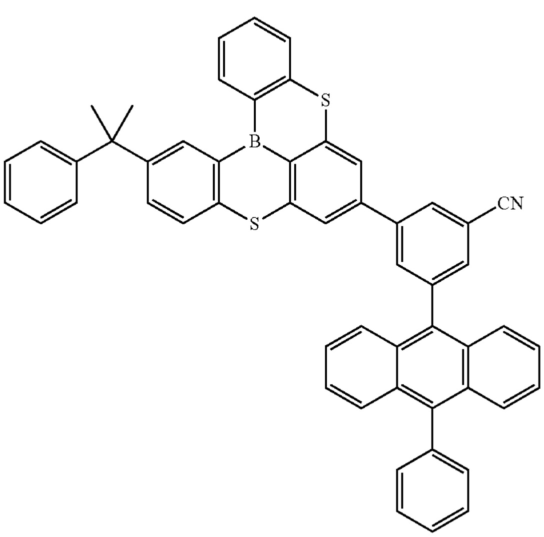
458
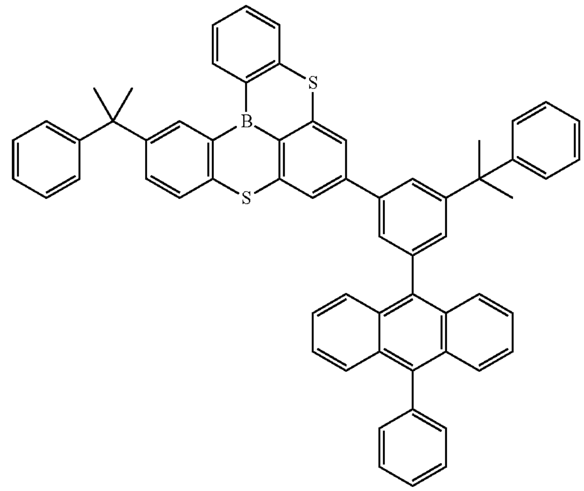
459
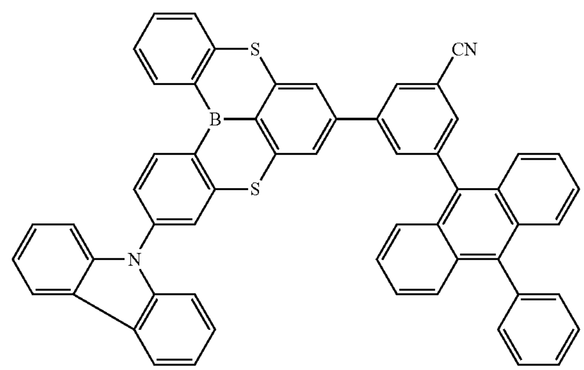
460
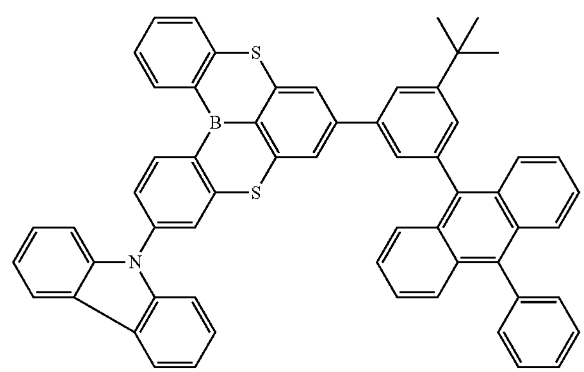

461
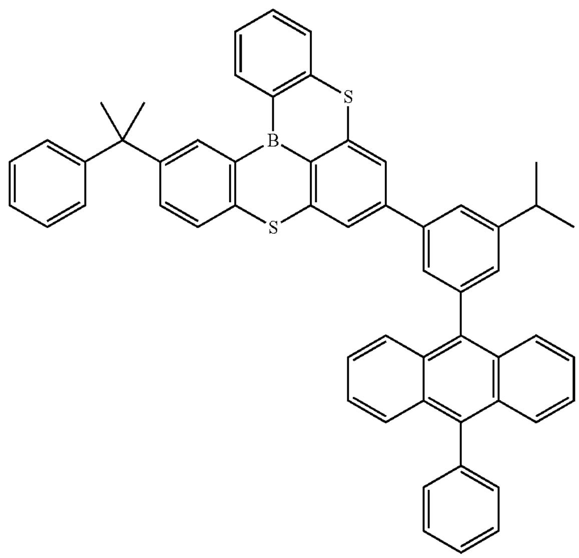
462
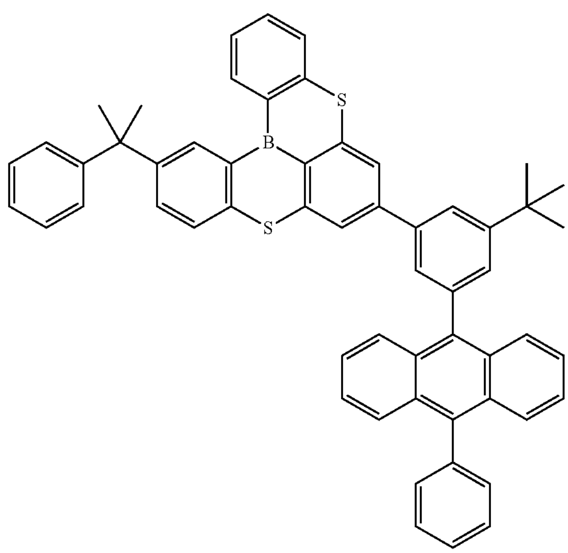
463
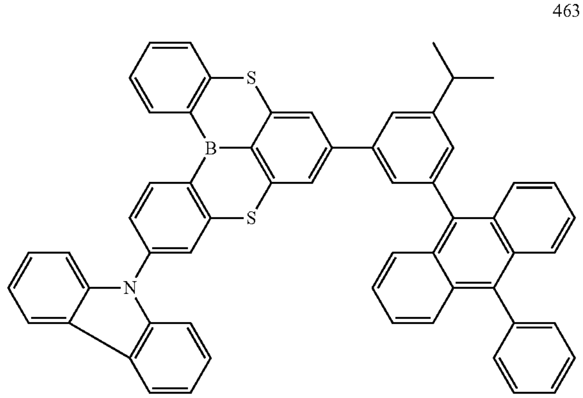
464
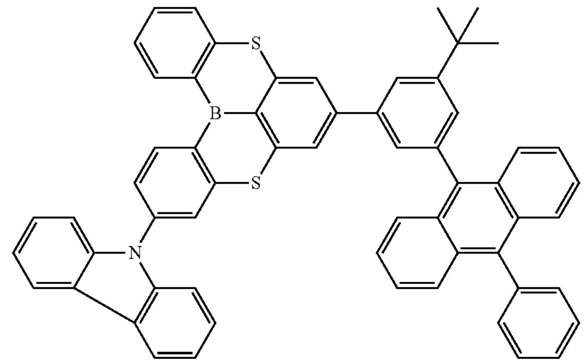
465
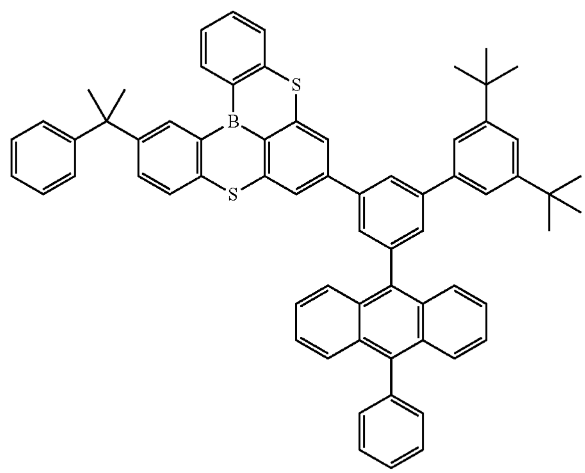
466
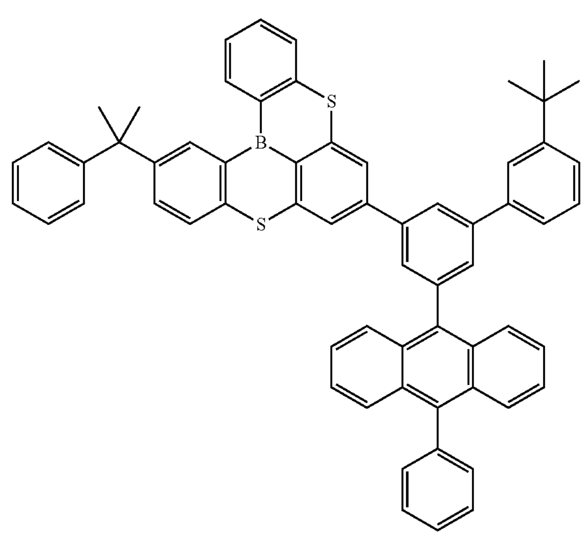

-continued

467

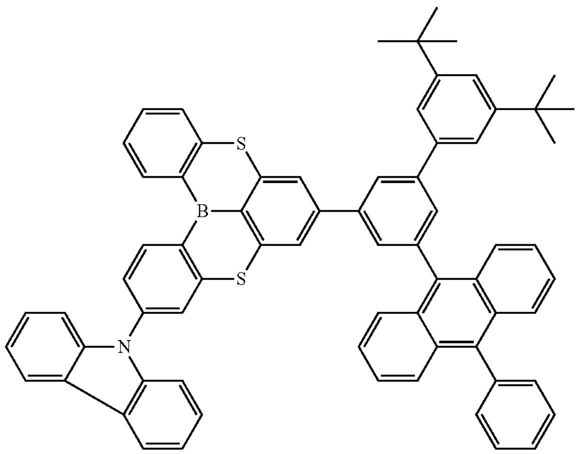

468

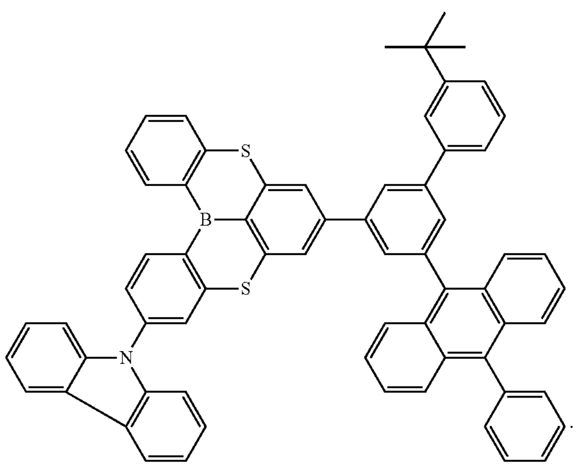

Without wishing to be bound by theory, in Formula 1, in the polycyclic compound, an element $Y_1$-containing core may have a planar structure with multiple resonance structures and a rigid backbone condensed by sharing a phenyl ring. Thus, the polycyclic compound may exhibit high colorimetric purity. At the same time, a fluorescent emitter represented by Formula 1 may include an anthracenyl group having a lowest excited triplet (T1*) similar to a lowest excited triplet (T1) of a core structure, and reverse intersystem crossing (RISC) by a spin orbit coupling (SOC) mechanism due to a resonance between T1 and T1* may be amplified, thus significantly improving efficiency.

Without wishing to be bound by theory, a compound having a multiple resonance structure in the related art may achieve improvement in colorimetric purity, but may not achieve improvement in efficiency due to a reduced spatial overlapping between the highest occupied molecular orbital (HOMO) and the lowest unoccupied molecular orbital (LUMO). On the other hand, a donor-acceptor structure in which HOMO and LUMO are spaced apart spatially to decrease ΔEst value was suggested to improve the efficiency. In this embodiment, the efficiency was improved, however, oscillator strength was reduced to thereby reduce a colorimetric purity. The colorimetric purity and the efficiency are in a trade-off relationship.

However, as the organic light-emitting device according to one or more embodiments may include the polycyclic compound represented by Formula 1, the colorimetric purity and the efficiency may be both improved by a triple resonance mechanism that simultaneously uses multiple resonance mechanisms and resonance mechanisms between triplets.

In one or more embodiments, the polycyclic compound represented by Formula 1 may be a fluorescent emitter.

In one or more embodiments, the emission layer may further include a sensitizer that may satisfy Equation 1, and an amount of the host may be greater than a total amount of the sensitizer and the polycyclic compound combined in the emission layer:

$$\Delta E_{ST} \leq 0.3 \text{ eV} \quad \text{Equation 1}$$

wherein, in Equation 1, $\Delta E_{ST}$ represents an energy level difference or gap (in electron volts, eV) between a lowest excited singlet energy level ($S_1$) and a lowest excited triplet energy level ($T_1$).

Here, the triplet energy level and the singlet energy level may be evaluated according to density functional theory (DFT) method, wherein structure optimization is performed at the level of B3LYP and 6-31 G(d,p) according to a Gaussian program.

The sensitizer and the polycyclic compound may satisfy Conditions 1 and 2:

$$T_{decay}(PC) < T_{decay}(S) \quad \text{Condition 1}$$

$$T_{decay}(PC) < 1.5 \text{ microseconds } (\mu s) \quad \text{Condition 2}$$

wherein, in Conditions 1 and 2, $T_{decay}$(PC) is a decay time (μs) of the polycyclic compound, and $T_{decay}$(S) is a decay time (μs) of the sensitizer.

The decay time of the polycyclic compound may be calculated from a time-resolved photoluminescence spectrum (TRPL) at room temperature with respect to a 40 nanometer (nm)-thickness film (hereinafter referred to as "Film (CD)") obtained by vacuum-codepositing the host and the dopant (i.e. the polycyclic compound) comprised in the emission layer at the weight ratio of 90:10 on a quartz substrate at the vacuum pressure of $10^{-7}$ torr.

The decay time of the sensitizer is calculated from TRPL at room temperature with respect to a 40 nm-thickness film (hereinafter referred to as "Film (S)") obtained by vacuum-codepositing the host and the sensitizer comprised in the emission layer at the weight ratio of 90:10 on a quartz substrate at the vacuum pressure of $10^{-7}$ torr.

Without being bound to theory, since triplet excitons remain long in an excited state, they influence the decrease in the lifespan of organic light-emitting devices. However, according to the present disclosure, the polycyclic compound is used to decrease the time during which the triplet excitons of the sensitizer remains in the excited state. Accordingly, an organic light-emitting device including the polycyclic compound may have a prolonged lifespan.

In one or more embodiments, the greater amount of triplet excitons in the sensitizer results in greater excess of energy that is accumulated in the sensitizer, resulting in a greater number of hot excitons. That is, the amount of triplet excitons of the sensitizer is proportional to the number of hot excitons. The hot excitons break down various chemical bonds of a compound included in an emission layer and/or a compound existing at the interface of the emission layer and other layers to degrade the compound. Accordingly, the lifespan of organic light-emitting devices may be reduced. However, according to the present disclosure, by using polycyclic compounds, the triplet excitons of the sensitizer can be quickly converted to singlet excitons of the polycyclic compound, ultimately reducing the amount of hot excitons and increasing the lifespan of an organic light-emitting device.

In this regard, "hot excitons" may be generated or increased by exciton-exciton annihilation due to an increase in the density of excitons in an emission layer, exciton-charge annihilation due to the charge imbalance in an emission layer, and/or radical ion pairs due to the delivery of electrons between a host and dopant (for example, the polycyclic compound of Formula 1).

In one or more embodiments, to rapidly convert triplet excitons of the sensitizer to singlet excitons of the polycyclic compound, Condition 1 may be satisfied.

In one or more embodiments, the polycyclic compound emits fluorescent light, and a high color purity organic light-emitting device may be provided, and in particular, Condition 2 may be satisfied, so that the singlet excitons of the polycyclic compound excited state at room temperature can be rapidly transferred, and thus, the singlet state of the polycyclic compound in the excited state may not be accumulated, and the lifespan of an organic light-emitting device may be increased.

In one or more embodiments, Condition 3 may be satisfied, and the transition from the triplet excitons of the sensitizer to the singlet excitons of the polycyclic compound may occur more rapidly. Accordingly, the lifespan of an organic light-emitting device may be further prolonged:

$$T_{decay}(PC)/T_{decay}(S)<0.5 \qquad \text{Condition 3}$$

wherein, in Condition 3, $T_{decay}(PC)$ is a decay time of the polycyclic compound, and $T_{decay}(S)$ is a decay time of the sensitizer.

In one or more embodiments, the organic light-emitting device may further satisfy Condition 4:

$$\mathrm{BDE}(S)-T_1(S)<3.0\ \mathrm{eV} \qquad \text{Condition 4}$$

wherein, in Condition 4,

BDE (S) is the bond dissociation energy level of the sensitizer, and $T_1$ (S) is the lowest excitation triplet energy level of the sensitizer.

In one or more embodiments, the organic light-emitting device may have a desirable level of lifespan by satisfying Condition 5 below:

$$R(\mathrm{Hex})/e^{10}<15 \qquad \text{Condition 5}$$

wherein, in Condition 5,

R (Hex) is the production rate of hot excitons.

In this regard, R(Hex) was subjected to the photochemical stability of the organic light-emitting device (photochemical stability), and then calculated through the Gaussian 09 program according to Equation C:

$$R(\mathrm{Hex})=a\times T_{decay}(S)\times e^{-(BDE(S)-T_1(S))} \qquad \text{Equation C}$$

wherein, in Equation C, a is an arbitrary constant, $T_{decay}(S)$ is a decay time of the sensitizer, BDE (S) is the bond dissociation energy level of the sensitizer, and $T_1$ (S) is the lowest excitation triplet energy level of the sensitizer.

The hot-exciton production rate is estimated to be proportional to (decay time)×$e^{-(BDE-T1)}$, and in order to obtain the target level of the lifespan of the organic light-emitting device, (hot-exciton production rate)/$e^{10}$ should be less than 15.

In this regard, the degradation analysis (PCS) of organic light-emitting devices was calculated according to the following Equation P:

$$\mathrm{PCS}\ (\%)=I_2/I_1\times 100\% \qquad \text{Equation P}$$

wherein, in Equation P, $I_1$, with respect to a film formed by depositing a compound of which PCS is to be measured, is a maximum light intensity obtained from the PL spectrum which is evaluated at room temperature under Ar atmosphere where outside air is excluded immediately after the formation of the film by using a He—Cd laser (excitation wavelength=325 nm, power density=100 milliwatts per square centimeter (mW/cm$^2$), and $I_2$, with respect to a film formed by depositing a compound of which PCS is to be measured, is a maximum light intensity obtained from the PL spectrum which is evaluated at room temperature under Ar atmosphere where outside air is blocked, by exposing the film to light of the He—Cd laser (excitation wavelength=325 nm, power density=100 mW/cm$^2$) for 3 hours. In the case of the sensitizer, reverse intersystem crossing (RISC) and/or intersystem crossing (ISC) actively occur, which allows excitons generated at the host to be delivered to the polycyclic compound.

Measurements may be performed using a He—Cd pumping laser by KIMMON-KOHA, Inc.

Figure 2A:
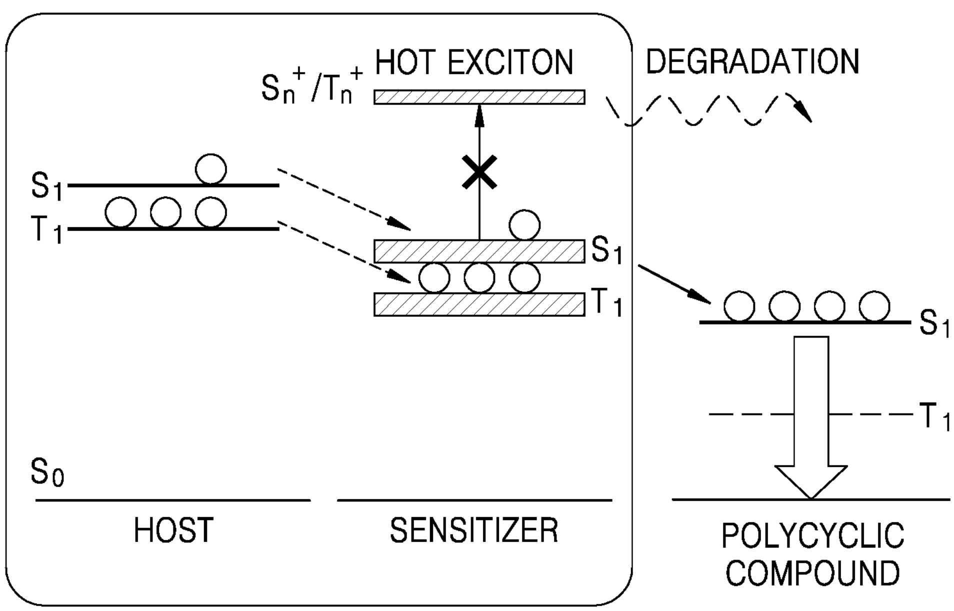
FIGS. 2A to 2C each show a diagram schematically illustrating energy transfer in an emission layer of an organic light-emitting device according to an aspect of one or more embodiments.

Specifically, the general energy transfer of an organic light-emitting device according to one or more embodiments will be described with reference to FIG. 2A.

Singlet and triplet excitons are formed at the host in the emission layer, and the energy of the singlet and triplet excitons formed at the host are transferred to the sensitizer and then to the polycyclic compound through Forster energy transfer (FRET). At this time, in order to embody the high efficiency and long lifespan of the organic light-emitting device, controlling the hot excitons generated in the emission layer may be crucial, and necessitates optimization of energy transfer.

Figure 2B:
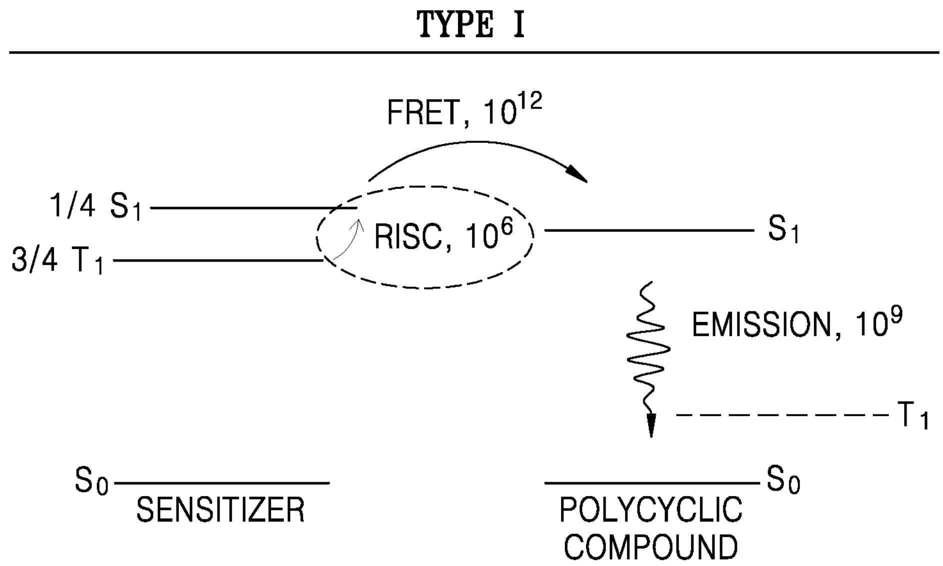

Specifically, the general energy transfer of an organic light-emitting device (type I) according to one or more embodiments will be described with reference to FIG. 2B. This is the case when the sensitizer is a thermally activated delayed fluorescence (TADF) emitter satisfying the condition of $\Delta E_{ST}$<0.3 eV.

The energy of the singlet excitons formed at the host, which are 25% of the total excitons, are transferred to the sensitizer through FRET, and the energy of triplet excitons formed at the host, which are 75% of the total excitons, is transferred to the singlet and triplet of the sensitizer, among which the energy delivered to triplet is subjected to RISC into singlet, and then, the singlet energy of the sensitizer is transferred to the polycyclic compound through FRET.

Figure 2C:
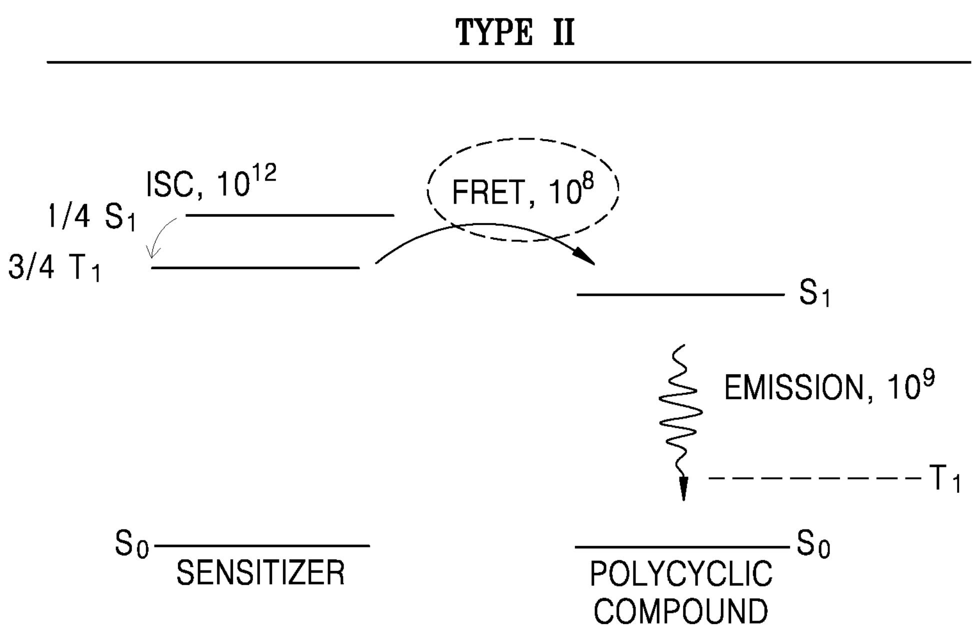

Specifically, the general energy transfer of an organic light-emitting device (type II) according to one or more embodiments will be described with reference to FIG. 2C. In this case, the sensitizer is an organic metallic compound including Pt.

The energy of the triplet excitons formed at the host, which is 75% of the total excitons, are transferred to the sensitizer through Dexter energy transfer, and the energy of singlet excitons formed at the host, which is 25% of the total excitons, is transferred to the singlet and triplet of the sensitizer, among which the energy delivered to singlet is subjected to ISC into triplet, and then, the triplet energy of the sensitizer is transferred to the polycyclic compound through FRET.

Accordingly, by transferring the singlet excitons and triplet excitons generated in the emission layer to the dopant, for example by transferring all of the singlet excitons and triplet excitons, an organic light-emitting device having improved efficiency can be obtained. In addition, since an organic light-emitting device can be obtained with significantly reduced energy loss, the lifespan characteristics of the organic light-emitting device can be improved.

The amount of the sensitizer in the emission layer may be from about 5 weight percent (wt %) to about 50 wt % with respect to the total weight of the emission layer. Within these ranges, it is possible to achieve effective energy transfer in the emission layer, and accordingly, an organic light-emitting device having high efficiency and long lifespan can be obtained.

In one or more embodiments, the host, the polycyclic compound, and the sensitizer may further satisfy Condition 6:

$$T_1(H) \geq T_1(S) \geq S_1(PC) \qquad \text{Condition 6}$$

wherein, in Condition 6, $T_1$(H) is the lowest excitation triplet energy level of the host, $S_1$(PC) is the lowest excitation singlet energy level of the polycyclic compound, and $T_1$(S) is the lowest excitation triplet energy level of the sensitizer.

When the host, the polycyclic compound, and the sensitizer each satisfy Condition 6, triplet excitons may be effectively transferred from the host to the polycyclic compound, and thus, an organic light-emitting device having improved efficiency may be obtained.

The emission layer may consist of the host, the polycyclic compound, and the sensitizer. That is, in one or more embodiments, the emission layer may not further include materials other than the host, the polycyclic compound, and the sensitizer.

In one or more embodiments, the emission layer may further include a photoluminescent dopant, and an amount of the host may be greater than a total amount of the photoluminescent dopant and the polycyclic compound represented by Formula 1 combined in the emission layer. The photoluminescent dopant may include a photoluminescent dopant having suitable $S_1$ and $T_1$ energy levels for receiving energy from an excited $S_1$ energy level of the polycyclic compound. In this embodiment, the polycyclic compound may serve as a sensitizer that may transfer energy, and the polycyclic compound and the photoluminescent dopant may equally satisfy the Conditions for the sensitizer and the polycyclic compound.

A method of synthesizing the polycyclic compound represented by Formula 1 may be apparent to one of ordinary skill in the art by referring to Synthesis Examples provided herein.

In one or more embodiments, in the organic light-emitting device, the first electrode may be an anode, the second electrode may be a cathode, the organic layer may include a hole transport region disposed between the first electrode and the emission layer and an electron transport region disposed between the emission layer and the second electrode, wherein the hole transport region may include a hole injection layer, a hole transport layer, an electron blocking layer, a buffer layer, or a combination thereof, and wherein the electron transport region may include a hole blocking layer, an electron transport layer, an electron injection layer, or a combination thereof, but embodiments are not limited thereto.

The emission layer may emit a blue light. For example, the blue light may have a wavelength in a range of about 440 nm to about 490 nm.

FIG. 1 is a schematic view of an exemplary embodiment of an organic light-emitting device 10. Hereinafter, the structure of an exemplary embodiment of an organic light-emitting device and an exemplary embodiment of a method of manufacturing an organic light-emitting device will be described in connection with FIG. 1. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent polymeric substrate, each having excellent mechanical strength, thermal stability, transparency, surface smoothness, ease of handling, and water resistance.

The first electrode 11 may be formed, for example, by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), or zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. In an exemplary embodiment, the first electrode 11 may have a three-layered structure of ITO/Ag/ITO, but the structure of the first electrode 11 is not limited thereto.

The organic layer 15 may be disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or a combination thereof.

In one or more embodiments, the hole transport region may include only either one of a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition, but are not limited thereto.

When a hole injection layer is formed by vacuum deposition, the deposition conditions may vary according to a compound that is used to form the hole injection layer, and the structure and thermal characteristics of the hole injection layer. In an exemplary embodiment, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. In an exemplary embodiment, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, a compound represented by Formula 202, or a combination thereof:

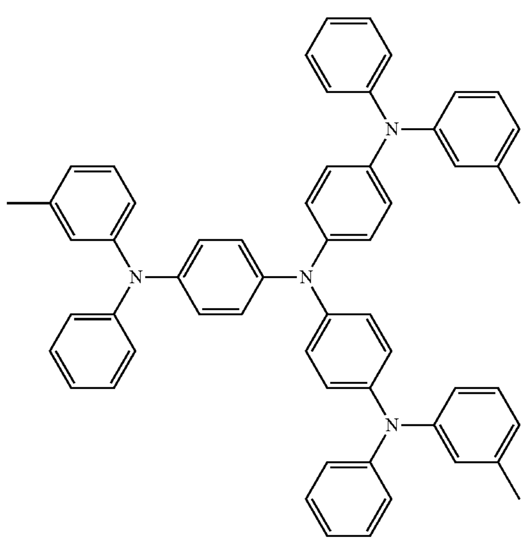

m-MTDATA

-continued

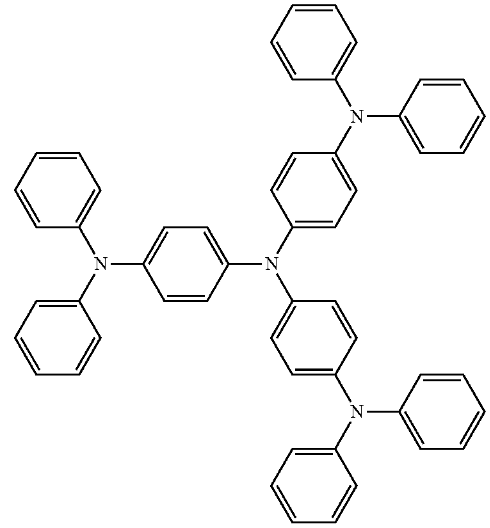

TDATA

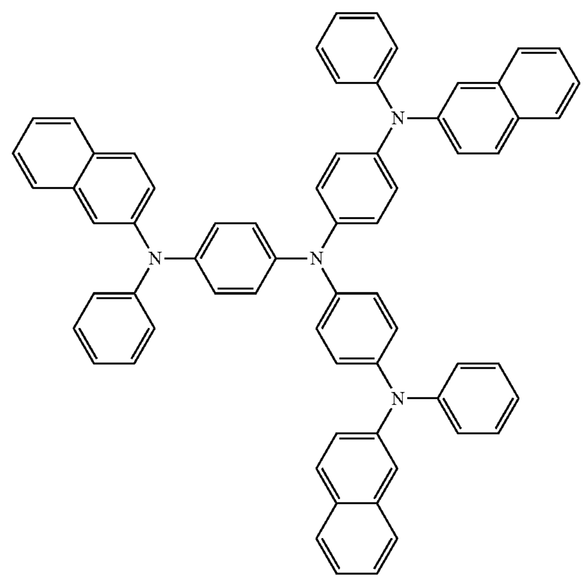

2-TNATA

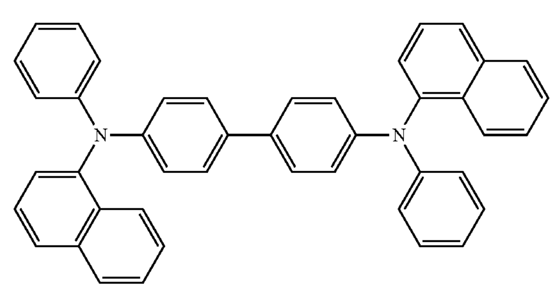

NPB

-continued

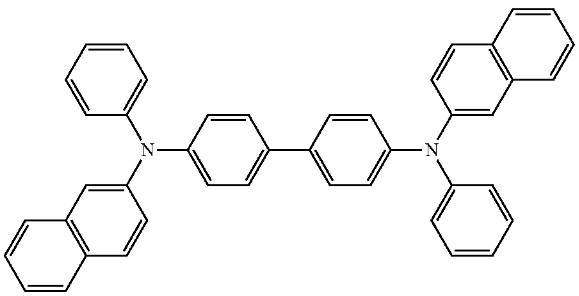

β-NPB

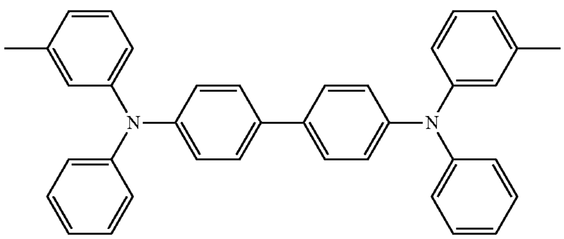

TPD

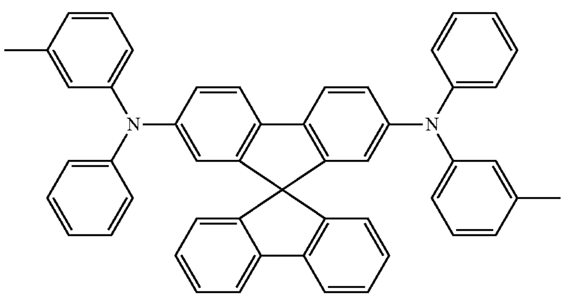

Spiro-TPD

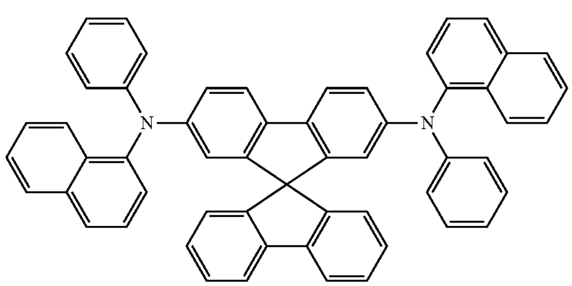

Spiro-NPB

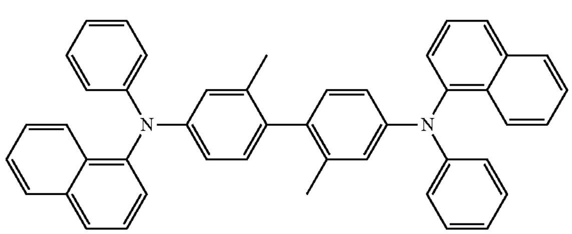

methylated NPB

-continued

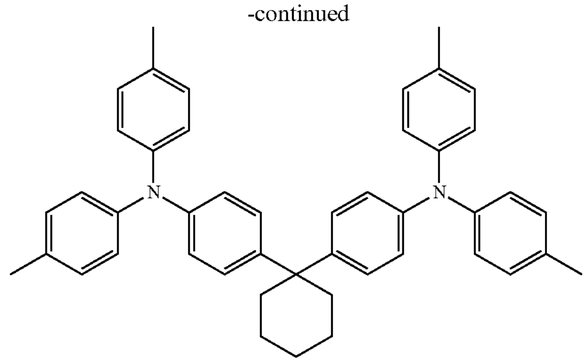

TAPC

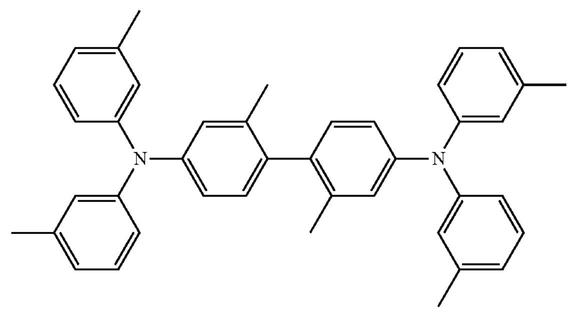

HMTPD

Formula 201

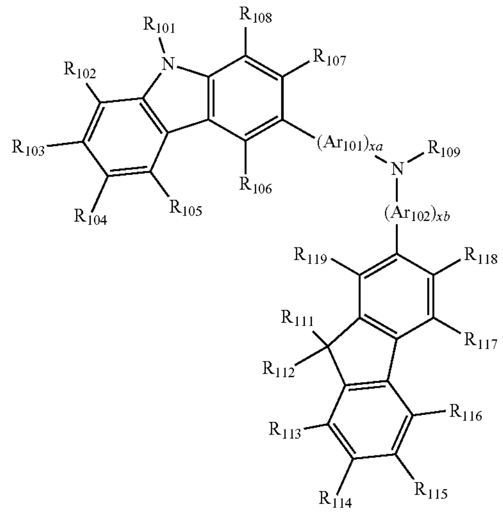

Formula 202

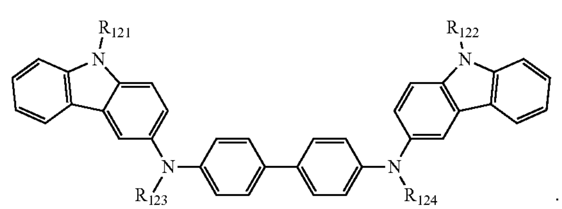

wherein, $Ar_{101}$ and $Ar_{102}$ in Formula 201 may each independently be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group.

In Formula 201, xa and xb may each independently be an integer from 0 to 5, or may be 0, 1, or 2. In an exemplary embodiment, xa may be 1 and xb may be 0, but embodiments of the present disclosure are not limited thereto.

$R_{101}$ to $R_{108}$, $R_{111}$ to $R_{119}$, and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and the like), or a $C_1$-$C_{10}$ alkoxy group (for example, a methoxy group, an ethoxy group, a propoxy group, a butoxy group, a pentoxy group, and the like);

a $C_1$-$C_{10}$ alkyl group or a $C_1$-$C_{10}$ alkoxy group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a phenyl group, a naphthyl group, an anthracenyl group, a fluorenyl group, or a pyrenyl group; or a phenyl group, a naphthyl group, an anthracenyl group, a fluorenyl group, or a pyrenyl group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group, but embodiments of the present disclosure are not limited thereto.

$R_{109}$ in Formula 201 may be:

a phenyl group, a naphthyl group, an anthracenyl group, or a pyridinyl group; or a phenyl group, a naphthyl group, an anthracenyl group, or a pyridinyl group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, or a pyridinyl group.

In one or more embodiments, the compound represented by Formula 201 may be represented by Formula 201A, but embodiments of the present disclosure are not limited thereto:

Formula 201A

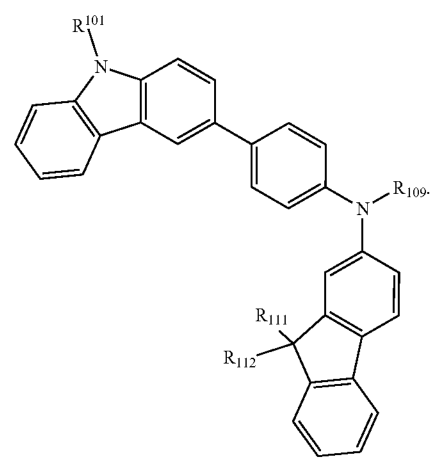

wherein $R_{101}$, $R_{111}$, $R_{112}$, and $R_{109}$ in Formula 201A are the same as described above.

In an exemplary embodiment, the compound represented by Formula 201, and the compound represented by Formula 202 may include one of Compounds HT1 to HT20, but embodiments of the present disclosure are not limited thereto:

HT1

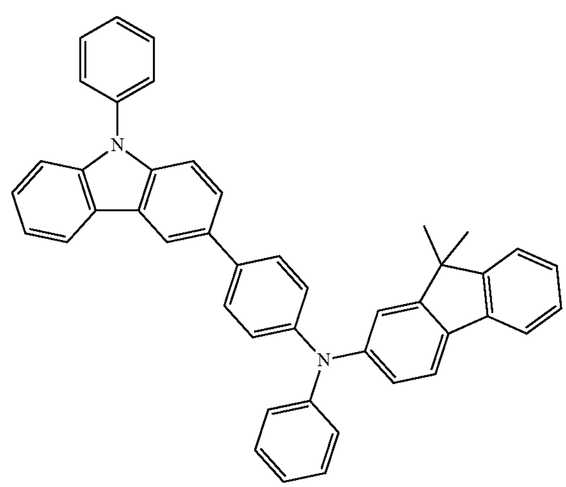

HT2
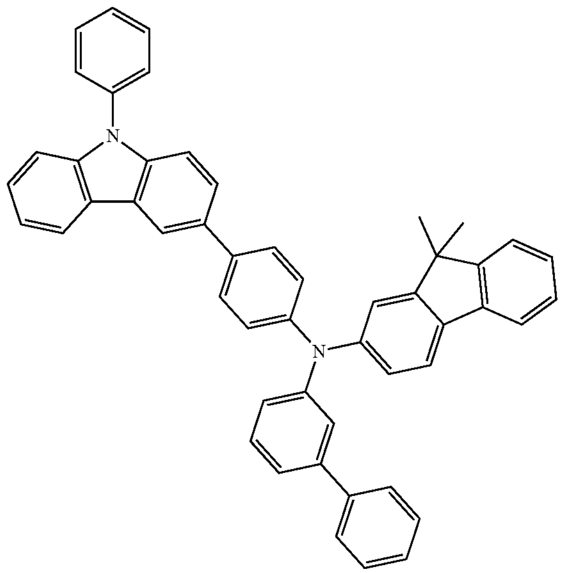
HT3
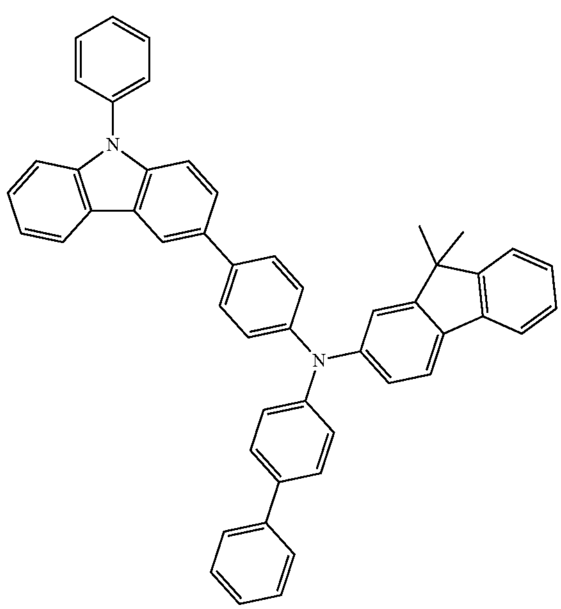
HT4
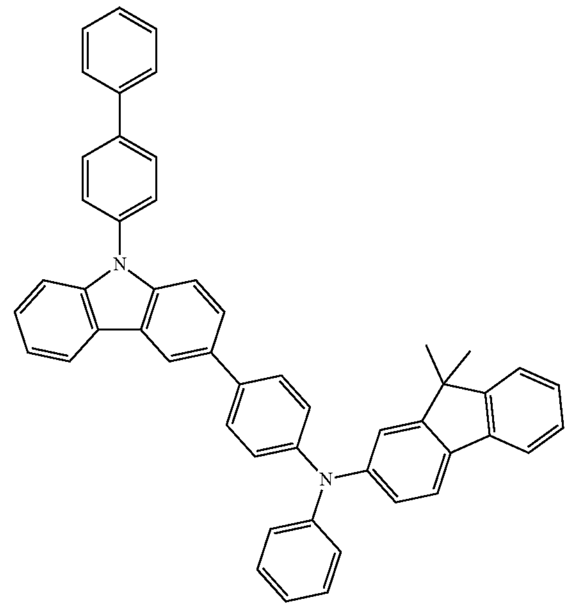
HT5
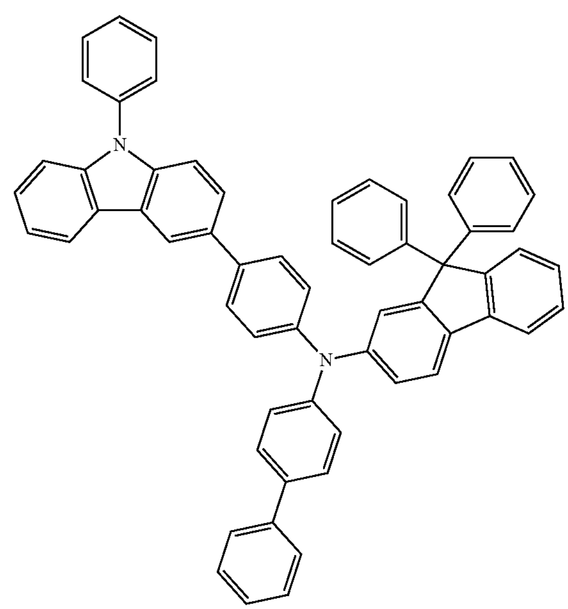

-continued
HT6
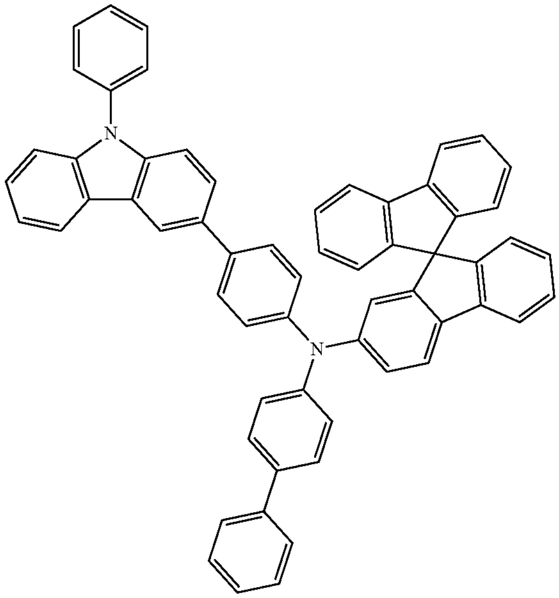
HT7
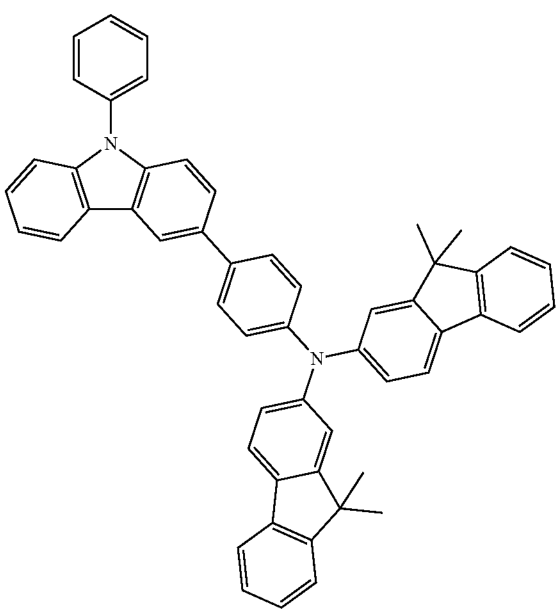
-continued
HT8
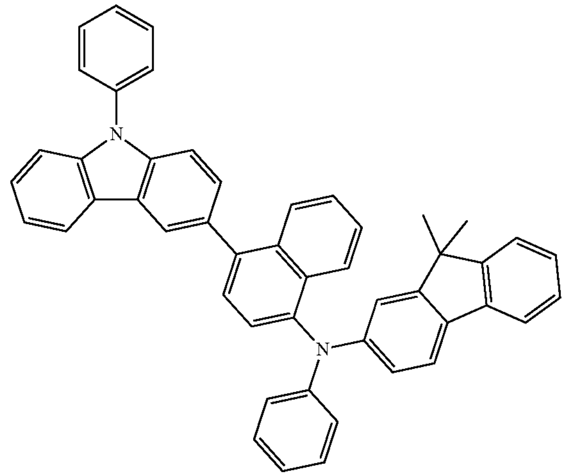
HT9
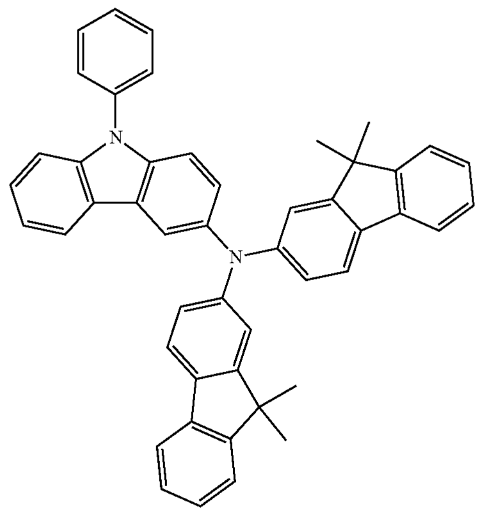
HT10
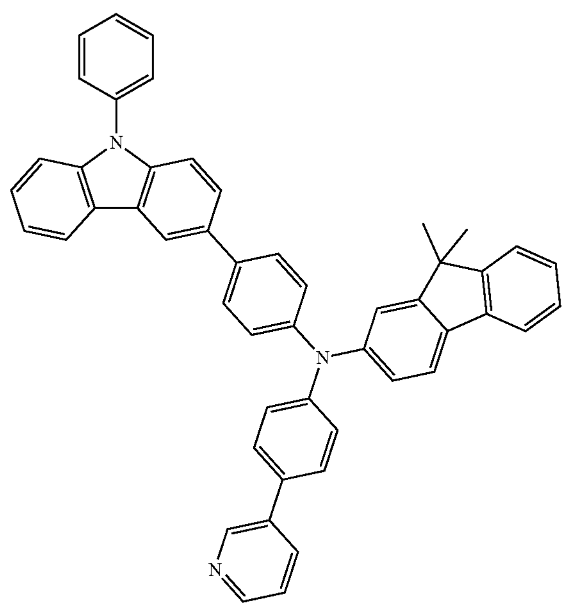

-continued
HT11
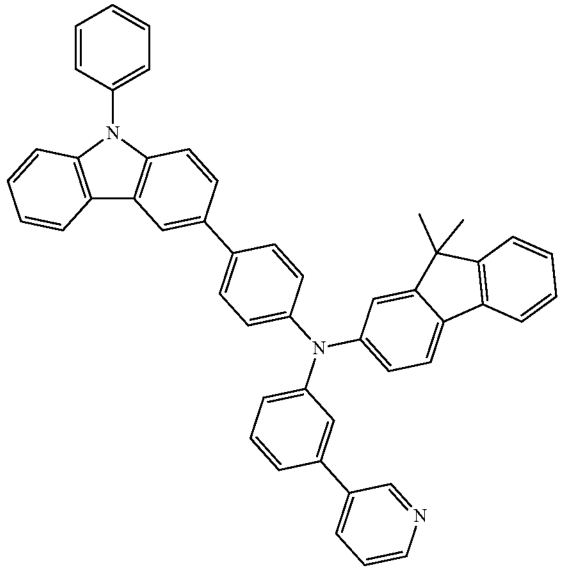
HT12
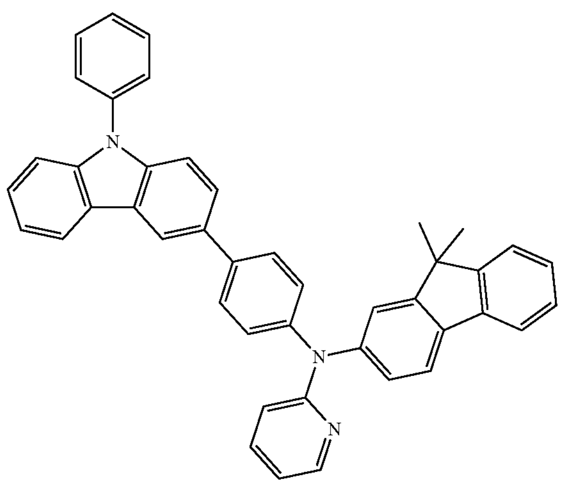
HT13
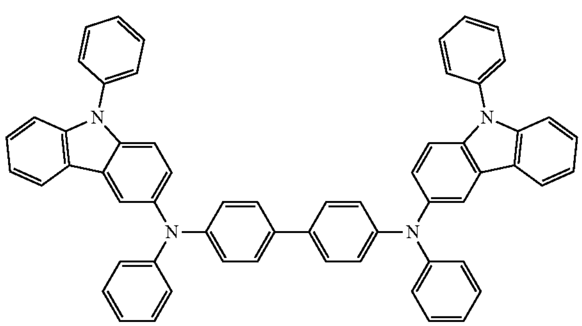
-continued
HT14
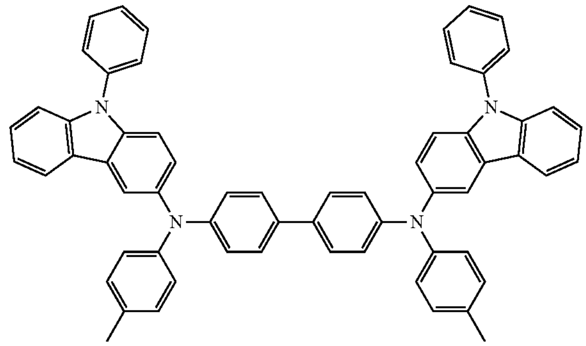
HT15
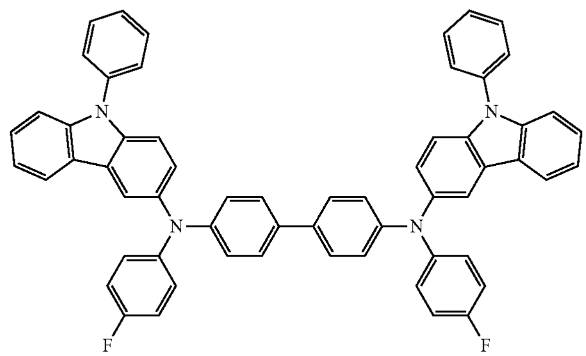
HT16
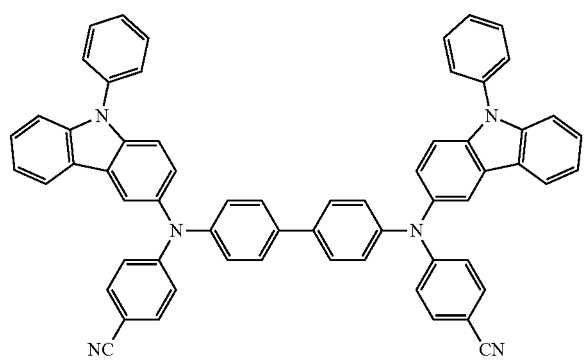
HT17
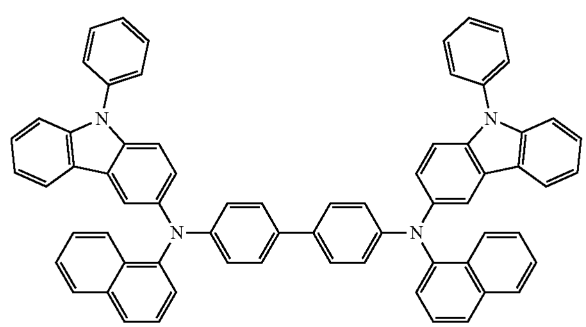

-continued

HT18

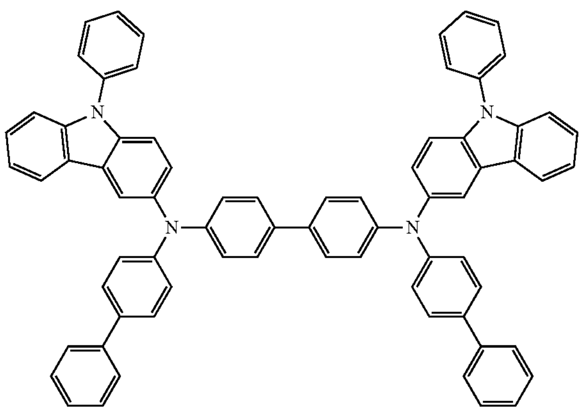

HT19

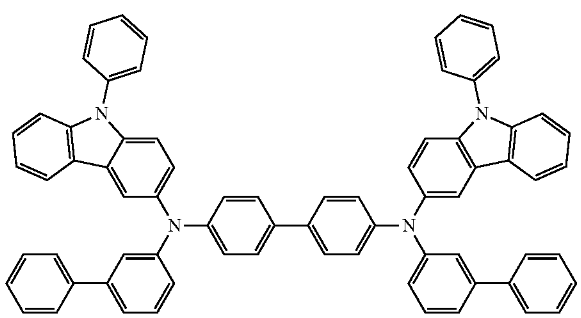

HT20

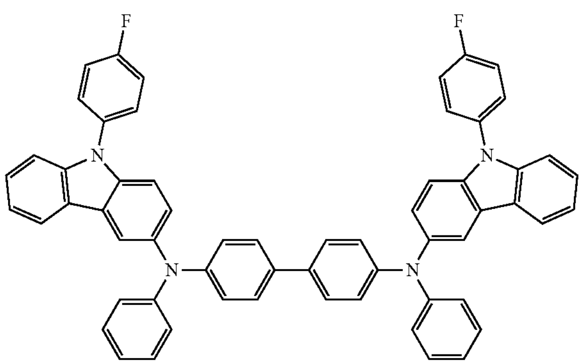

A thickness of the hole transport region may be in a range of about 100 Å to about 10,000 Å, for example, about 100 Å to about 1,000 Å. When the hole transport region includes a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, or a cyano group-containing compound, but embodiments of the present disclosure are not limited thereto. Non-limiting examples of the p-dopant are a quinone derivative, such as tetracyanoquinodimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 or Compound HT-D2 below, but are not limited thereto:

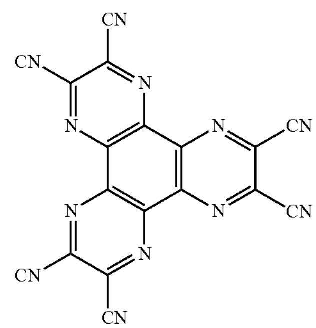

HT-D1

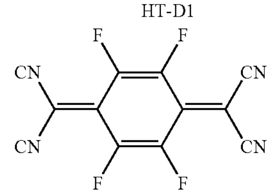

F4-TCNQ

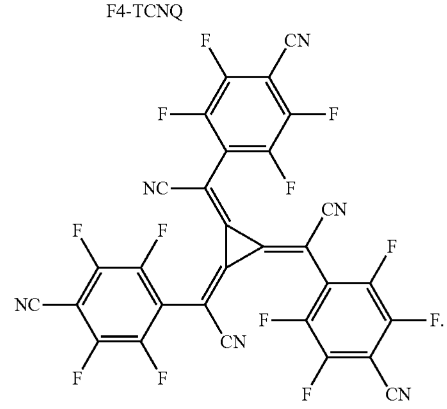

HT-D2

The hole transport region may include a buffer layer.

Without wishing to be bound by theory, the buffer layer may compensate for an optical resonance distance according to a wavelength of light emitted from the emission layer, and thus, efficiency of a formed organic light-emitting device may be improved.

The hole transport region may further include an electron blocking layer. The electron blocking layer may include, for example, mCP, but is not limited thereto:

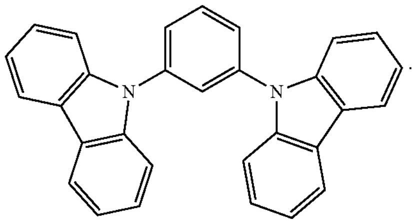

mCP

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

The emission layer may include a host and a dopant, and the dopant may include the polycyclic compound represented by Formula 1.

The host may include at least one of TPBi, TBADN, ADN(also referred to as "DNA"), CBP, CDBP, TCP, mCP, or Compound H50 to Compound H52:

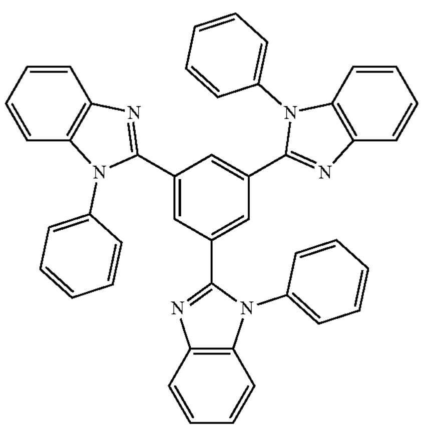

TPBi

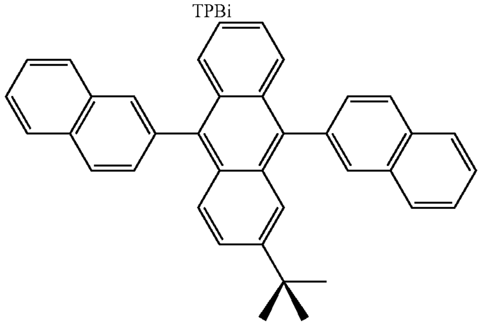

TBADN

-continued

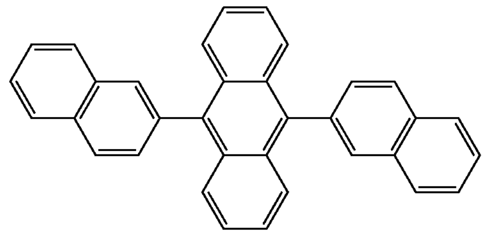

ADN

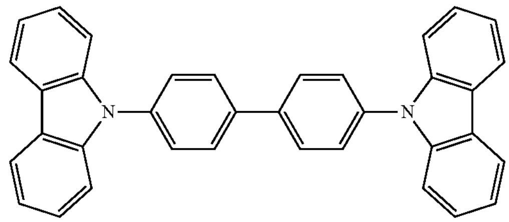

CBP

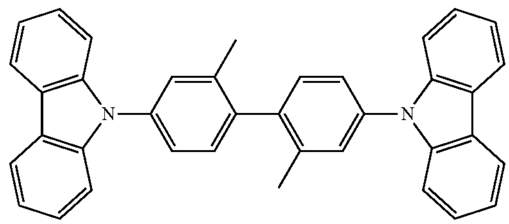

CDBP

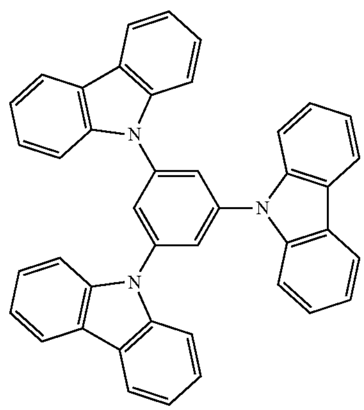

TCP

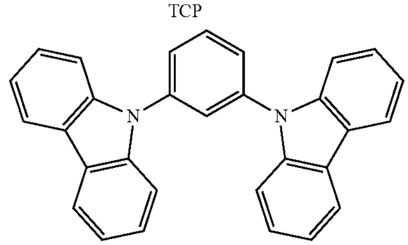

mCP

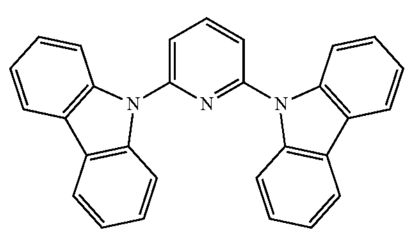

H50

-continued

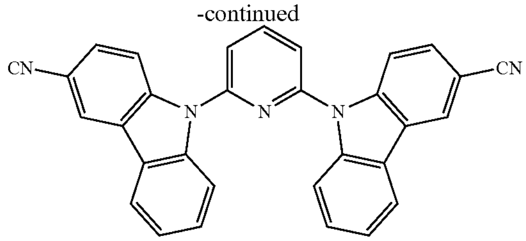

H51

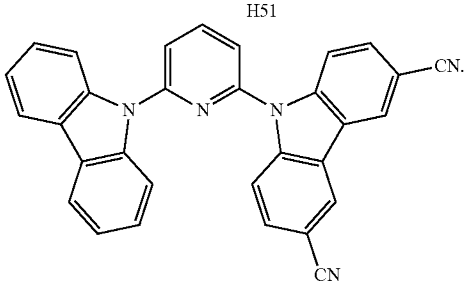

H52

In one or more embodiments, the host may further include a compound represented by Formula 301:

Formula 301

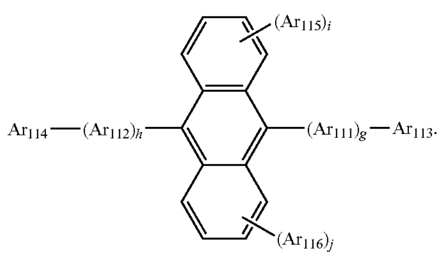

wherein $Ar_{111}$ and $Ar_{112}$ in Formula 301 may each independently be:

- a phenylene group, a naphthylene group, a phenanthrenylene group, a pyrenylene group, or a combination thereof; or
- a phenylene group, a naphthylene group, a phenanthrenylene group, a pyrenylene group, or a combination thereof, each substituted with at least one of a phenyl group, a naphthyl group, an anthracenyl group, or a combination thereof.

$Ar_{113}$ to $Ar_{116}$ in Formula 301 may each independently be:

- a $C_1$-$C_{10}$ alkyl group, a phenyl group, a naphthyl group, a phenanthrenyl group, a pyrenyl group, or a combination thereof; or
- a phenyl group, a naphthyl group, a phenanthrenyl group, a pyrenyl group, or a combination thereof, each substituted with at least one a phenyl group, a naphthyl group, an anthracenyl group, or a combination thereof.

g, h, i, and j in Formula 301 may each independently be an integer from 0 to 4 and may be, for example, 0, 1, or 2.

$Ar_{113}$ to $Ar_{116}$ in Formula 301 may each independently be:

- a $C_1$-$C_{10}$ alkyl group, substituted with at least one of a phenyl group, a naphthyl group, an anthracenyl group, or a combination thereof;
- a phenyl group, a naphthyl group, an anthracenyl group, a pyrenyl group, a phenanthrenyl group, a fluorenyl group, or a combination thereof;
- a phenyl group, a naphthyl group, an anthracenyl group, a pyrenyl group, a phenanthrenyl group, a fluorenyl group, or a combination thereof, each substituted with at least one of deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, or a fluorenyl group; or

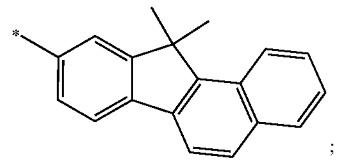 [SMILES: Cc1ccc2c(c1)C(C)(C)c1c-2ccc2ccccc12]

;

but embodiments of the present disclosure are not limited thereto.

In one or more embodiments, the host may include a compound represented by Formula 302:

Formula 302

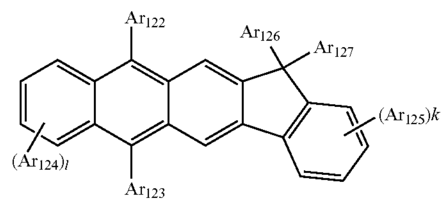

wherein $Ar_{122}$ to $Ar_{125}$ in Formula 302 are the same as described in detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Angstrom (A) to about 1,000 Å, for example, about 200 Å to about 600 Å. When the thickness of the emission layer is within any of these ranges, excellent light-emission characteristics may be obtained without a substantial increase in driving voltage.

Then, an electron transport region may be disposed on the emission layer.

The electron transport region may include a hole blocking layer, an electron transport layer, an electron injection layer, or a combination thereof.

In an exemplary embodiment, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP and Bphen, but may also include other materials:

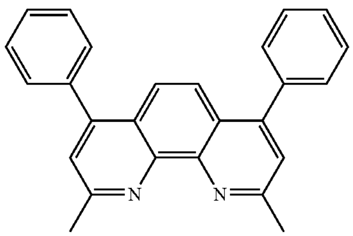

BCP

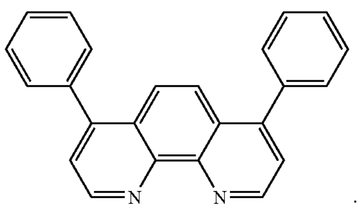

Bphen

A thickness of the hole blocking layer may be in a range of about 20 Å to about 1,000 Å, for example, about 30 Å to about 300 Å. When the thickness of the hole blocking layer is within these ranges, the hole blocking layer may have improved hole blocking ability without a substantial increase in driving voltage.

The electron transport layer may further include BCP, Bphen, $Alq_3$, BAlq, TAZ, NTAZ, or a combination thereof.

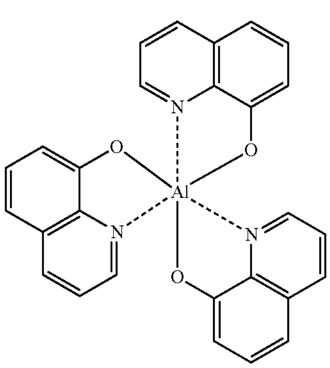

$Alq_3$

-continued

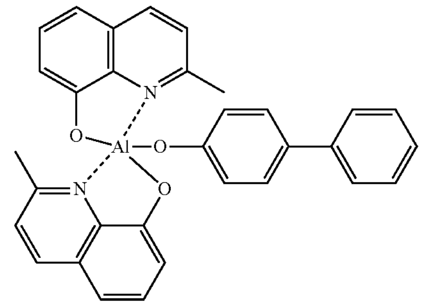

BAlq

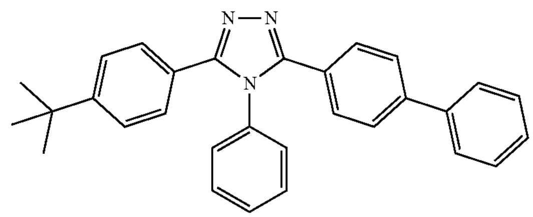

TAZ

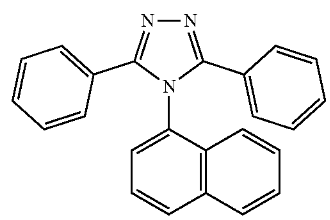

NTAZ

In one or more embodiments, the electron transport layer may include one or more of ET1 to ET25, but are not limited thereto:

ET1

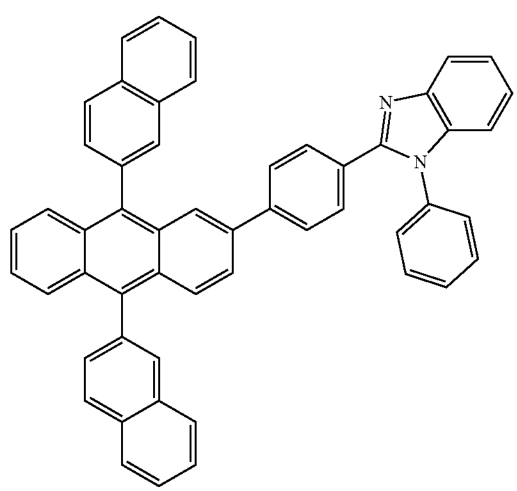

-continued
ET2
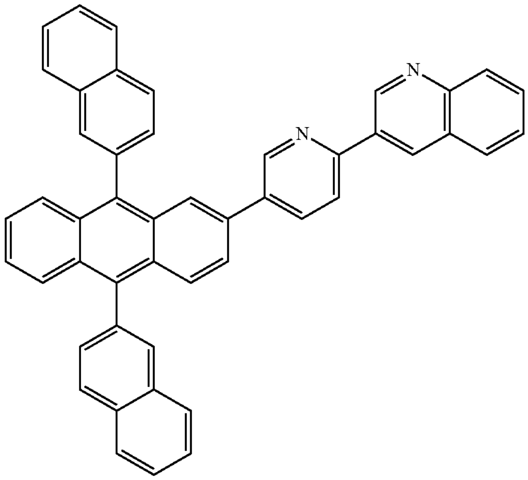
ET3
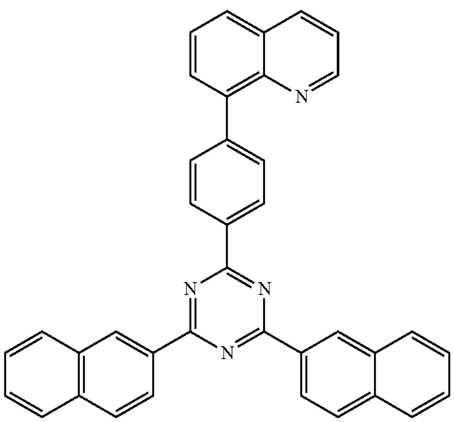
ET4
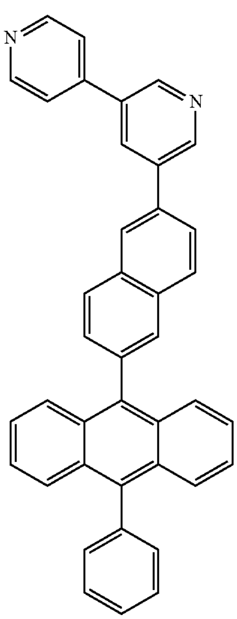
-continued
ET5
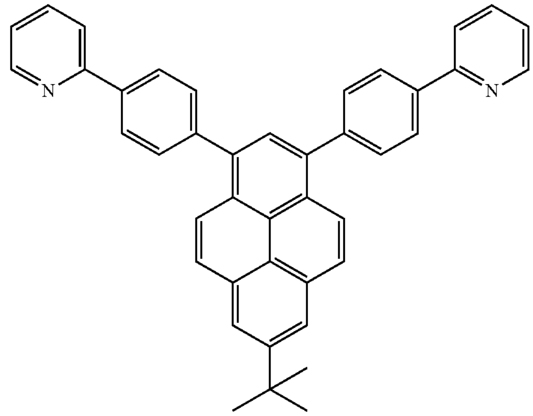
ET6
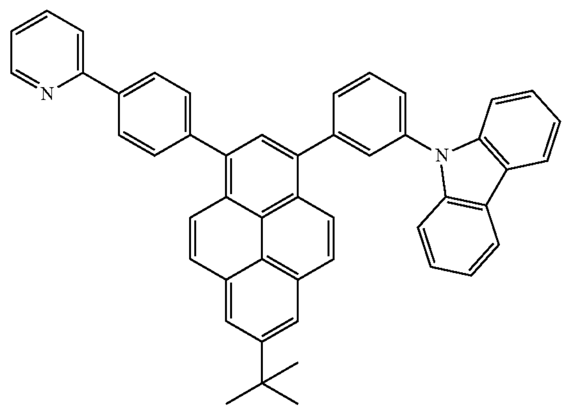
ET7
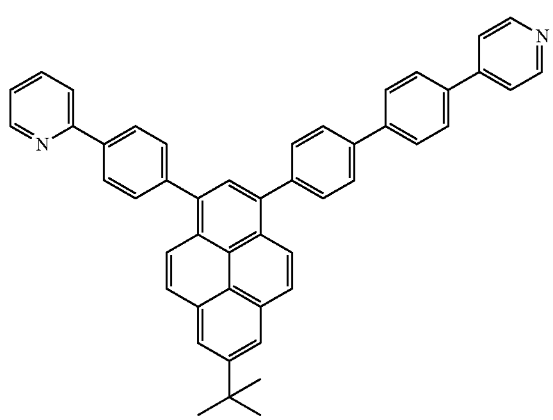

196
-continued
ET8
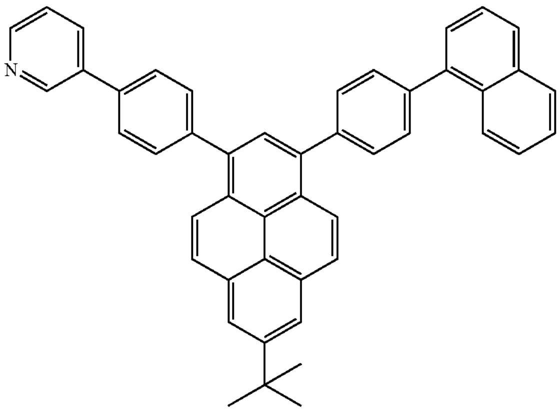
ET9
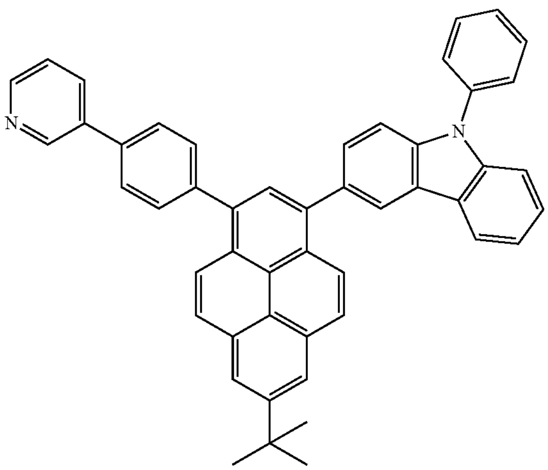
ET10
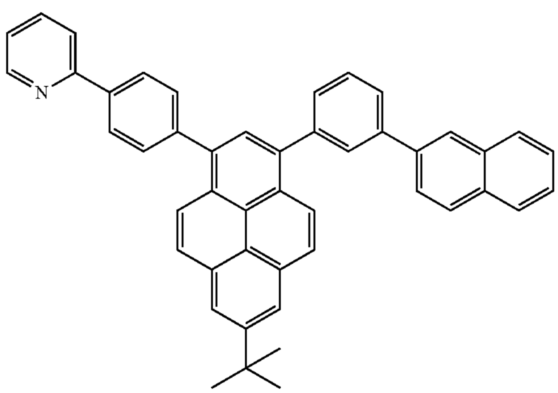
ET11
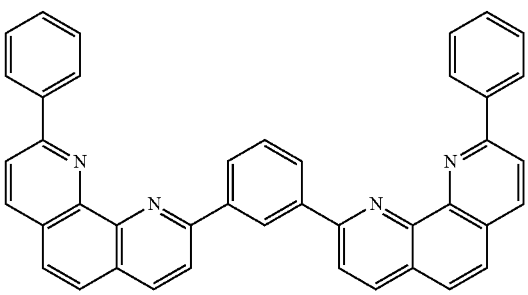
ET12
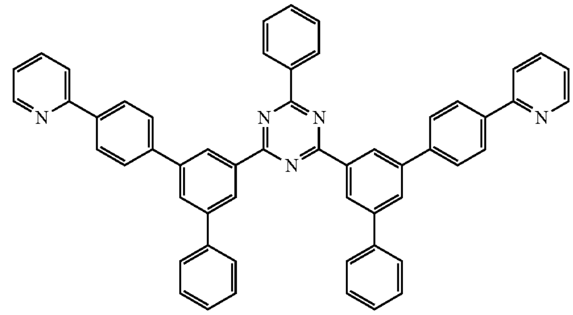
ET13
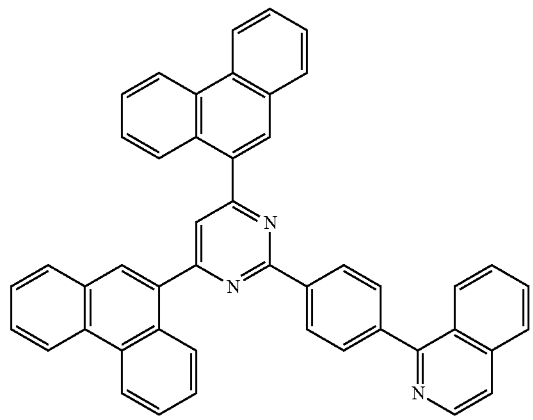
ET14
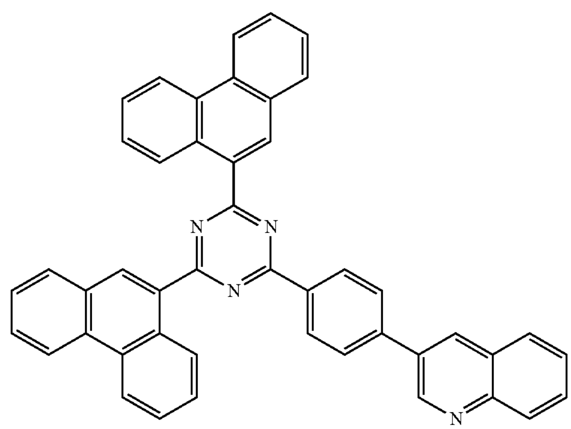
ET15
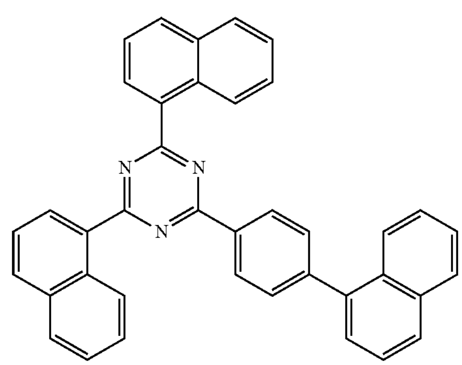

-continued
ET16
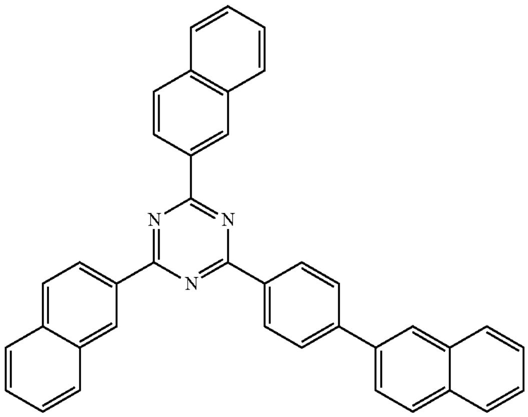
ET17
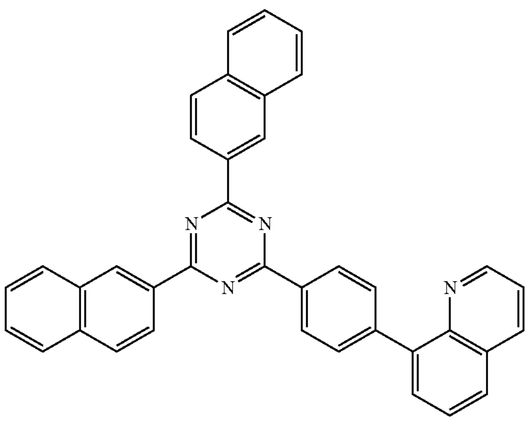
ET18
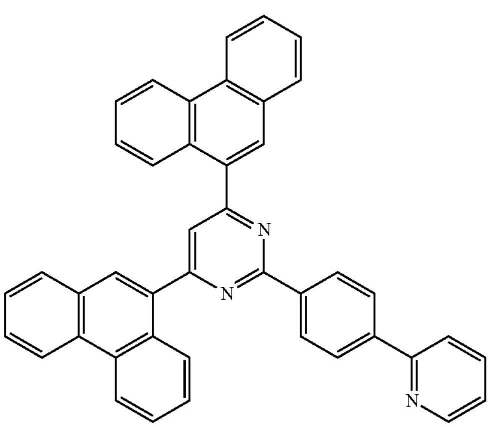
-continued
ET19
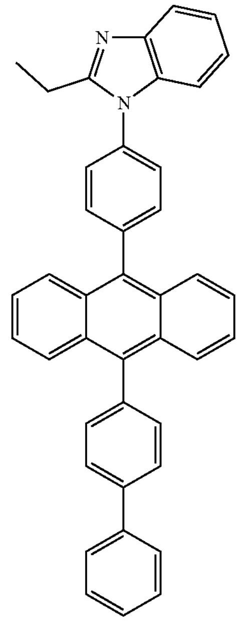
ET20
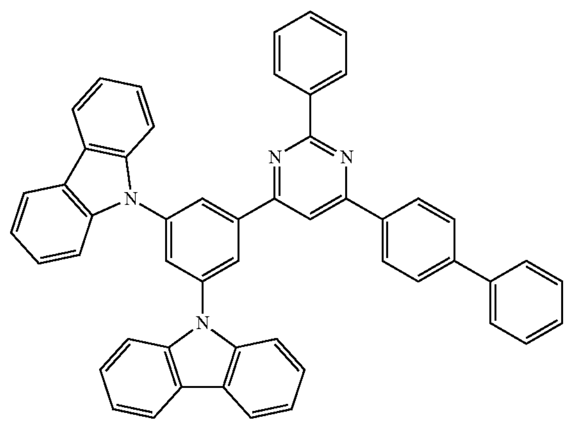
ET21
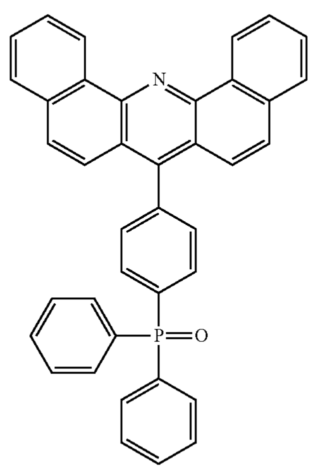

-continued

ET22

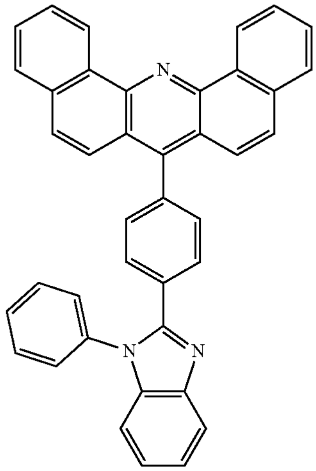

ET23

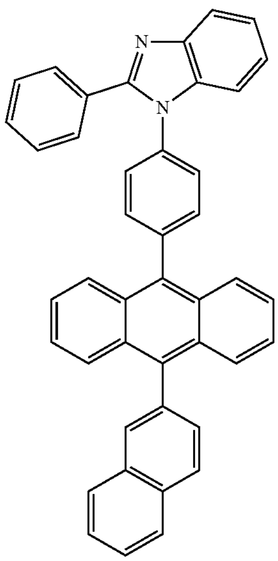

ET24

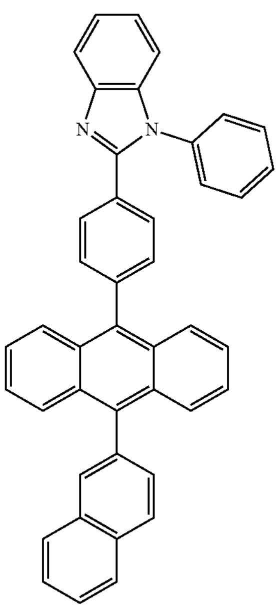

-continued

ET25

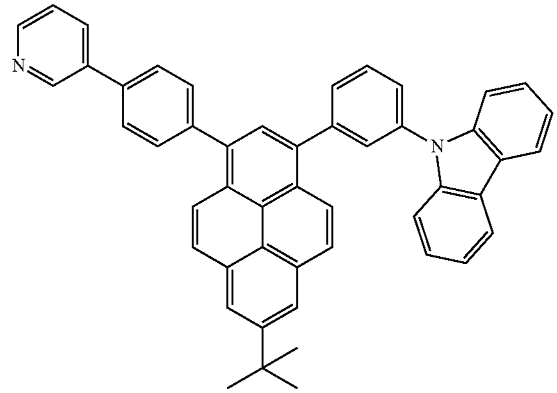

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Lithium ($L_1$) complex. The $L_1$ complex may include, for example, Compound ET-D1 (lithium 8-hydroxyquinolate, LiQ) or ET-D2:

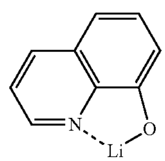

ET-D1

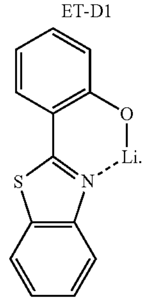

ET-D2

The electron transport region may include an electron injection layer (EIL) that promotes flow of electrons from the second electrode 19 thereinto.

The electron injection layer may include LiF, NaCl, CsF, $Li_2O$, BaO, or a combination thereof.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

The second electrode 19 may be formed on the organic layer 15. The second electrode 19 may be a cathode. A material for forming the second electrode 19 may be selected from metal, an alloy, an electrically conductive compound, and a combination thereof, which have a relatively low work function. In an exemplary embodiment, lithium ($L_1$), magnesium (Mg), aluminum (Al), aluminum-lithium (Al-$L_1$), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one N, O, P, Si, S, or a combination thereof other than 1 to 30 carbon atoms. The $C_1$-$C_{30}$ heterocyclic group may be a monocyclic group or a polycyclic group.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_2$-$C_{60}$ alkenyl group" as used herein refers to a hydrocarbon group formed by substituting at least one double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one double bond in the ring thereof and no aromaticity, and non-limiting examples thereof include a cyclopentenyl group, a cyclohexenyl group, and a cycloheptenyl group. The term "$O_3$—$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Non-limiting examples of the $C_1$-$C_{10}$ heterocycloalkenyl group include a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, P, Si, and S as a ring-forming atom, and 1 to 60 carbon atoms. The term "$C_1$-$C_{60}$ heteroarylene group," as used herein refers to a divalent group having a heterocyclic aromatic system that has at least one heteroatom selected from N, O, P, $S_1$, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein refers to —$OA_{102}$ (wherein A102 is the $C_6$-$C_{60}$ aryl group), and a $C_6$-$C_{60}$ arylthio group used herein indicates —$SA_{103}$ (wherein A103 is the $C_6$-$C_{60}$ aryl group).

The term "$C_7$-$C_{60}$ arylalkyl group" as used herein refers to -A104A105 (wherein A104 is $C_1$-$C_{54}$ alkyl group, and A105 is $C_6$-$C_{59}$ aryl group). Non-limiting example of the $C_7$-$C_{60}$ arylalkyl group is a cumyl group.

The term "monovalent non-aromatic condensed polycyclic group" as used herein refers to a monovalent group having two or more rings condensed to each other, only carbon atoms (for example, the number of carbon atoms may be in a range of 8 to 60) as a ring-forming atom, and no aromaticity in its entire molecular structure. Non-limiting examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, a heteroatom selected from N, O, P, Si, and S, other than carbon atoms (for example, the number of carbon atoms may be in a range of 2 to 60), as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, $—S_1(Q_{11})(Q_{12})(Q_{13})$, $—N(Q_{14})(Q_{15})$, $—B(Q_{16})(Q_{17})$, or $—P(=O)(Q_{18})(Q_{19})$, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, $—S_1(Q_{21})(Q_{22})(Q_{23})$, $—N(Q_{24})(Q_{25})$, $—B(Q_{26})(Q_{27})$, or $—P(=O)(Q_{28})(Q_{29})$; or $—S_1(Q_{31})(Q_{32})(Q_{33})$, $—N(Q_{34})(Q_{35})$, $—B(Q_{36})(Q_{37})$, or $—P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be hydrogen, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, or a substituted or unsubstituted monovalent non-aromatic condensed heteropolycyclic group.

The term "room temperature" as used herein refers to about 25° C.

The terms "biphenyl group" and "terphenyl group" as used herein refer to a monovalent group in which two or three benzene groups are linked to each other via a single bond, respectively.

Hereinafter, compounds and organic light-emitting devices according to exemplary embodiments are described in additional detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 158

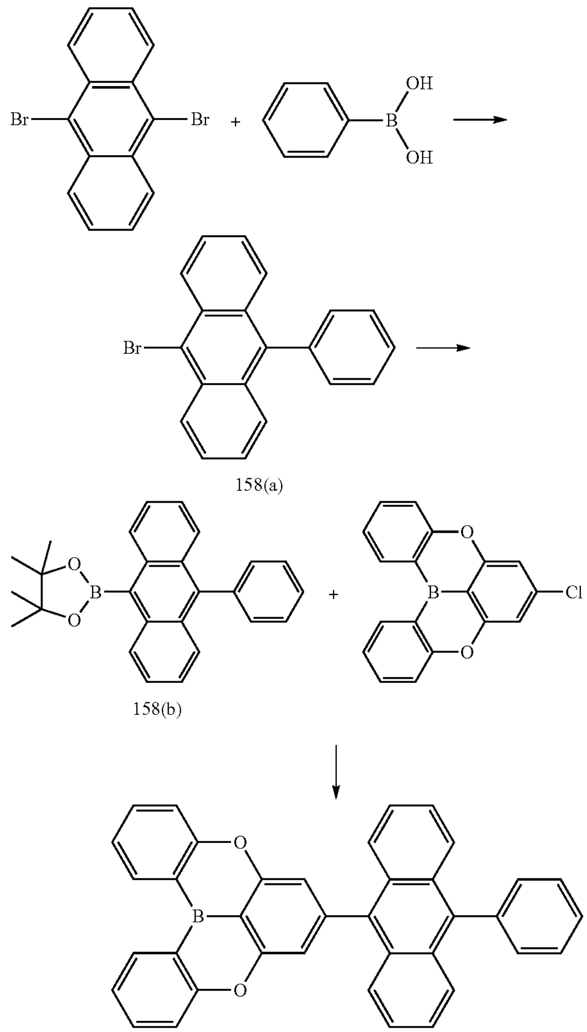

158(a)

158(b)

158

Synthesis of Intermediate 158 (a)

2.09 grams (g) (17.11 millimole (mmol)) of phenylboronic acid, 5.0 g (14.88 mmol) of 9,10-dibromoanthracene, 1.72 g (1.49 mmol) of palladium tetrakis(triphenylphosphine) ($Pd(PPh_3)_4$), 4.11 g (29.76 mmol) of potassium carbonate ($K_2CO_3$), and 1.22 g (2.98 mmol) of 2-dicyclohexylphosphino-2',6'-dimethoxybiphenyl (S-phos) were added to 50 milliliters (mL) of tetrahydrofuran and 50 mL of deionized (DI) water, followed by heating under reflux. Once the reaction was complete, the resulting mixture was cooled to room temperature. Then an organic layer was extracted therefrom using ethyl acetate, and the resulting organic layer was dried using anhydrous sodium sulfate ($Na_2SO_4$) for concentration, followed by separation through silica gel column chromatography (dichloromethane/hexane eluents). The solid resulting therefrom was recrystallized using hexane to thereby obtain 4.23 g (14.88 mmol) of a white solid, Intermediate 158(a) (yield: 85%).

LC-Mass Spetrometry (calculated value: 333.23 grams per mole (g/mol), found value: 334.2 g/mol (M+1))

Synthesis of Intermediate 158(b)

4.2 g (12.60 mmol) of Intermediate 158(a), 4.8 g (18.91 mmol) of bis(pinacolato)diboron, 3.09 g (31.51 mmol) of potassium acetate (AcOK), and 0.46 g (0.63 mmol) of 1,1'-bis(diphenylphosphino)ferrocene] palladium(II) dichloride, $Pd(dppf)Cl_2$ were added to a reaction vessel, and the mixture was dissolved in 30 mL of dioxane and stirred at a temperature of 100° C. Once the reaction was complete, the resulting mixture was cooled to room temperature, and an extraction process was performed by using ethyl acetate and water to thereby obtain an organic layer. The obtained organic layer was subjected to filtration through silica gel column chromatography for concentration. The resulting solid compound Intermediate 158(b) was used in the following reaction without any further purification process. (4.1 g, yield: 86%)

LC-Mass Spetrometry (calculated value: 380.19 g/mol, found value: 381.3 g/mol (M+1))

Synthesis of Compound 158

5.99 g (15.76 mmol) of Intermediate 158(b), 4.0 g (13.13 mmol) of 7-chloro-5,9-dioxa-13b-boranaphtho[3,2,1-de]anthracene, 0.38 g (0.66 mmol) of (bis(dibenzylideneacetone) palladium(0)), $Pd(dba)_2$, 5.58 g (26.27 mmol) of potassium phosphate tribasic ($K_3PO_4$), and 1.08 g (2.63 mmol) of S-phos were added to 40 mL of toluene and 40 mL of DI water. Then the mixture was heated under reflux. Once the reaction was complete, the resulting mixture was cooled to room temperature. Then an organic layer was extracted therefrom using ethyl acetate, and the resulting organic layer was dried using anhydrous sodium sulfate ($Na_2SO_4$) for concentration, followed by separation through silica gel column chromatography (dichloromethane/hexane). The solid resulting therefrom was recrystallized using hexane to thereby obtain 3.6 g (13.13 mmol) of a yellow solid, Compound 15 (yield: 52%).

LC-Mass Spetrometry (calculated value: 522.41 g/mol, found value: 523.4 g/mol (M+1))

Synthesis Example 2: Synthesis of Compound (160)

Synthesis of Compound 160

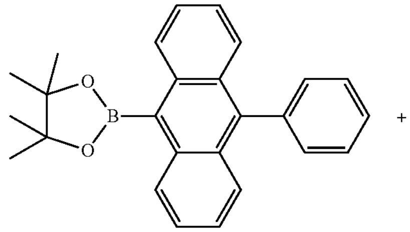

158(b)

-continued

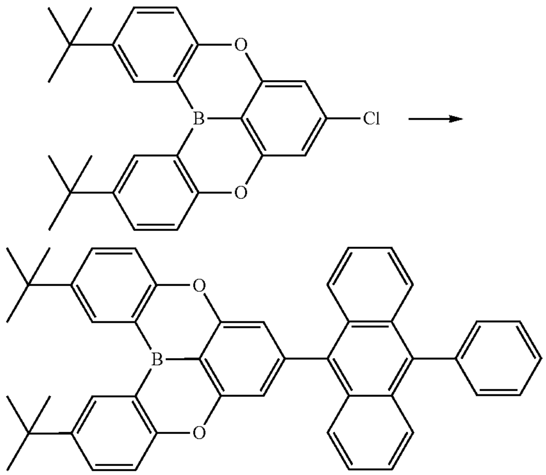

160

Compound 160 was synthesized in substantially the same manner as in Synthesis of Compound 158 in Synthesis Example 1, except that 2,12-di-tert-butyl-7-chloro-5,9-di-oxa-13b-boranaphtho[3,2,1-de]anthracene was used instead of 7-chloro-5,9-dioxa-13b-boranaphtho[3,2,1-de]anthracene (yield: 4.2 g, 69%).

LC-Mass Spetrometry (calculated value: 634.3 g/mol, found value: 635.3 g/mol (M+1))

Synthesis Example 3: Synthesis of Compound (170)

Synthesis of Compound 170

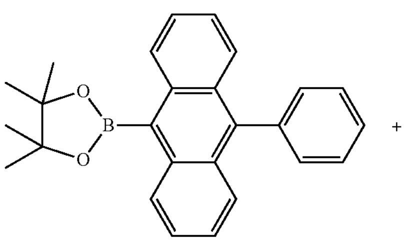

158(b)

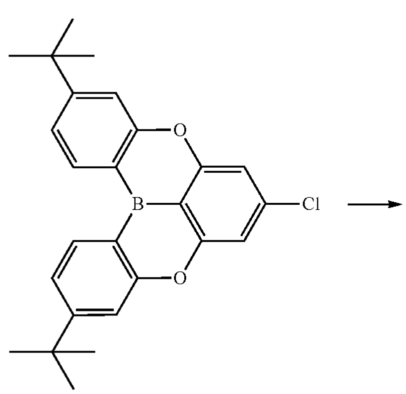

-continued

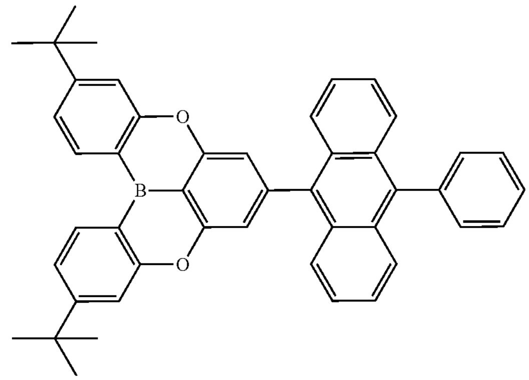

170

Compound 170 was synthesized in substantially the same manner as in Synthesis of Compound 158 in Synthesis Example 1, except that 3,11-di-tert-butyl-7-chloro-5,9-di-oxa-13b-boranaphtho[3,2,1-de]anthracene was used instead of 7-chloro-5,9-dioxa-13b-boranaphtho[3,2,1-de]anthracene (yield: 4.2 g, 69%).

LC-Mass Spetrometry (calculated value: 634.3 g/mol, found value: 635.3 g/mol (M+1))

Synthesis Example 4: Synthesis of Compound (165)

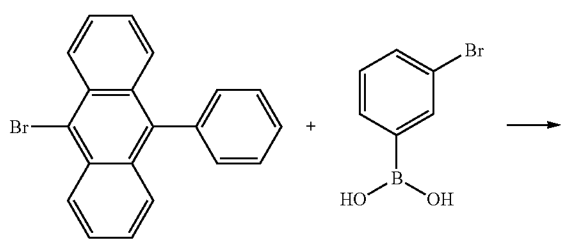

158(a)

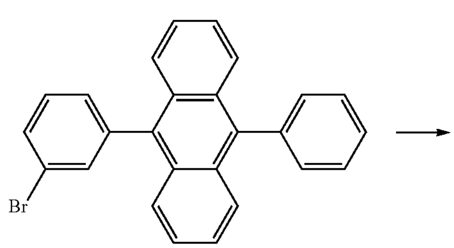

165(a)

-continued

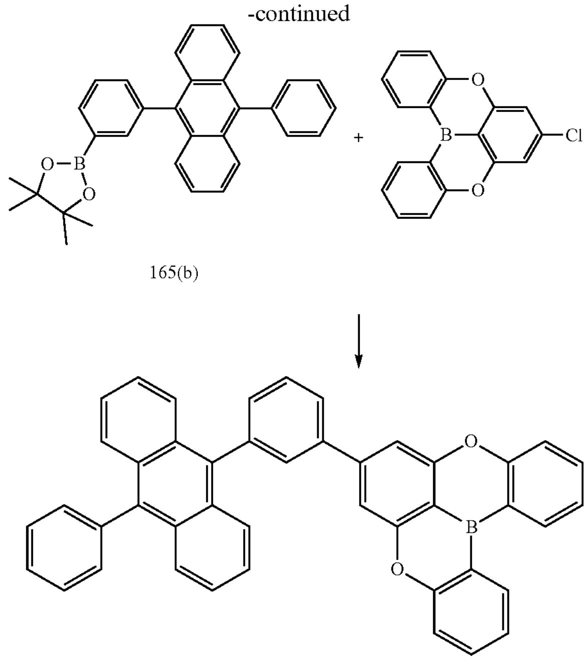

165(b)

165

Synthesis of Intermediate 165(a)

Intermediate 165(a) was synthesized in substantially the same manner as in Synthesis of Compound 158(a) in Synthesis Example 1, except that (3-bromophenyl)boronic acid was used instead of phenylboronic acid (yield: 5.24 g, 86%)

LC-Mass Spetrometry (calculated value: 408.05 g/mol, found value: 410.05 g/mol (M+1))

Synthesis of Intermediate 165(b)

Intermediate 165(a) was synthesized in substantially the same manner as in Synthesis of Compound 158(b) in Synthesis Example 1, except that Intermediate 165(a) was used instead of Intermediate 158(a) (yield: 5.8 g, 99%).

LC-Mass Spetrometry (calculated value: 456.23 g/mol, found value: 457.2 g/mol (M+1))

Synthesis of Compound 165

Compound 165 was synthesized in substantially the same manner as in Synthesis of Compound 158 in Synthesis Example 1, except that Intermediate 165(b) was used instead of Intermediate 158(b) (yield: 2.6 g, 43%).

LC-Mass Spetrometry (calculated value: 598.21 g/mol, found value: 599.31 g/mol (M+1))

Synthesis Example 5: Synthesis of Compound (167)

Synthesis of Compound 167

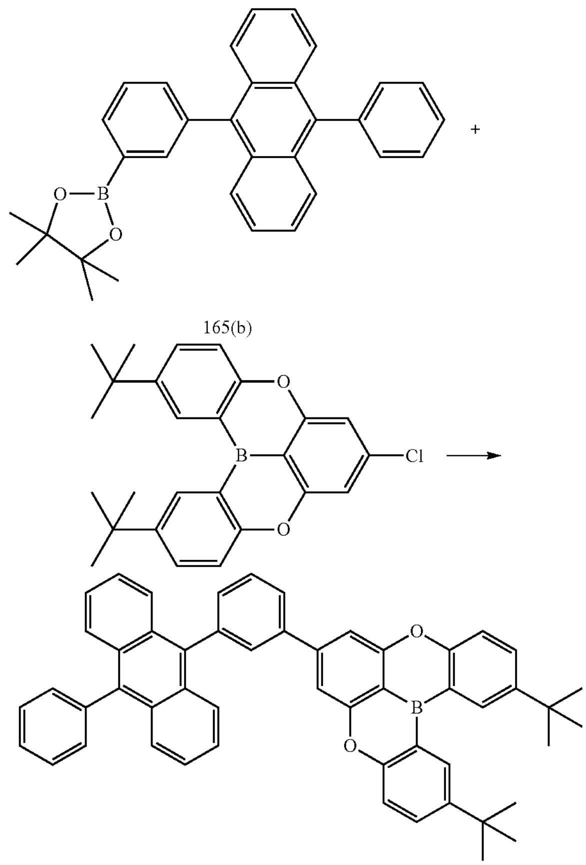

165(b)

167

Compound 167 was synthesized in substantially the same manner as in Synthesis of Compound 160 in Synthesis Example 2, except that Intermediate 165(b) was used instead of Intermediate 158(b) (yield: 3.8 g, 55%).

LC-Mass Spetrometry (calculated value: 710.34 g/mol, found value: 711.3 g/mol (M+1))

Evaluation Example 1: Material Property Evaluation

The optical band gap $E_g$, $S_{1,max}$ energy level (eV), $S_{1,onset}$ (nm), PL spectrum maximum (nm), and full width at half maximum (FWHM, nm) of some of the polycyclic compounds represented by Formula 1, e.g., Compounds 158, 160, and 170, were measured as described in Table 1. The results thereof are shown in Table 2.

TABLE 1

| | |
|---|---|
| Evaluation method of optical band gap $E_g$ | Each compound was diluted at a concentration of $1 \times 10^{-5}$M in Toluene, and an UV absorption spectrum thereof was measured at room temperature by using a Shimadzu UV-350 spectrometer. A LUMO energy level thereof was calculated by using an optical band gap ($E_g$) from an edge of the absorption spectrum and a HOMO energy level. |

TABLE 1-continued

| | |
|---|---|
| $S_1$ energy level evaluation method | A photoluminescence spectrum of a mixture of each compound, diluted with toluene at a concentration of about 1 × $10^{-4}$M, was measured by using a device for measuring photoluminescence (F7000 spectrofluorometer (available from Hitachi)) at room temperature. The observed peaks were analyzed to calculate onset $S_1$ energy levels. |
| Measurement of photoluminescence (PL) spectrum | Each compound was dissolved in a toluene at a concentration of $10^{-4}$M, and then a F7000 spectrofluorometer (available from Hitachi) in which a Xenon lamp was mounted was used to measure a PL spectrum (@ 298K) of each compound and FWHM of each compound from the PL spectrum. |

TABLE 2

| Compound No. | $E_g$ | $S_{1,max}$ (eV) | $S_{1,onset}$ (nm) | PL (nm) | FWHM (nm) |
|---|---|---|---|---|---|
| 158 | 2.98 | 2.84 | 408 | 436 | 48 |
| 160 | 2.98 | 2.86 | 415 | 433 | 49 |
| 170 | 3.0 | 2.88 | 401 | 430 | 52 |

Referring to the results of Table 2, the polycyclic compound represented by Formula 1 was found to have excellent light-emitting characteristics and suitable electrical characteristics for use as a dopant in an electronic device, e.g., an organic light-emitting device.

Evaluation Example 2: Evaluation of Photoluminescent Quantum Yield (PLQY) and Decay Time (1) Preparation of Thin Film A quartz substrate was prepared by washing with chloroform and pure water. Then, as shown in Table 2, compounds (99.5 wt % of poly(methyl methacrylate:0.5 wt % of compound) were each dissolved in dichloromethane to use in spin-coating. Thus, a thin film having a thickness of 30 nm was manufactured.

(2) Evaluation of Photoluminescent Quantum Yield

Photoluminescent quantum yields in the thin film was evaluated by using Hamamatsu Photonics absolute PL quantum yield measurement system employing PLQY measurement software (Hamamatsu Photonics, Ltd., Shizuoka, Japan), in which a xenon light source, a monochromator, a photonic multichannel analyzer, and an integrating sphere are mounted. Thus, PLQY of the thin film of the compounds shown in Table 2 were measured accordingly.

(3) Decay Time Evaluation

The PL spectrum of each thin film was evaluated at room temperature by using a time-resolved photoluminescence (TRPL) measurement system, Fluo Time 300 (available from PicoQuant), and a pumping source, PLS340 (available from PicoQuant, excitation wavelength=340 nm, spectral width=20 nm). Then, a wavelength of the main peak in the PL spectrum was determined, and upon photon pulses (pulse width=500 picoseconds, ps) applied to the thin film by PL S340, the number of photons emitted at the wavelength of the main peak for each thin film was repeatedly measured over time by time-correlated single photon counting (TCSPC), thereby obtaining TRPL curves available for the sufficient fitting. $T_{decay}(E_x)$ (decay time) of the thin film was obtained by fitting at least two exponential decay functions to the results thereof. The functions used for the fitting are as described in Equation 1, and a decay time $T_{decay}$ having the largest value among values for each of the exponential decay functions used for the fitting was taken as $T_{decay}(E_x)$, i.e., a decay time. The results thereof are shown in Table 3.

The remaining decay time $T_{decay}$ values were used to determine the lifetime of typical fluorescence to be decayed. Here, during the same measurement time as the measurement time for obtaining TRPL curves, the same measurement was repeated once more in a dark state (i.e., a state where a pumping signal incident on each of the films was blocked), thereby obtaining a baseline or a background signal curve available as a baseline for the fitting:

$$f(t) = \sum_{i=1}^{n} A_i \exp(-t / T_{decay,i}) \quad \text{Equation 1}$$

TABLE 3

| Compound No. | PLQY | $T_{decay}(E_x)$ (ns) |
|---|---|---|
| 158 | 0.957 | 91 |
| 160 | 0.934 | 19 |
| 170 | 0.954 | 109 |

Referring to the results shown in Table 3, the polycyclic compound represented by Formula 1, e.g., Compounds 158, 160, and 170, were found to be suitable for use as a dopant and have excellent PLQY (in film) and decay time characteristics.

Example 1

A glass substrate, on which an ITO electrode was formed, was cut to a size of 50 millimeters (mm)×50 mm×0.5 mm. Then the glass substrate was sonicated in acetone isopropyl alcohol and pure water for about 15 minutes in each solvent, and cleaned by exposure to ultraviolet rays with ozone for 30 minutes.

Subsequently, HAT-CN was deposited on the ITO electrode (anode) of the glass substrate to form a hole injection layer having a thickness of 100 Å, NPB was deposited on the hole injection layer to form a first hole transport layer having a thickness of 500 Å, TCTA was deposited on the first hole transport layer to form a second hole transport layer having a thickness of 50 Å, and mCP was deposited on the second hole transport layer to form an electron blocking layer having a thickness of 50 Å.

A host, a sensitizer, and an emitter were co-deposited at a predetermined weight ratio on the electron blocking layer as shown in Table 4 to thereby form an emission layer having a thickness of 400 Å.

DBFPO was deposited on the emission layer to form a hole blocking layer having a thickness of 100 Å. DBFPO and LiQ were co-deposited on the hole blocking layer at a weight ratio of 5:5 to form an electron transport layer having a thickness of 300 Å. LiQ was deposited on the electron transport layer to form an electron injection layer having a thickness of 10 Å. Aluminum (Al) was deposited on the electron injection layer to form cathode having a thickness of 1000 Å, thereby completing the manufacture of an organic light-emitting device.

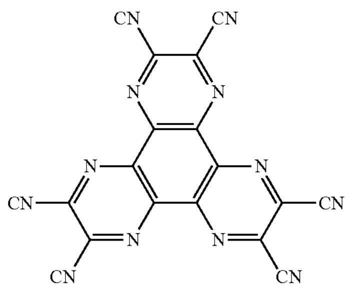

HT-D1(HAT-CN)

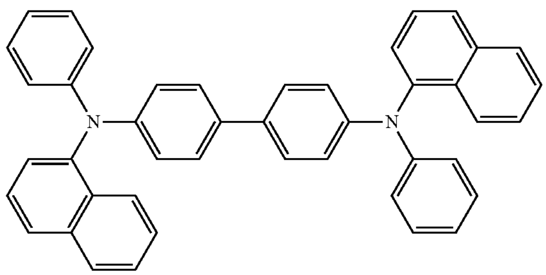

NPB

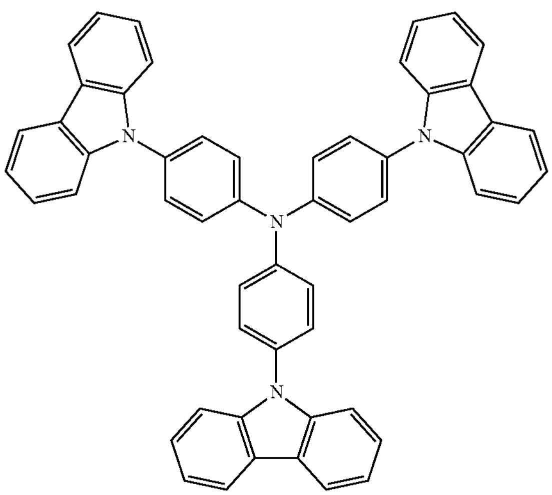

TCTA

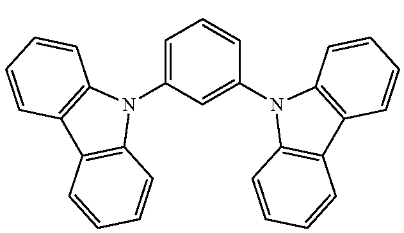

mCP

-continued

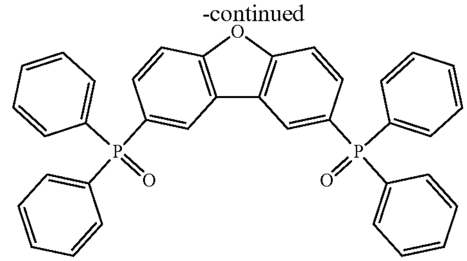

DBFPO

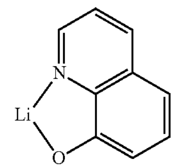

Liq

Examples 2 to 5 and Comparative Examples 1 to 3

Organic light-emitting devices were manufactured in the same manner as in Example 1, except that compounds shown in Table 4 were used in the formation of the emission layer.

TABLE 4

| | Host (mixed ratio) | Sensitizer (amount) | Emitter (amount) |
|---|---|---|---|
| Example 1 | H1, H2 (50:50) (84 wt %) | S-1 (13 wt %) | Compound 158 (3 wt %) |
| Example 2 | H1, H2 (50:50) (84 wt %) | S-1 (13 wt %) | Compound 160 (3 wt %) |
| Example 3 | H1, H2 (50:50) (84 wt %) | S-1 (13 wt %) | Compound 170 (3 wt %) |
| Example 4 | H1, H2 (50:50) (84 wt %) | S-1 (13 wt %) | Compound 165 (3 wt %) |
| Example 5 | H1, H2 (50:50) (84 wt %) | S-1 (13 wt %) | Compound 167 (3 wt %) |
| Comparative Example 1 | H1, H2 (50:50) (84 wt %) | S-1 (13 wt %) | Compound A (3 wt %) |
| Comparative Example 2 | H1, H2 (50:50) (84 wt %) | S-1 (13 wt %) | Compound B (3 wt %) |
| Comparative Example 3 | Compound C (97 wt %) | — | Compound A (3 wt %) |

H1

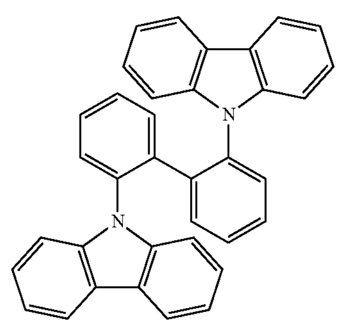

-continued
H2
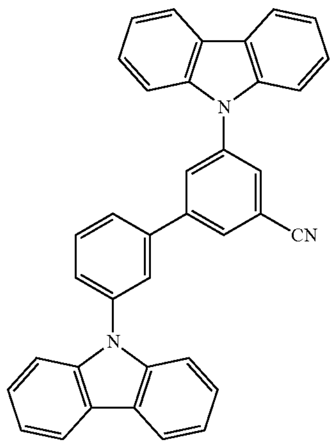
S-1
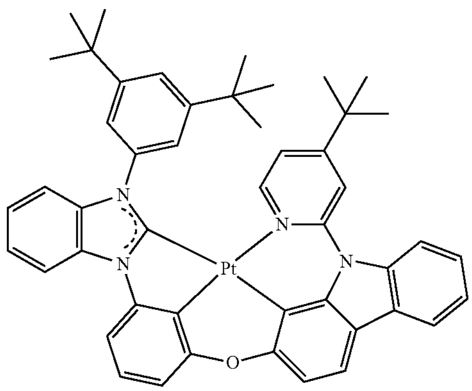
A
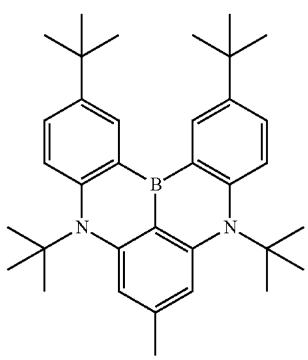
B
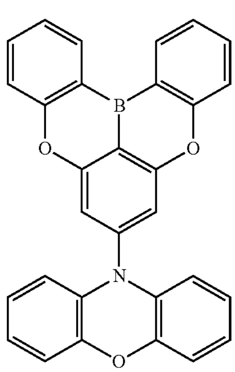
-continued
C
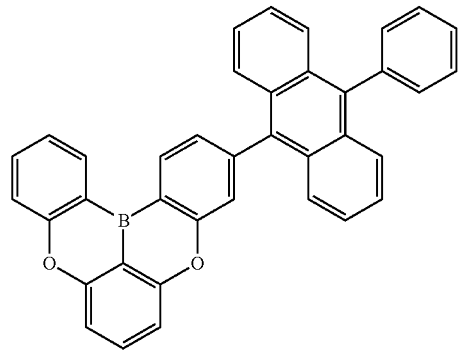
158
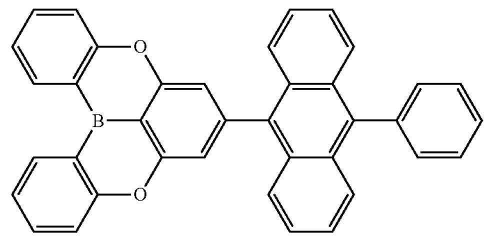
160
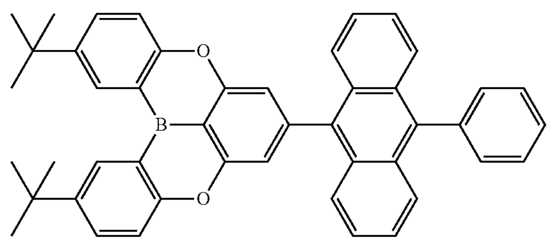
170
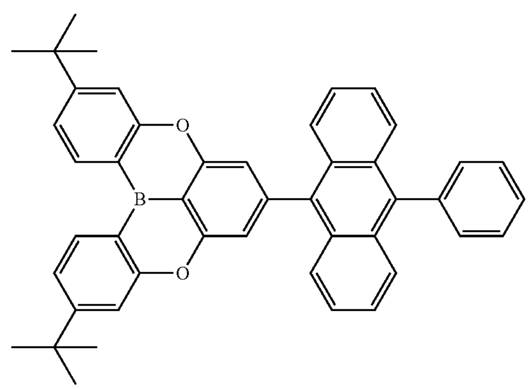
165
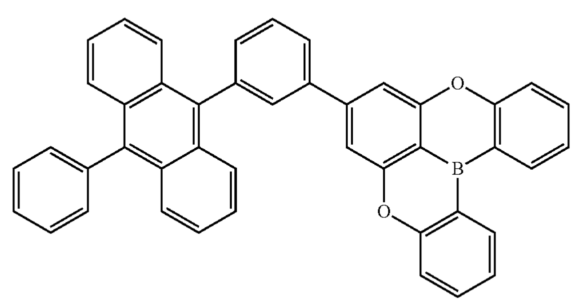

-continued

167

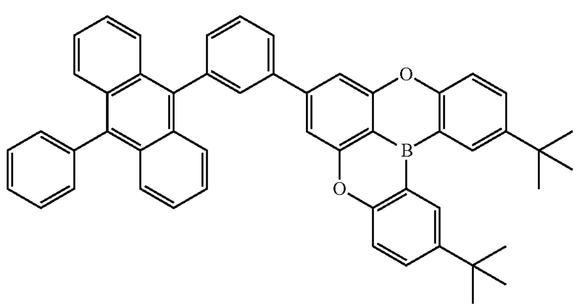

Evaluation Example 3: Evaluation of Characteristics of Organic Light-Emitting Device The driving voltage, T95 lifespan that indicates time (hour) for the luminance of each organic light-emitting device to decline to 95% of its initial luminance, and quantum yield of the organic light-emitting devices manufactured in Examples 1 to 5 and Comparative Examples 1 to 3 were measured, and the relative values for Comparative Example 3 are shown in Table 5.

TABLE 5

| | Driving voltage (V) | Maximum emission wavelength (nm) | Relative quantum yield (%) | Relative lifespan (%) |
|---|---|---|---|---|
| Example 1 | 4.24 | 423 | 102 | 101 |
| Example 2 | 4.27 | 422 | 102 | 126 |
| Example 3 | 4.11 | 456 | 113 | 88 |
| Example 4 | 3.53 | 461 | 104 | 348.3 |
| Example 5 | 3.23 | 459 | 68 | 127.2 |
| Comparative Example 1 | | Light-emitting characteristics not shown (not working) | | |
| Comparative Example 2 | | Light-emitting characteristics not shown (not working) | | |
| Comparative Example 3 | 3.7 | 463 | 100 | 100 |

Referring to the results of Table 5, the organic light-emitting devices of Examples 1 to 5 and Comparative Example 3 were found to have high efficiency and/or long lifespan characteristics, and the organic light-emitting devices of Comparative Examples 1 and 2 were found not to have light-emitting characteristics due to no energy transfer to the dopant.

As apparent from the foregoing description, an organic light-emitting device according to one or more embodiments may have high efficiency and high colorimetric purity.

It should be understood that the exemplary embodiments described herein should be considered in a descriptive sense and not for purposes of limitation. Descriptions of features or aspects within each exemplary embodiment should typically be considered as available for other similar features or aspects in other embodiments. While one or more exemplary embodiments have been described with reference to the drawings, it will be understood by those of ordinary skill in the art that various changes in form and details may be made therein without departing from the spirit and scope as defined by the following claims.

What is claimed is:

1. An organic light-emitting device, comprising:

a first electrode;

a second electrode; and an organic layer disposed between the first electrode and the second electrode, wherein the organic layer comprises an emission layer, wherein the emission layer comprises:

a polycyclic compound represented by Formula 1, and a host, and wherein an amount of the polycyclic compound is less than an amount of the host in the emission layer, based on weight:

Formula 1

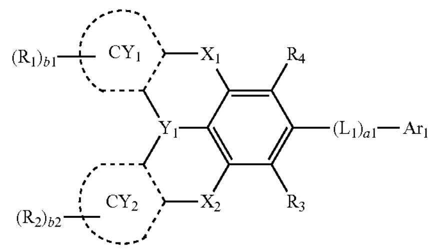

wherein $Ar_1$ is a group represented by Formula 1A:

Formula 1A

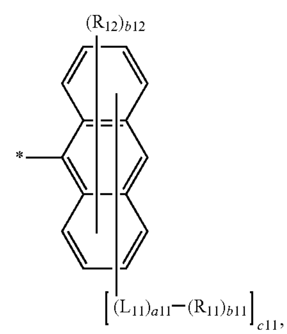

wherein, in Formulae 1 and 1A, rings $CY_1$ and $CY_2$ are each independently a $C_5$-$C_{30}$ carbocyclic group or a $C_1$-$C_{30}$ heterocyclic group, $Y_1$ is B, P, P(=O), P(=S), Al, Ga, As, $Si(R_5)$, or $Ge(R_5)$, $X_1$ and $X_2$ are each independently O, S, Se, $C(R_6)(R_7)$, $Si(R_6)(R_7)$, $Ge(R_6)(R_7)$, or $P(=O)(R_6)$, $L_1$ and $L_{11}$ are each independently a single bond, a substituted or unsubstituted $C_5$-$C_{30}$ carbocyclic group, or a substituted or unsubstituted $C_1$-$C_{30}$ heterocyclic group, a1 and a11 are each independently an integer from 1 to 3, when a1 is 2 or greater, at least two $L_1$(s) are identical to or different from each other, and when a11 is 2 or greater, at least two $L_{11}$(s) are identical to or different from each other, $R_1$, $R_2$, $R_3$, $R_4$, $R_5$, $R_6$, $R_7$, $R_{11}$, and $R_{12}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —B($Q_6$)($Q_7$), or —P(═O)($Q_8$)($Q_9$), $R_1$ and $R_2$ are optionally bound to form a substituted or unsubstituted $C_5$-$C_{30}$ carbocyclic group or a substituted or unsubstituted $C_1$-$C_{30}$ heterocyclic group, b1 and b2 are each independently an integer from 0 to 10, when b1 is 2 or greater, at least two $R_1$(s) are identical to or different from each other, and when b2 is 2 or greater, at least two $R_2$(s) are identical to or different from each other, b11 is an integer from 1 to 5, when b11 is 2 or greater, at least two $R_{11}$(s) are identical to or different from each other, b12 is an integer from 1 to 8, when b12 is 2 or greater, at least two $R_{12}$(s) are identical to or different from each other, c11 is an integer from 1 to 8, when c11 is 2 or greater, at least two -$(L_{11})_{a11}$-$(R_{11})_{b11}$(s) are identical to or different from each other, a sum of b12 and c11 is 9, $R_{11}$ is represented by one of Formulae 4-1 to 4-42; and $R_{12}$ is:

hydrogen, deuterium, —F, —Cl, —Br, —I, a hydroxyl group, a cyano group, a nitro group, a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group; or a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group, each substituted with at least one of deuterium, —F, —Cl, —Br, —I, a hydroxyl group, a cyano group, a nitro group, or a phenyl group, 4-1

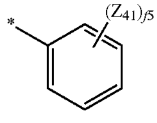

-continued 4-2

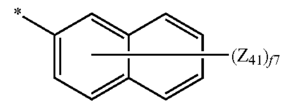

4-3

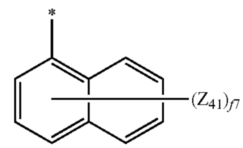

4-4

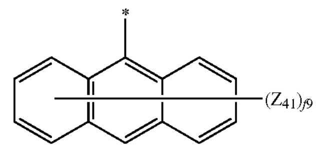

4-5

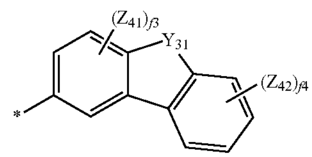

4-6

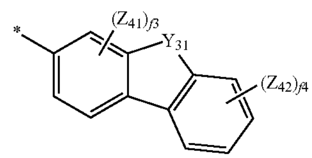

4-7

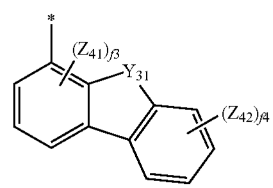

4-8

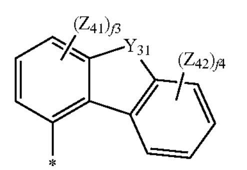

4-9

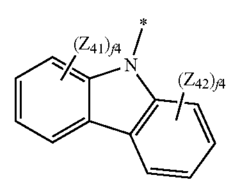

4-10

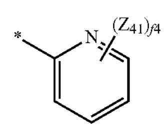

4-11

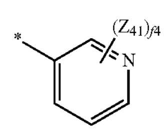

-continued
4-12
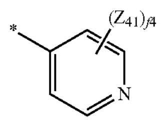
4-13
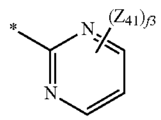
4-14
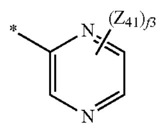
4-15
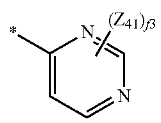
4-16
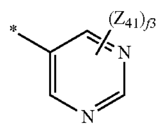
4-17
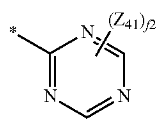
4-18
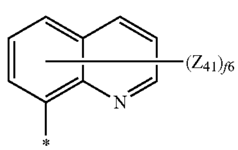
4-19
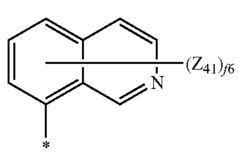
4-20
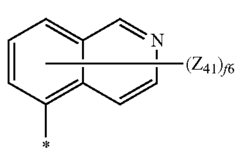
4-21
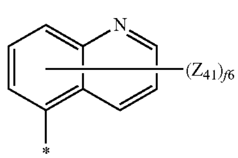
4-22
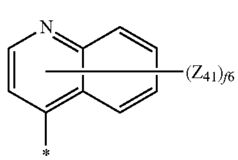
-continued
4-23
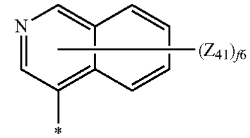
4-24
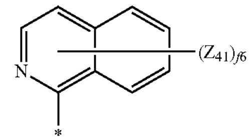
4-25
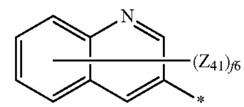
4-26
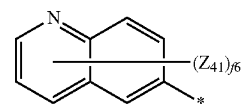
4-27
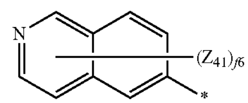
4-28
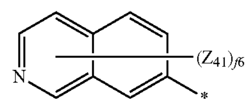
4-29
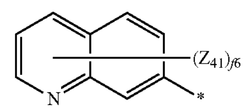
4-30
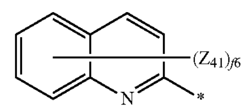
4-31
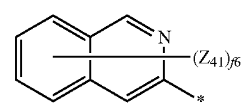
4-32
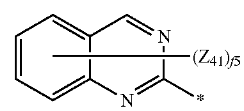
4-33
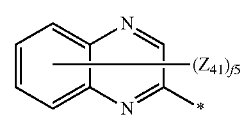
4-34
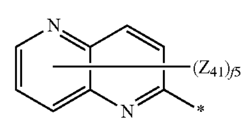
4-35
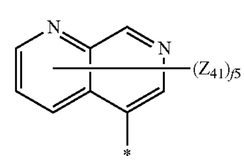

-continued 4-36

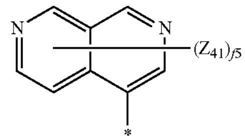

4-37

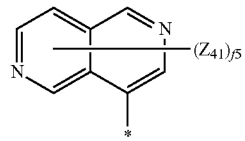

4-38

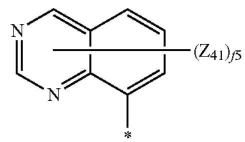

4-39

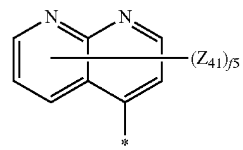

4-40

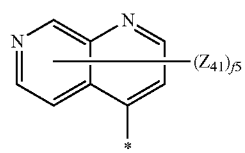

4-41

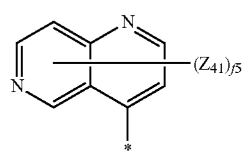

4-42

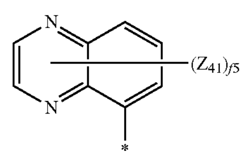

wherein, in Formulae 4-1 to 4-42, $Y_{31}$ is O, S, $C(Z_{45})(Z_{46})$, or $N(Z_{47})$, $Z_{41}$ to $Z_{49}$ are each independently:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_7$-$C_{60}$ arylalkyl group, a cyclopentyl group, a cyclohexyl group, a cycloheptyl group, a cyclopentenyl group, a cyclohexenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, or a carbazolyl group;

a cyclopentyl group, a cyclohexyl group, a cycloheptyl group, a cyclopentenyl group, a cyclohexenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, and a carbazolyl group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, or a cumyl group, f3 is an integer from 1 to 3, f4 is an integer from 1 to 4, f5 is an integer from 1 to 5, f6 is an integer from 1 to 6, f7 is an integer from 1 to 7, f9 is an integer from 1 to 9, and

* indicates a binding site to an adjacent atom, and at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{14})(Q_{15})$, —$B(Q_{16})(Q_{17})$, or —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{24})(Q_{25})$—B $(Q_{26})(Q_{27})$, or —$P(=O)(Q_{28})(Q_{29})$; or —$N(Q_{34})(Q_{35})$, —$B(Q_{36})(Q_{37})$, or —$P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, or a substituted or unsubstituted monovalent non-aromatic condensed heteropolycyclic group, and

* indicates a binding site to an adjacent atom, wherein, when the host comprises a compound represented by Formula 301, then the compound represented by Formula 301 does not comprise deuterium:

Formula 301

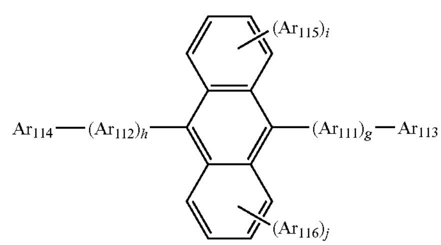

wherein, in Formula 301, $Ar_{111}$ and $Ar_{112}$ are each independently:

a phenylene group, a naphthylene group, a phenanthrenylene group, a pyrenylene group, or a combination thereof; or a phenylene group, a naphthylene group, a phenanthrenylene group, a pyrenylene group, or a combination thereof, each substituted with at least one of a phenyl group, a naphthyl group, an anthracenyl group, or a combination thereof, $Ar_{113}$ to $Ar_{116}$ are each independently:

a $C_1$-$C_{10}$ alkyl group, a phenyl group, a naphthyl group, a phenanthrenyl group, a pyrenyl group, or a combination thereof;

a $C_1$-$C_{10}$ alkyl group, substituted with at least one of a phenyl group, a naphthyl group, an anthracenyl group, or a combination thereof;

a phenyl group, a naphthyl group, an anthracenyl group, a pyrenyl group, a phenanthrenyl group, a fluorenyl group, or a combination thereof;

a phenyl group, a naphthyl group, a phenanthrenyl group, a pyrenyl group, or a combination thereof, each substituted with at least one of a phenyl group, a naphthyl group, an anthracenyl group, or a combination thereof;

a phenyl group, a naphthyl group, an anthracenyl group, a pyrenyl group, a phenanthrenyl group, a fluorenyl group, or a combination thereof, each substituted with at least one of —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, or a fluorenyl group; or

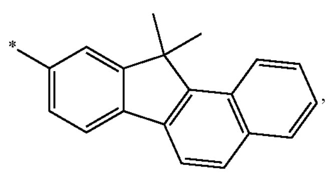 [SMILES: *c1ccc2c(c1)C(C)(C)c1c-2ccc2ccccc12]

and g, h, i, and j are each independently an integer from 0 to 4.

2. The organic light-emitting device of claim 1, wherein $Y_1$ is B, and $X_1$ and $X_2$ are each independently O, S, Se, $C(R_6)(R_7)$, or $Si(R_6)(R_7)$.

3. The organic light-emitting device of claim 1, wherein $CY_1$ and $CY_2$ are each independently:

an A group, a B group, a condensed ring in which at least two A groups are condensed, a condensed ring in which at least two B groups are condensed, or a condensed ring in which at least one A group and at least one B group are condensed, wherein, the A group is a cyclcopenta-1,3-diene group, an indene group, an azulene group, a benzene group, a naphthalene group, an anthracene group, a phenanthrene group, a tetracene group, a tetraphene group, a pyrene group, a chrysene group, a triphenylene group, or a fluorene group, and the B group is a furan group, a thiophene group, a pyrrole group, a borole group, a silole group, a pyrrolidine group, an imidazole group, an oxazole group, an isoxazole group, a thiazole group, an isothiazole group, a pyridine group, a pyrimidine group, a pyridazine group, a triazine group, an indole group, an isoindole group, an indolizine group, a quinoline group, an isoquinoline group, a quinoxaline group, an isoquinoxaline group, a carbazole group, a dibenzofuran group, a dibenzothiophene group, a dibenzosilole group, or a dibenzoborole group.

4. The organic light-emitting device of claim 1, wherein $CY_1$ and $CY_2$ are each independently a benzene group, a naphthalene group, an anthracene group, or a fluorene group.

5. The organic light-emitting device of claim 1, wherein Li and $L_{11}$ are each independently:

a single bond;

a phenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, or a chrysenylenylene group;

a phenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, or a chrysenylenylene group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group; or a phenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, and a chrysenylenylene group, each substituted with at least one selected from a phenyl group, an indenyl group, a naphthyl group, an azulenyl group, a heptalenyl group, an acenaphthyl group, a fluorenyl group, a phenalenyl group, a phenanthrenyl group, an anthracenyl group, a fluoranthenyl group, a triphenylenyl group, a pyrenyl group, or a chrysenylenyl group, each substituted with at least of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group.

6. The organic light-emitting device of claim 1, wherein $L_1$ and $L_{11}$ are each independently a single bond or a group represented by one of Formulae 3-1 to 3-32:

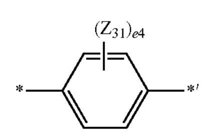

3-1

-continued
3-2
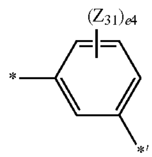
3-3
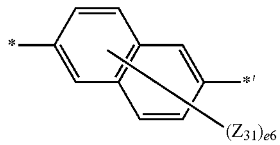
3-4
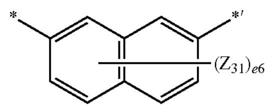
3-5
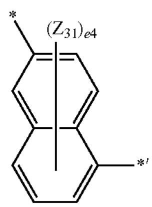
3-6
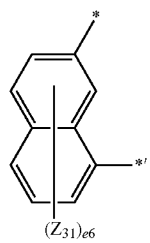
3-7
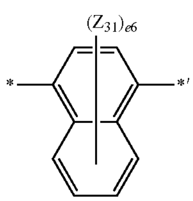
3-8
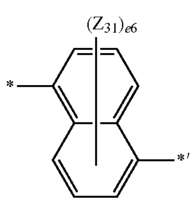
3-9
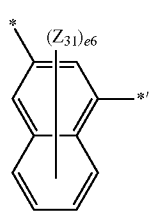
-continued
3-10
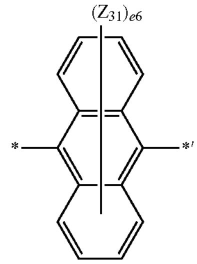
3-11
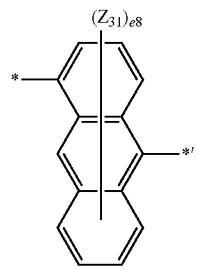
3-12
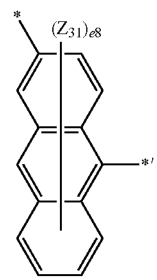
3-13
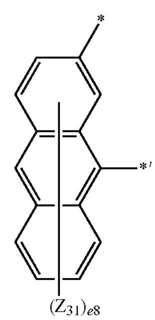
3-14
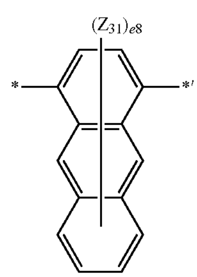

-continued
3-15
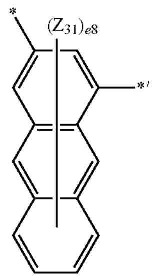
3-16
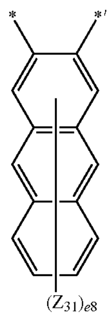
3-17
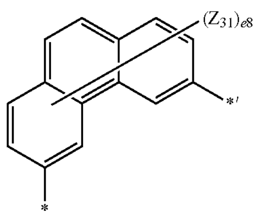
3-18
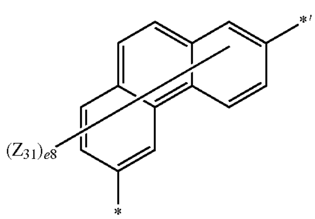
3-19
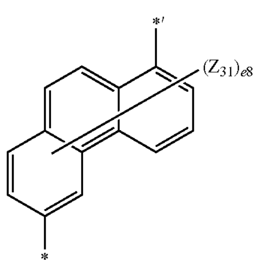
3-20
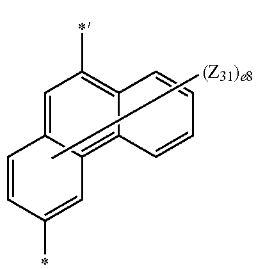
-continued
3-21
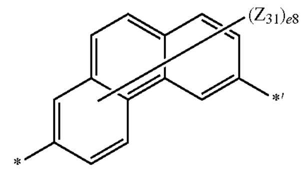
3-22
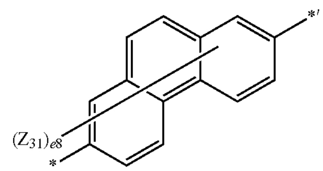
3-23
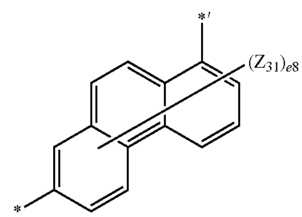
3-24
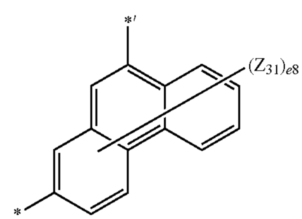
3-25
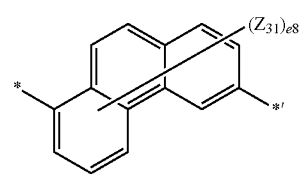
3-26
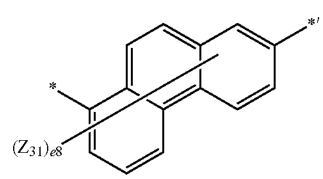
3-27
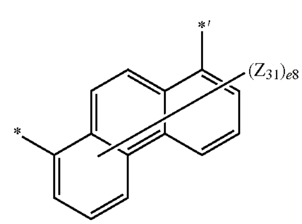
3-28
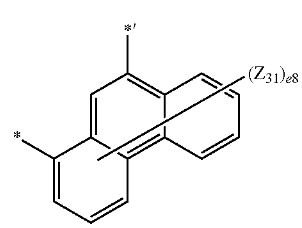

-continued 3-29

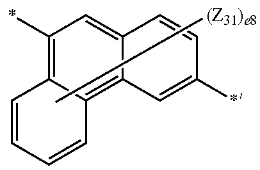

3-30

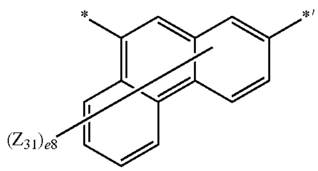

3-31

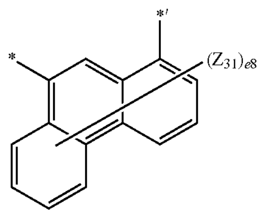

3-32

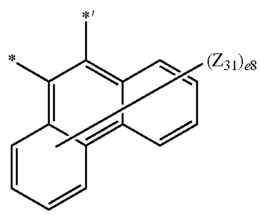

wherein, in Formulae 3-1 to 3-32, $Z_{31}$ is hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ cycloalkyl group, a $C_3$-$C_{60}$ cycloalkenyl group, a $C_1$-$C_{60}$ heterocycloalkyl group, a $C_1$-$C_{60}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, or a $C_1$-$C_{60}$ heteroaryl group; or a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, or a substituted or unsubstituted $C_2$-$C_{60}$ heteroarylalkyl group, each substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, $—N(Q_{24})(Q_{25})—B(Q_{26})(Q_{27})$, or $—P(═O)(Q_{28})(Q_{29})$, e4 is an integer from 1 to 4, e6 is an integer from 1 to 6, e8 is an integer from 1 to 8, and

* and *' each indicate a binding site to an adjacent atom.

7. The organic light-emitting device of claim 1, wherein $R_1$ and $R_2$ are each independently:

hydrogen, deuterium, —F, —Cl, —Br, —I, a hydroxyl group, a cyano group, a nitro group, an amino group, a $C_1$-$C_{60}$ alkyl group, or a $C_1$-$C_{60}$ alkoxy group;

a $C_1$-$C_{60}$ alkyl group or a $C_1$-$C_{60}$ alkoxy group, each substituted with at least one of deuterium, —F, —Cl, —Br, —I, a hydroxyl group, a cyano group, a nitro group, an amino group, a phenyl group, a biphenyl group, a naphthyl group, a fluorenyl group, a phenanthrenyl group, an anthracenyl group, a fluoranthenyl group, a triphenylenyl group, a pyrenyl group, or a chrysenyl group;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, or a carbazolyl group;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, or a carbazolyl group, each substituted with at least one of deuterium, —F, —Cl, —Br, —I, a hydroxyl group, a cyano group, a nitro group, an amino group, a $C_1$-$C_{60}$ alkyl group, a $C_1$-$C_{60}$ alkoxy group, a $C_7$-$C_{60}$ arylalkyl group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a carbazolyl group, —N($Q_{34}$)($Q_{35}$), —B($Q_{36}$)($Q_{37}$), or —P(=O)($Q_{38}$)($Q_{39}$); or —N($Q_1$)($Q_2$), —B($Q_6$)($Q_7$), or —P(=O)($Q_8$)($Q_9$).

8. The organic light-emitting device of claim 1, wherein at least one of $R_1$ or $R_2$ is a group represented by Formulae 5-1 or 5-2:

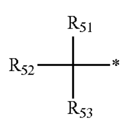

5-1

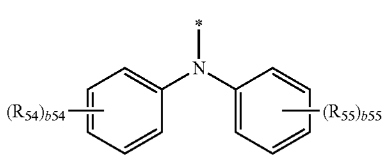

5-2 wherein, in Formulae 5-1 and 5-2, $R_{51}$ to $R_{55}$ are each independently:

deuterium, —F, —Cl, —Br, —I, a hydroxyl group, a cyano group, a nitro group, a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, a tert-hexyl group, a phenyl group, a biphenyl group, or a terphenyl group, or a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, and a tert-hexyl group, each substituted with at least one of deuterium, —F, —Cl, —Br, —I, a hydroxyl group, a cyano group, a nitro group, and a phenyl group;

$R_{54}$ and $R_{55}$ are optionally bound to each other to form a heterocyclic group;

b54 and b55 are each independently an integer from 0 to 4; and

* indicates a binding site to an adjacent atom.

9. The organic light-emitting device of claim 1, wherein $R_3$ and $R_4$ are each independently:

hydrogen, deuterium, —F, —Cl, —Br, —I, a hydroxyl group, a cyano group, a nitro group, a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group;

a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group, each substituted with at least one of deuterium, —F, —Cl, —Br, —I, a hydroxyl group, a cyano group, a nitro group, or a phenyl group.

10. The organic light-emitting device of claim 1, wherein $R_3$ and $R_4$ are each hydrogen.

11. The organic light-emitting device of claim 1, wherein $R_5$, $R_6$, and $R_7$ are each independently:

hydrogen, deuterium, —F, —Cl, —Br, —I, a hydroxyl group, a cyano group, a nitro group, a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group;

a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group, each substituted with at least one of deuterium, —F, —Cl, —Br, —I, a hydroxyl group, a cyano group, a nitro group, or a phenyl group, a phenyl group, a biphenyl group, a naphthyl group, a fluorenyl group, a carbazolyl group, a dibenzofuranyl group, or a dibenzothiophenyl group;

a phenyl group, a biphenyl group, a naphthyl group, a fluorenyl group, a carbazolyl group, a dibenzofuranyl group, or a dibenzothiophenyl group, each substituted with at least one of a phenyl group, a biphenyl group, a naphthyl group, a fluorenyl group, a carbazolyl group, a dibenzofuranyl group, or a dibenzothiophenyl group.

12. The organic light-emitting device of claim 1, wherein Formula 1A is selected from Formulae 1A-1 to 1A-5:

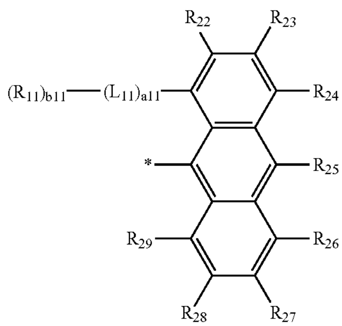

1A-1

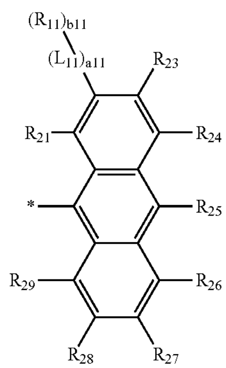

1A-2

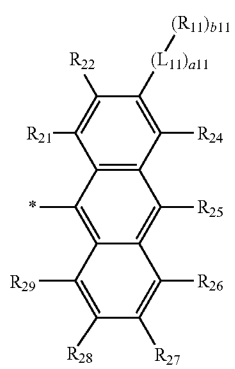

1A-3

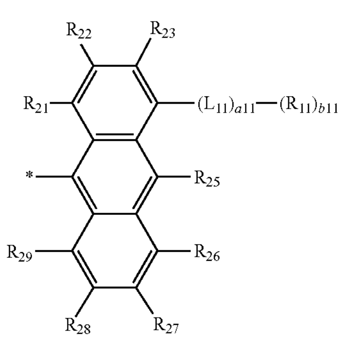

1A-4

-continued

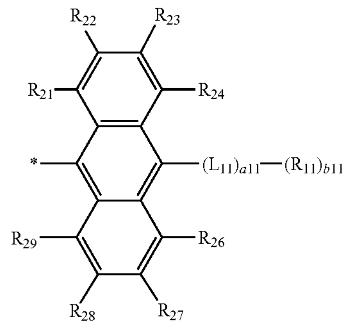

1A-5 wherein, in Formulae 1A-1 to 1A-5, $R_{21}$ to $R_{29}$ are each understood by referring to the description of $R_{12}$, and

* indicates a binding site to an adjacent atom.

13. The organic light-emitting device of claim 1, wherein the polycyclic compound comprises a compound represented by one of Formulae 2-1 to 2-8:

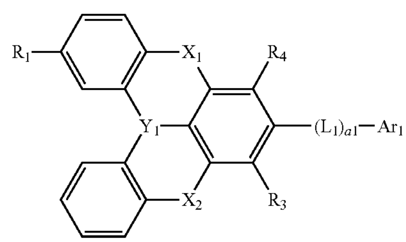

2-1

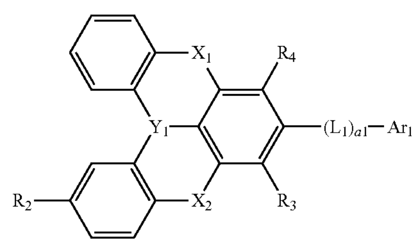

2-2

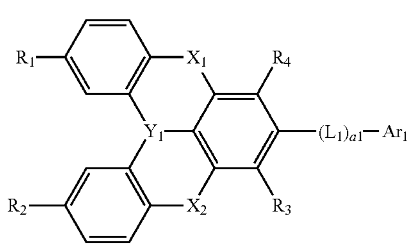

2-3

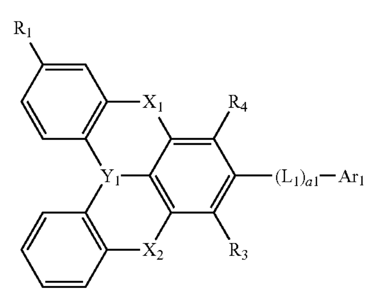

2-4

2-5
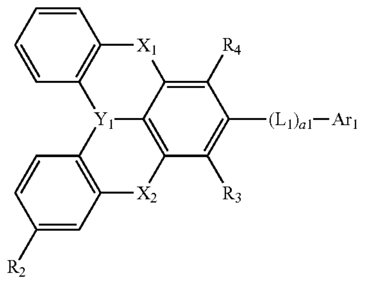
2-6
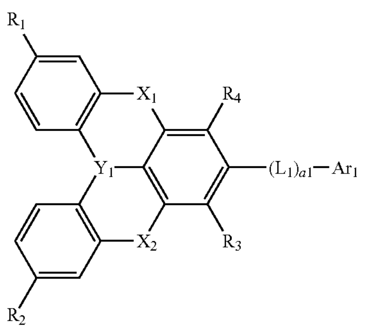
2-7
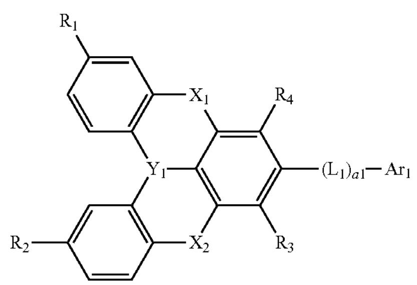
2-8
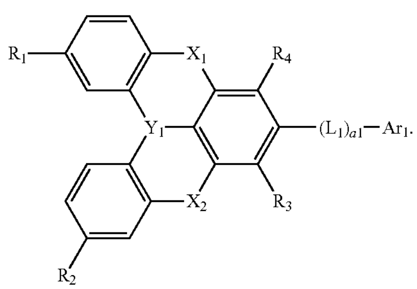
14. The organic light-emitting device of claim 1, wherein the polycyclic compound is represented by one of Compounds 157 to 468:
157
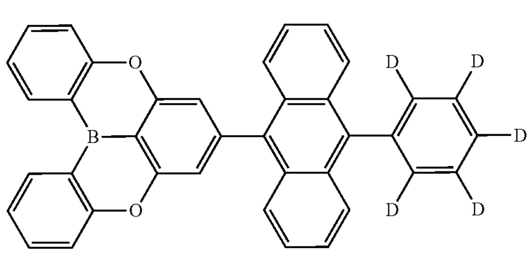
158
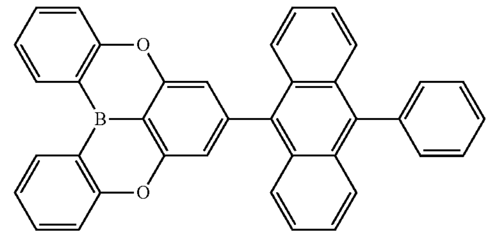
159
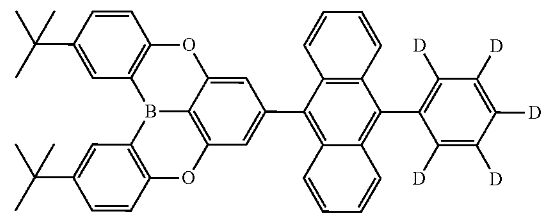
160
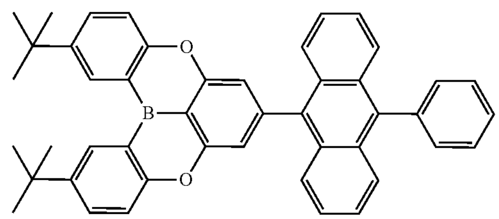
161
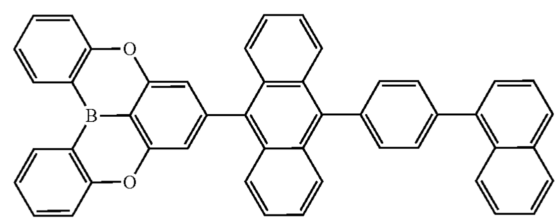
162
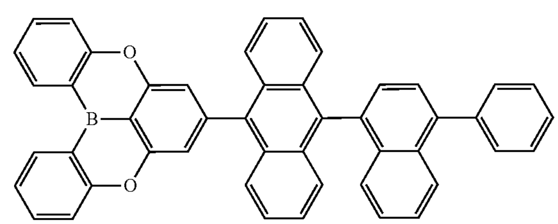
163
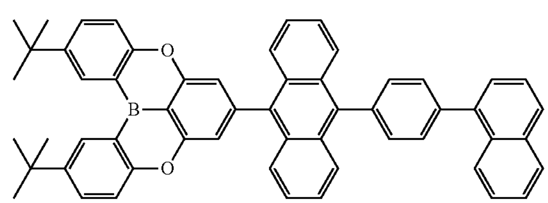
164
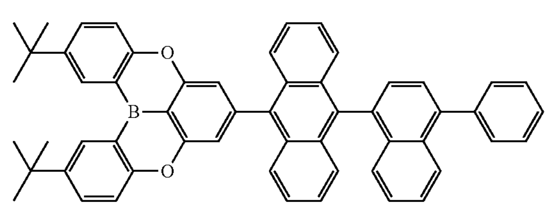

-continued
165
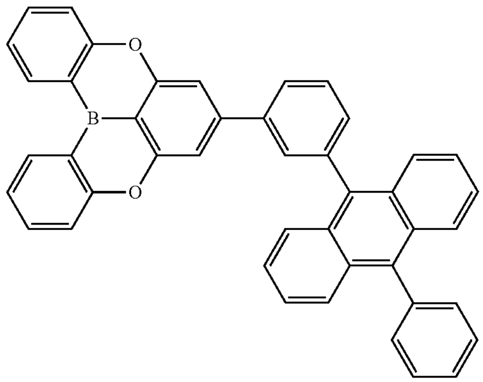
166
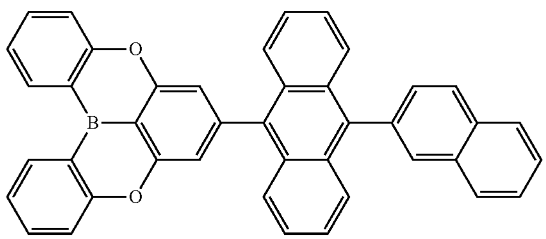
167
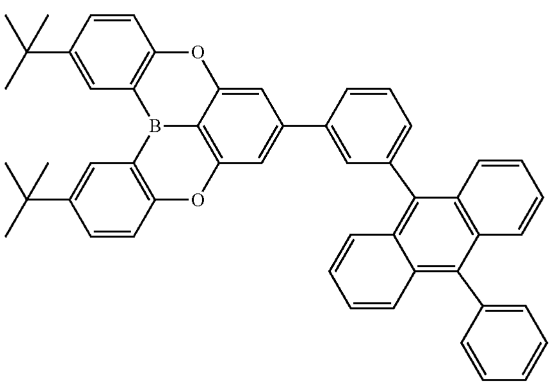
168
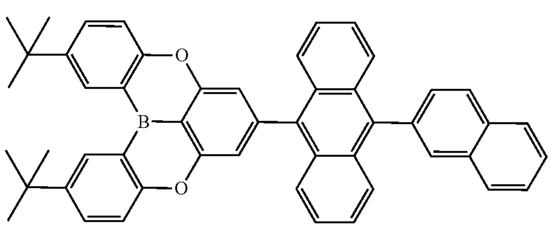
-continued
169
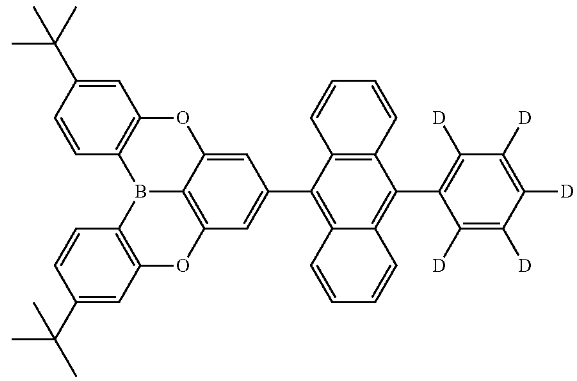
170
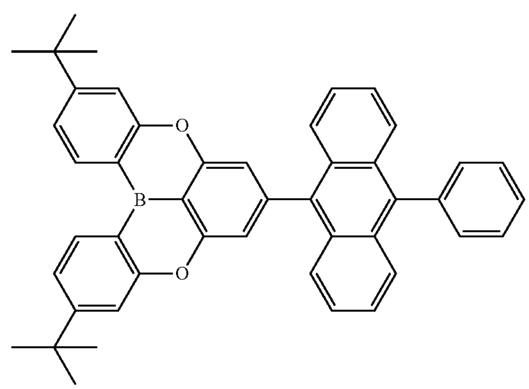
171
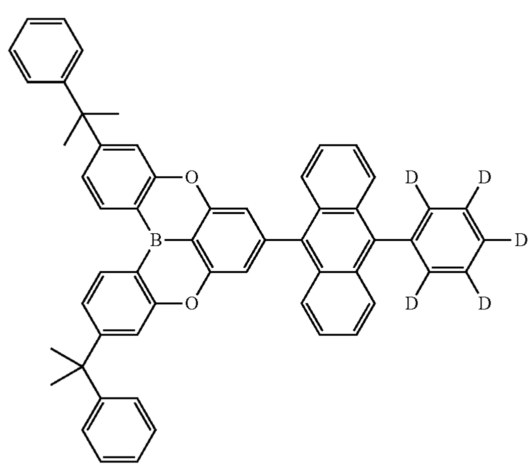

-continued
172
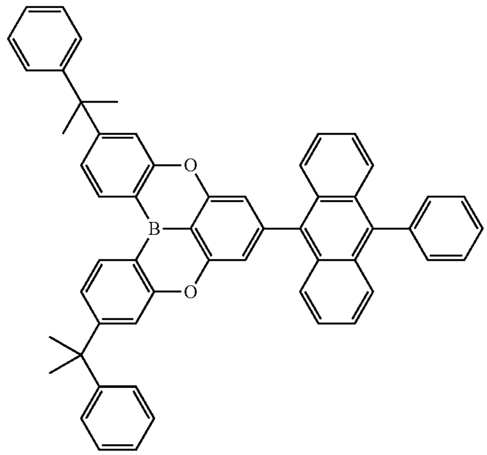
173
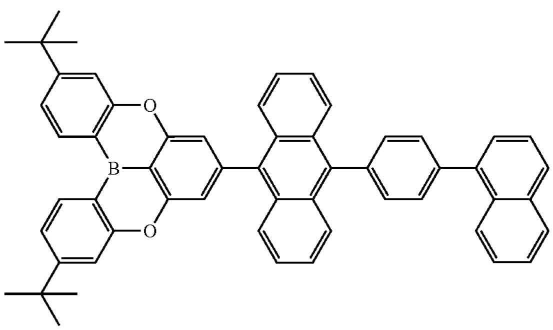
174
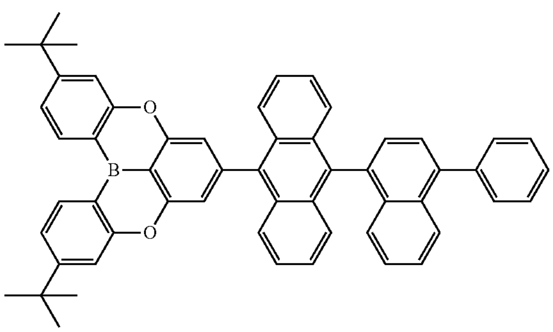
175
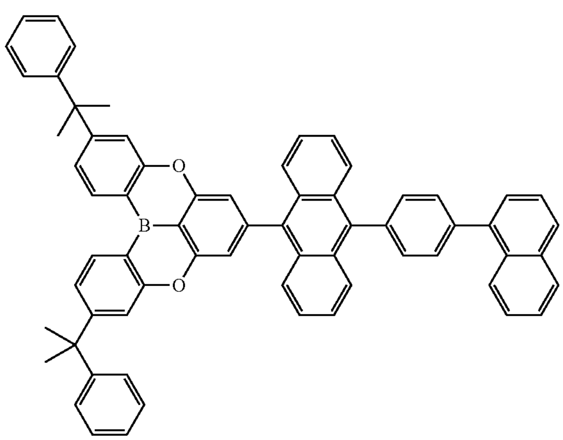
-continued
176
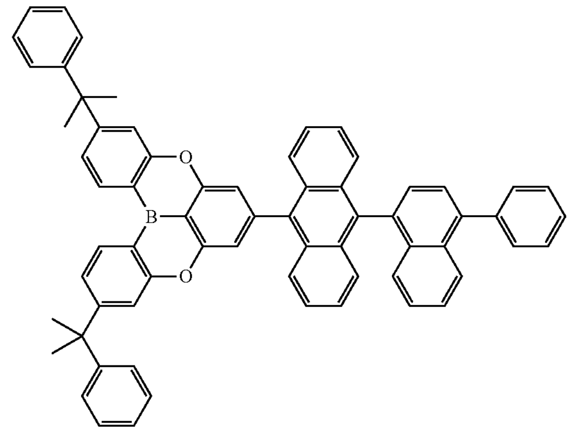
177
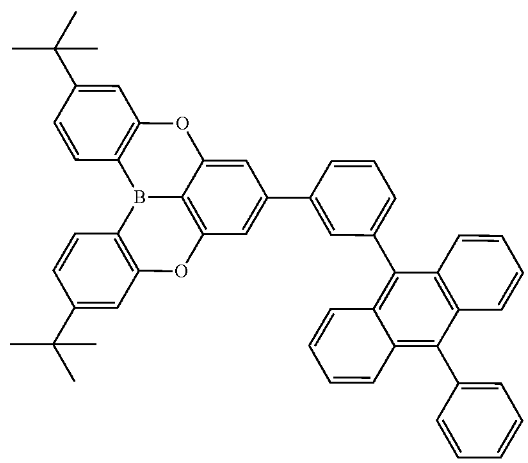
178
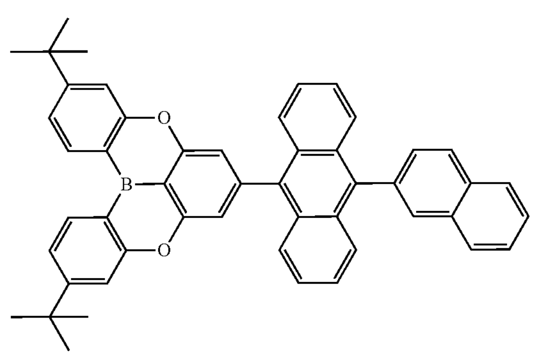

179
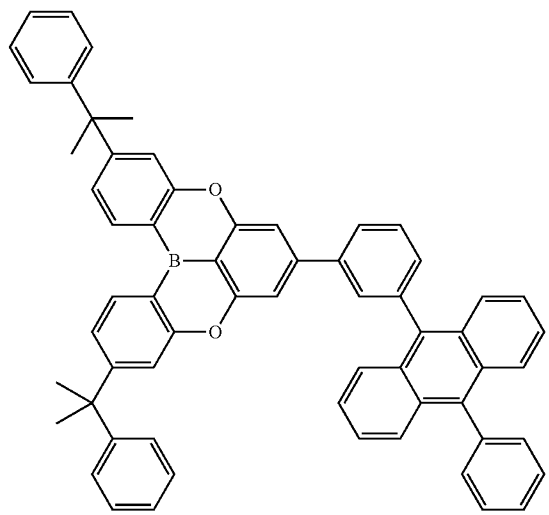
180
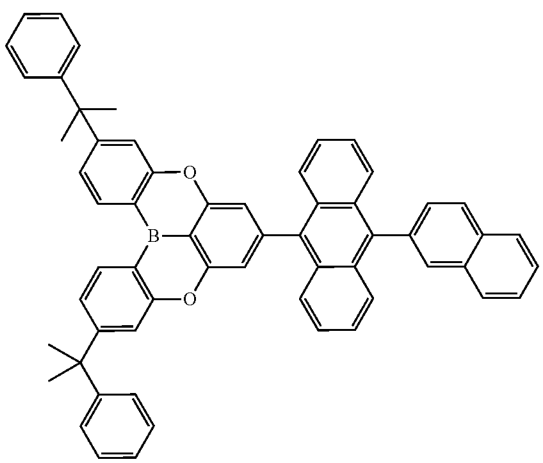
181
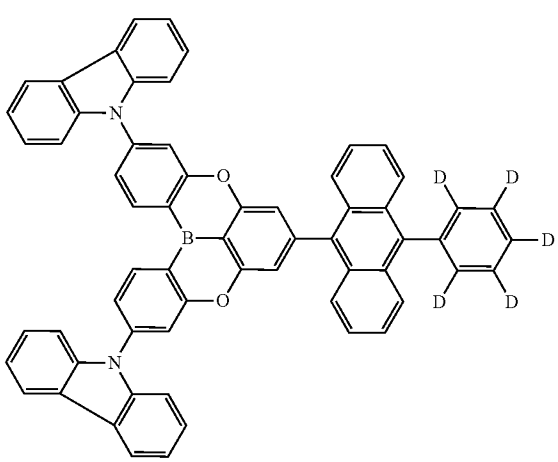
182
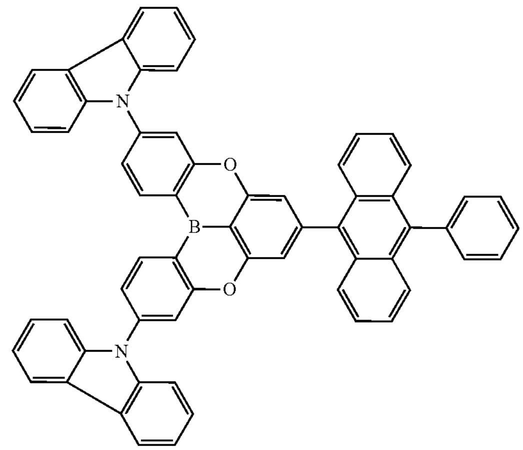
183
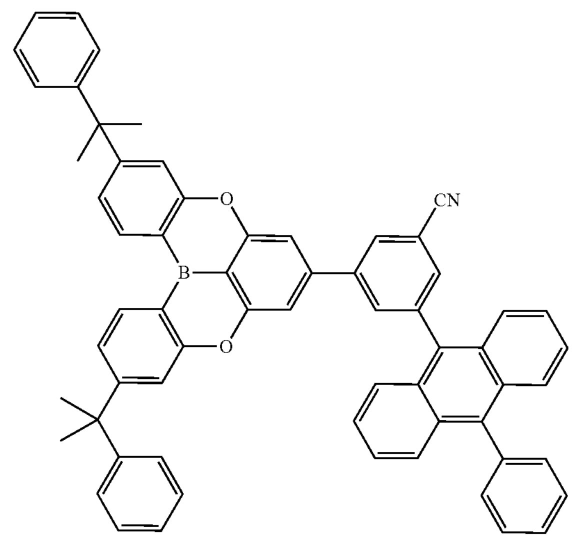
184
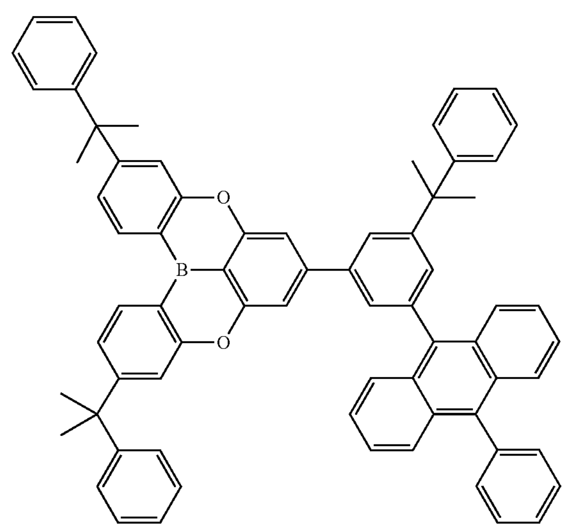

-continued
185
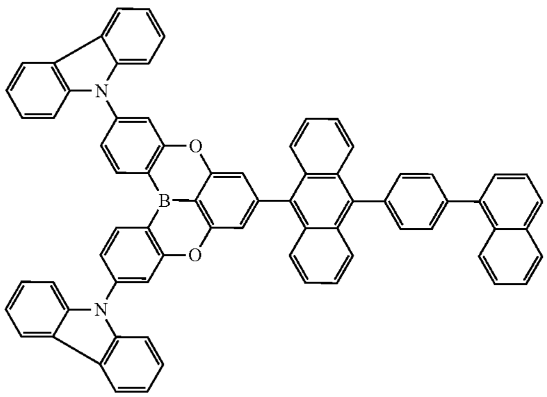
186
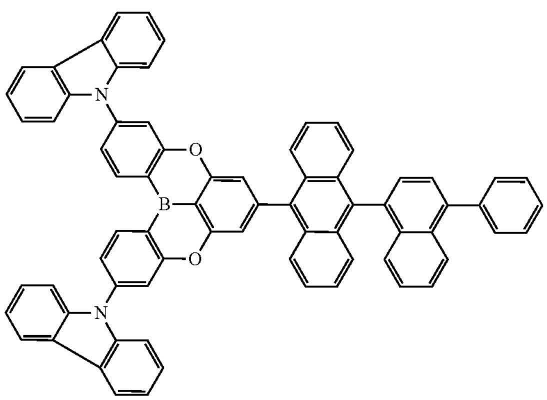
187
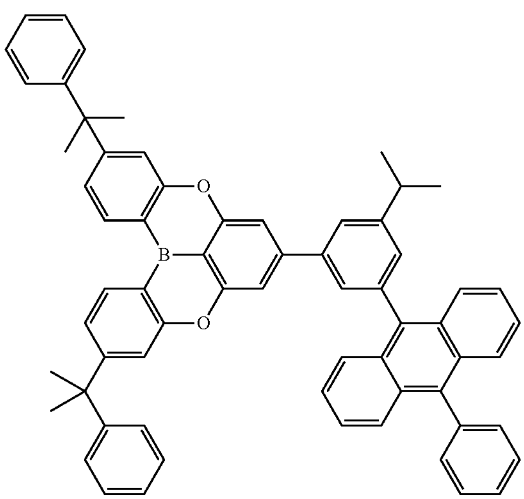
-continued
188
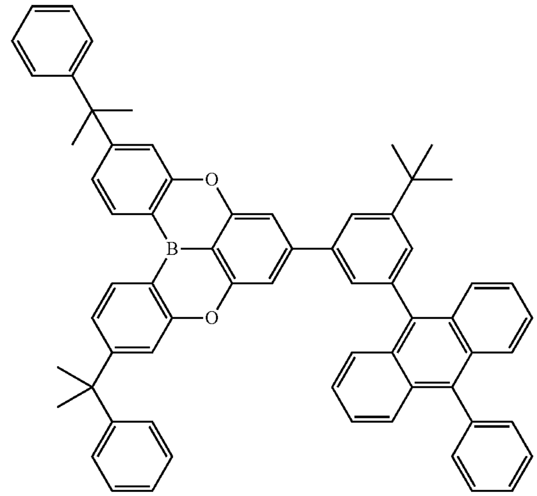
189
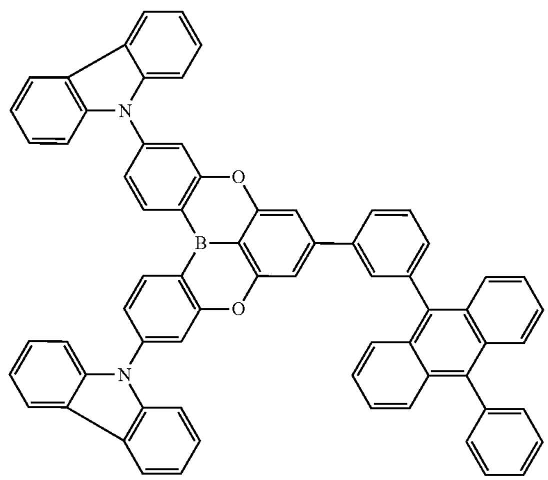
190
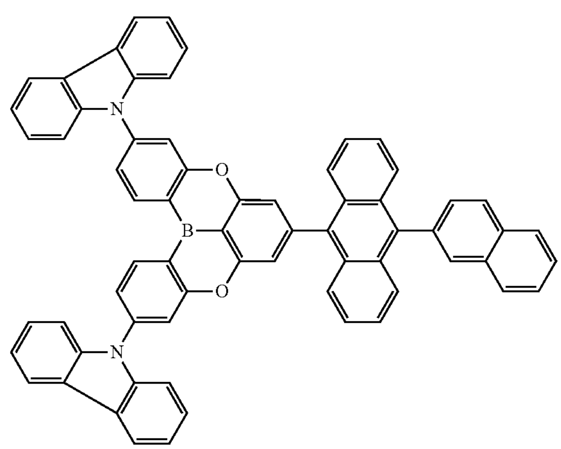

191
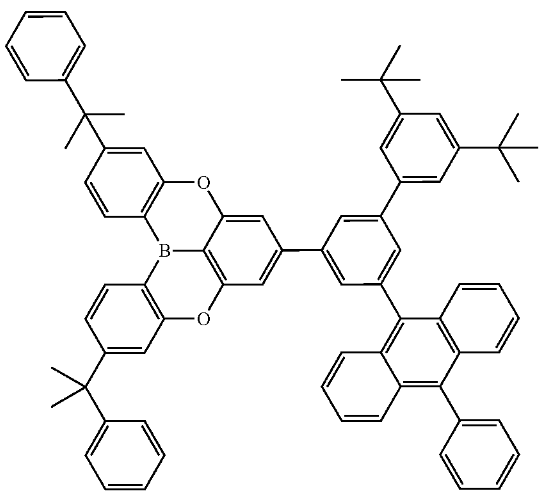
192
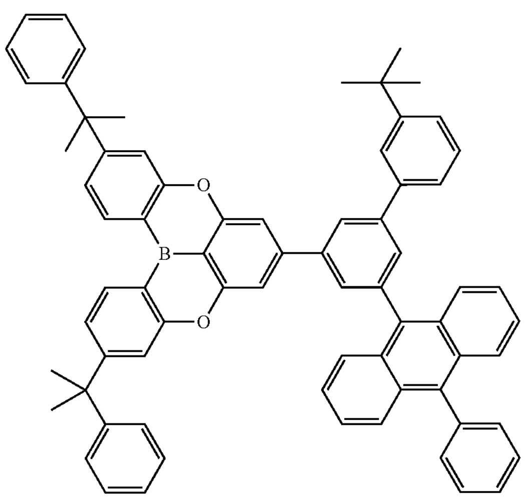
193
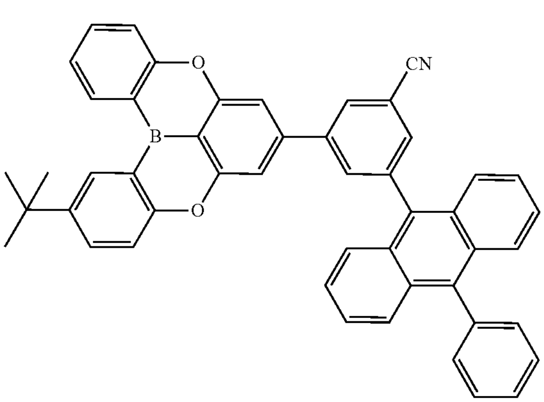
194
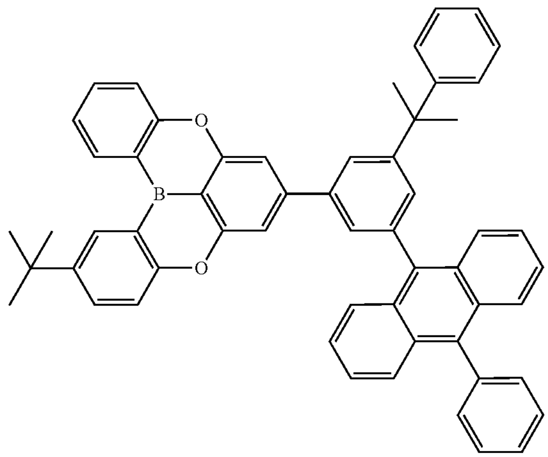
195
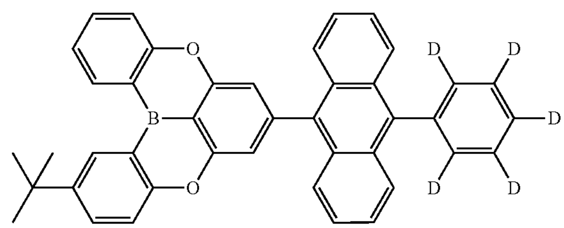
196
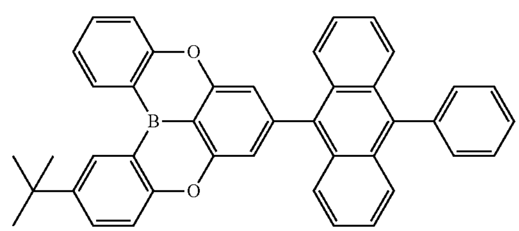
197
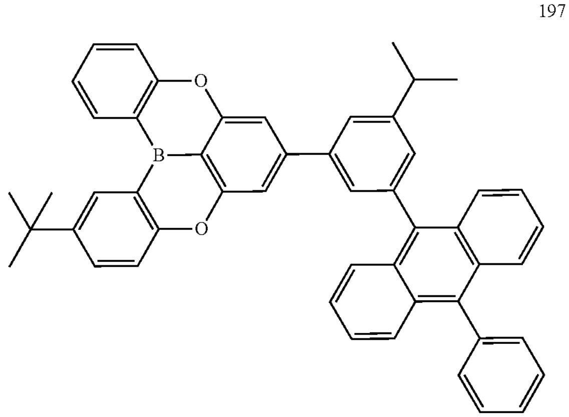

-continued
198
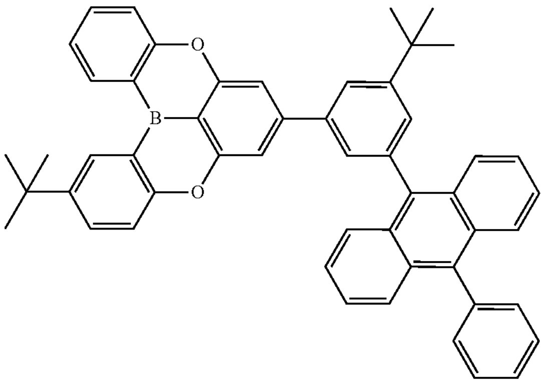
199
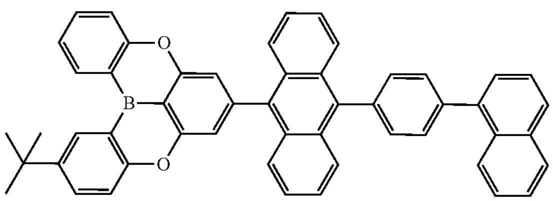
200
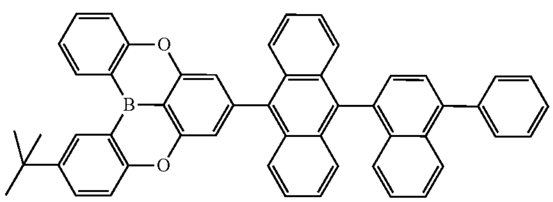
201
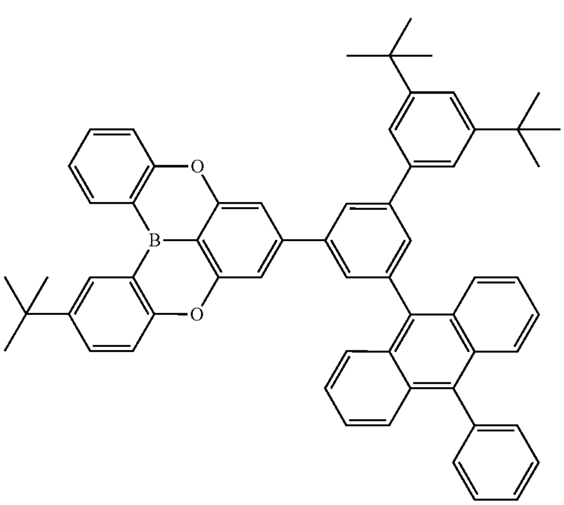
-continued
202
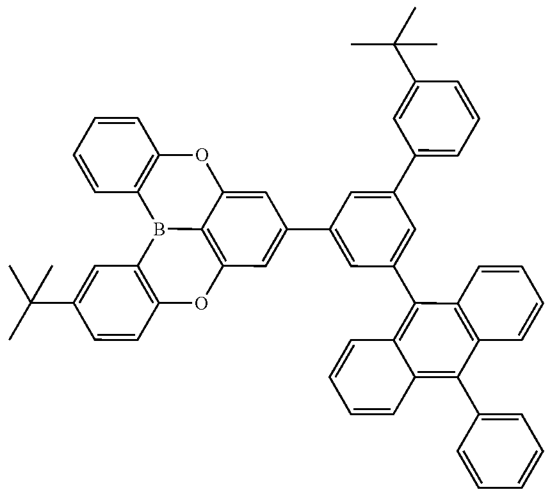
203
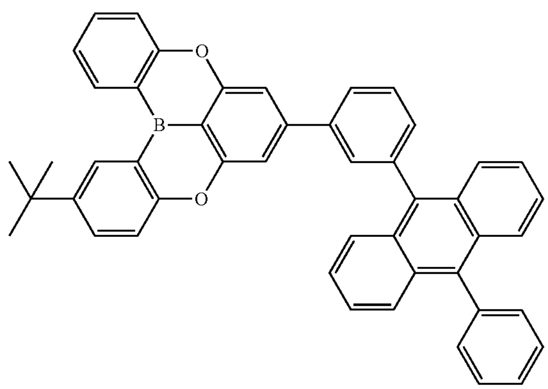
204
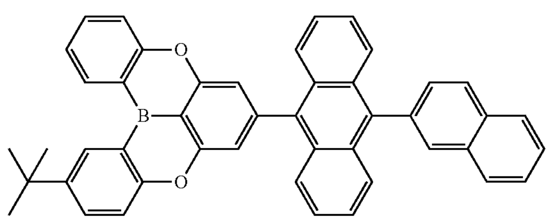
205
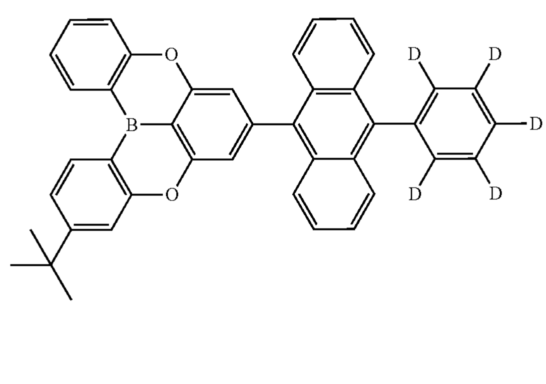

-continued
206
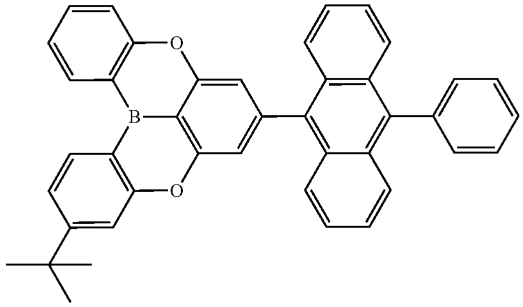
207
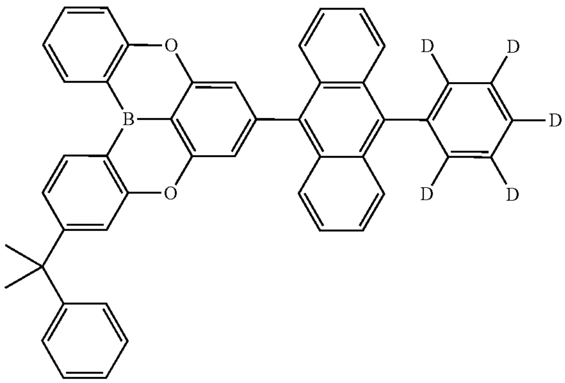
208
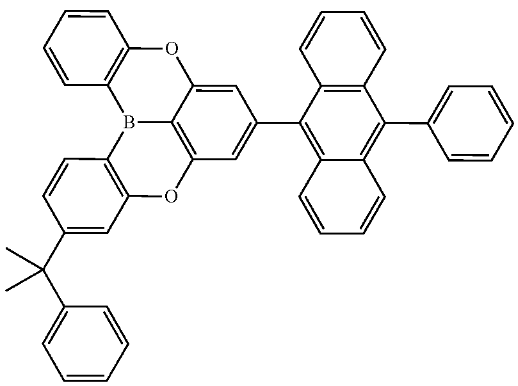
209
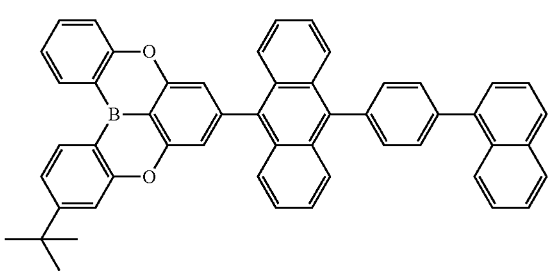
-continued
210
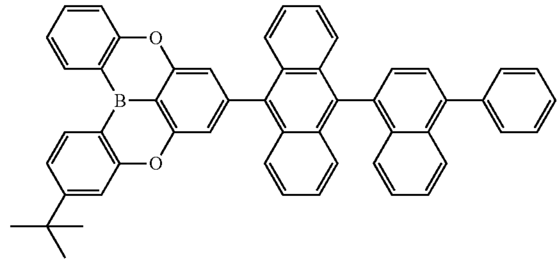
211
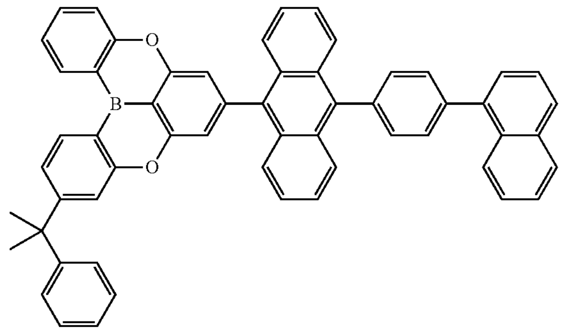
212
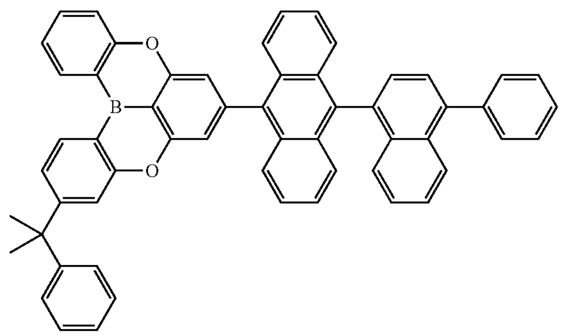
213
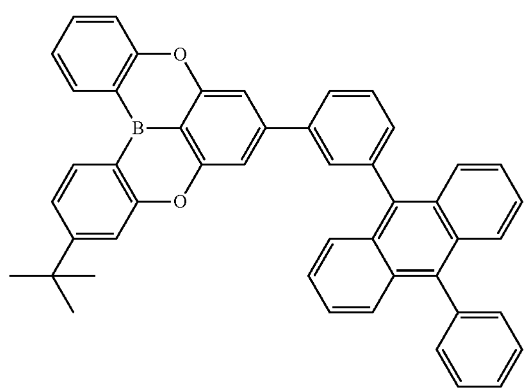

-continued
214
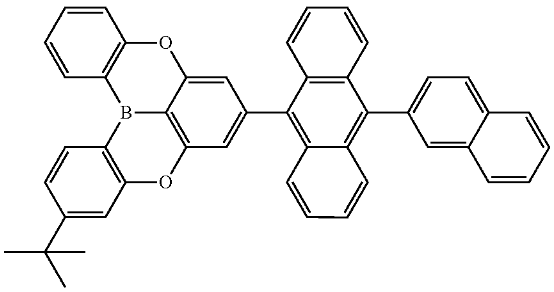
215
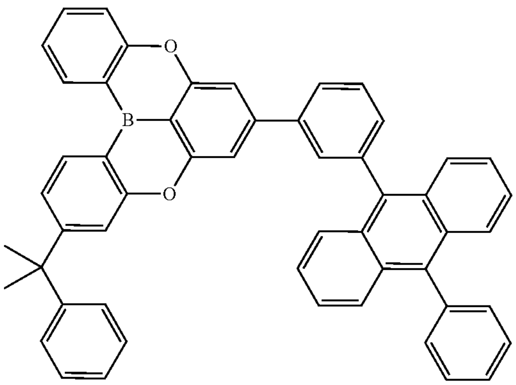
216
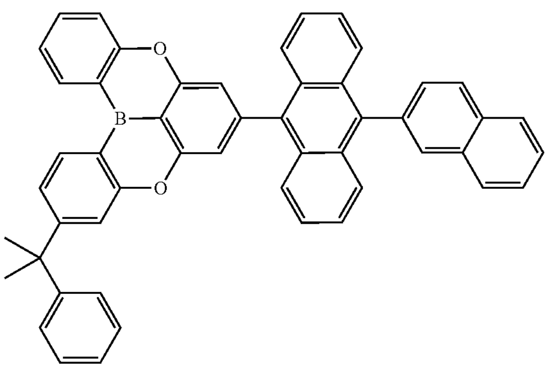
217
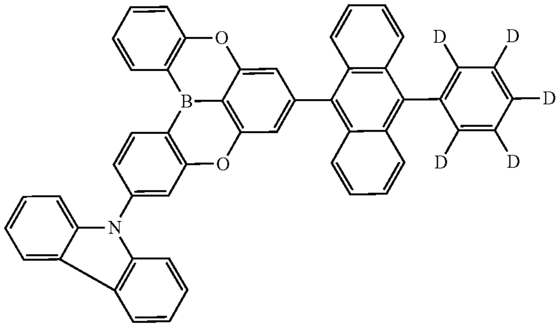
-continued
218
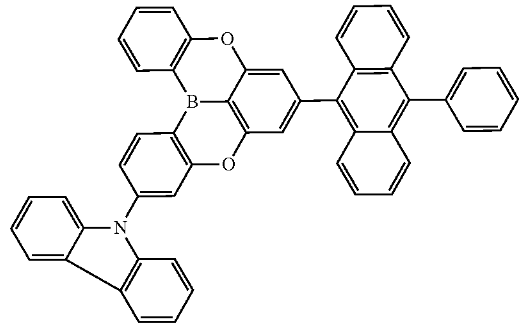
219
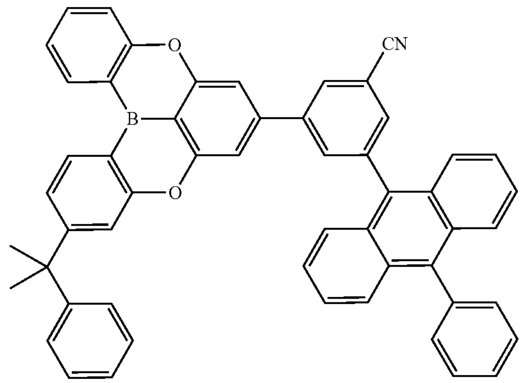
220
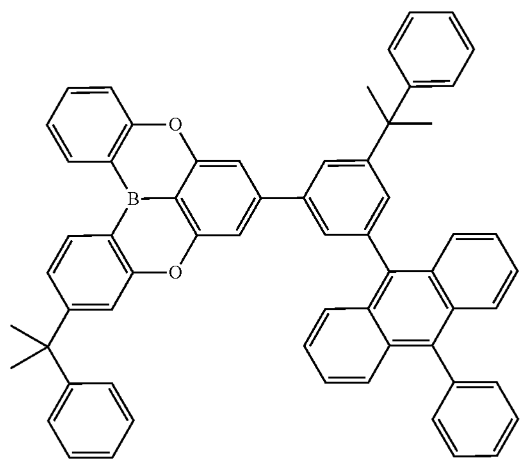
221
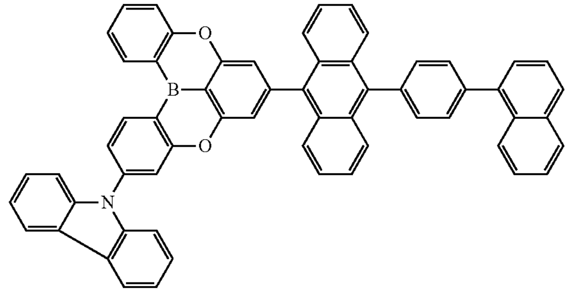

-continued
222
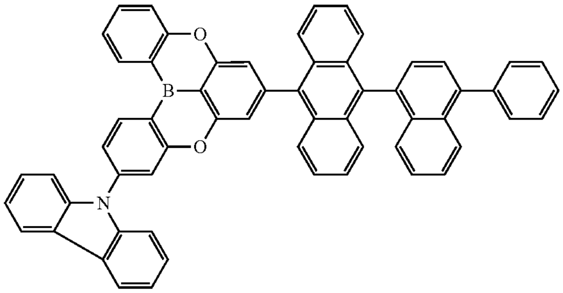
223
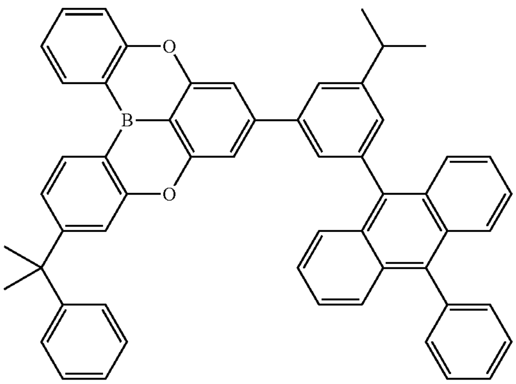
224
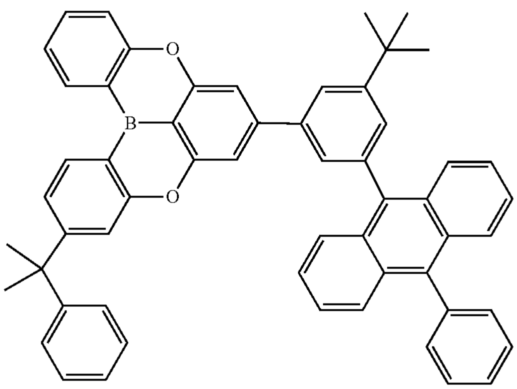
225
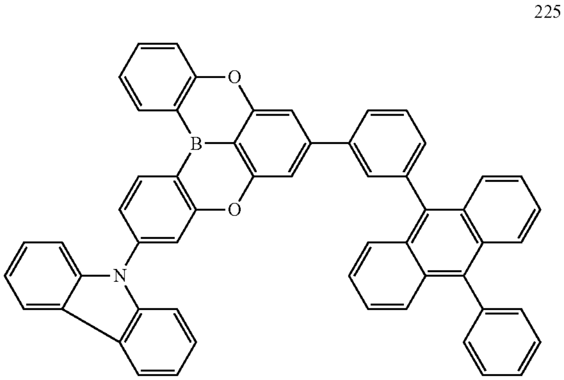
-continued
226
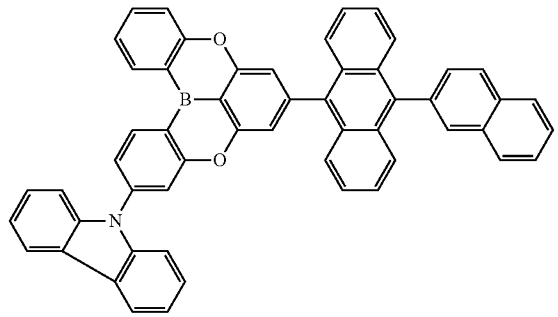
227
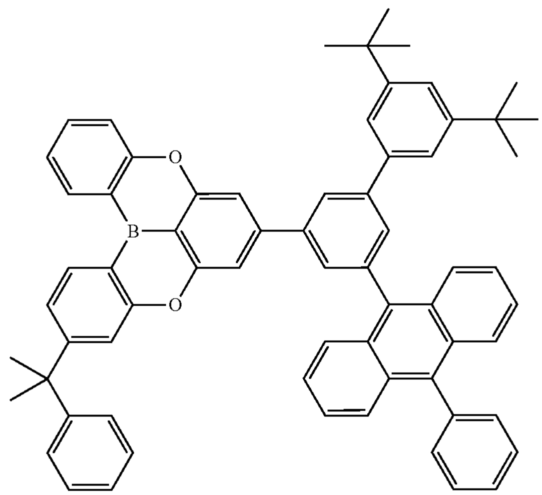
228
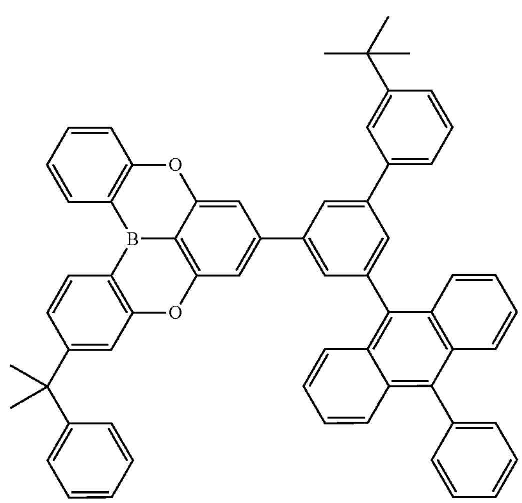

-continued
229
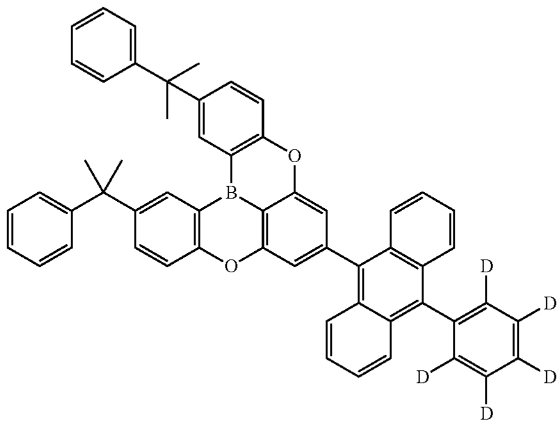
230
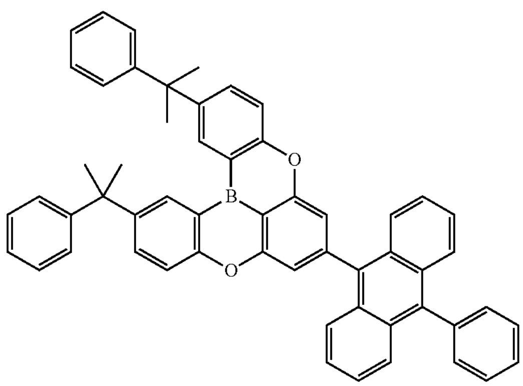
231
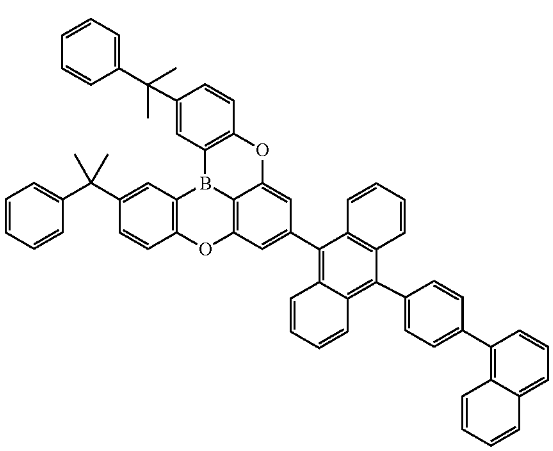
-continued
232
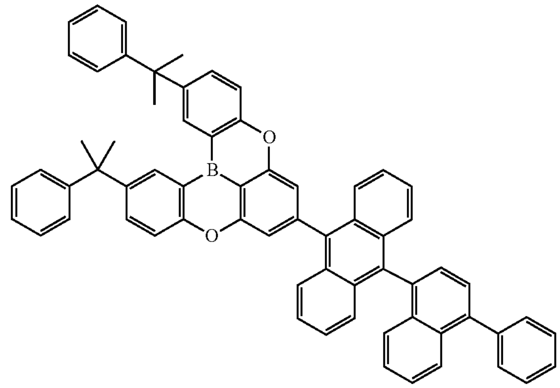
233
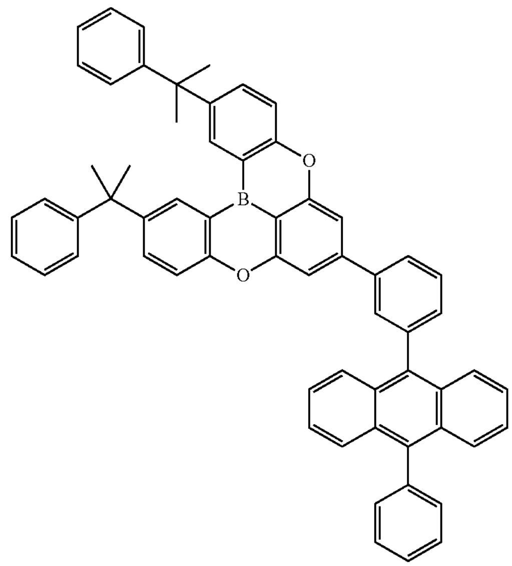
234
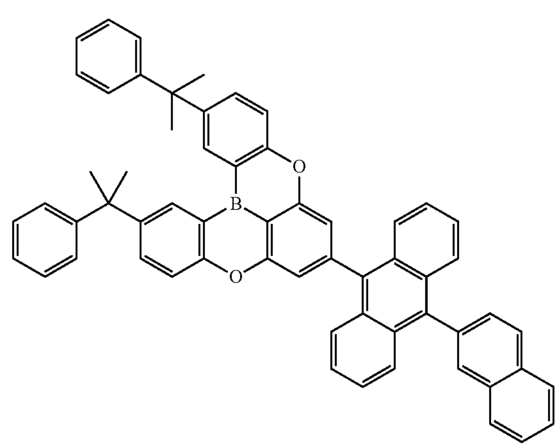

235
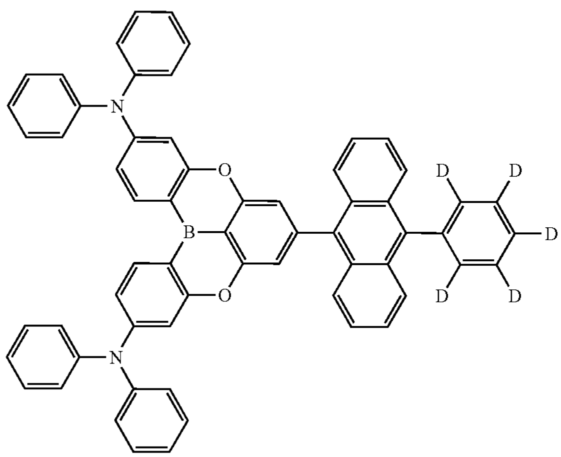
238
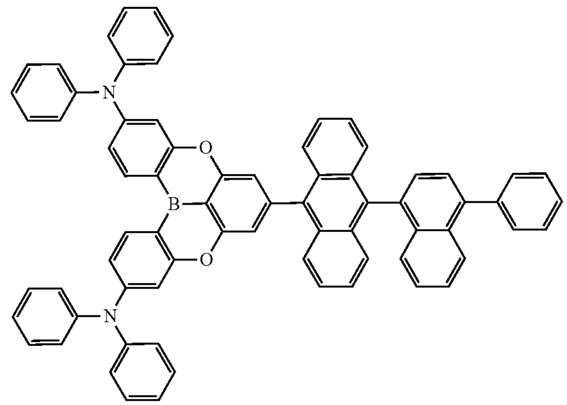
236
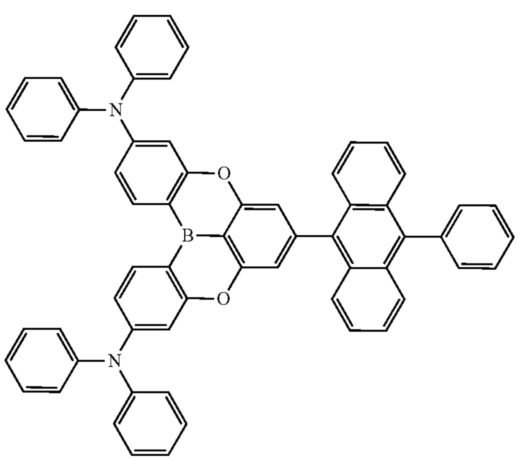
239
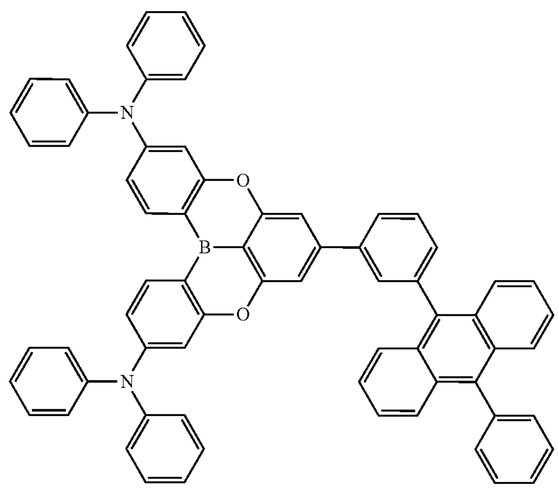
237
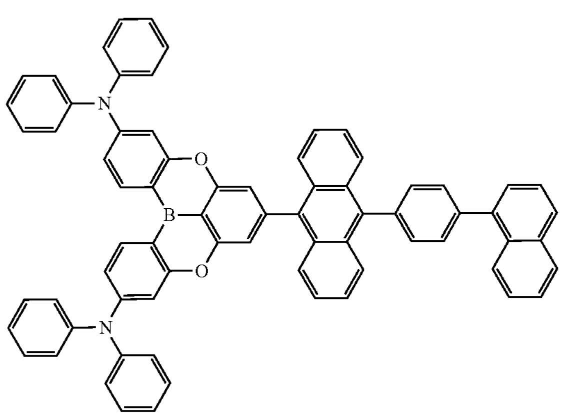
240
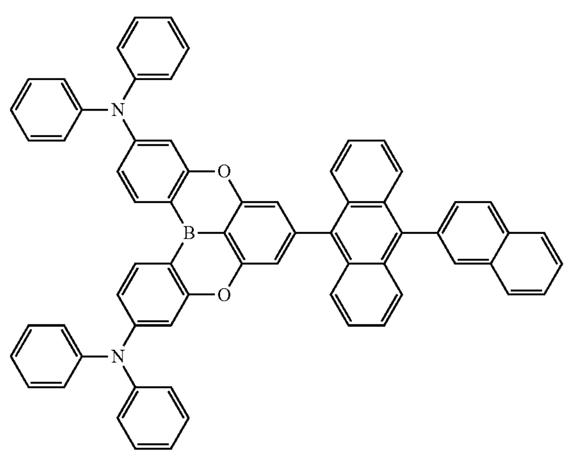

-continued
241
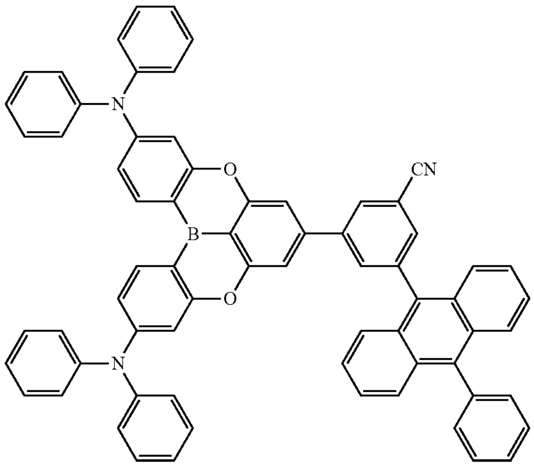
242
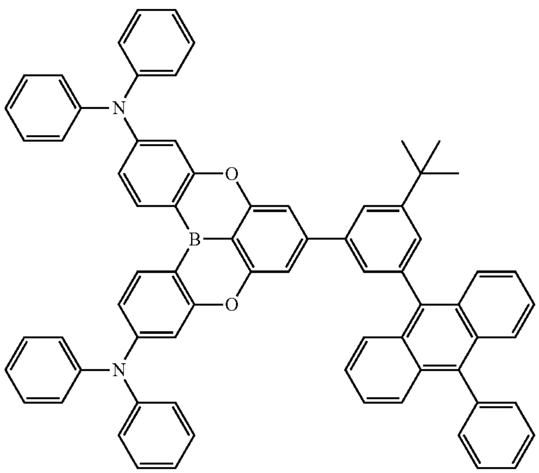
243
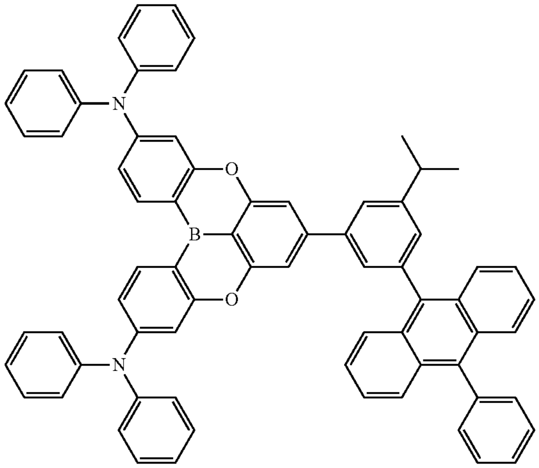
-continued
244
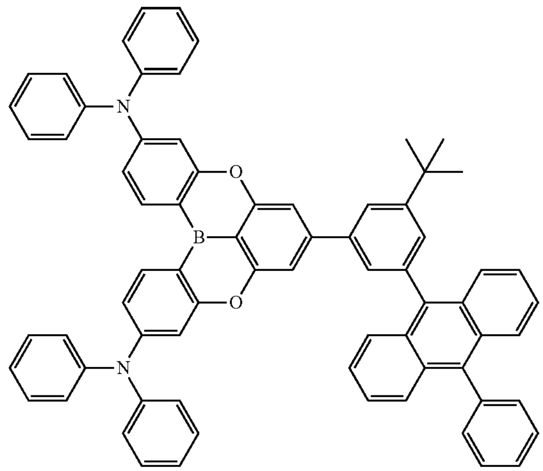
245
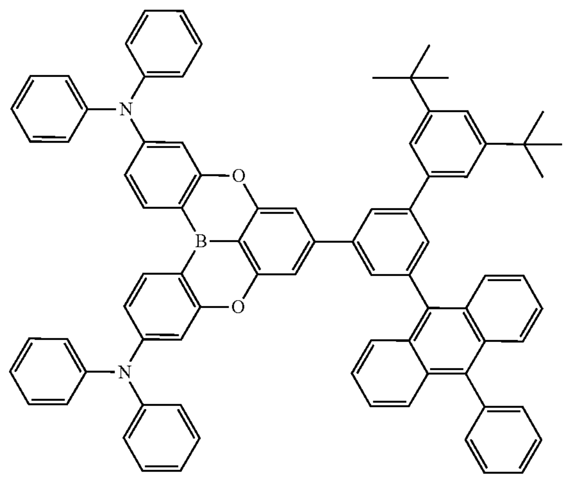
246
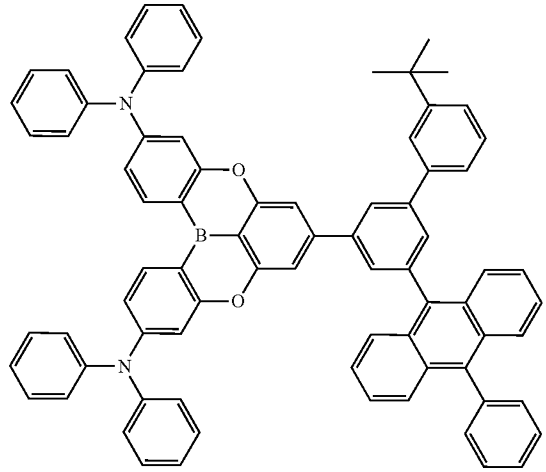

247
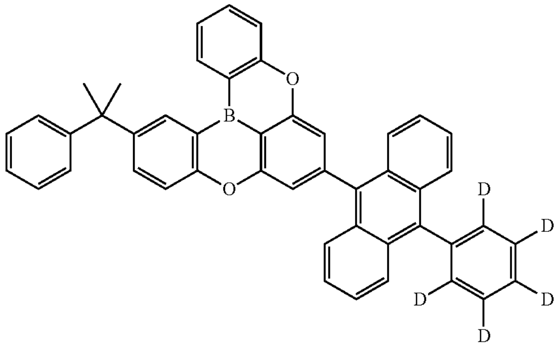
248
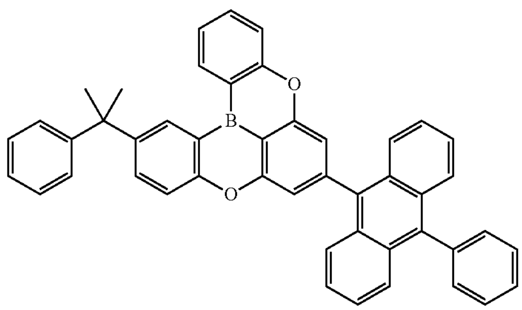
249
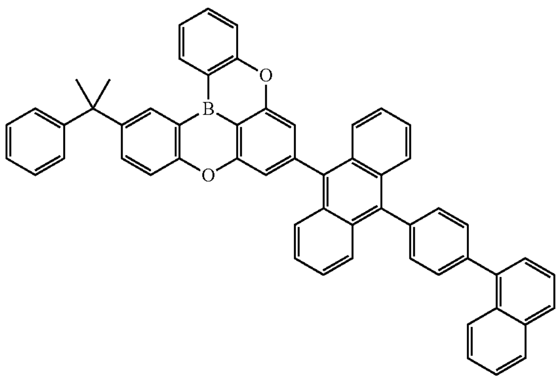
250
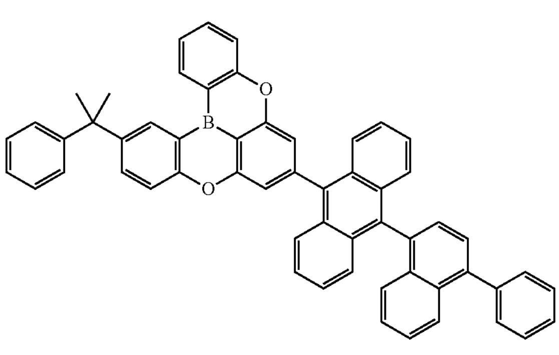
251
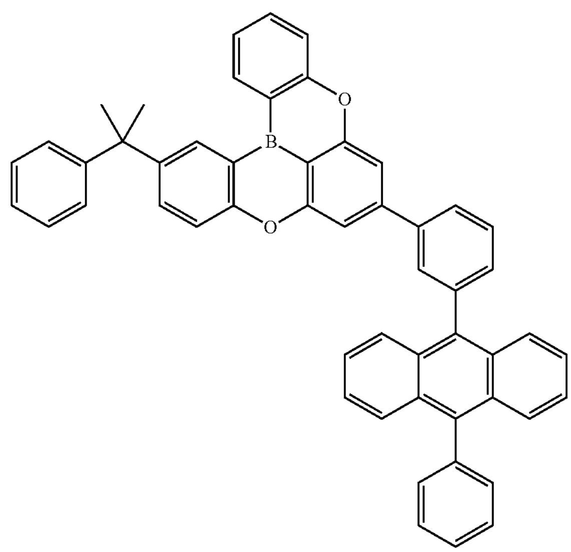
252
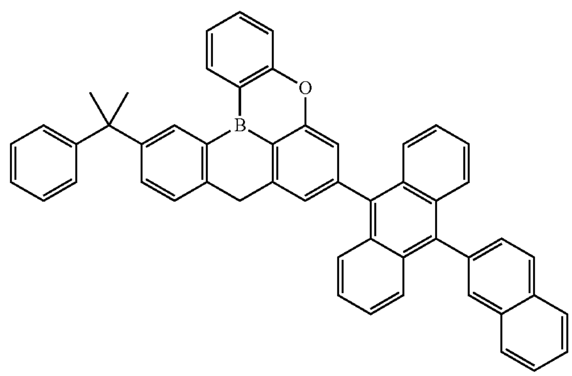
253
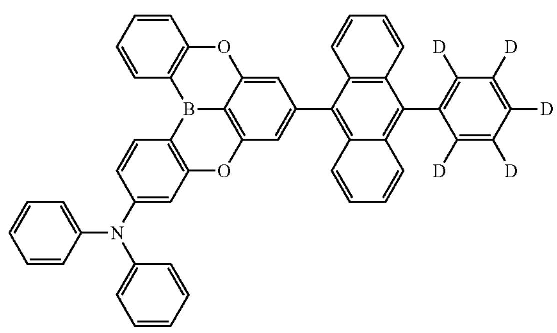
254
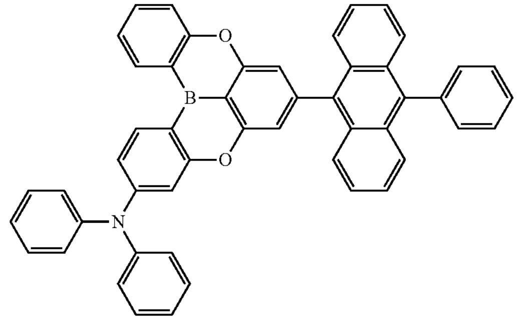

-continued
255
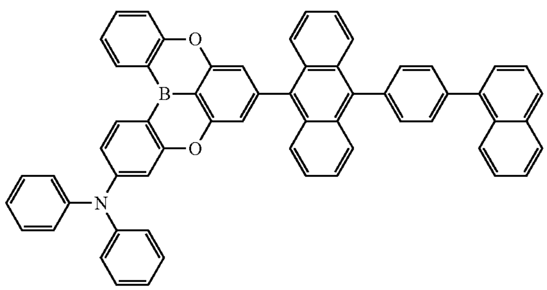
256
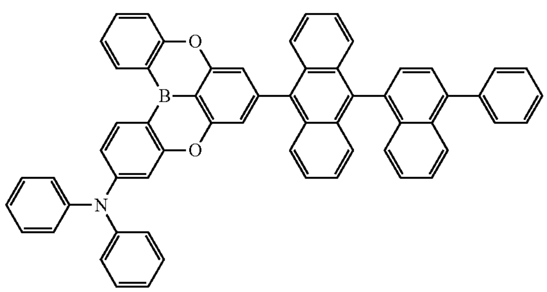
257
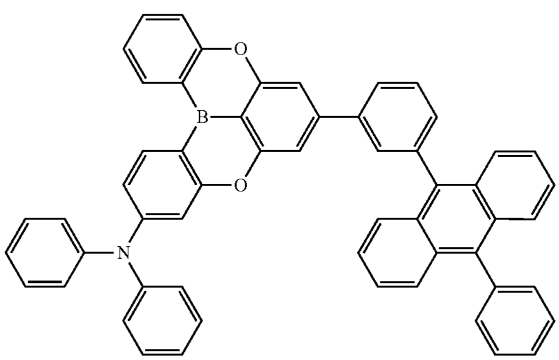
258
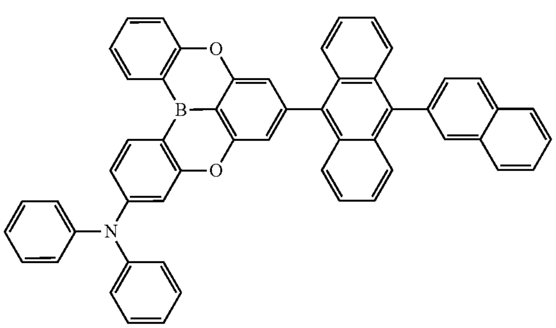
-continued
259
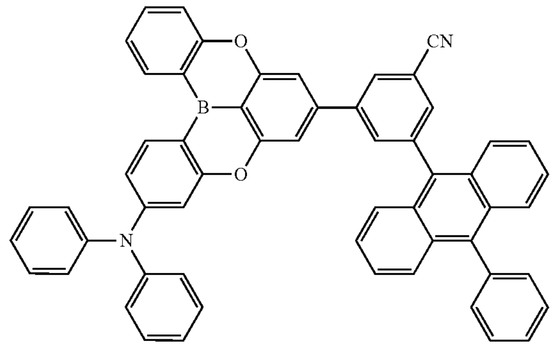
260
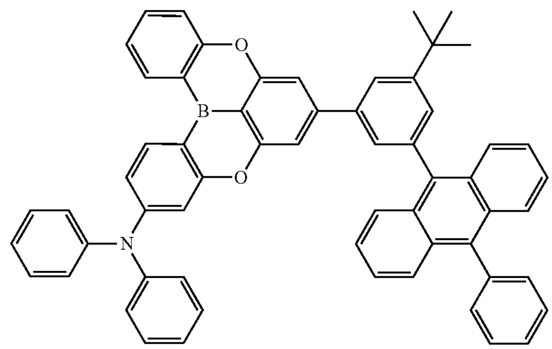
261
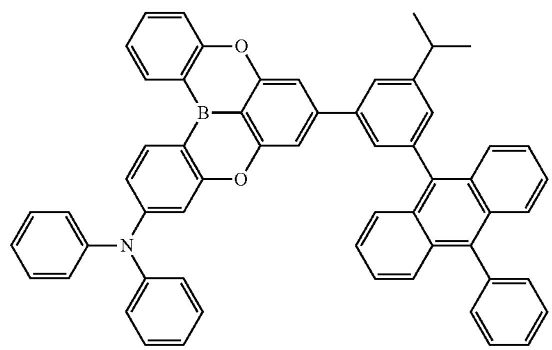
262
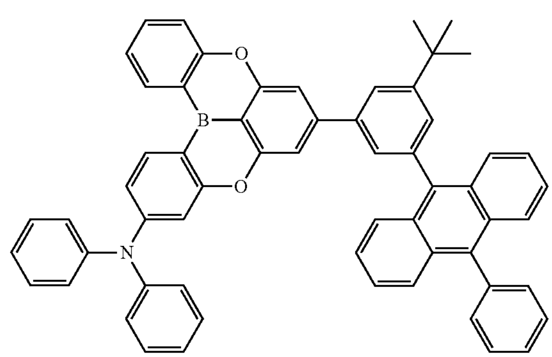

-continued
263
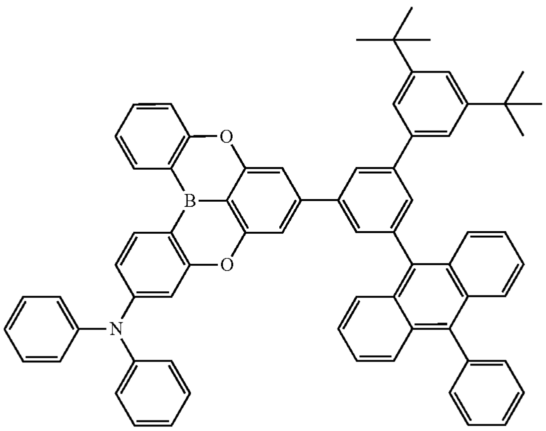
264
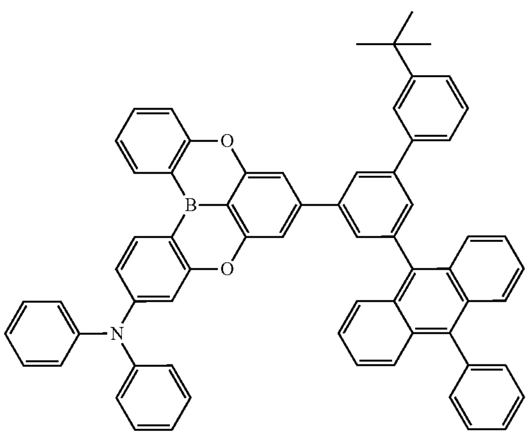
265
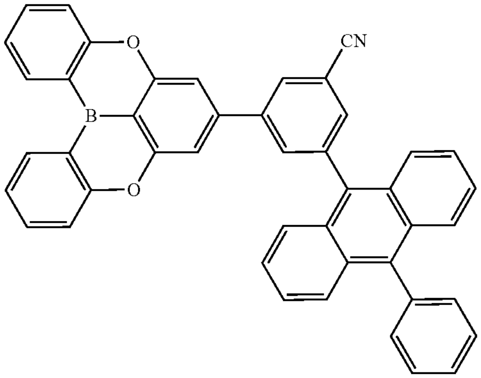
-continued
266
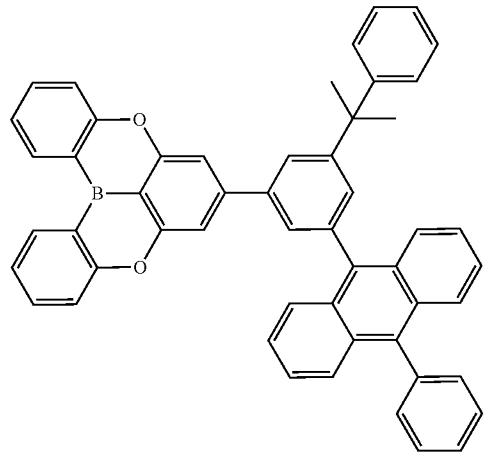
267
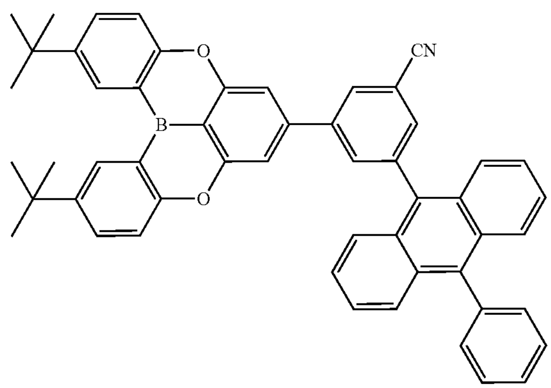
268
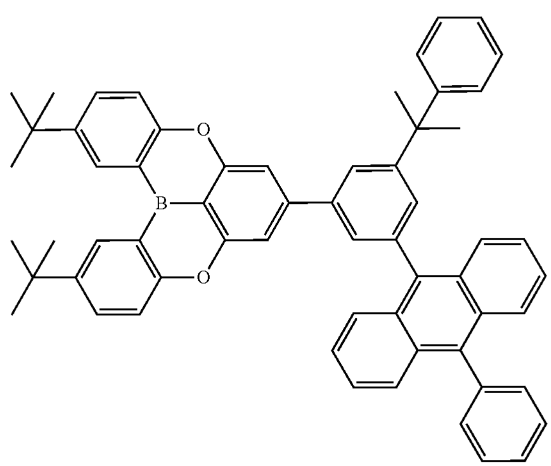

-continued
269
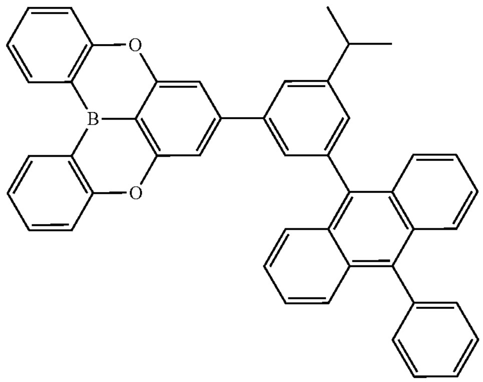
270
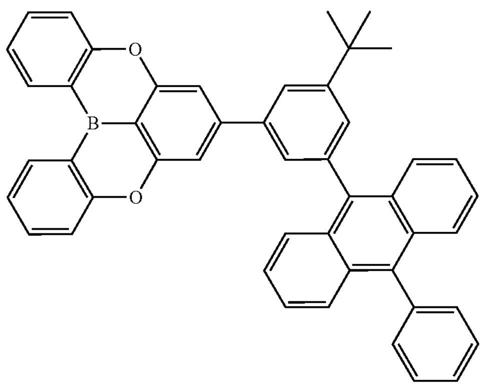
271
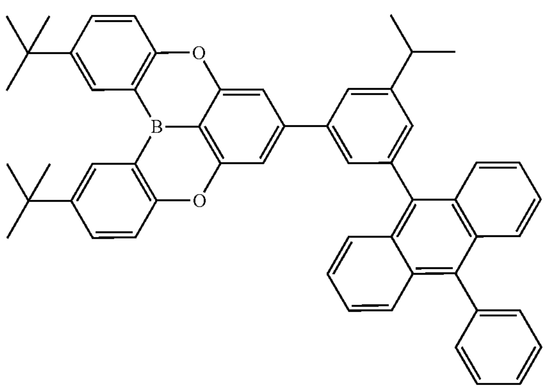
272
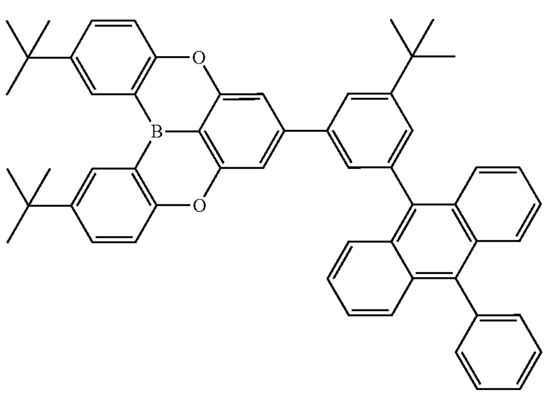
-continued
273
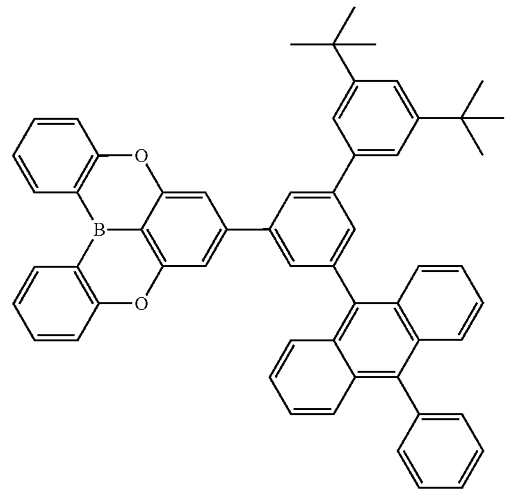
274
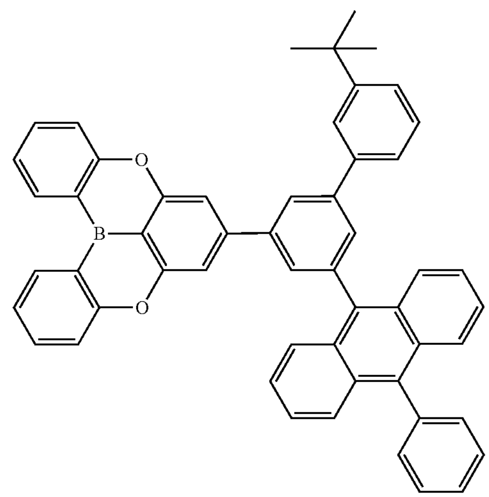
275
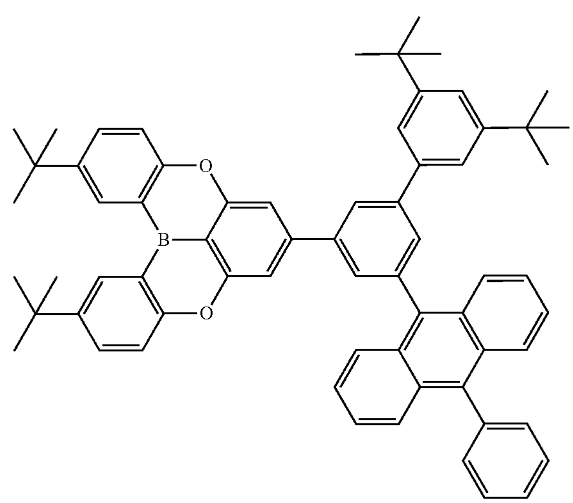

-continued
276
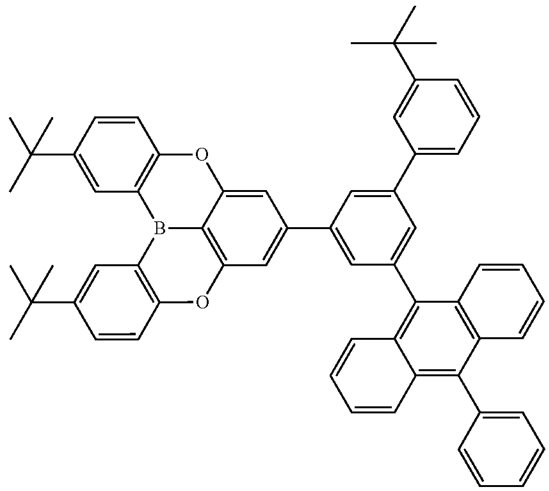
277
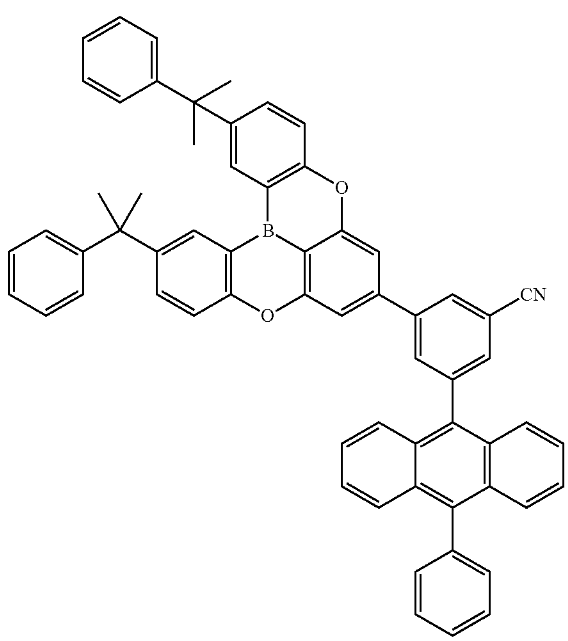
-continued
278
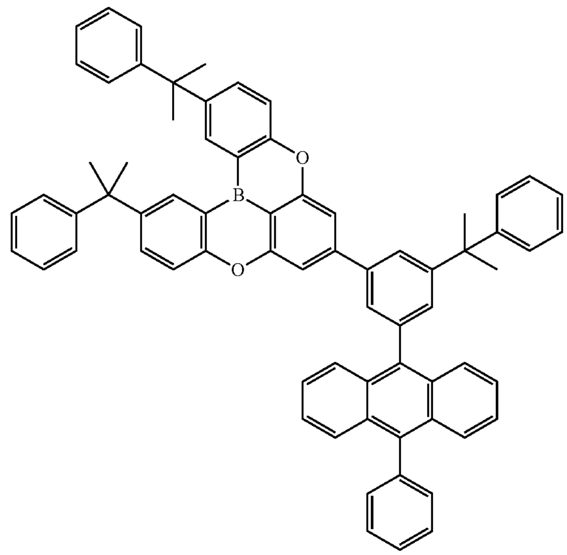
279
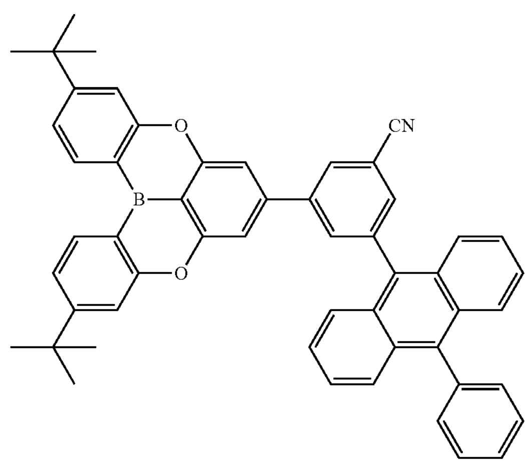
280
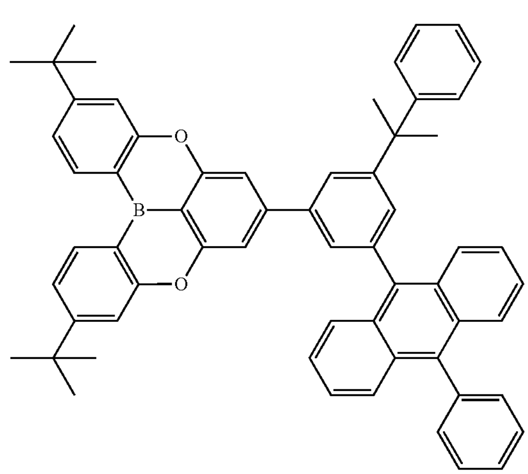

-continued
281
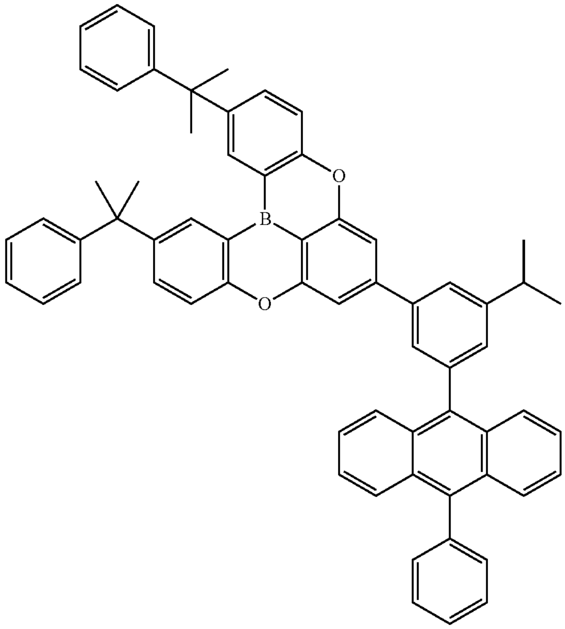
282
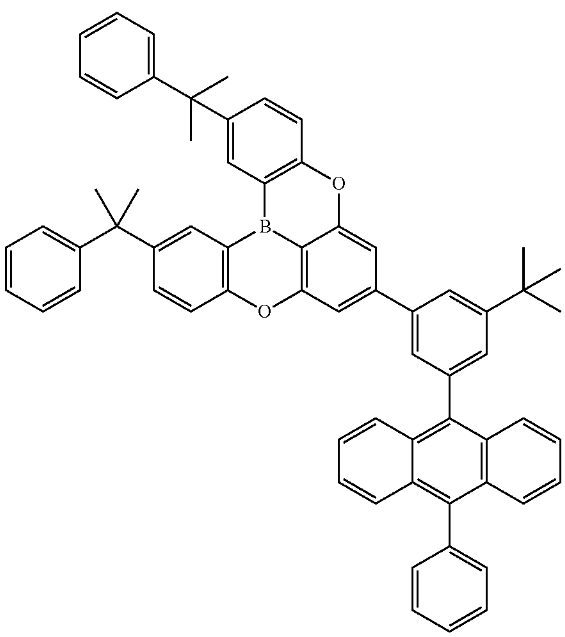
-continued
283
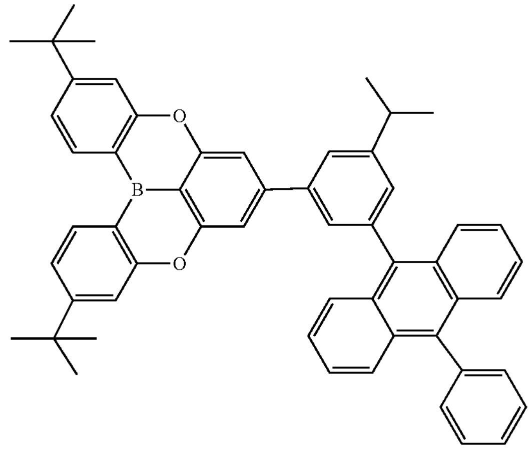
284
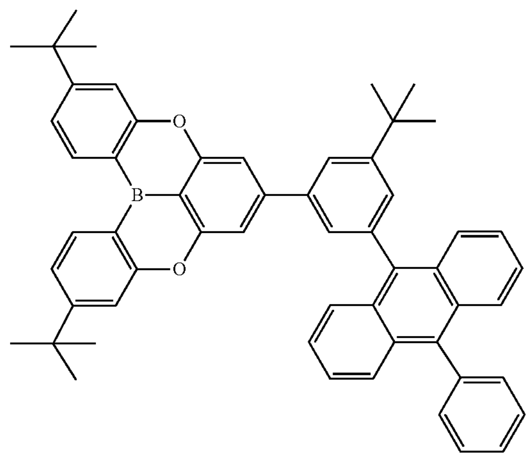
285
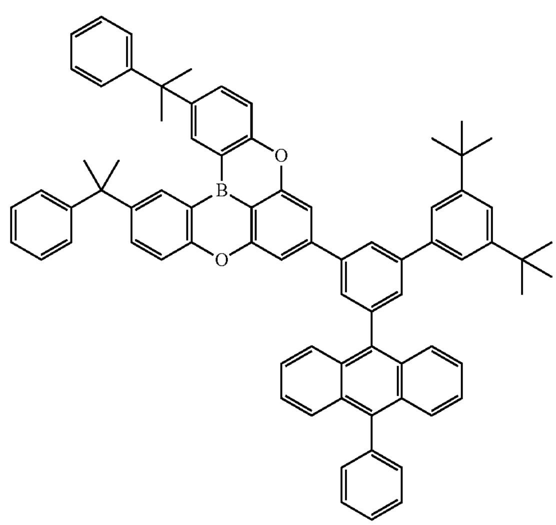

-continued
286
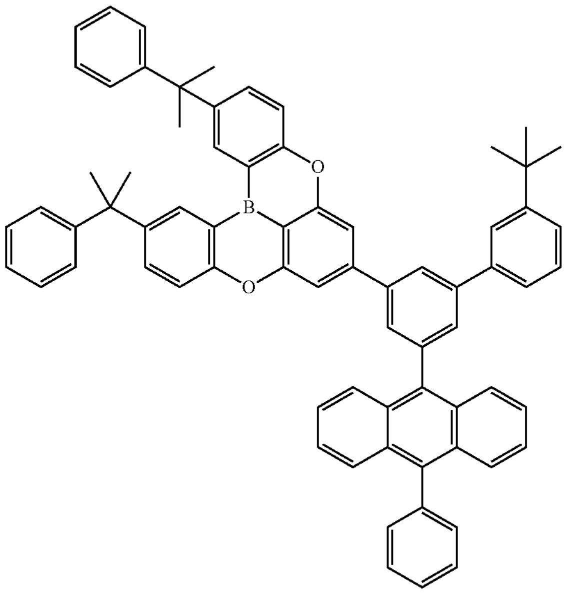
287
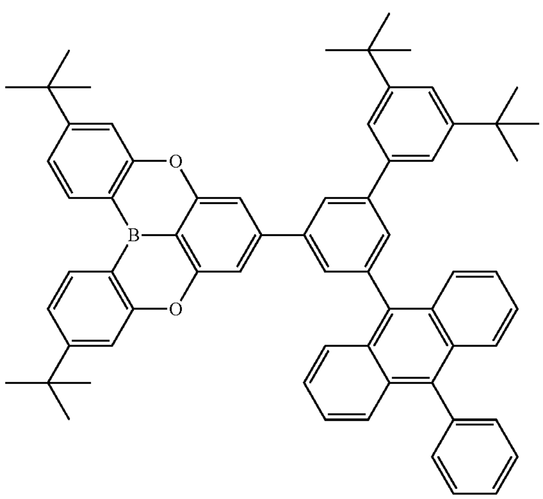
288
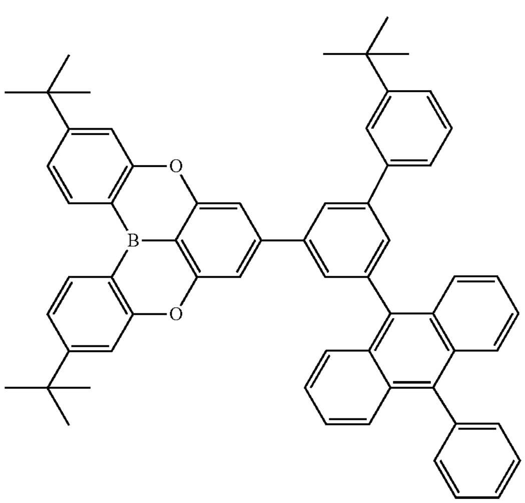
-continued
289
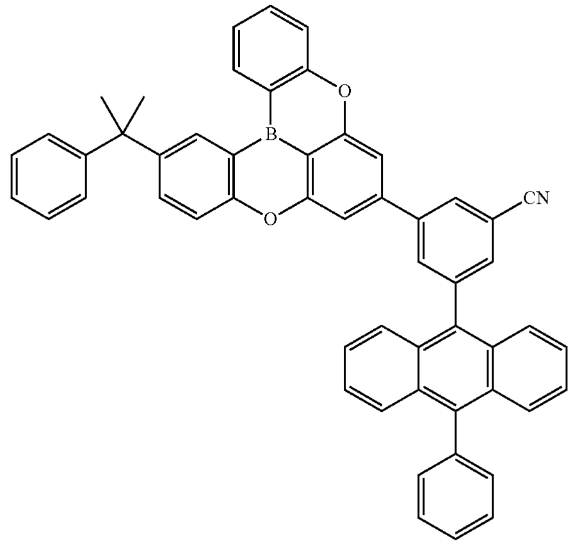
290
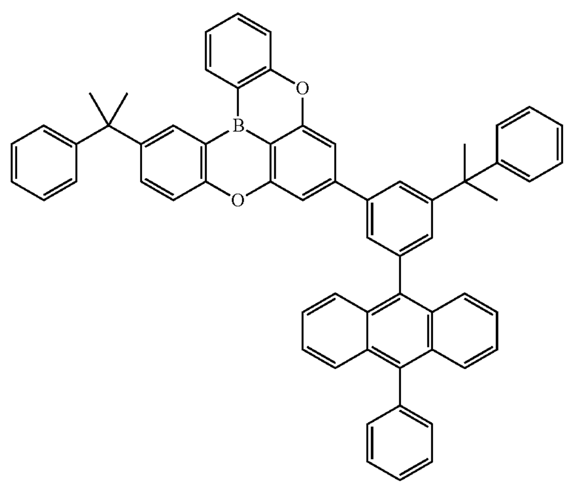
291
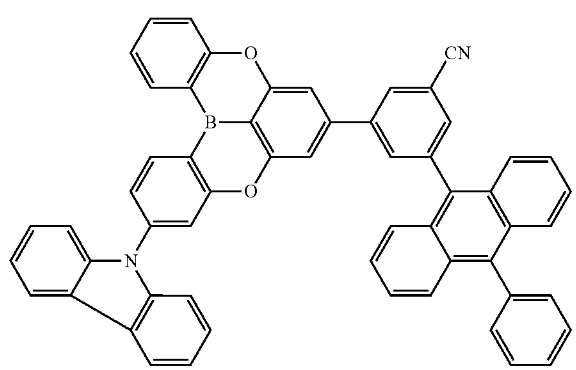

292
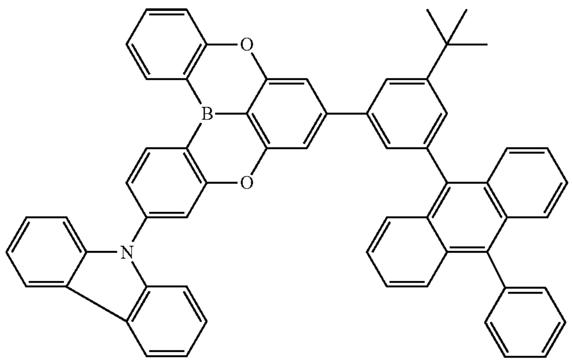
293
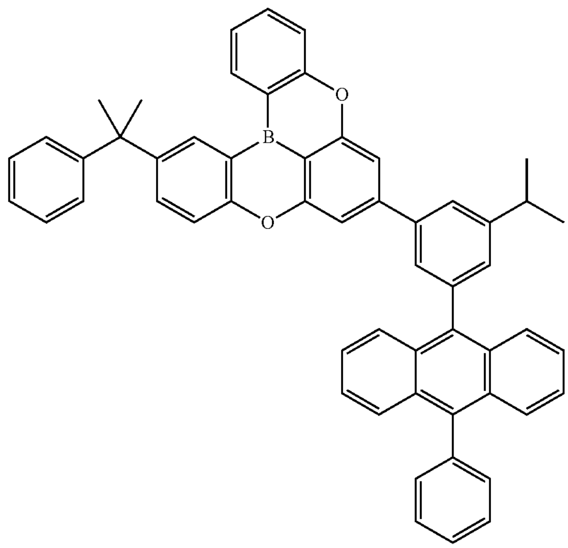
294
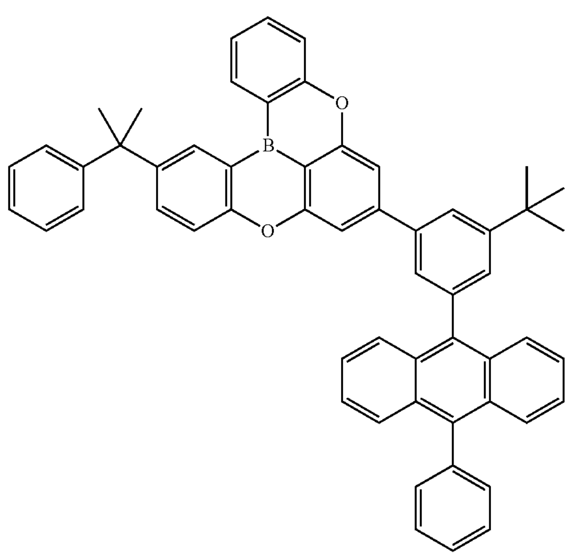
295
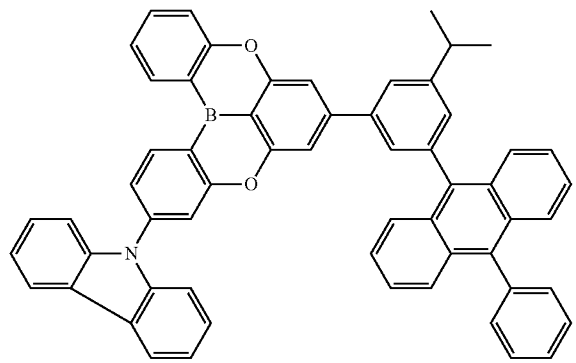
296
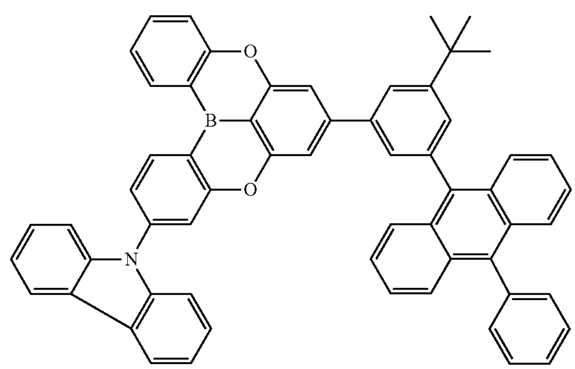
297
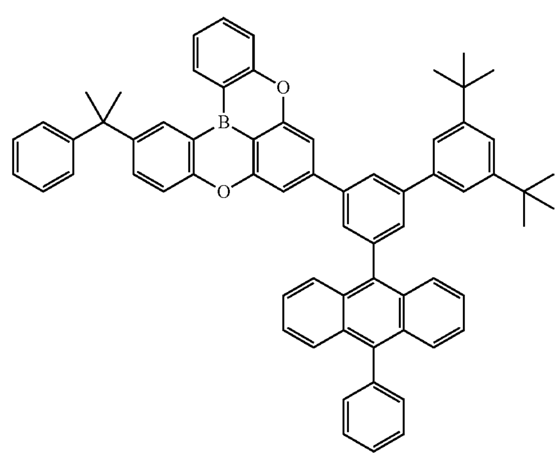

-continued
298
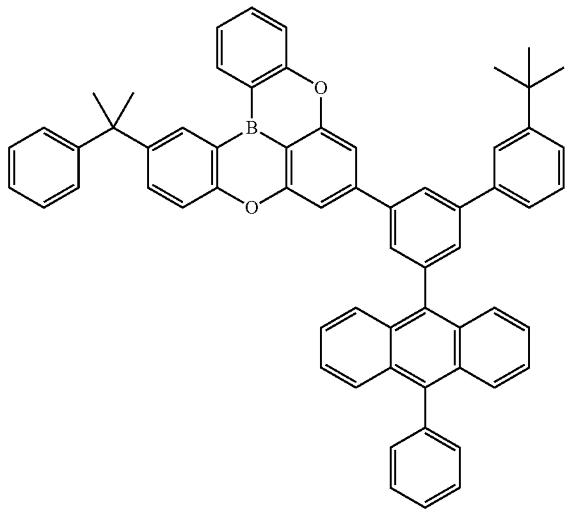
299
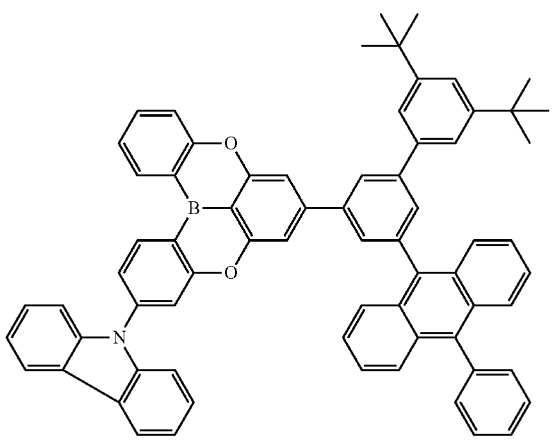
300
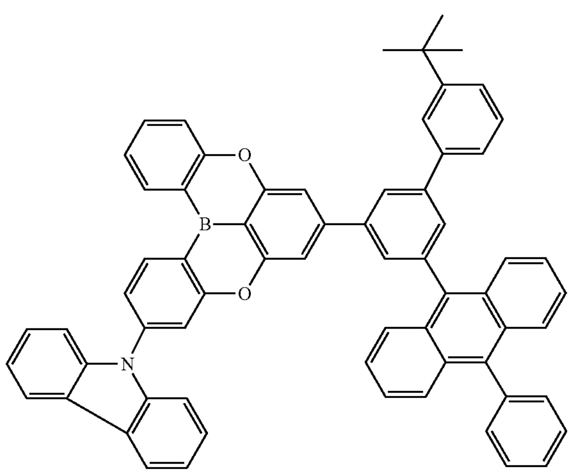
-continued
301
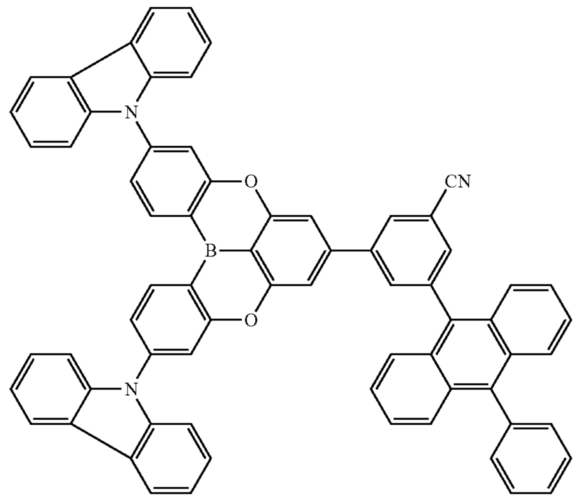
302
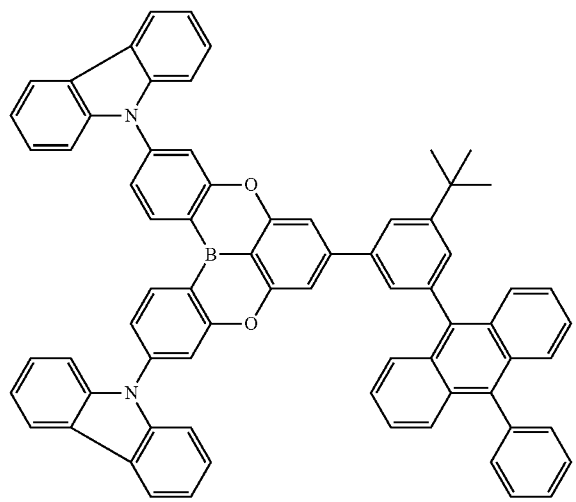
303
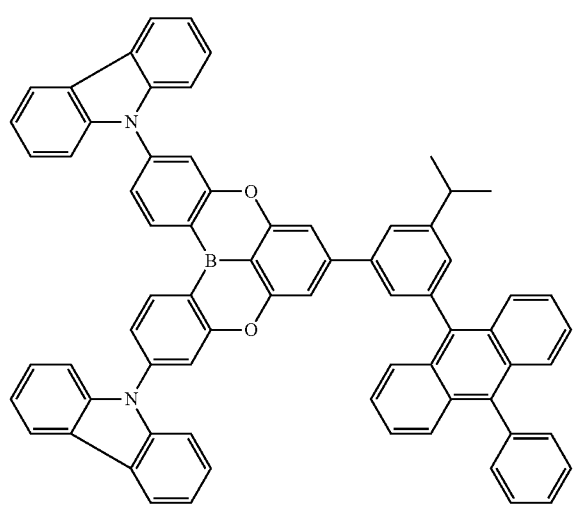

304
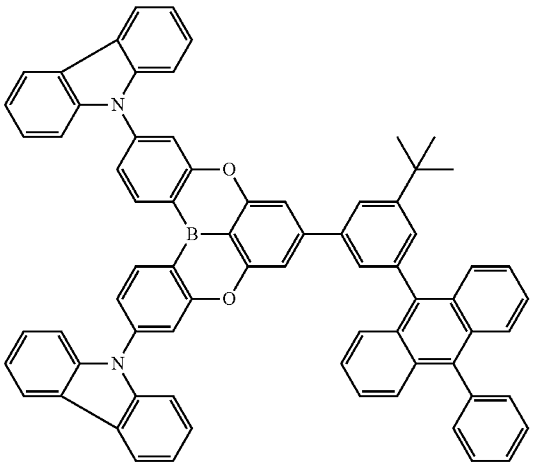
305
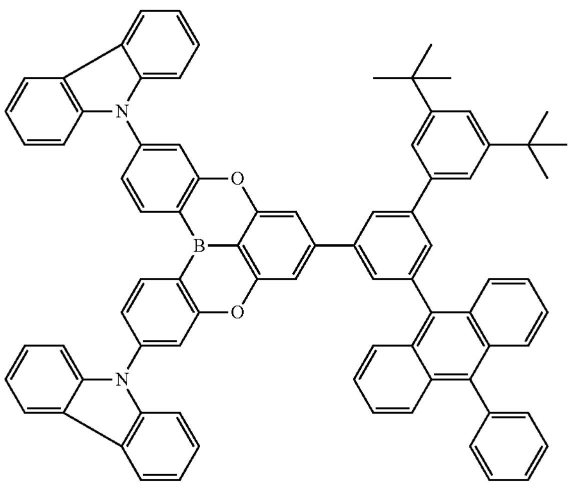
306
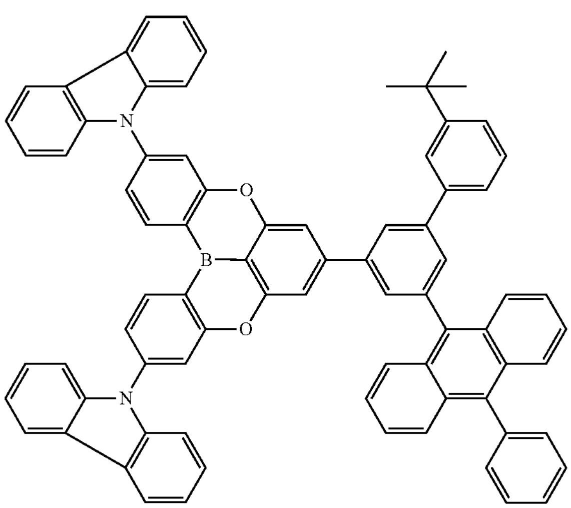
307
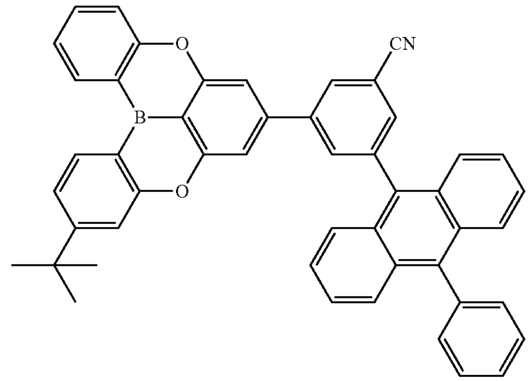
308
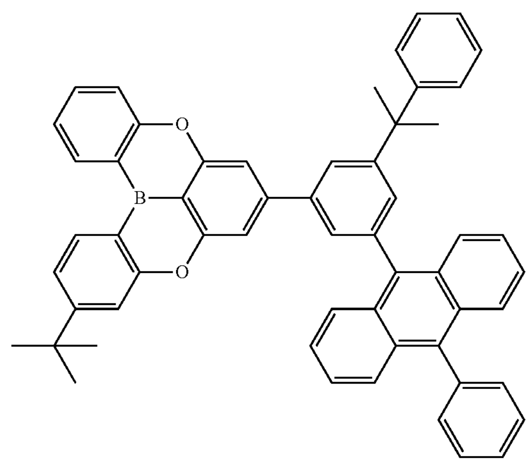
309
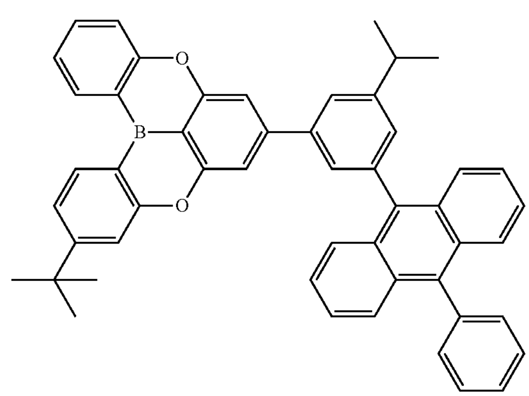

310
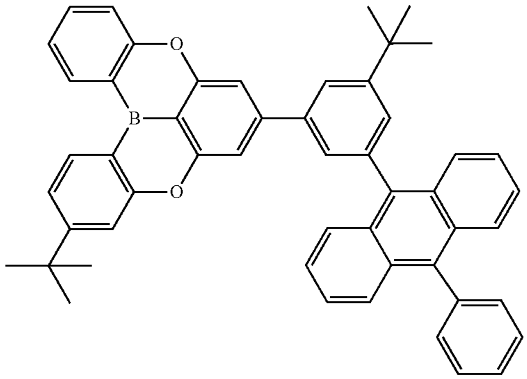
311
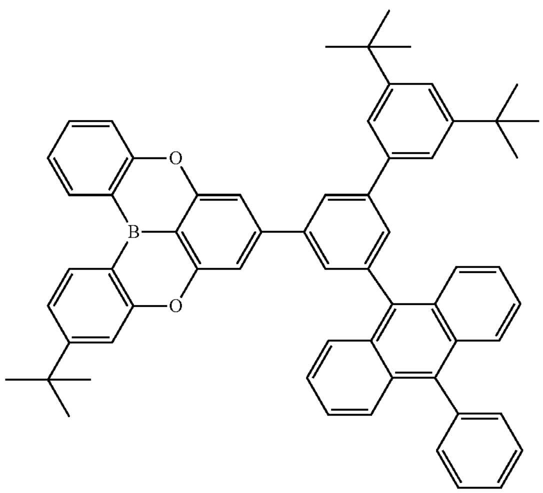
312
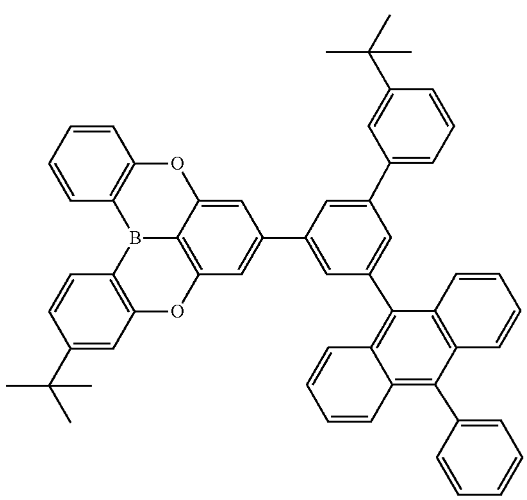
313
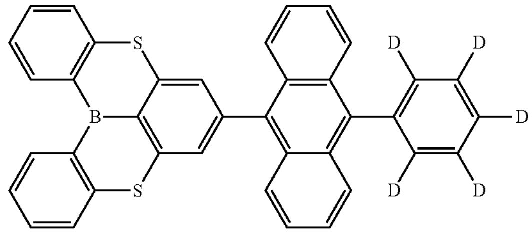
314
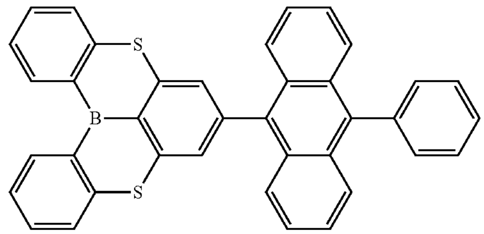
315
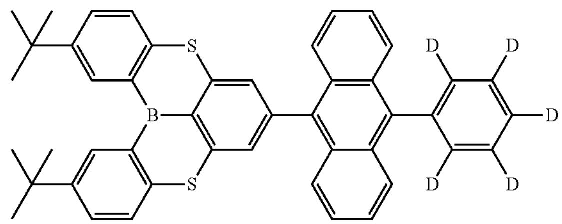
316
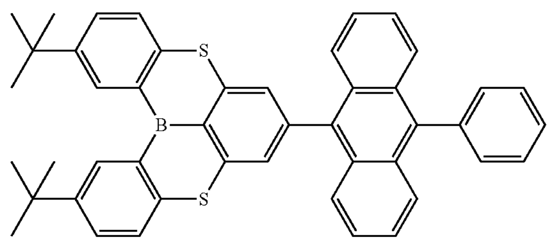
317
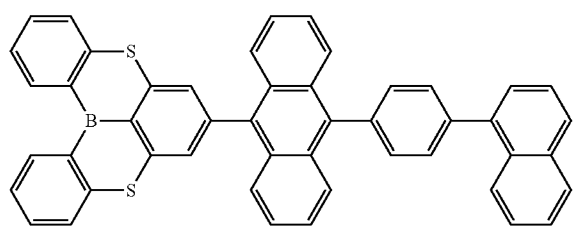
318
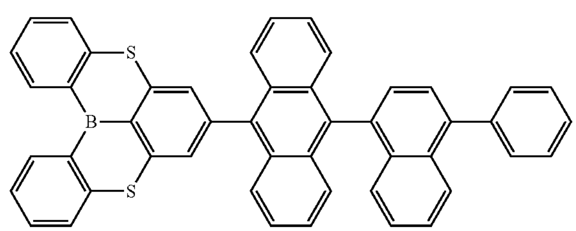

-continued
319
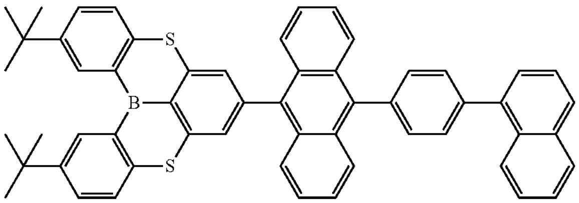
320
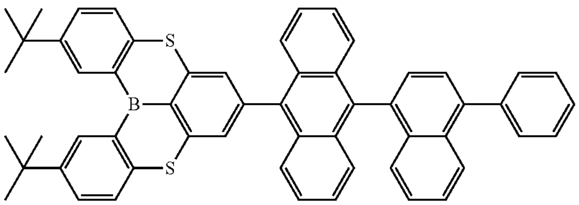
321
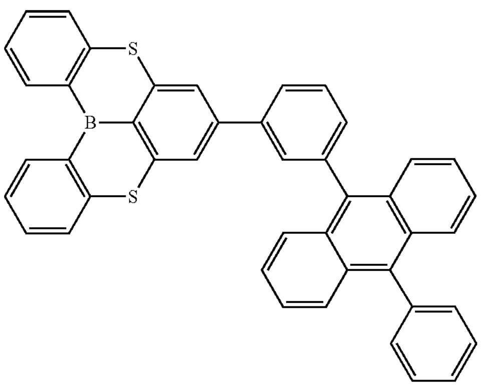
322
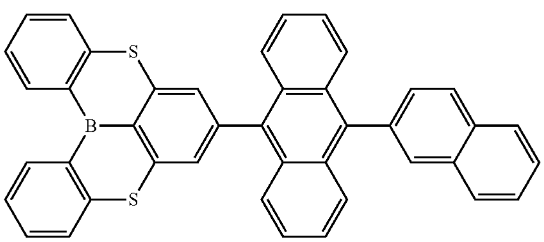
323
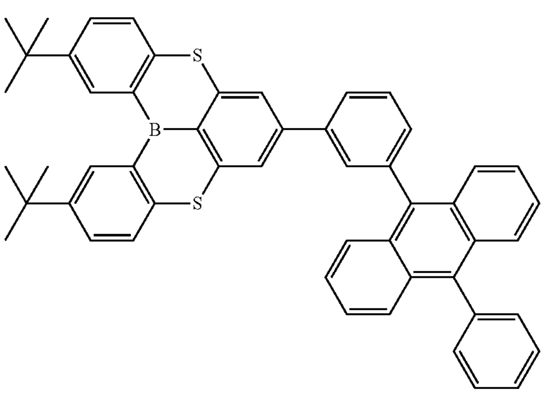
-continued
324
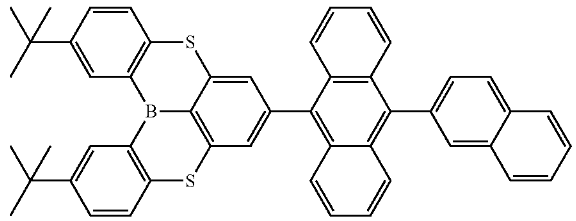
325
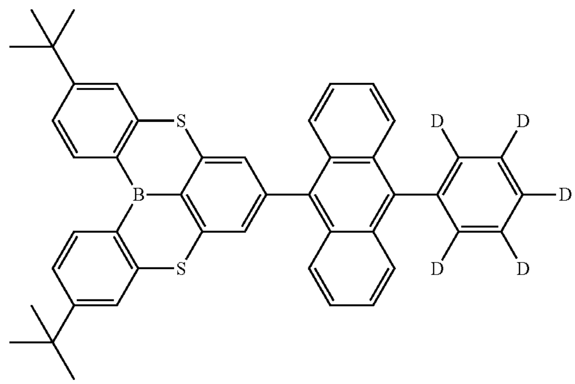
326
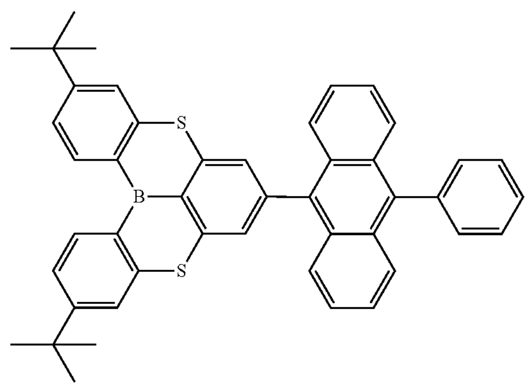
327
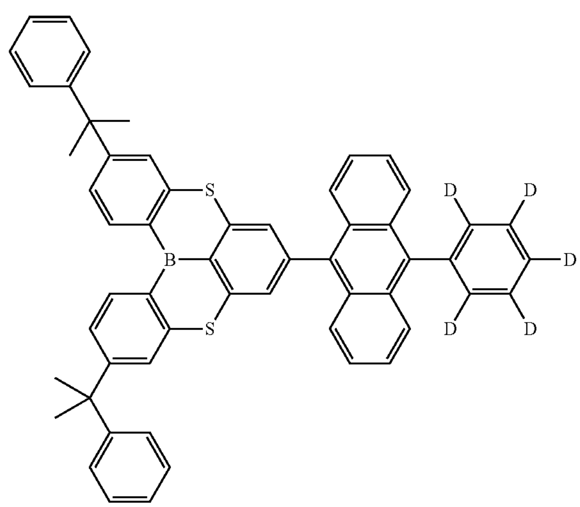

-continued
328
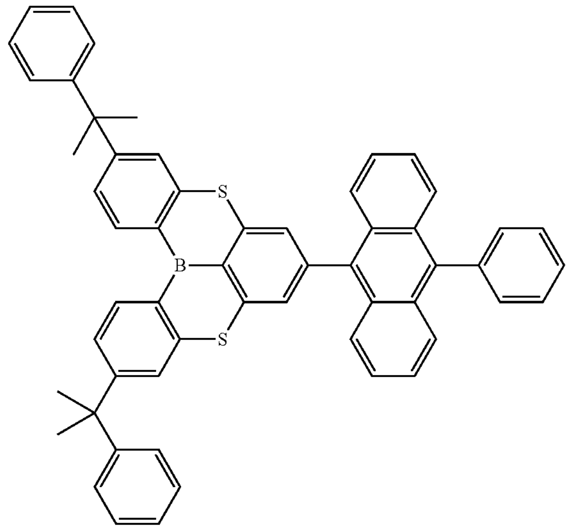
329
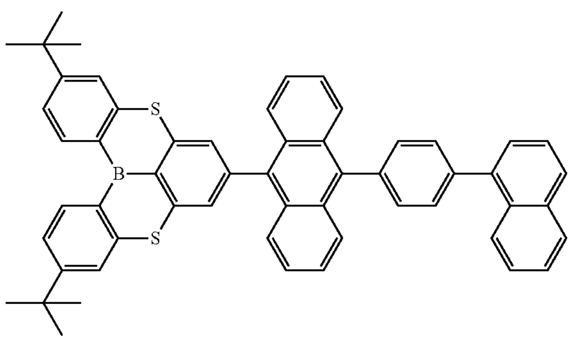
330
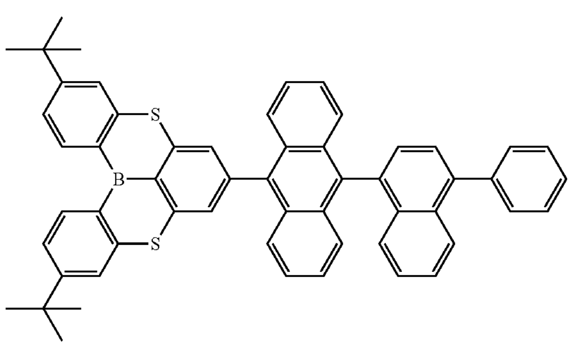
-continued
331
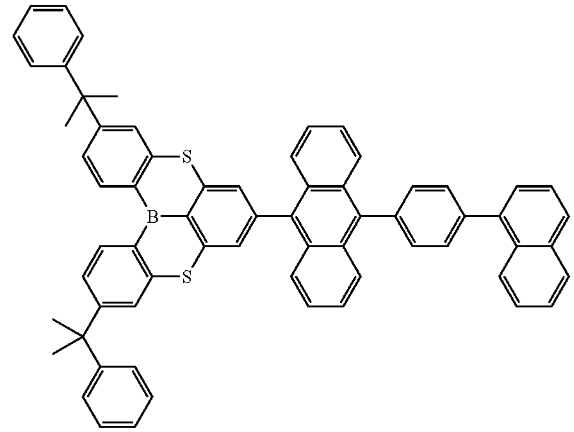
332
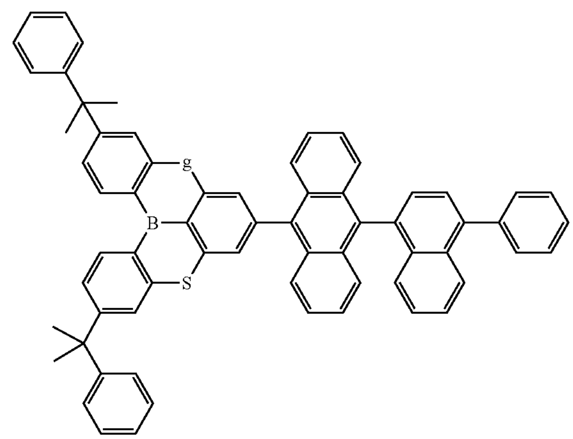
333
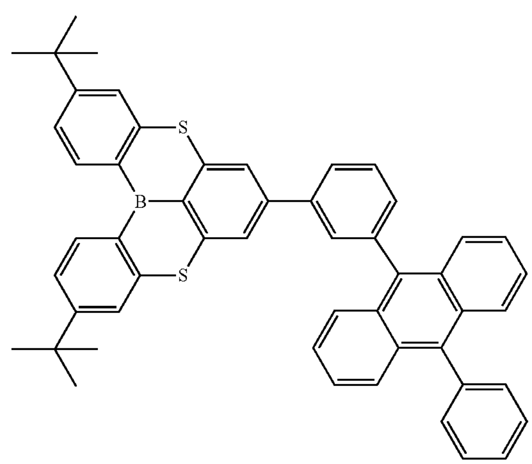

-continued
334
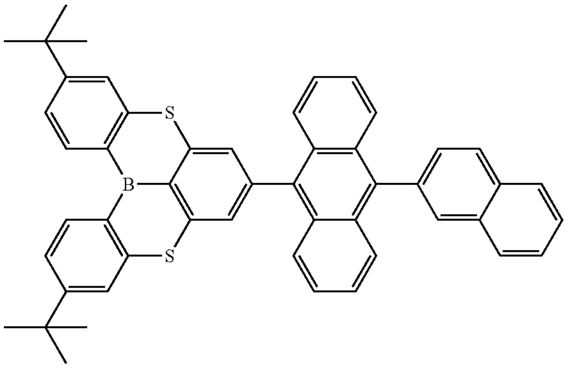
335
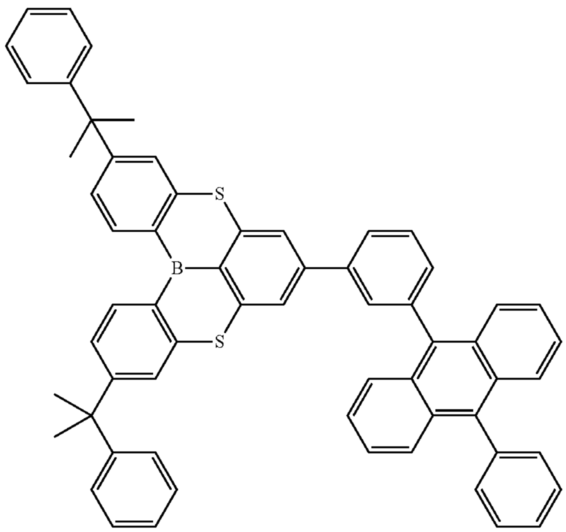
336
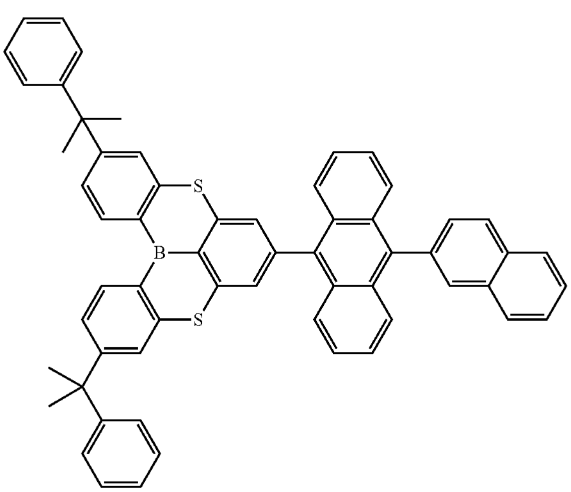
-continued
337
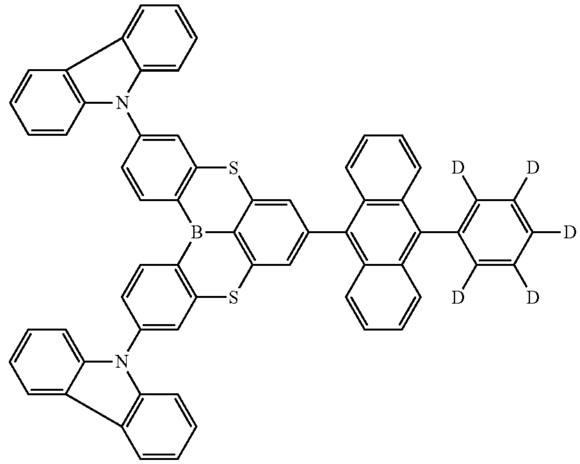
338
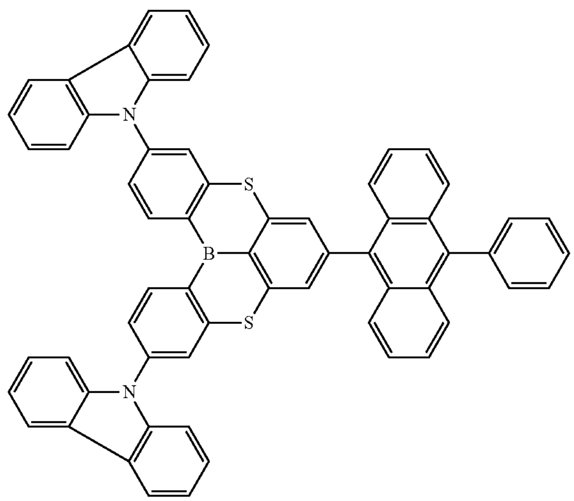
339
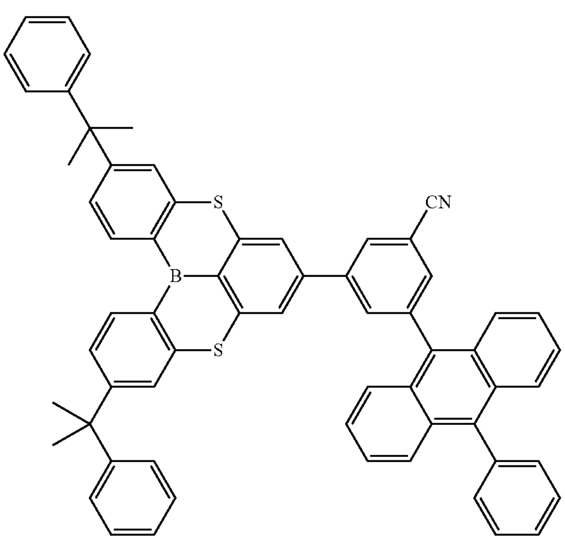

-continued
340
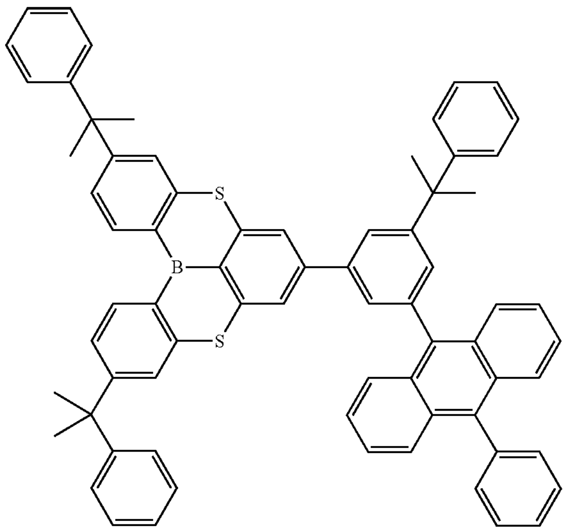
341
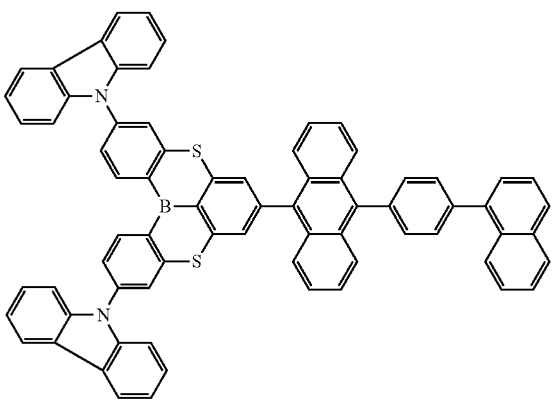
342
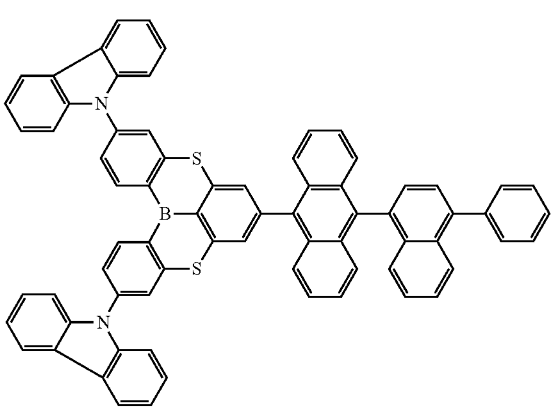
-continued
343
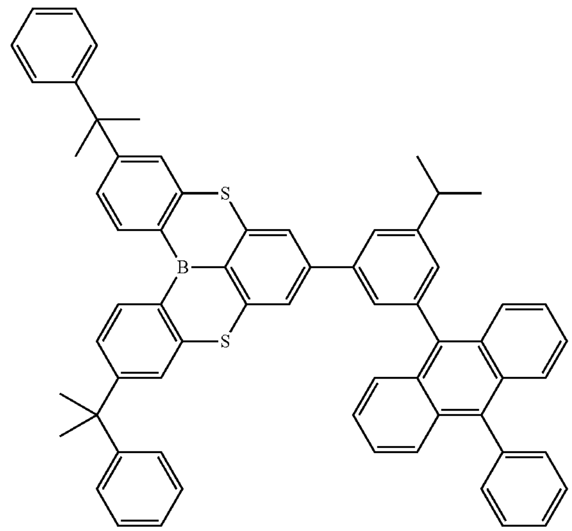
344
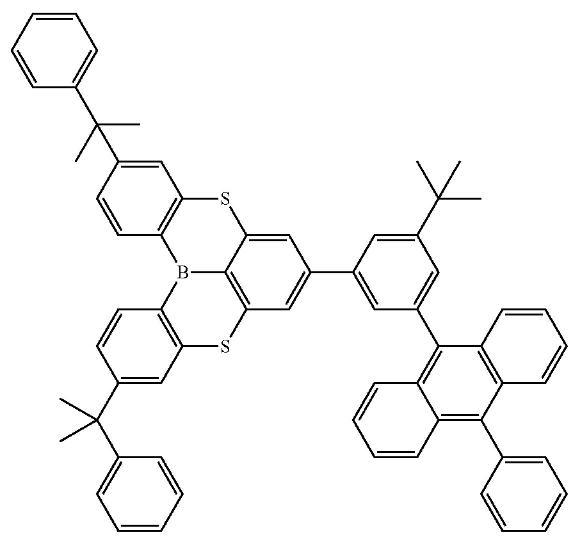
345
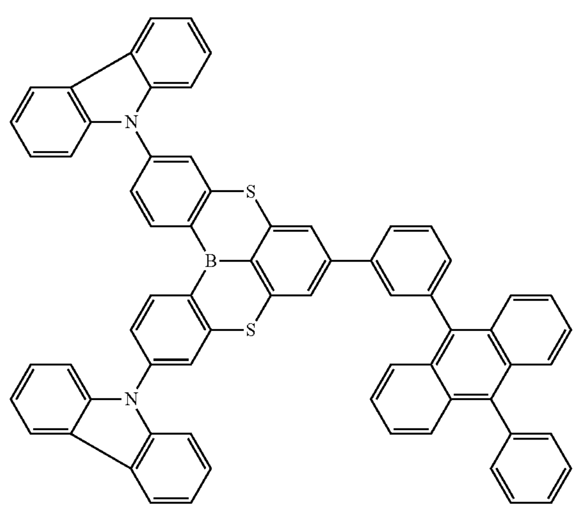

-continued
346
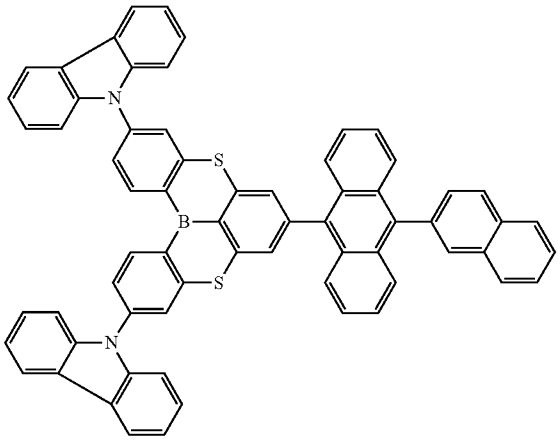
347
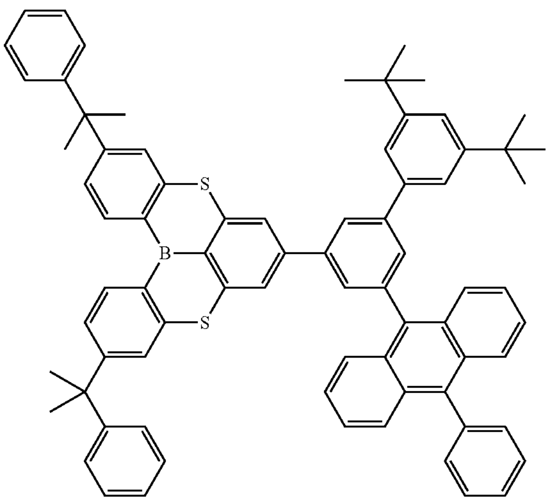
348
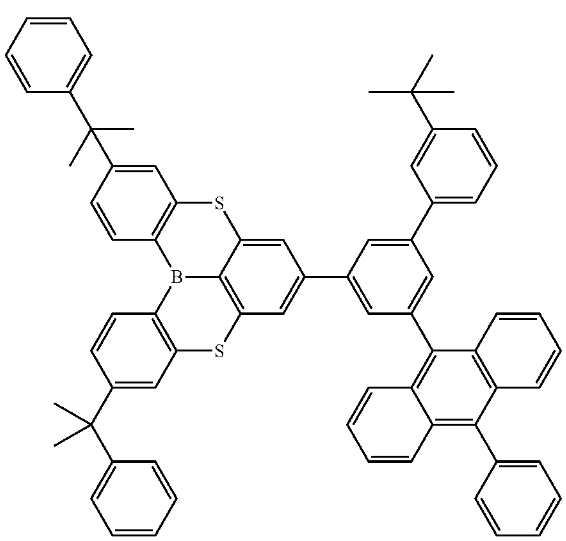
-continued
349
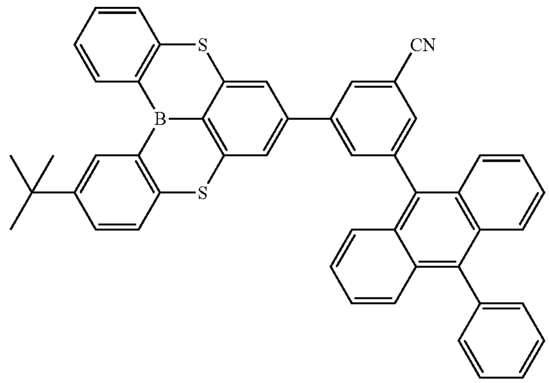
350
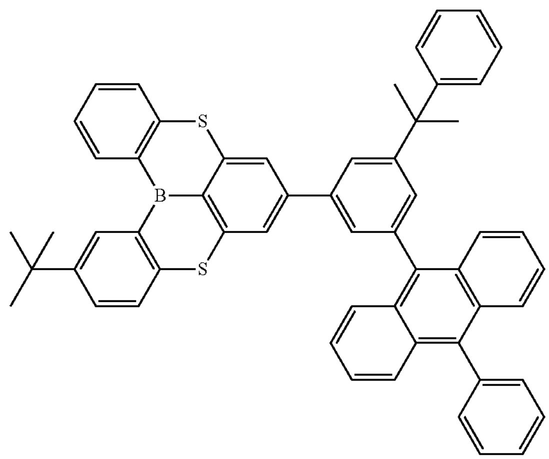
351
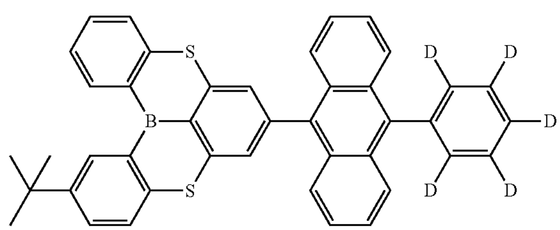
352
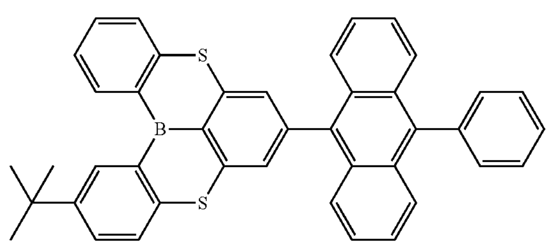

-continued
353
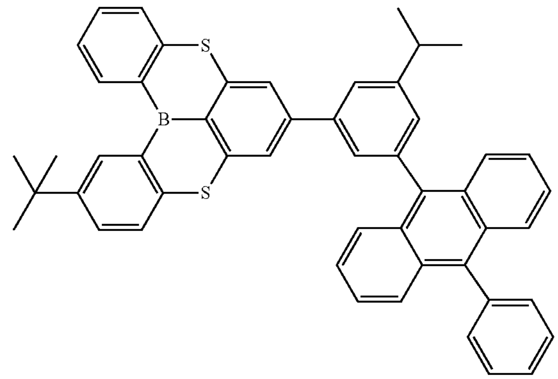
354
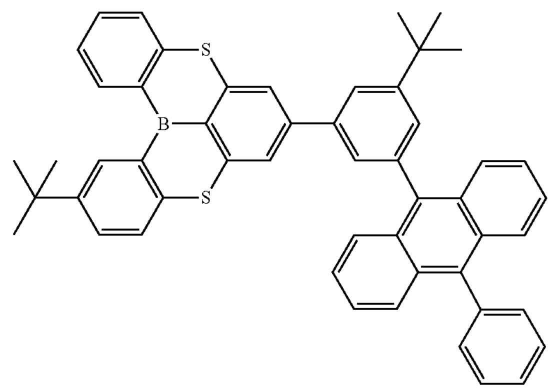
355
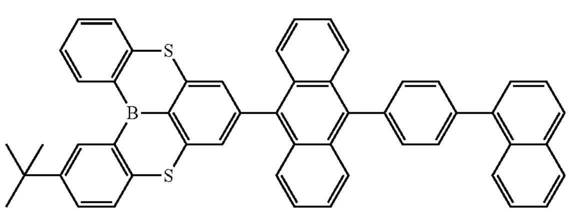
356
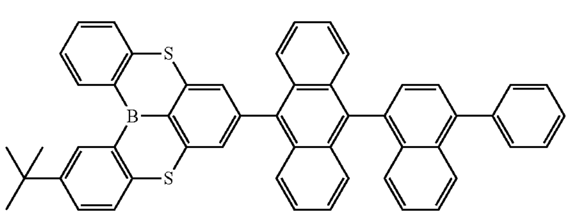
-continued
357
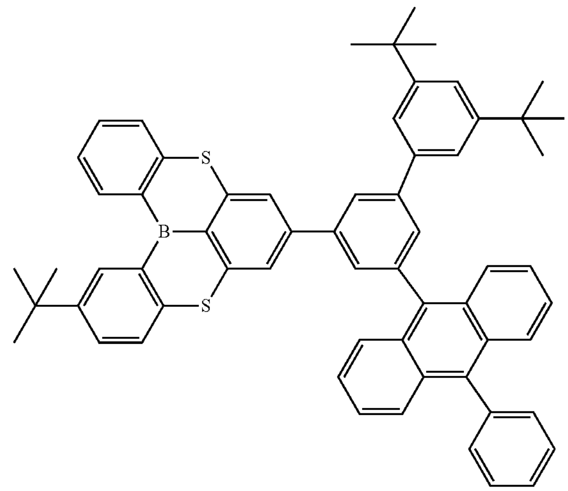
358
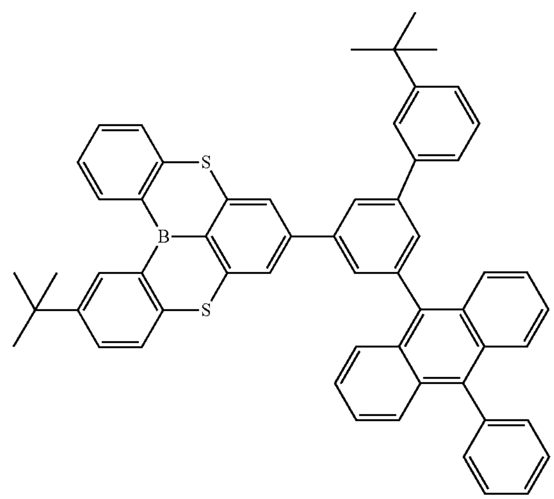
359
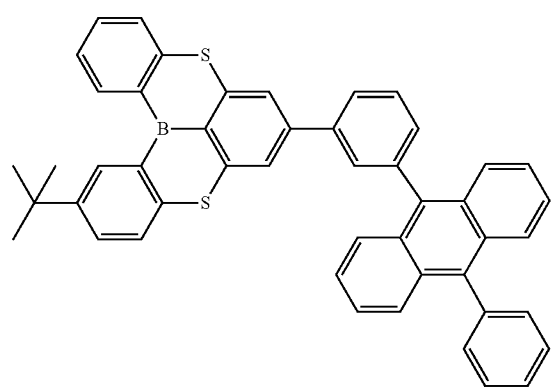

-continued
360
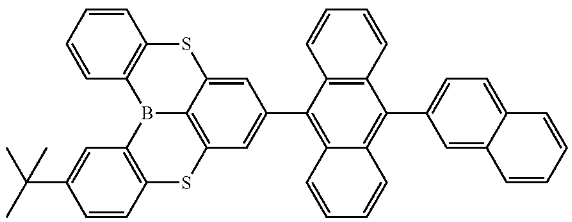
361
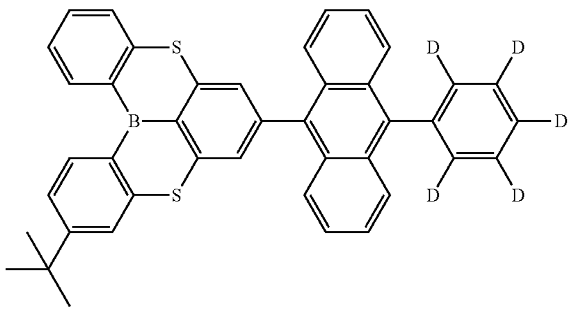
362
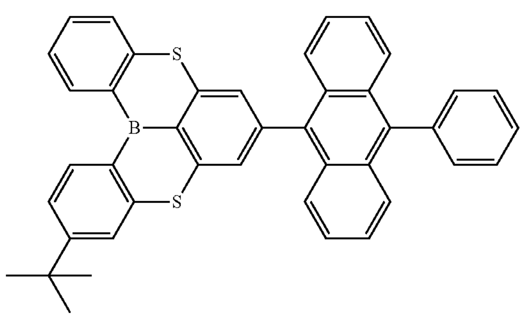
363
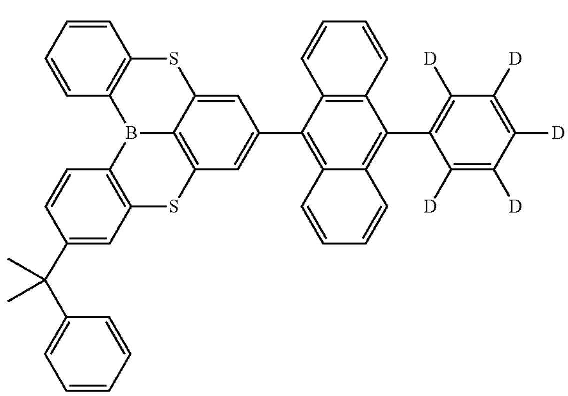
-continued
364
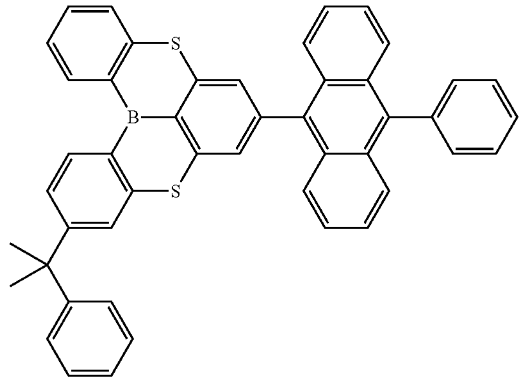
365
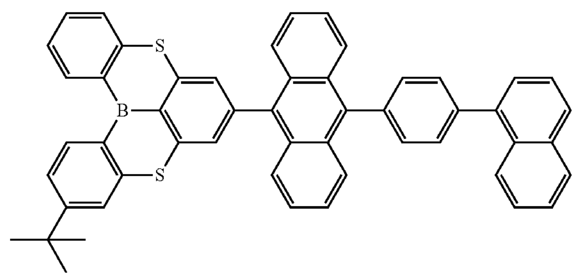
366
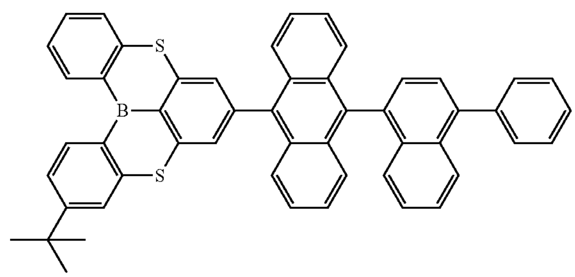
367
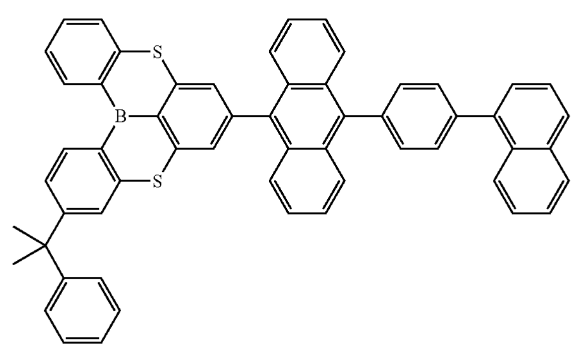

-continued
368
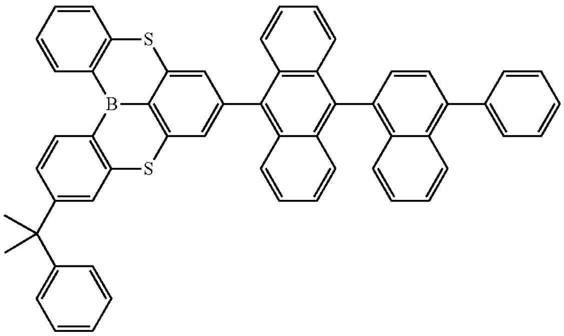
369
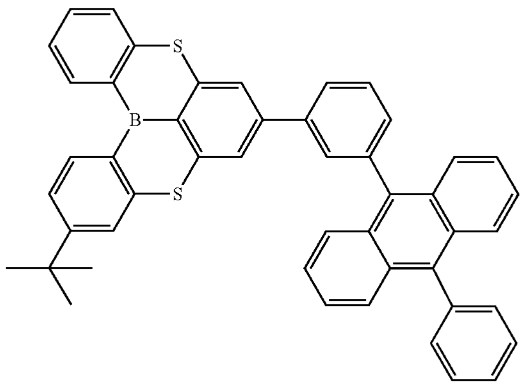
370
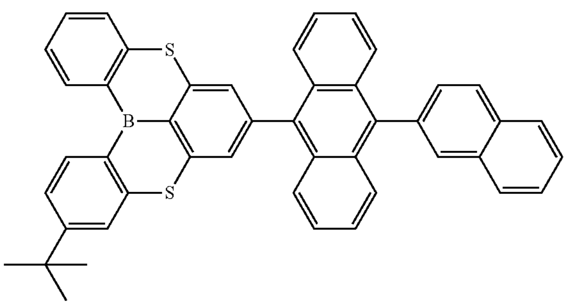
371
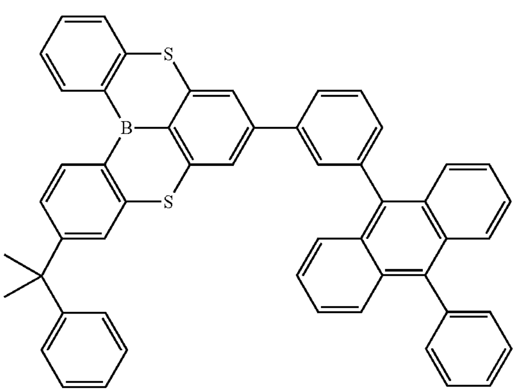
-continued
372
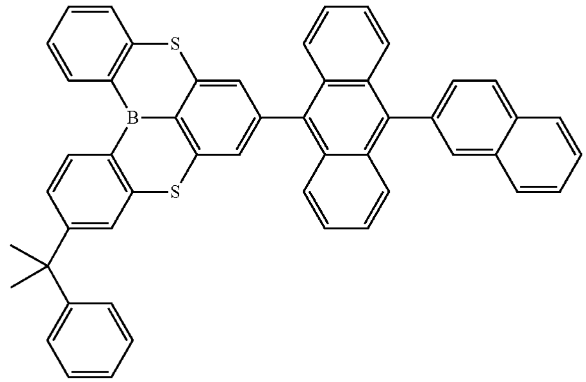
373
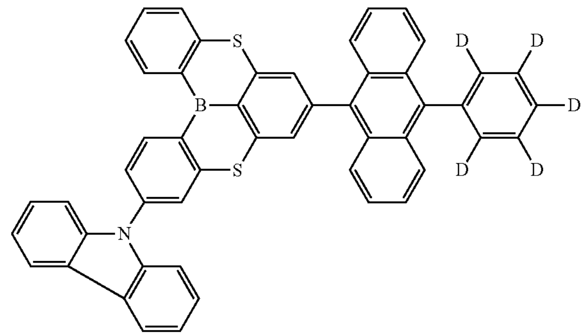
374
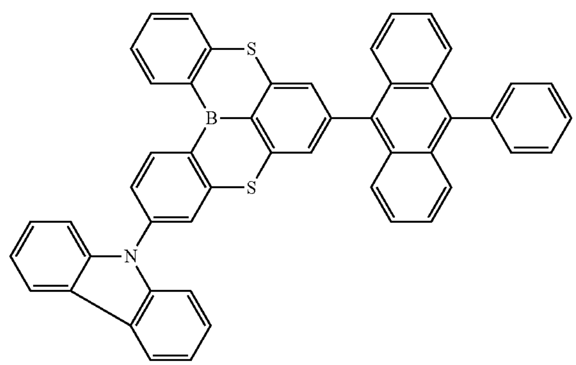
375
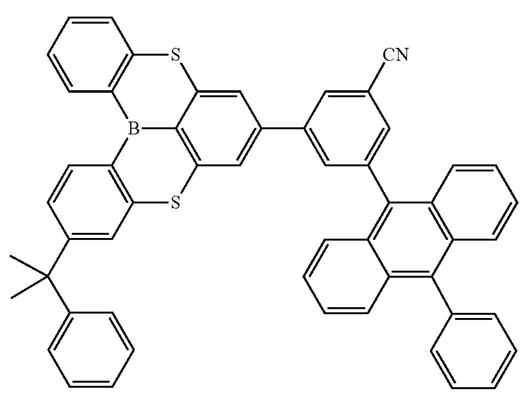

-continued
376
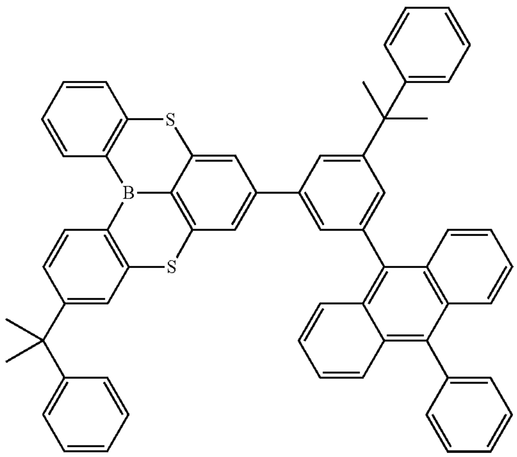
377
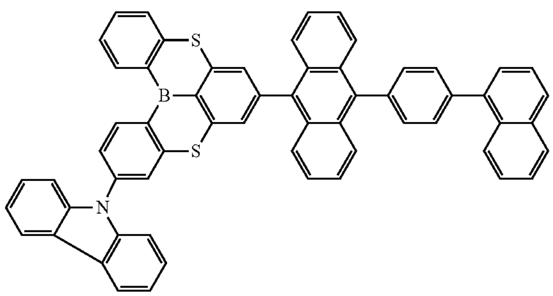
378
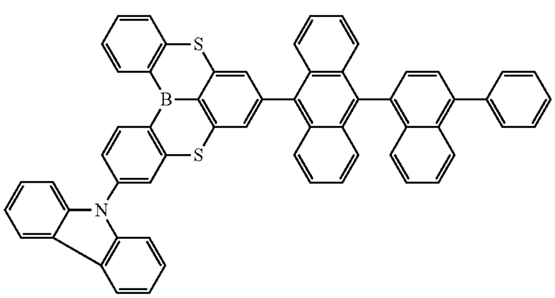
379
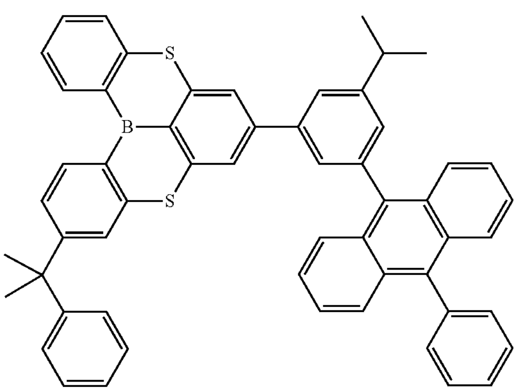
-continued
380
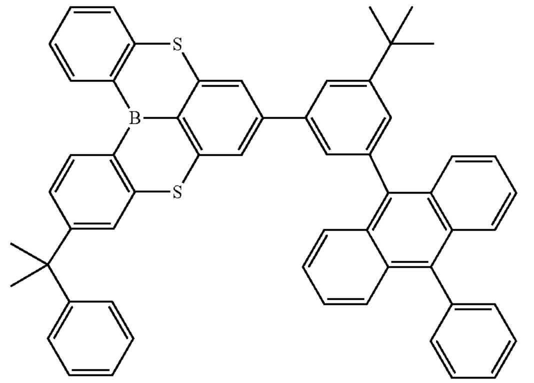
381
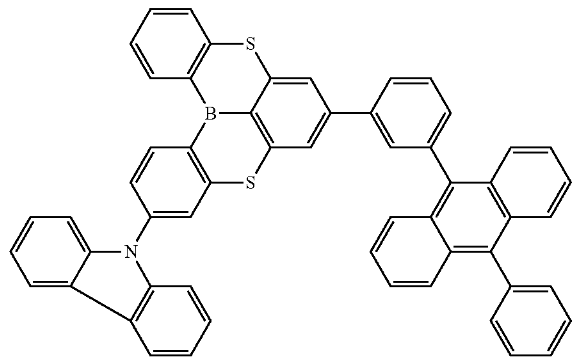
382
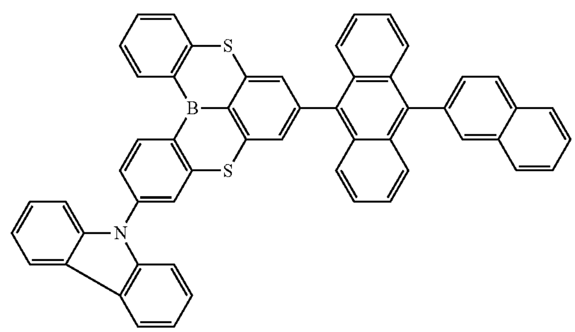
383
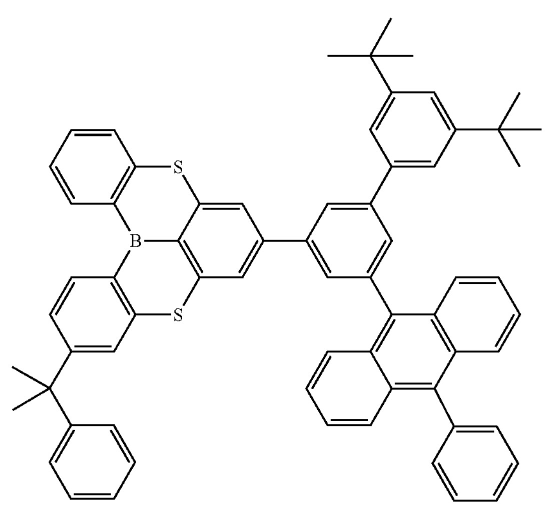

-continued
384
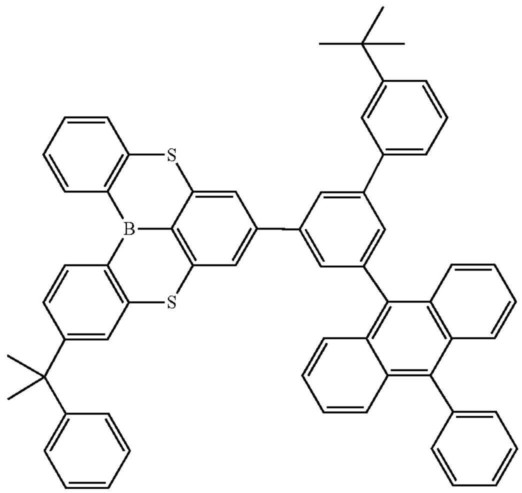
385
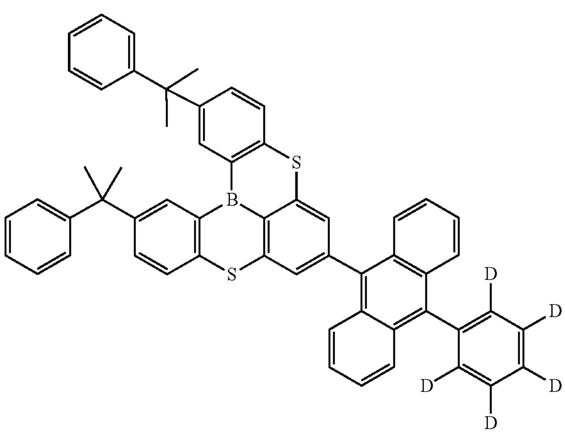
386
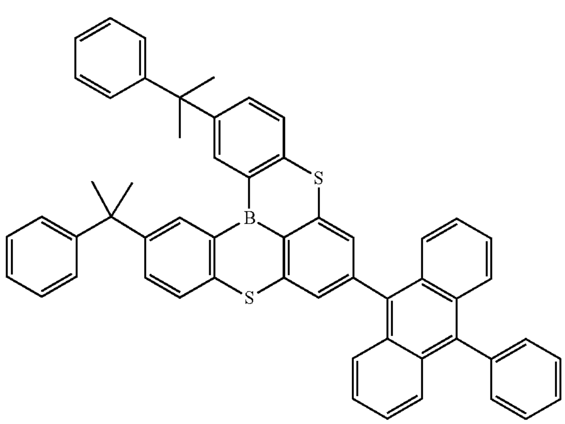
-continued
387
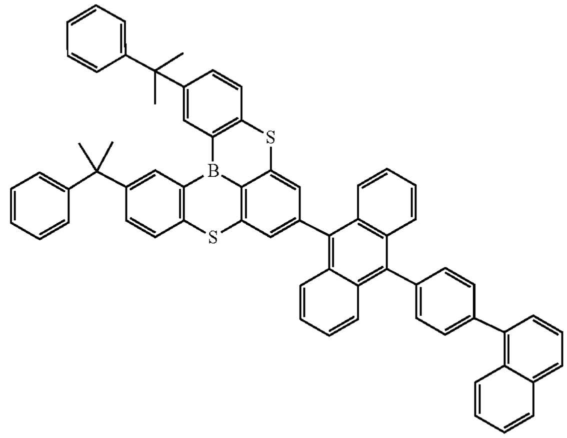
388
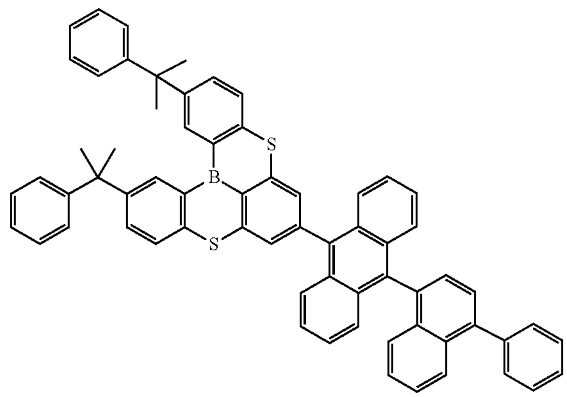
389
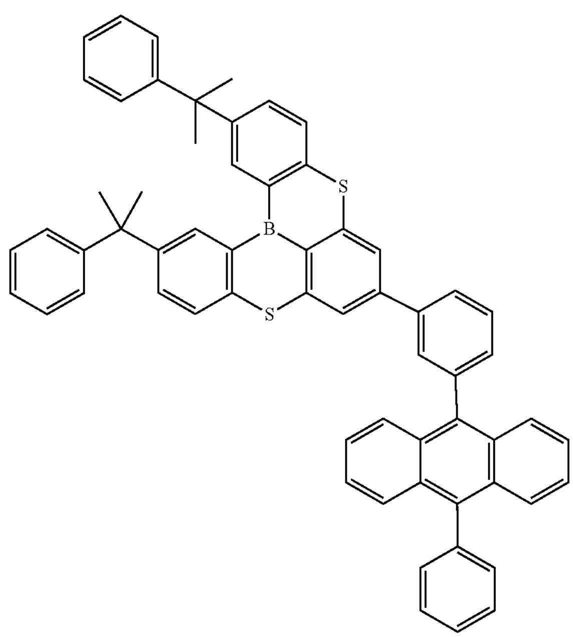

-continued
390
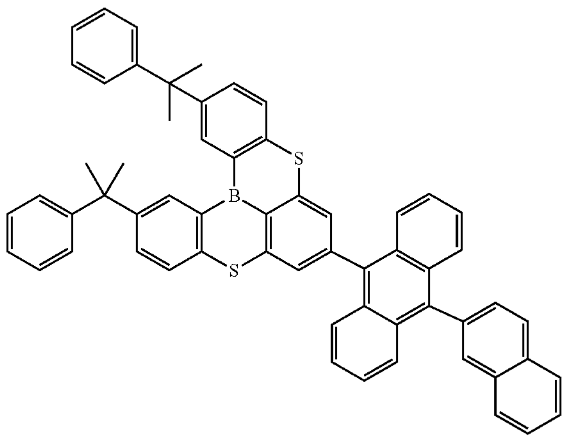
391
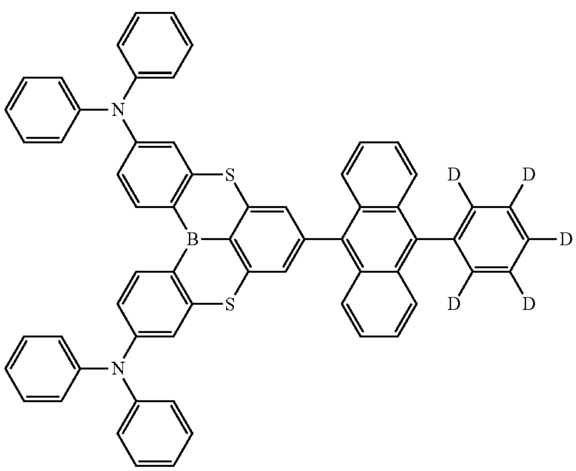
392
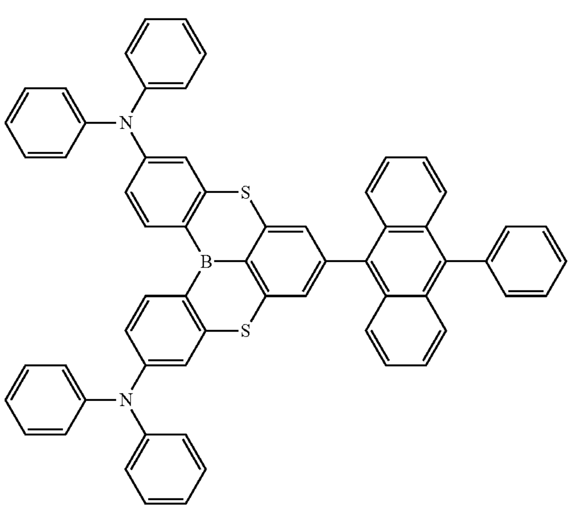
-continued
393
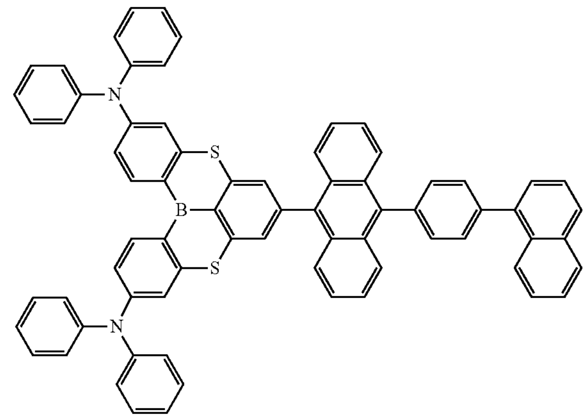
394
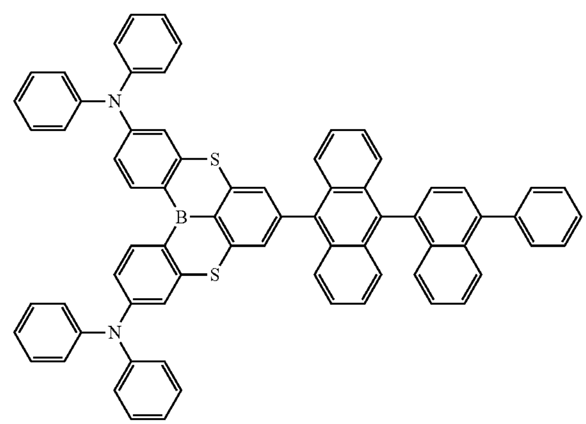
395
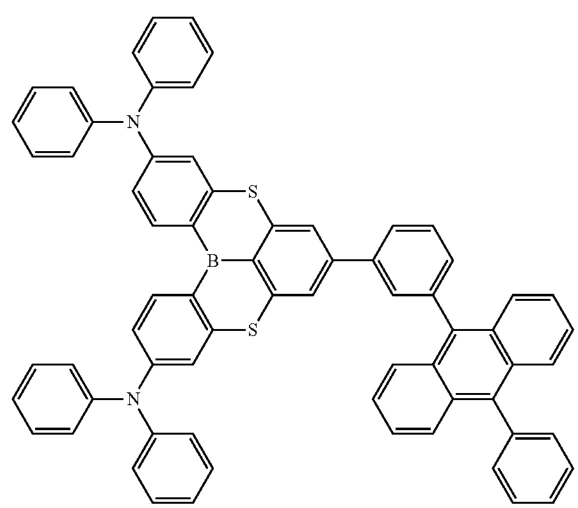

-continued
396
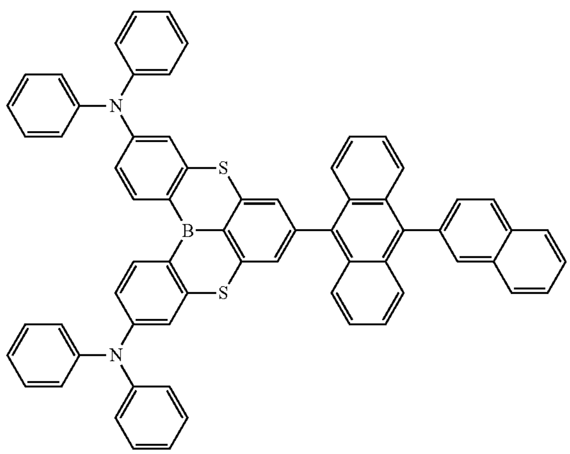
397
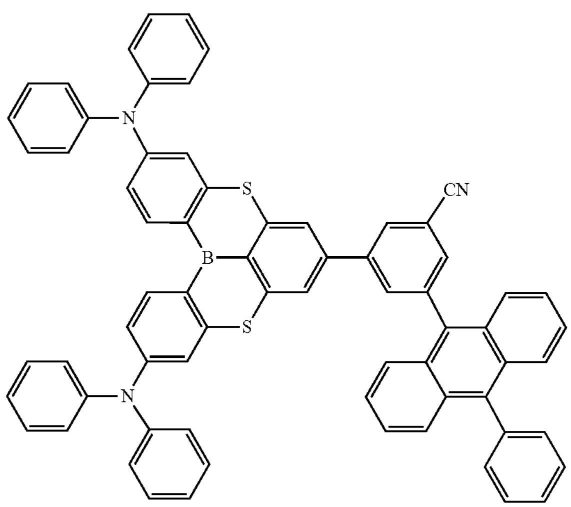
398
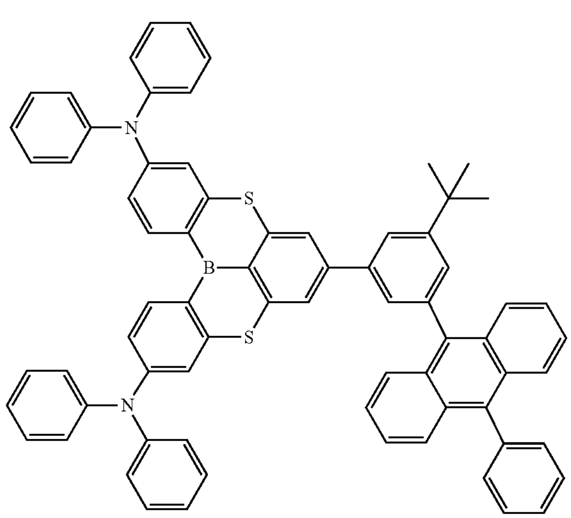
-continued
399
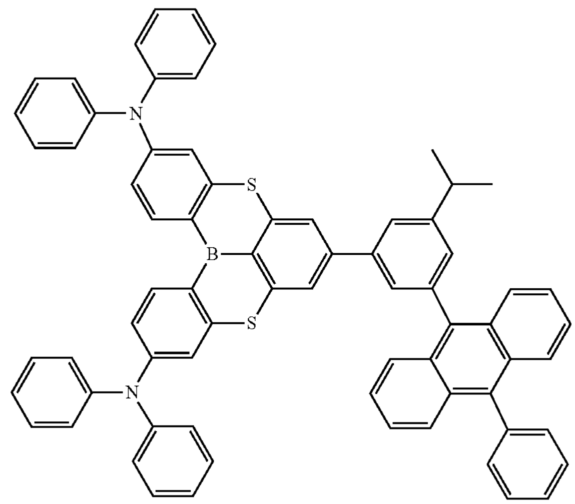
400
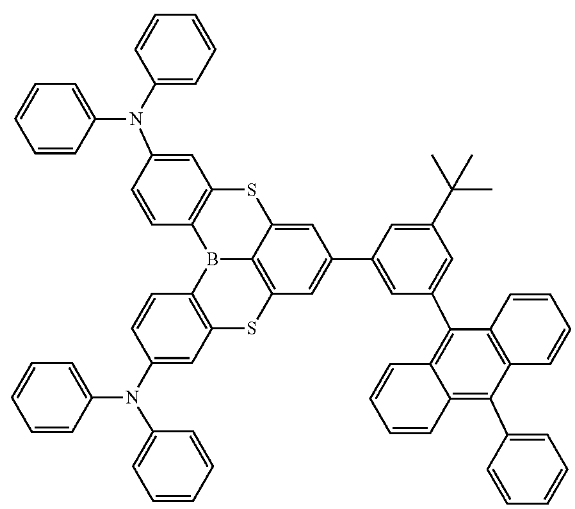
401
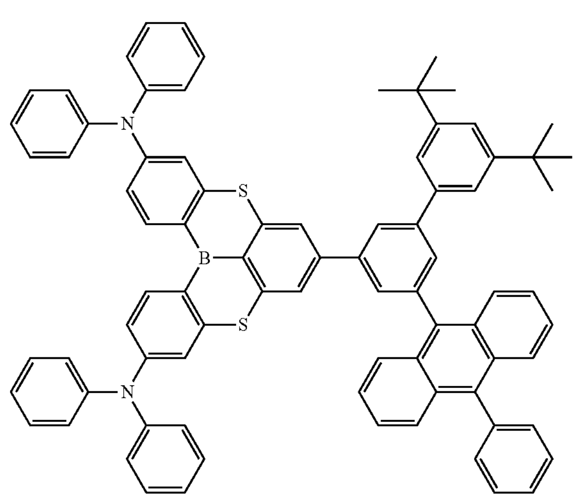

-continued
402
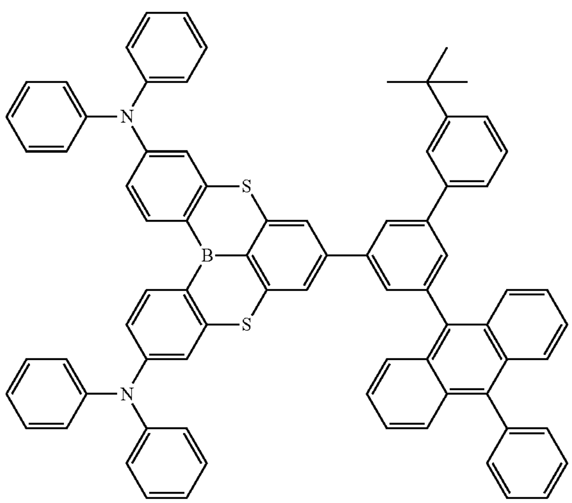
403
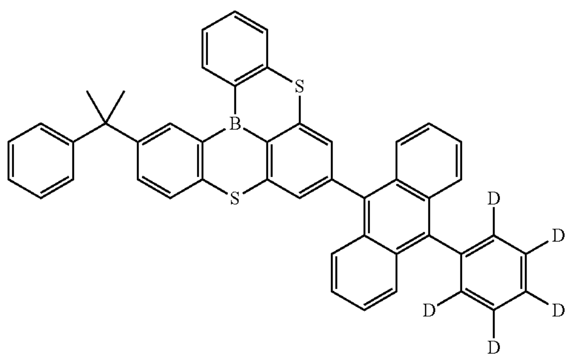
404
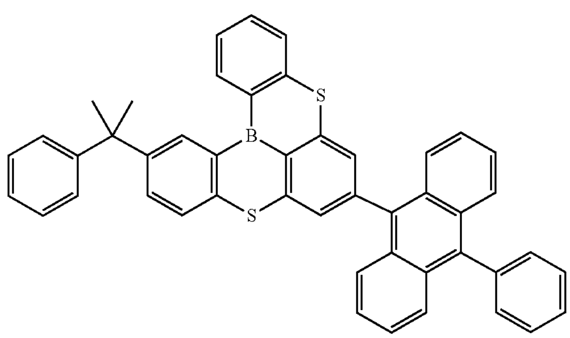
405
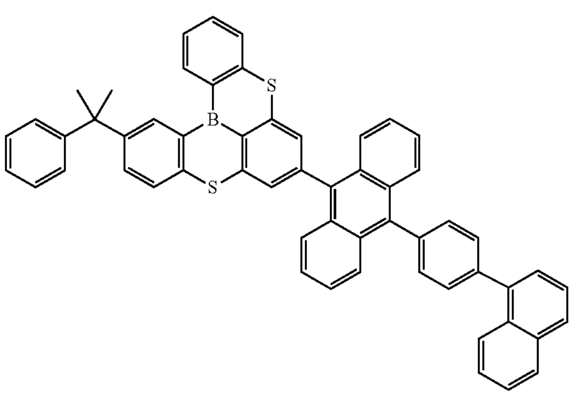
-continued
406
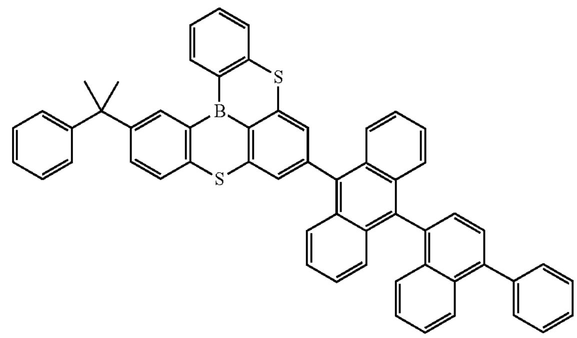
407
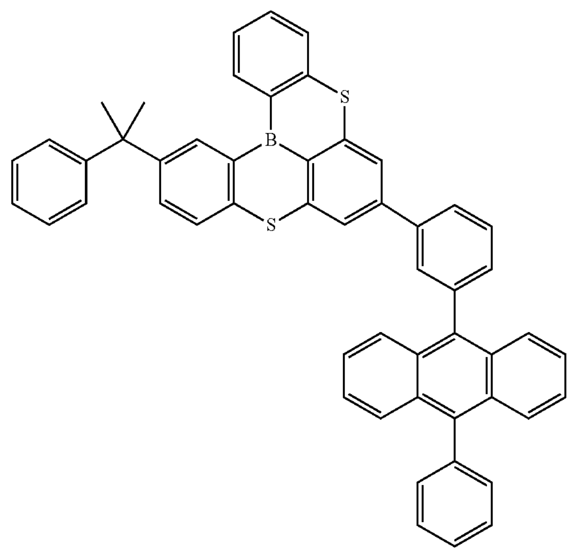
408
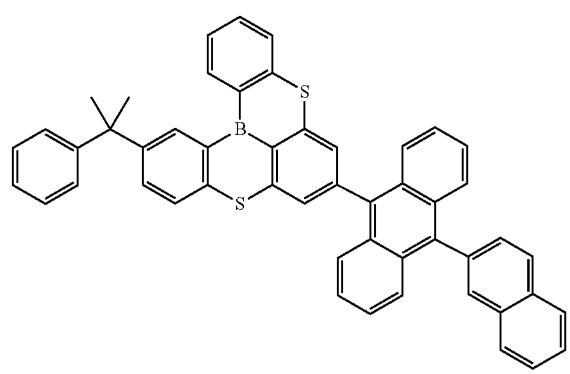

-continued
409
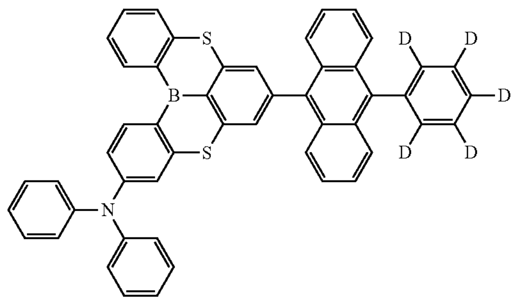
410
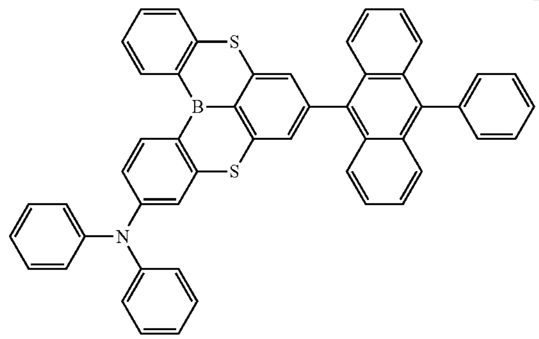
411
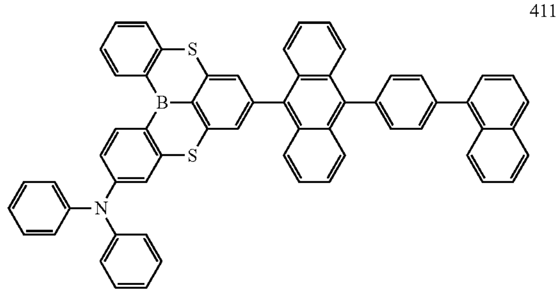
412
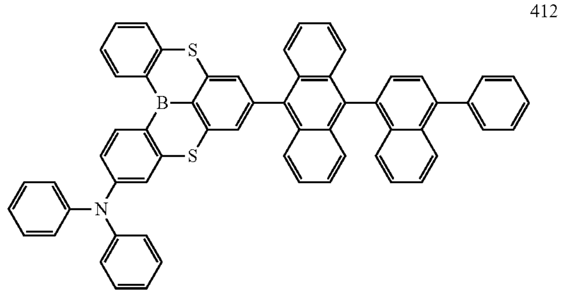
413
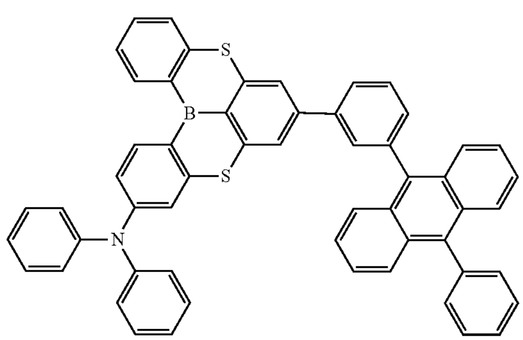
414
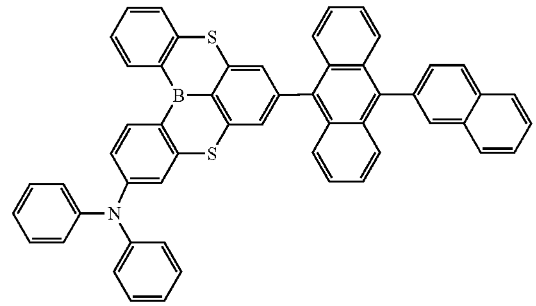
415
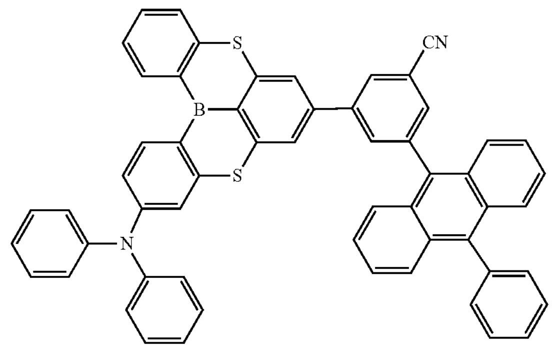
416
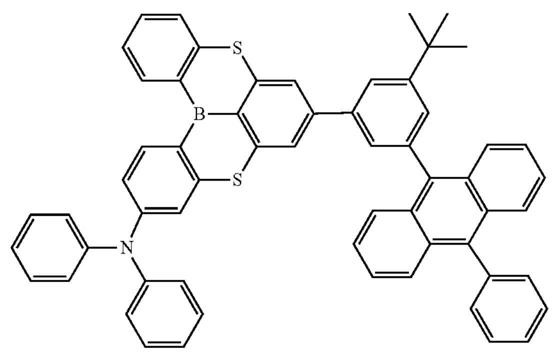
417
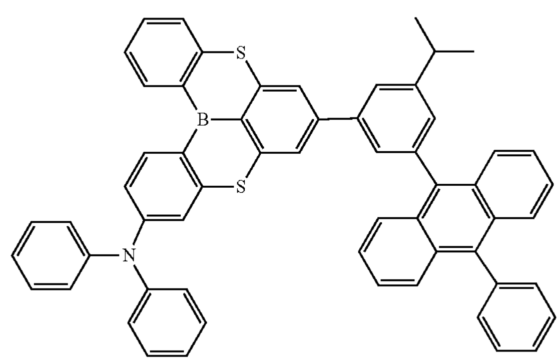

-continued
418
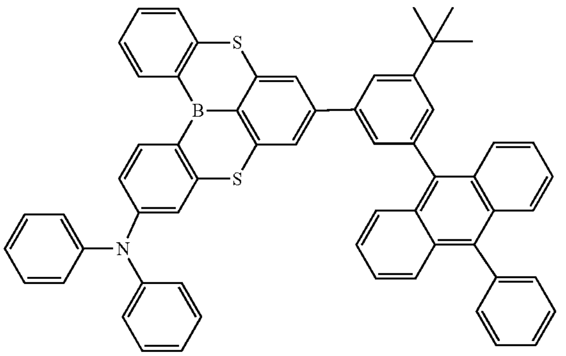
419
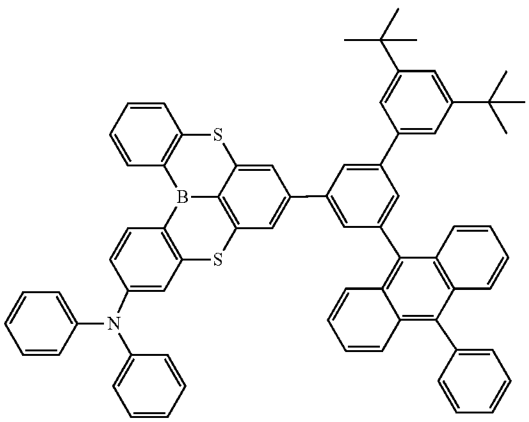
420
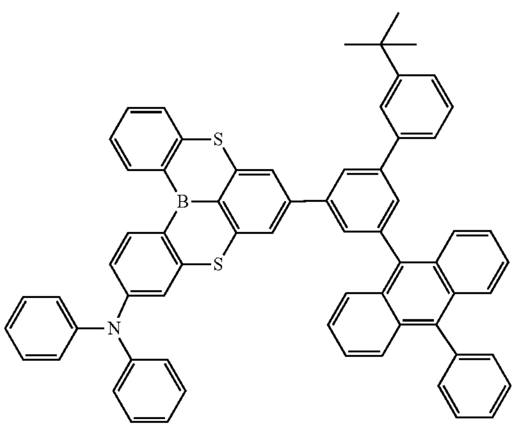
421
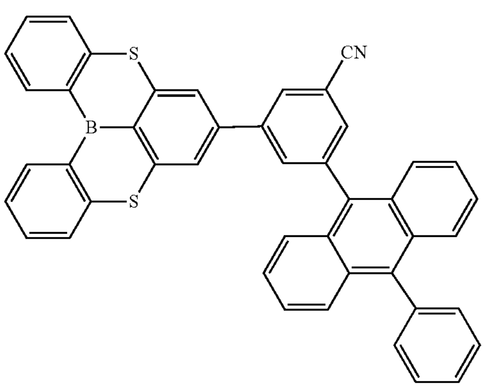
-continued
422
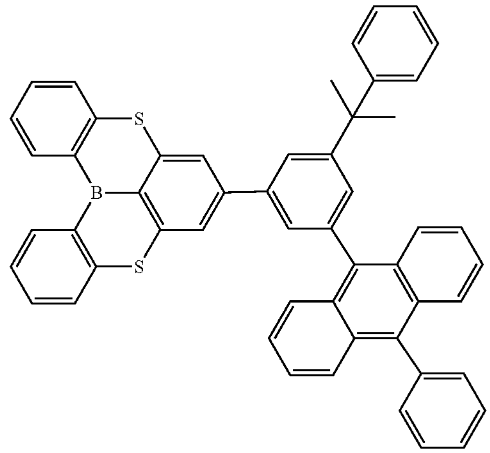
423
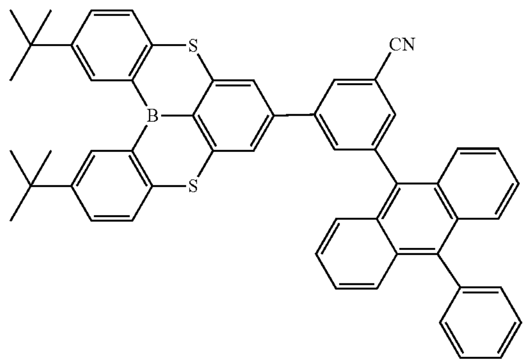
424
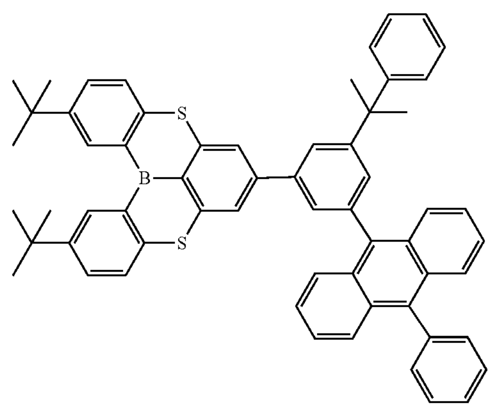
425
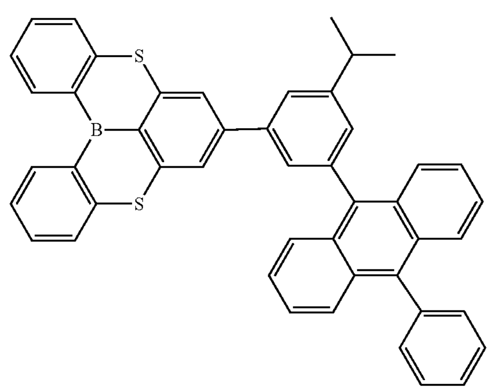

-continued
426
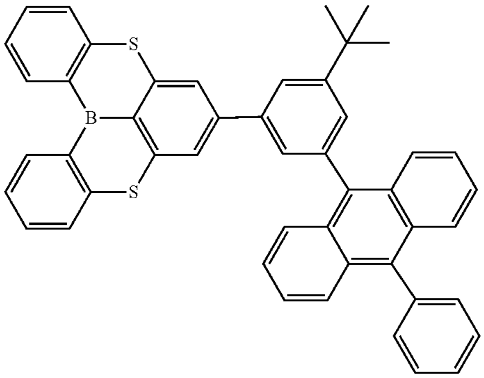
427
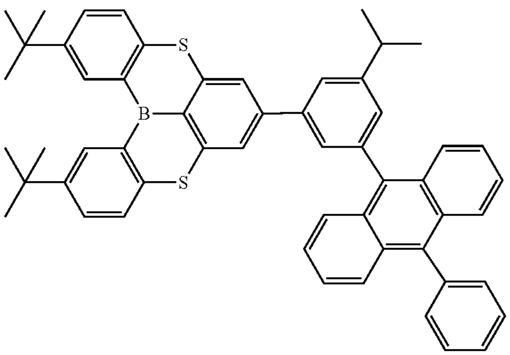
428
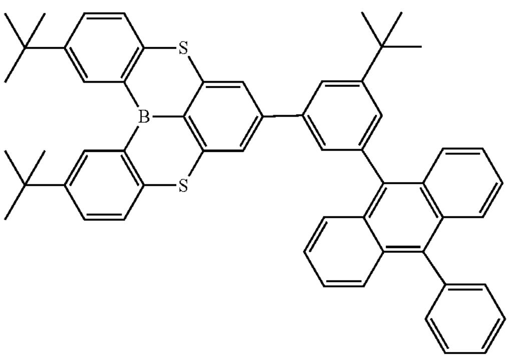
429
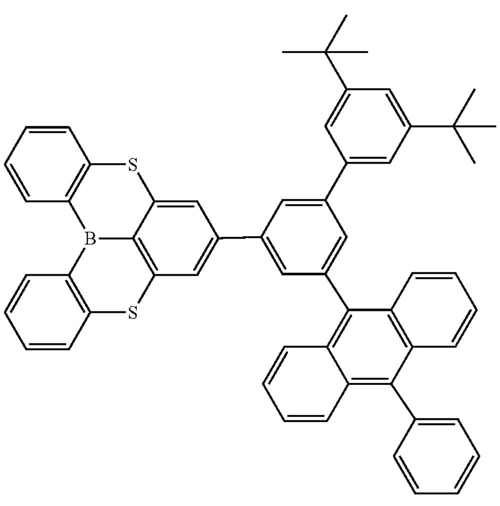
-continued
430
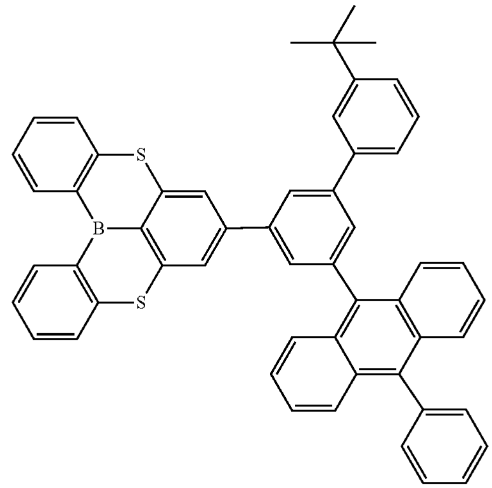
431
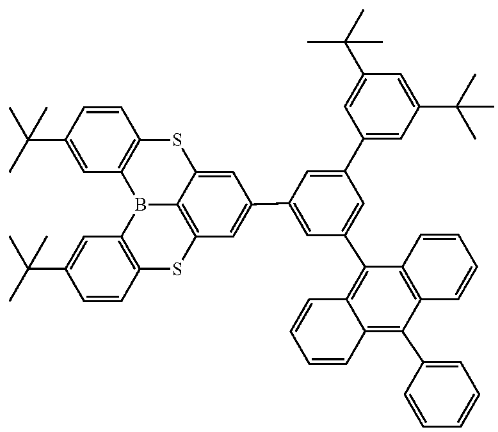
432
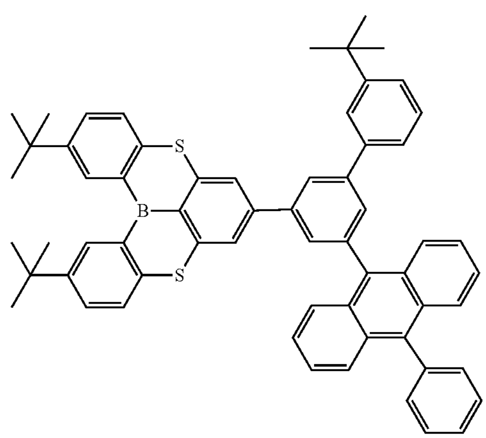

433
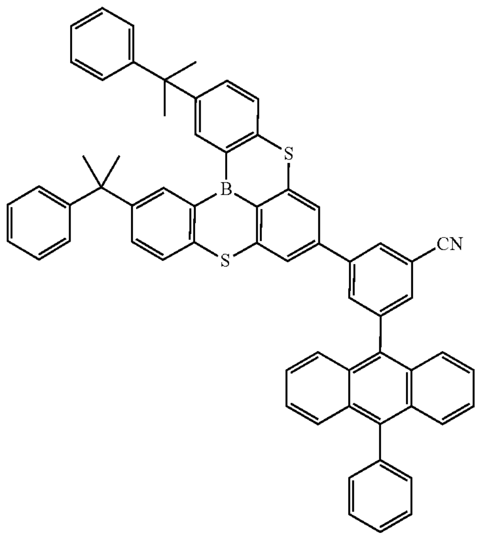
434
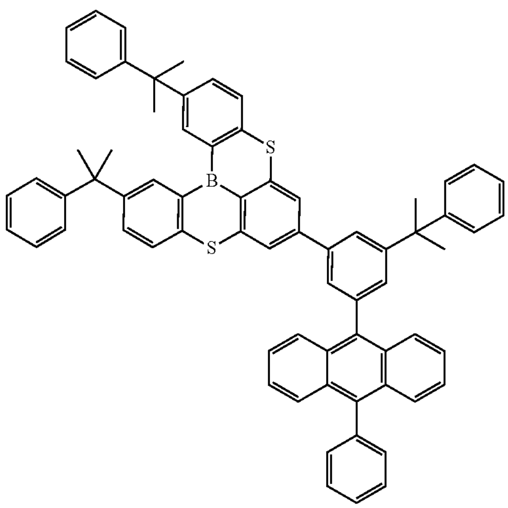
435
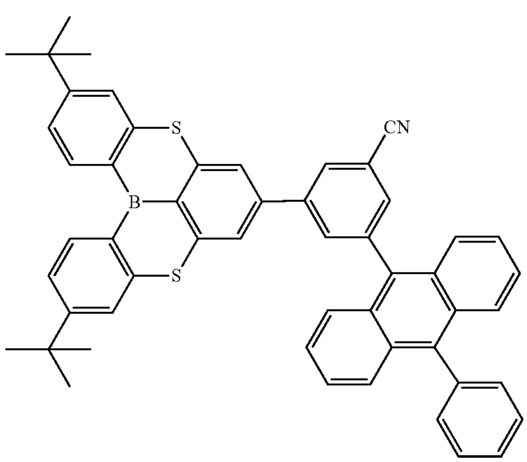
436
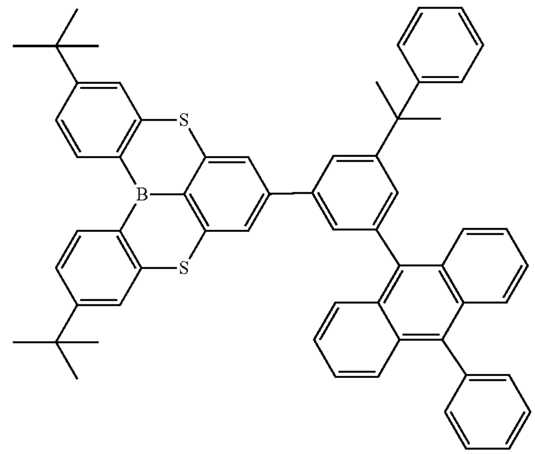
437
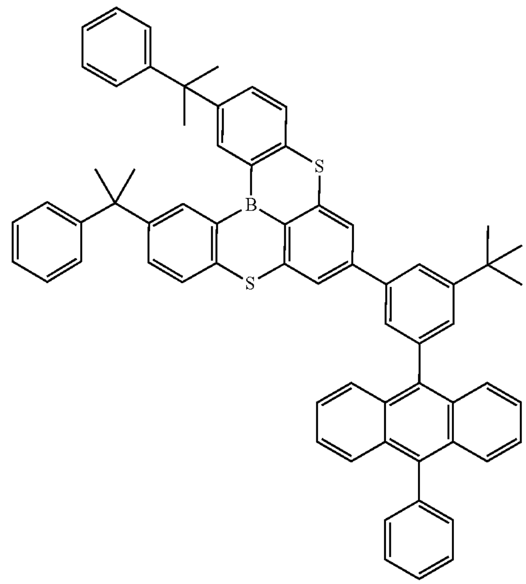
438
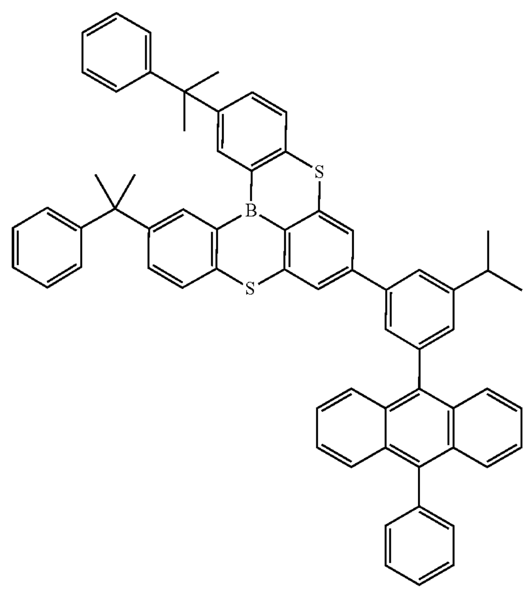

-continued
439
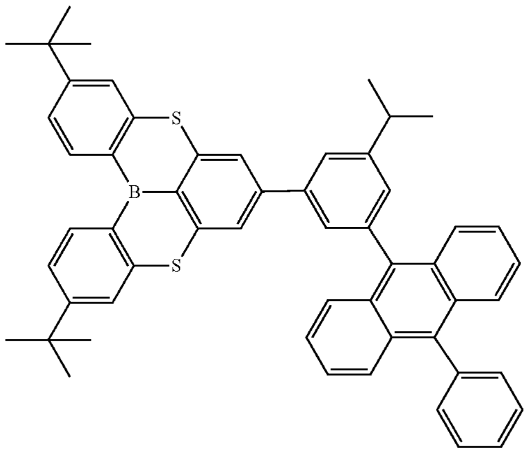
440
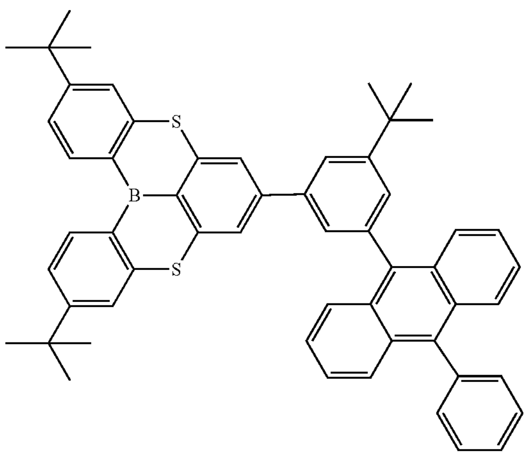
441
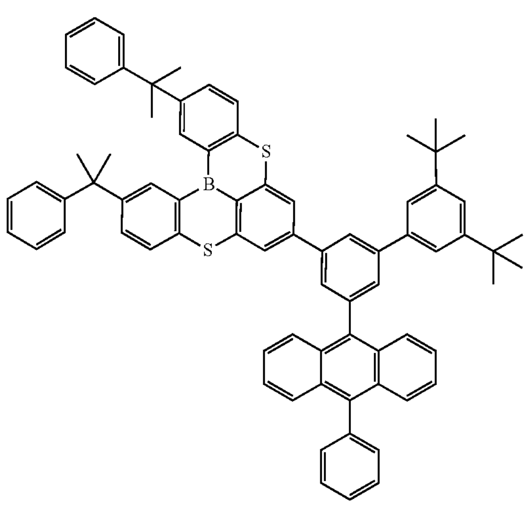
-continued
442
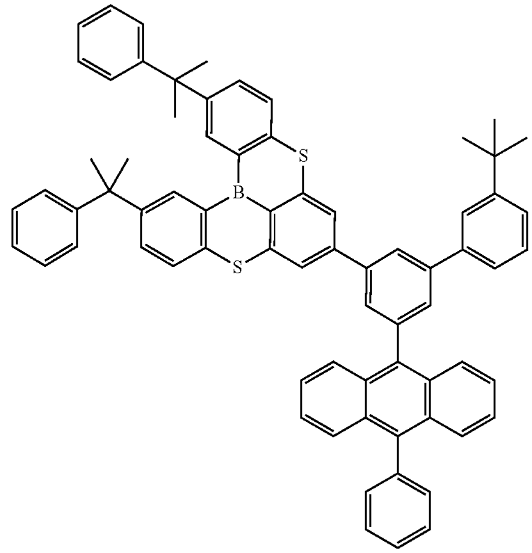
443
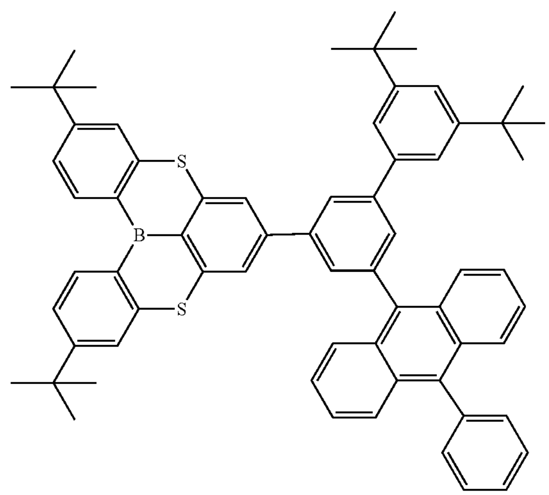
444
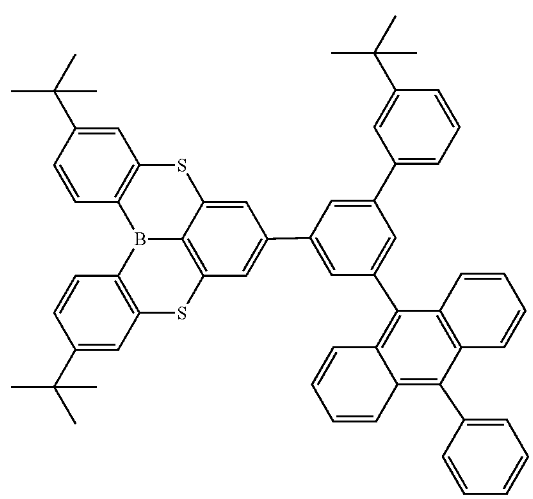

445
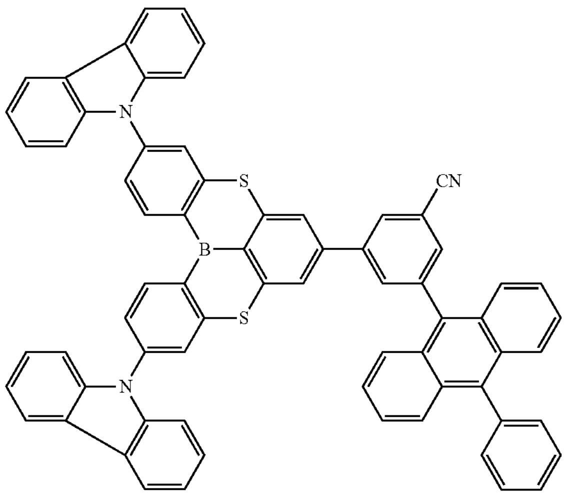
446
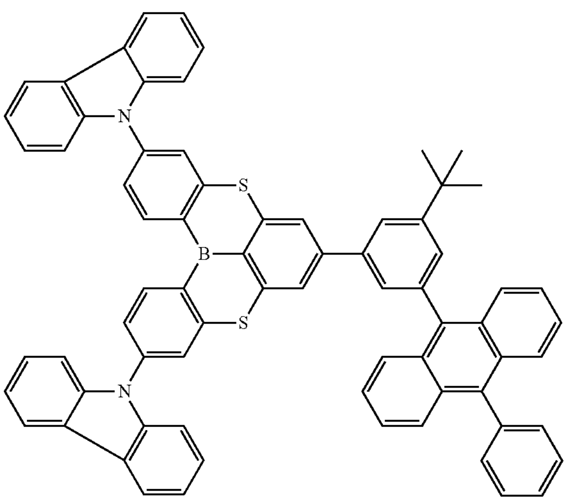
447
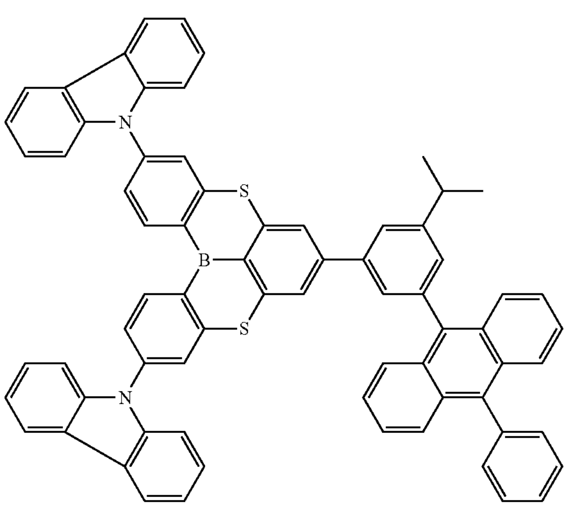
448
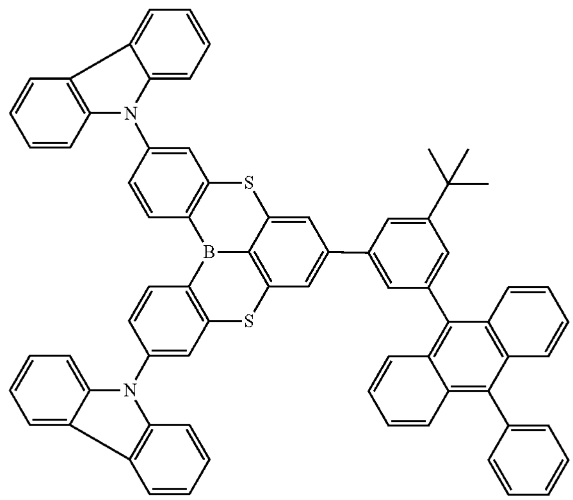
449
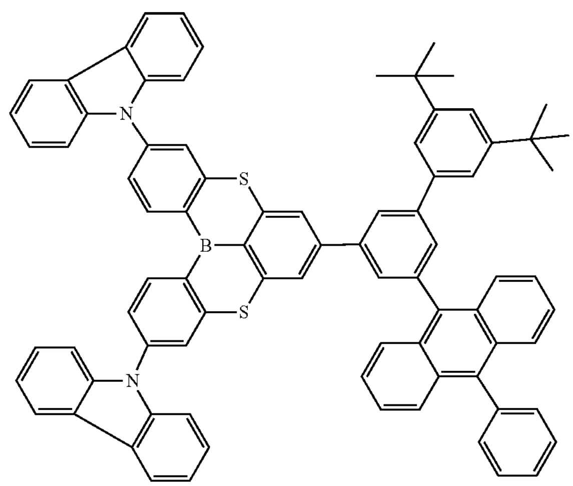
450
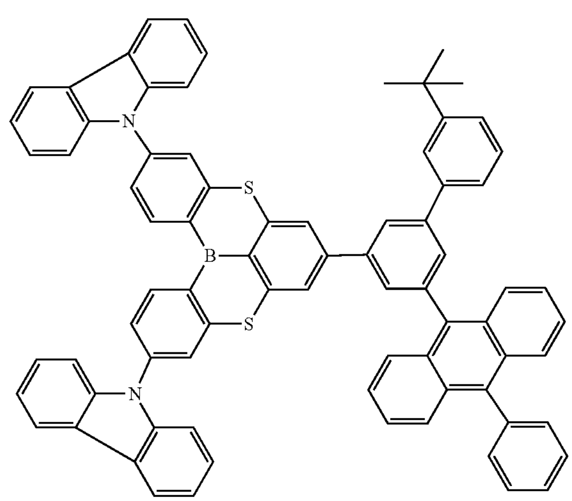

-continued
451
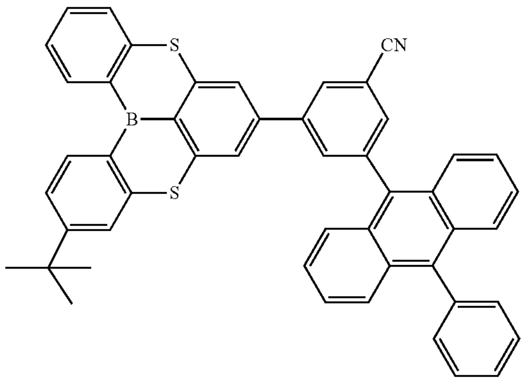
452
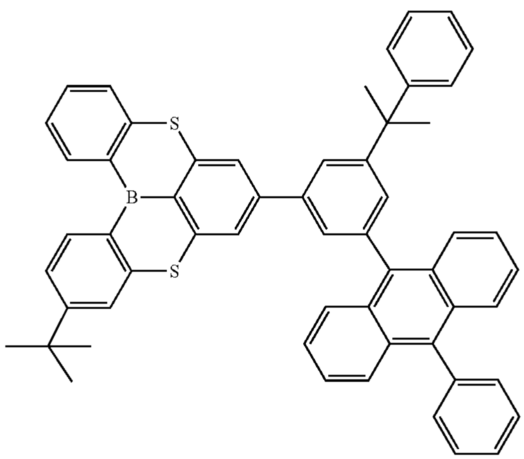
453
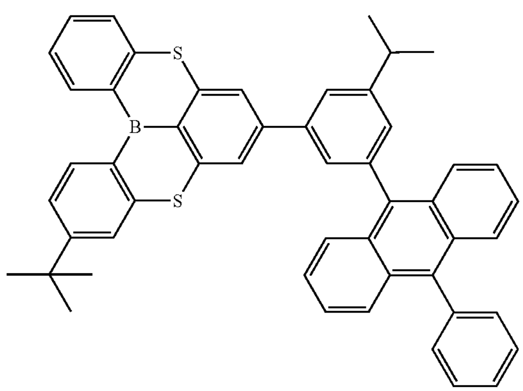
-continued
454
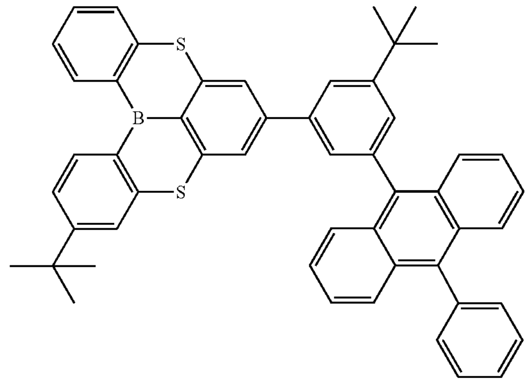
455
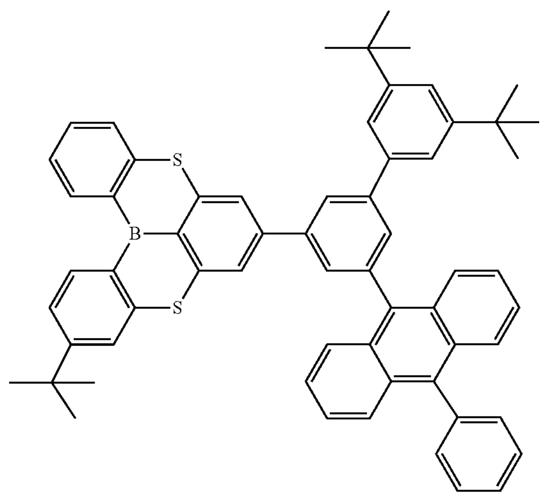
456
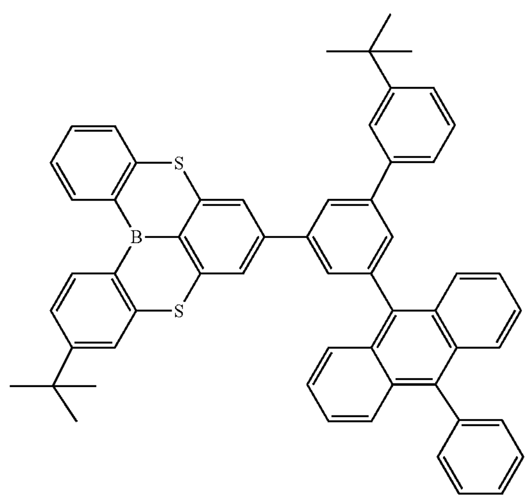

-continued
457
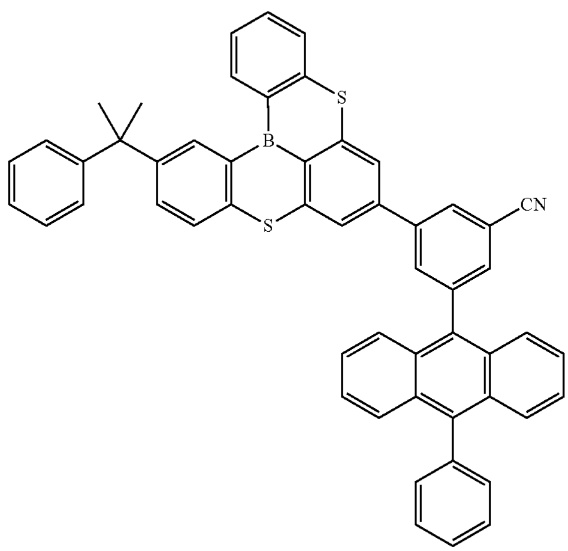
458
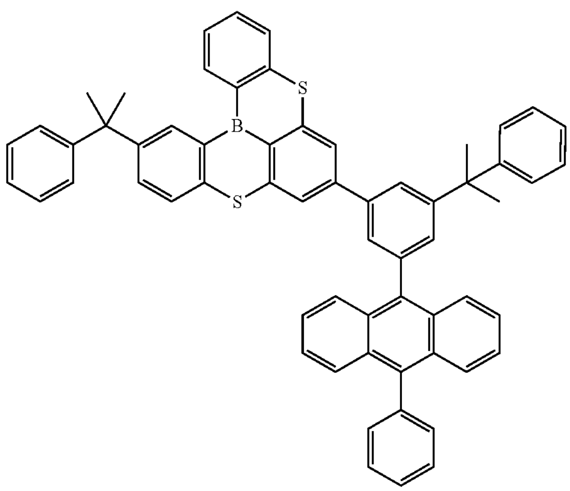
459
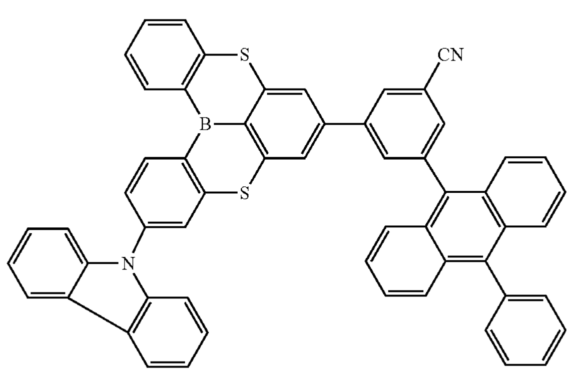
-continued
460
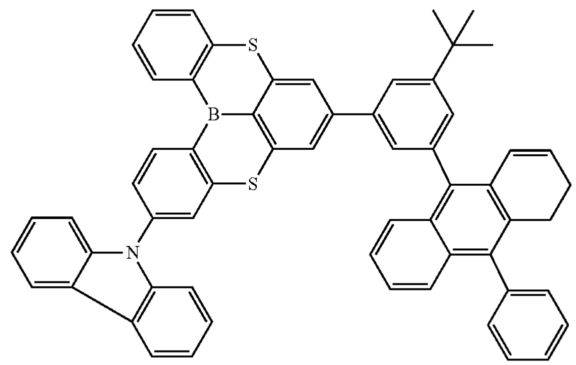
461
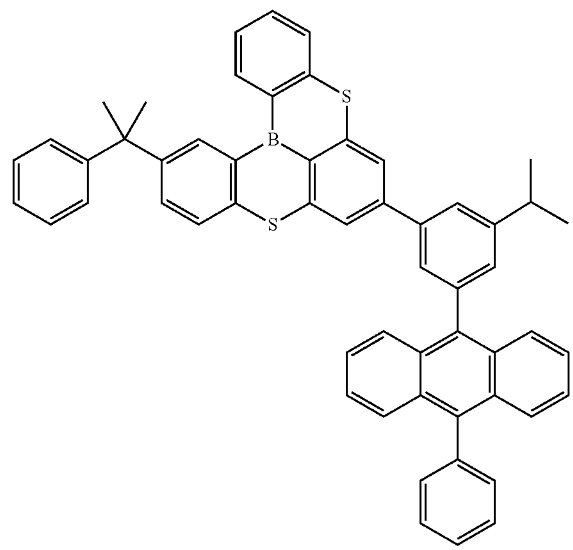
462
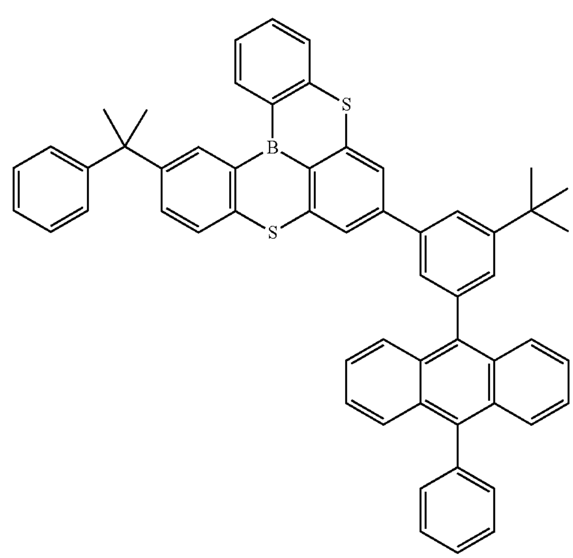

-continued
463
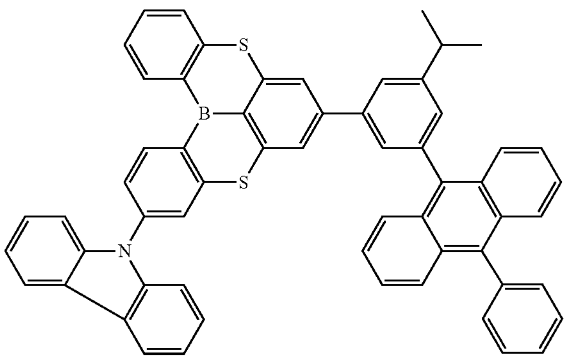
464
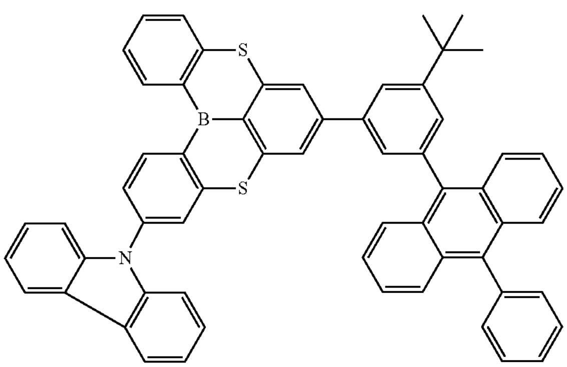
465
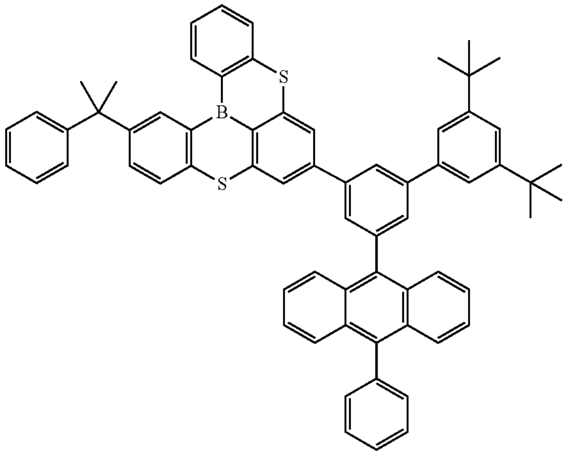
-continued
466
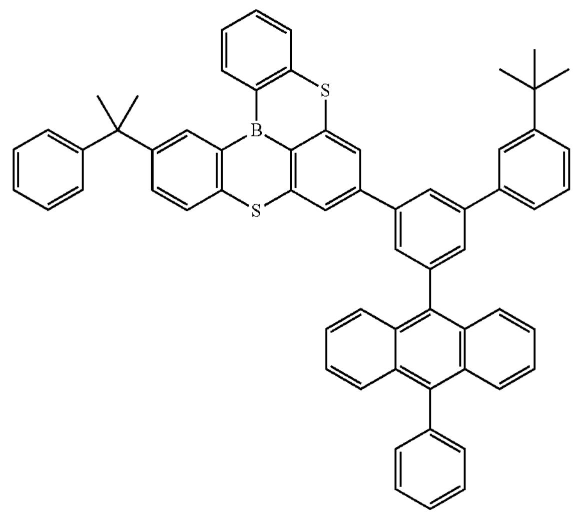
467
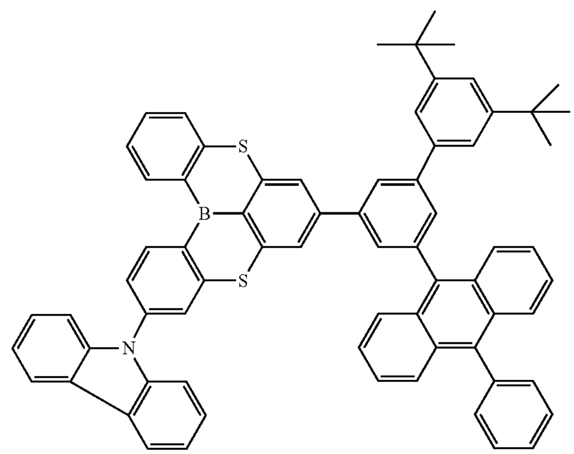
468
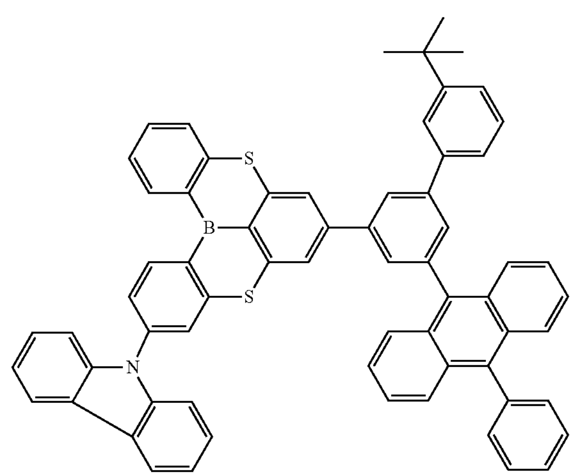

15. The organic light-emitting device of claim 1, wherein the polycyclic compound is a fluorescence emitter.

16. The organic light-emitting device of claim 15, wherein the emission layer further comprises a sensitizer comprising an organic metallic compound comprising Pt, wherein the sensitizer satisfies Equation 1:

$$\Delta E_{ST} \leq 0.3 \text{ eV} \qquad \text{Equation 1}$$

wherein, in Equation 1, $\Delta E_{ST}$ represents an energy level difference between a lowest excited singlet energy level ($S_1$) and a lowest excited triplet energy level ($T_1$) of the sensitizer, and eV is electron volts.

17. The organic light-emitting device of claim 16, wherein the sensitizer and the polycyclic compound each satisfy Conditions 1 and 2:

$$T_{decay}(PC) < T_{decay}(S) \qquad \text{Condition 1}$$

$$T_{decay}(PC) < 1.5 \text{ microseconds} \qquad \text{Condition 2}$$

wherein, in Conditions 1 and 2, $T_{decay}(PC)$ represents a decay time of the polycyclic compound in microseconds, and $T_{decay}(S)$ represents a decay time of the sensitizer in microseconds.

18. The organic light-emitting device of claim 1, wherein the emission layer further comprises a photoluminescent dopant, and wherein an amount of the host is greater than an amount of the polycyclic compound and the photoluminescent dopant combined in the emission layer.

19. The organic light-emitting device of claim 1, wherein the first electrode is an anode, the second electrode is a cathode, the organic layer comprises a hole transport region disposed between the first electrode and the emission layer and an electron transport region disposed between the emission layer and the second electrode, wherein the hole transport region comprises a hole injection layer, a hole transport layer, an electron blocking layer, a buffer layer, or a combination thereof, and wherein the electron transport region comprises a hole blocking layer, an electron transport layer, an electron injection layer, or a combination thereof.

* * * * *